United States Patent [19]
Ito et al.

[11] Patent Number: 6,060,864
[45] Date of Patent: May 9, 2000

[54] BATTERY SET STRUCTURE AND CHARGE/DISCHARGE CONTROL APPARATUS FOR LITHIUM-ION BATTERY

[75] Inventors: Hironori Ito; Shigeru Sekine; Masahiko Kasashima; Hisao Tsukazawa; Yuichiro Hino, all of Tokyo; Shizuo Morioka, Hanno; Nobuyuki Hosoya, Tokyo; Yoshiaki Ukiya, Tokyo; Katsuo Ozawa, Tokyo; Hirohito Motomiya, Kawagoe; Masaru Harashima; Masahiko Hagiwara, both of Tokyo; Masanori Morita, Sayama; Akihiko Uchida, Tokyo; Naoki Tashiro, Tokyo; Masayasu Tanaka, Tokyo; Keiichi Mitsui, Tokyo; Naoki Isooka, Tokyo, all of Japan

[73] Assignee: Kabushiki Kaisha Toshiba, Kawasaki, Japan

[21] Appl. No.: 09/257,061

[22] Filed: Feb. 25, 1999

Related U.S. Application Data

[62] Division of application No. 09/009,422, Jan. 20, 1998, Pat. No. 5,903,131, which is a division of application No. 08/853,415, May 9, 1997, Pat. No. 5,825,155, which is a continuation of application No. 08/286,193, Aug. 8, 1994, abandoned.

[51] Int. Cl.[7] ............................................. H02J 7/00
[52] U.S. Cl. ................................ 320/136; 320/134
[58] Field of Search ........................... 320/116, 106, 320/112, DIG. 13, 163, 134, 136; 324/433; 361/90–92

[56] References Cited

U.S. PATENT DOCUMENTS

| | | | |
|---|---|---|---|
| 3,909,685 | 9/1975 | Baker et al. | 318/139 |
| 4,418,127 | 11/1983 | Shambaugh et al. | 429/149 |
| 4,424,491 | 1/1984 | Bobbett et al. | 324/433 |
| 4,484,140 | 11/1984 | Dieu | 324/434 |
| 4,513,167 | 4/1985 | Brandstetter | 320/16 |
| 4,675,259 | 6/1987 | Totty | 429/157 |
| 4,879,188 | 11/1989 | Meinhold et al. | 429/7 |
| 4,885,523 | 12/1989 | Koenck | 320/21 |
| 5,130,706 | 7/1992 | Van Steenwyk | 340/854 |
| 5,302,902 | 4/1994 | Groehl | 324/434 |
| 5,304,915 | 4/1994 | Sanpei et al. | 320/14 |
| 5,455,499 | 10/1995 | Uskali et al. | 320/43 |
| 5,493,197 | 2/1996 | Eguchi et al. | 320/134 |
| 5,503,948 | 4/1996 | MacKay et al. | 429/160 |
| 5,534,765 | 7/1996 | Kreisinger et al. | 320/30 |
| 5,539,298 | 7/1996 | Perkins et al. | 320/21 |
| 5,563,496 | 10/1996 | McClure | 320/48 |
| 5,581,170 | 12/1996 | Mammano et al. | 320/17 |
| 5,610,495 | 3/1997 | Yee et al. | 320/DIG. 13 |
| 5,635,813 | 6/1997 | Shiga et al. | 320/2 |
| 5,652,501 | 7/1997 | McClure et al. | 320/17 |
| 5,694,024 | 12/1997 | Dias | 320/30 |
| 5,767,659 | 6/1998 | Farley | 320/106 |

*Primary Examiner*—Edward H. Tso
*Assistant Examiner*—Pia Tibbits
*Attorney, Agent, or Firm*—Finnegan, Henderson, Farabow, Garrett & Dunner, L.L.P.

[57] ABSTRACT

In a battery-driven portable computer, a battery pack is constituted by m battery sets connected in series each including n lithium-ion secondary battery cells connected in parallel. A voltage monitor for monitoring the voltage of the terminal electrode of each battery set and a charger for independently appropriately charging each battery set in accordance with a monitor result are arranged, thereby realizing battery driving by a lithium-ion secondary battery pack having a large capacity. A computer system monitors the voltages of the battery cells which are part of a secondary battery by comparing the battery voltages with a predetermined voltage value in order to detect overdischarge (undervoltage) or overcharge (overvoltage), outputs this information outside of the battery pack, and terminates processing prior to a circuit disconnect.

11 Claims, 58 Drawing Sheets

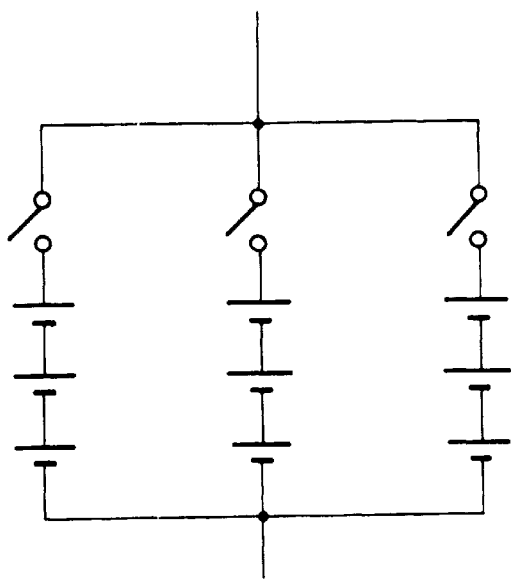
F I G. 1
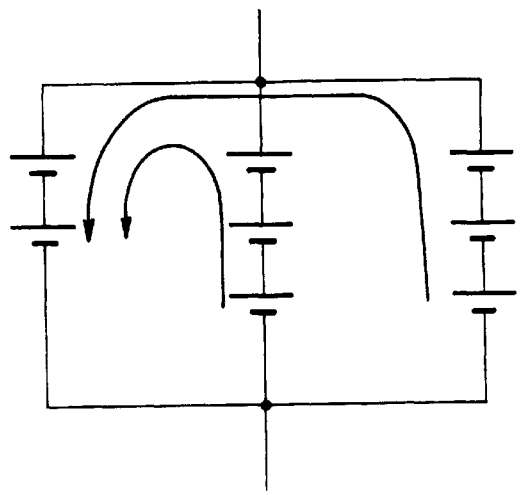
F I G. 2
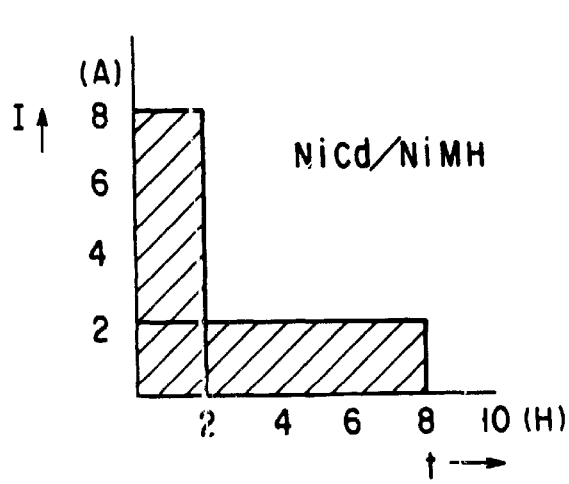
F I G. 3
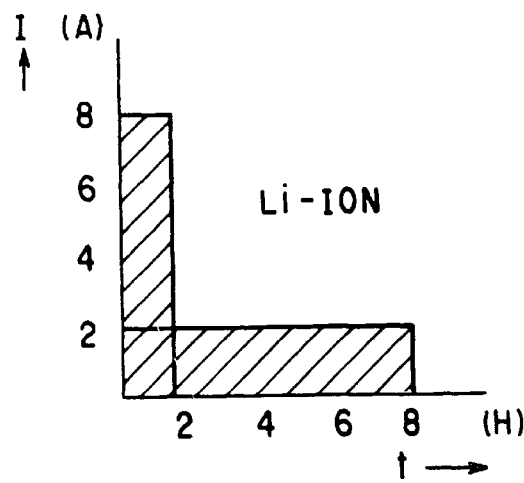
F I G. 4

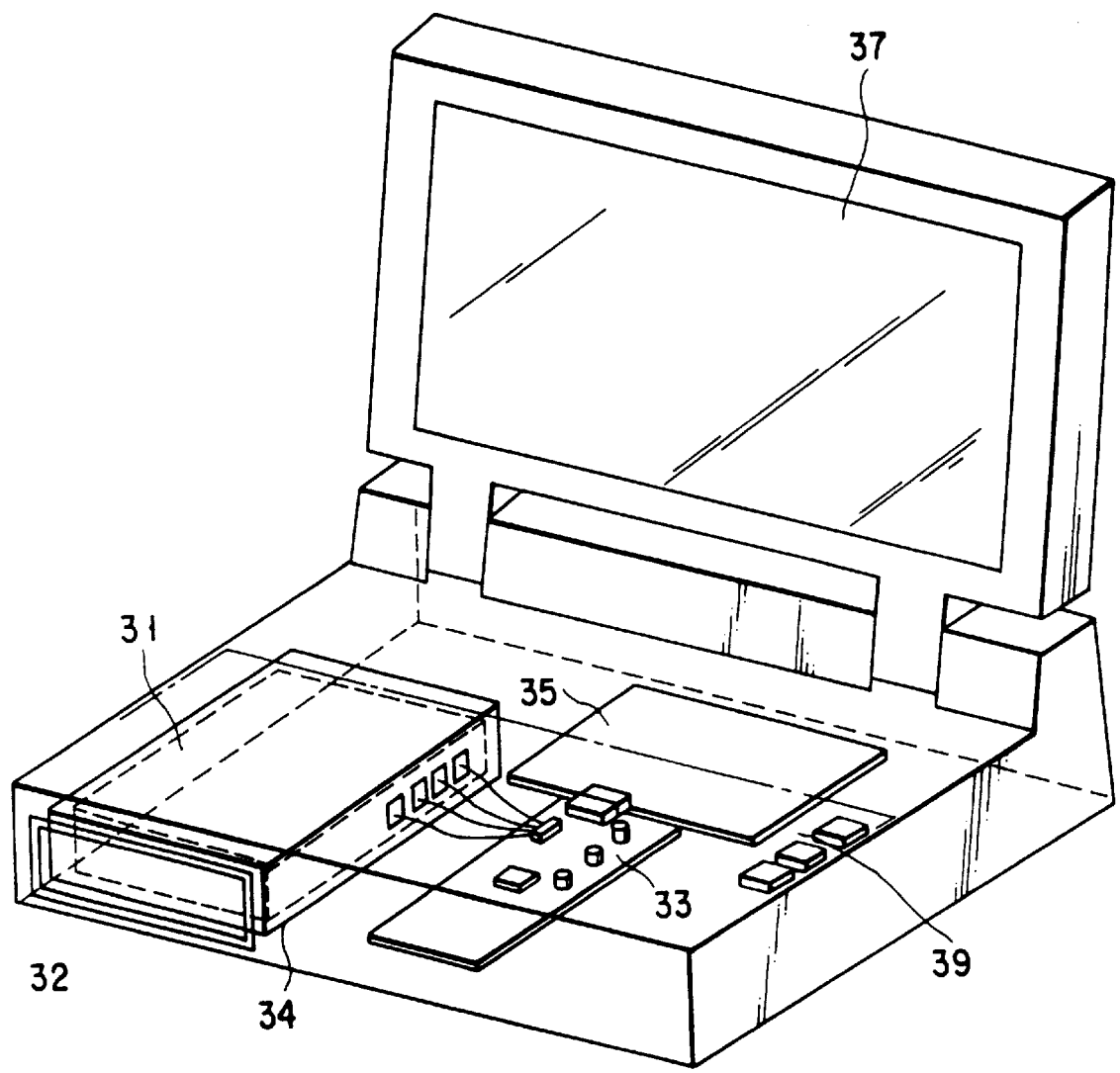
F I G. 5

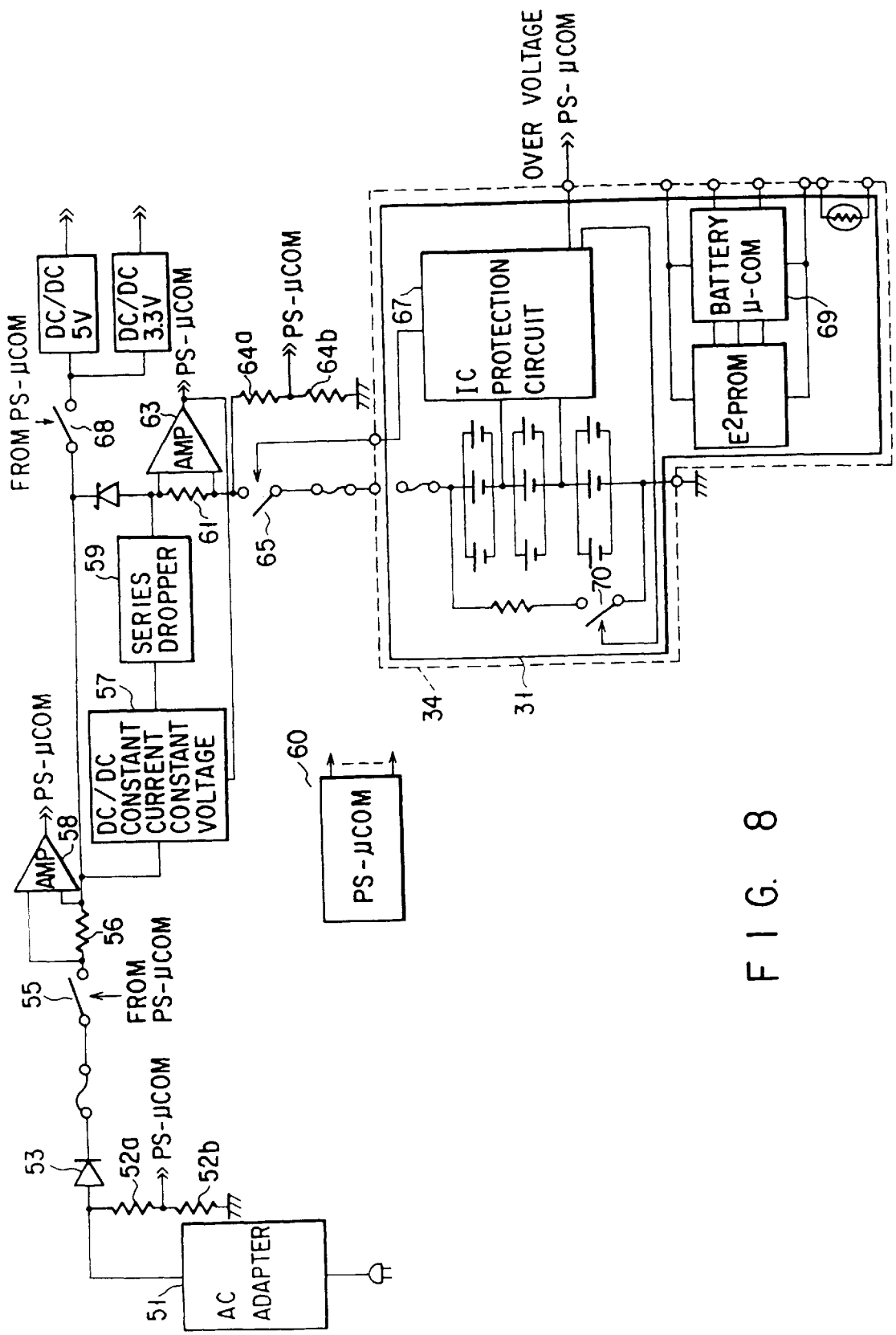
F I G. 8

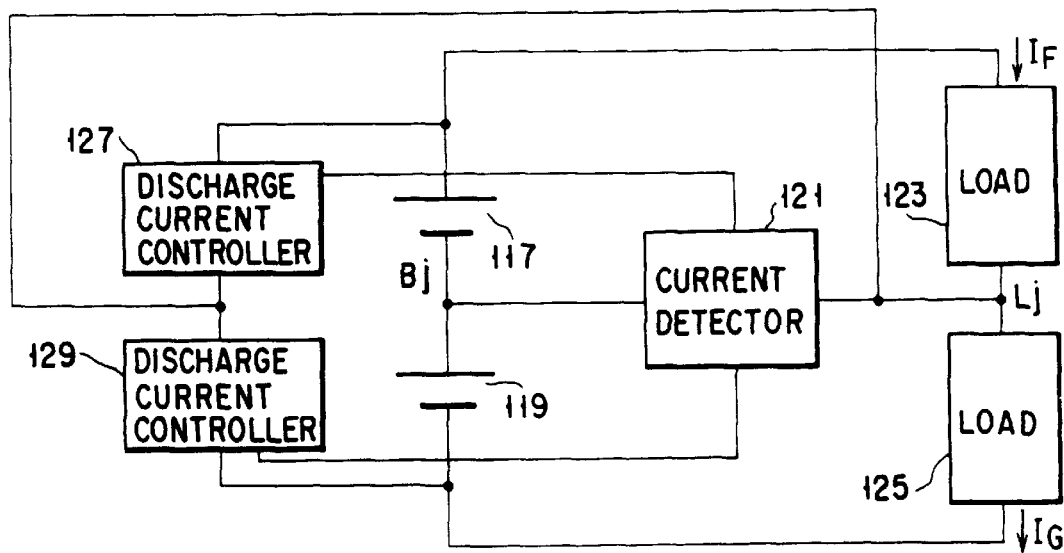
F I G. 11

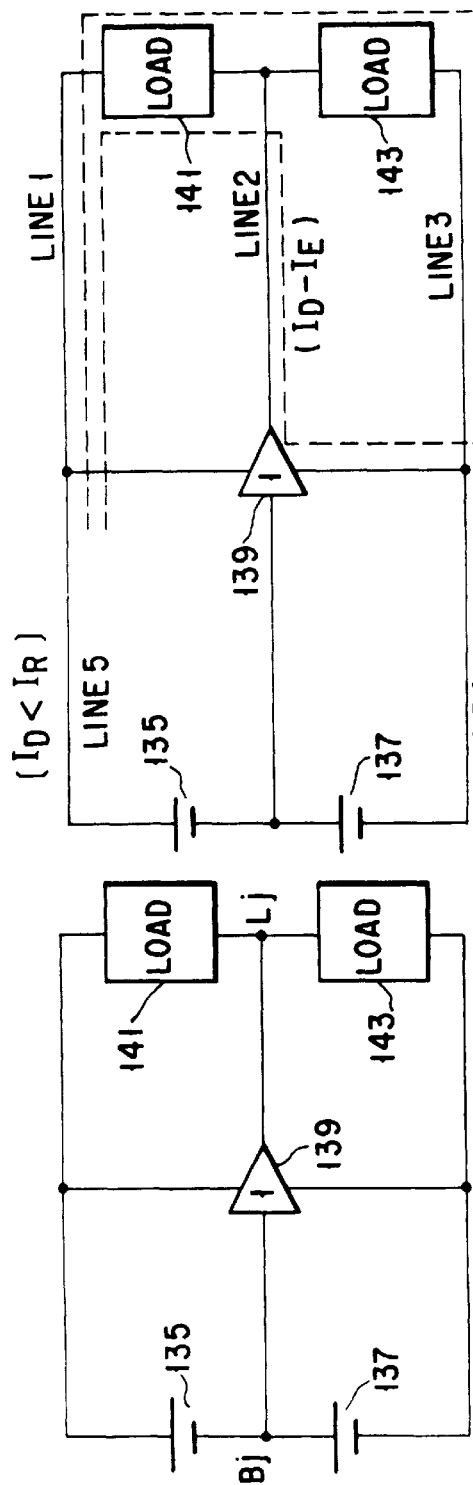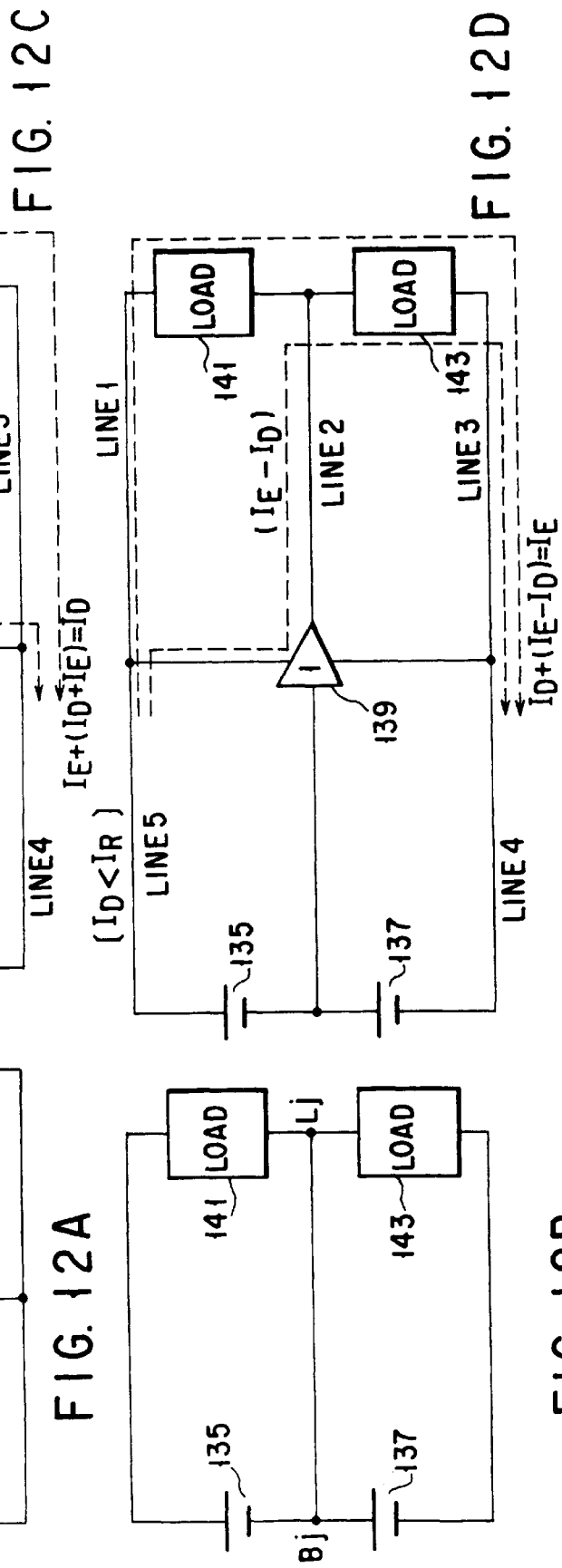

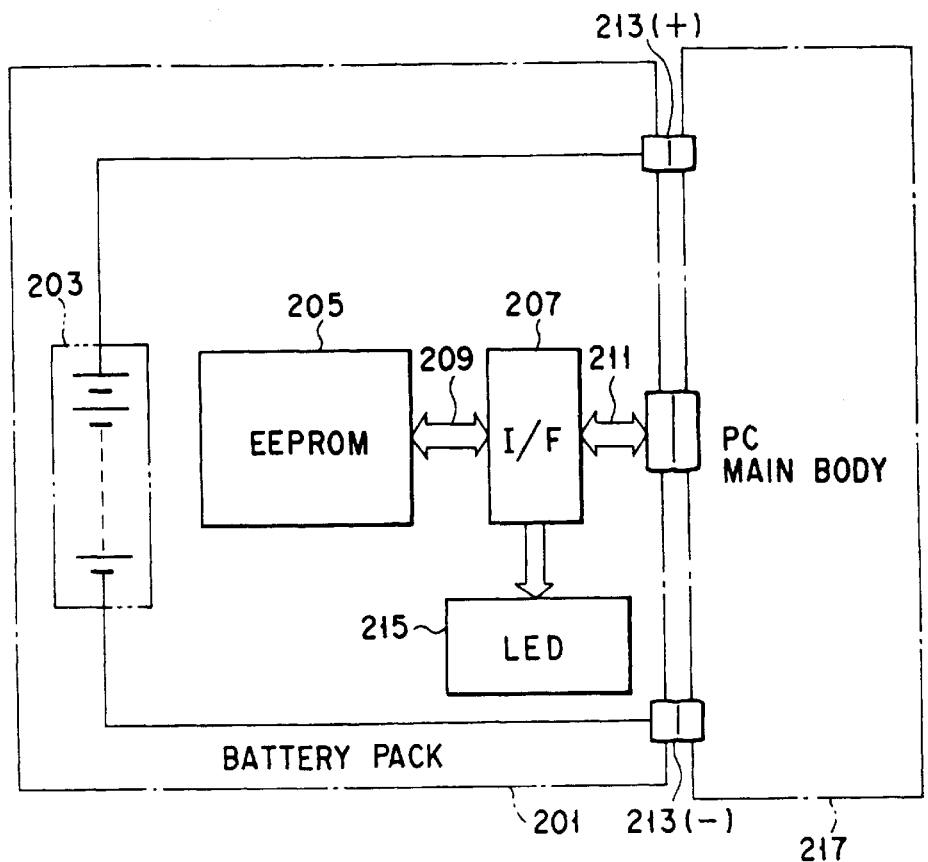
F I G. 19
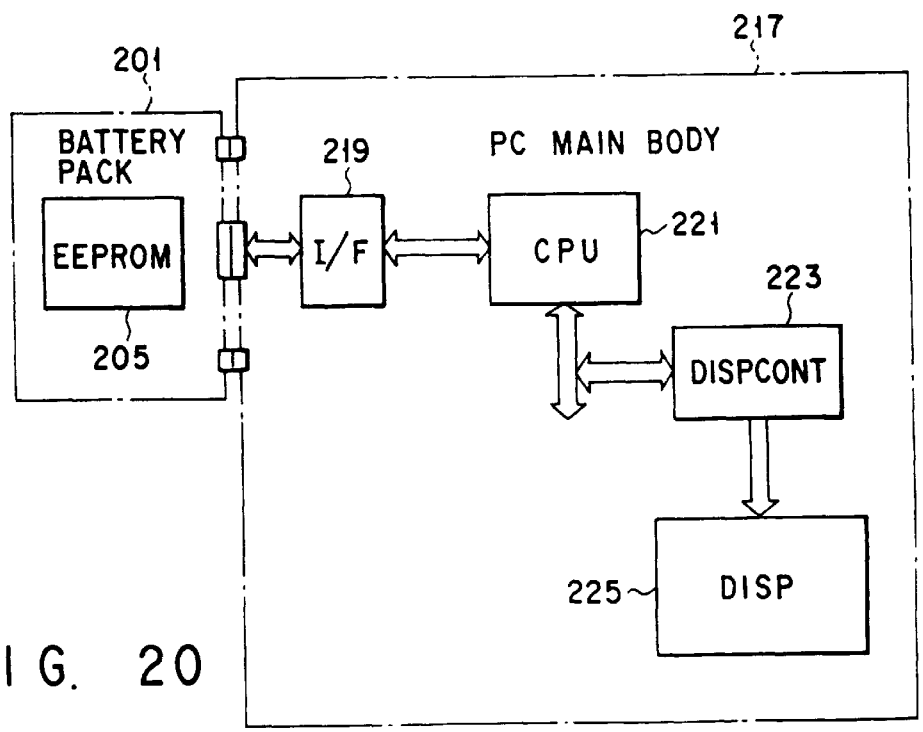
F I G. 20

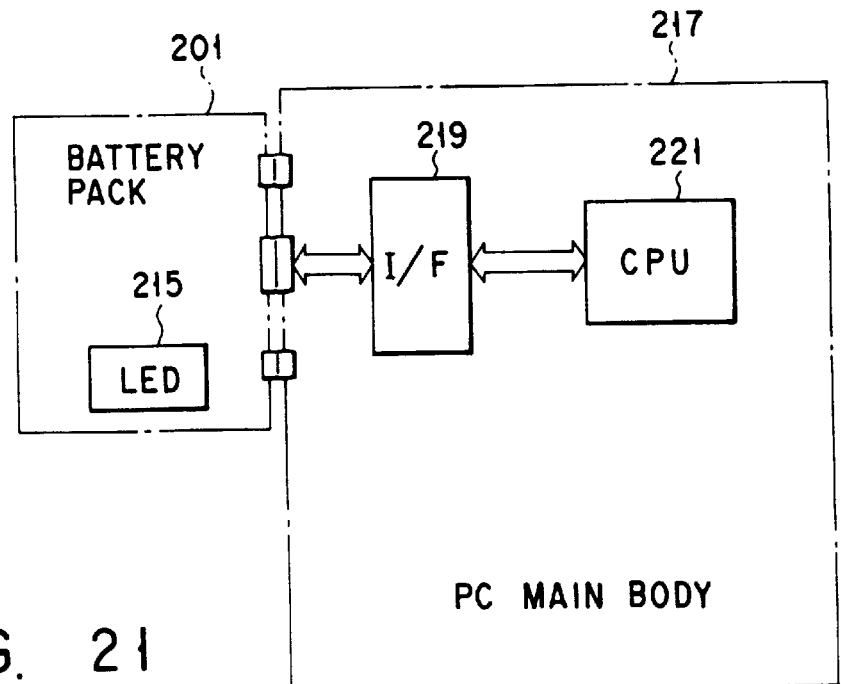
F I G. 21
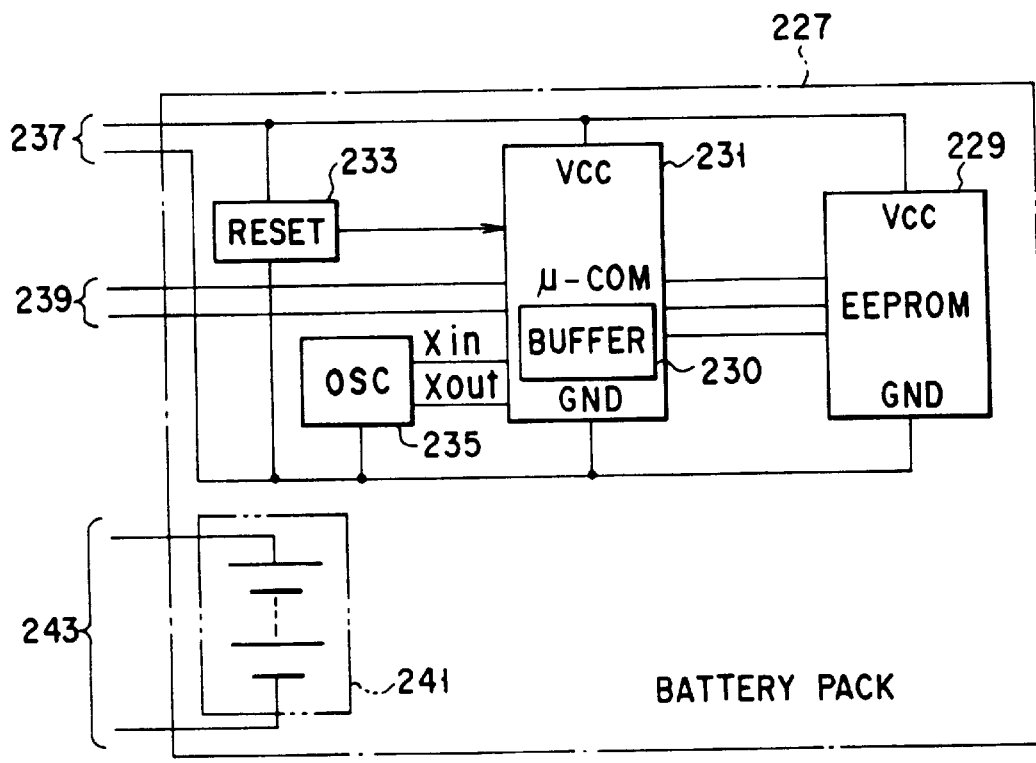
F I G. 22

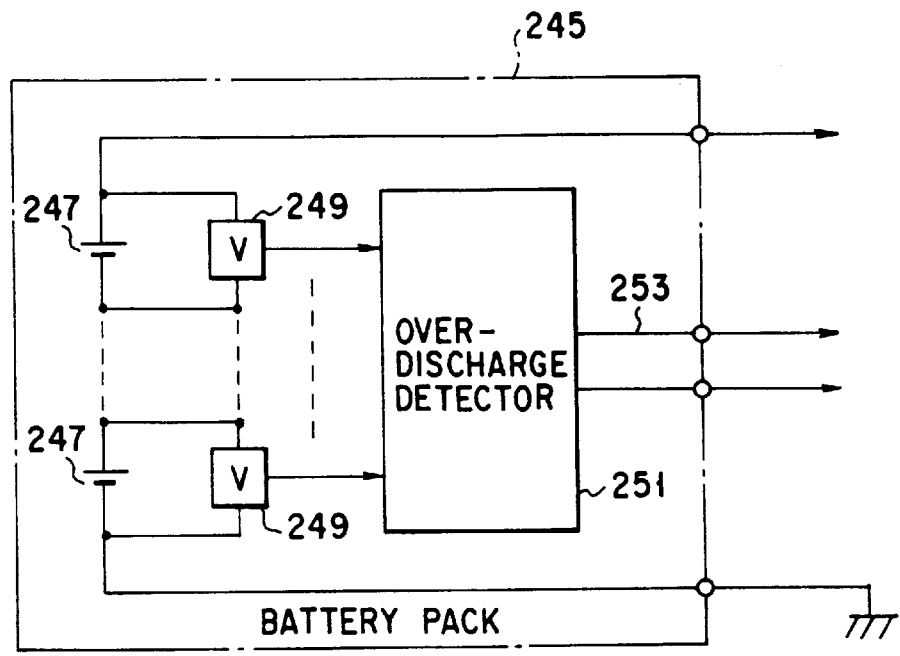
F I G. 23
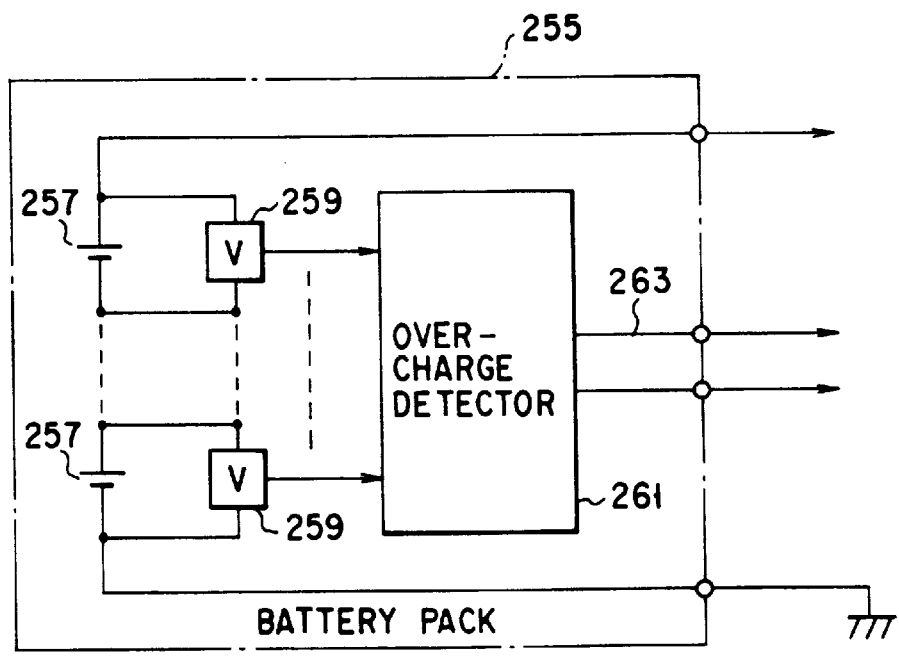
F I G. 24

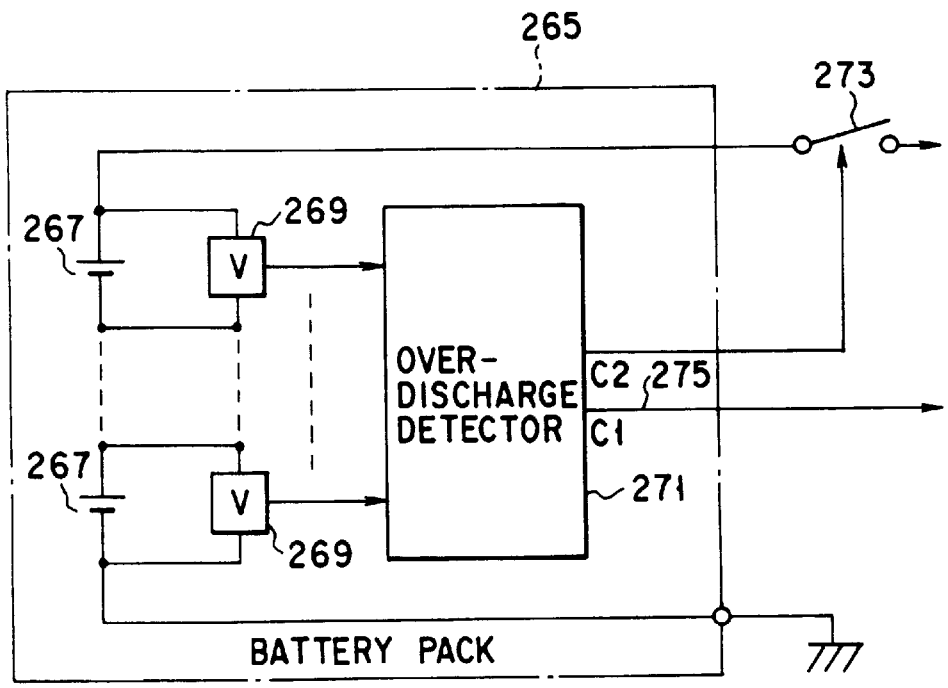
F I G. 25
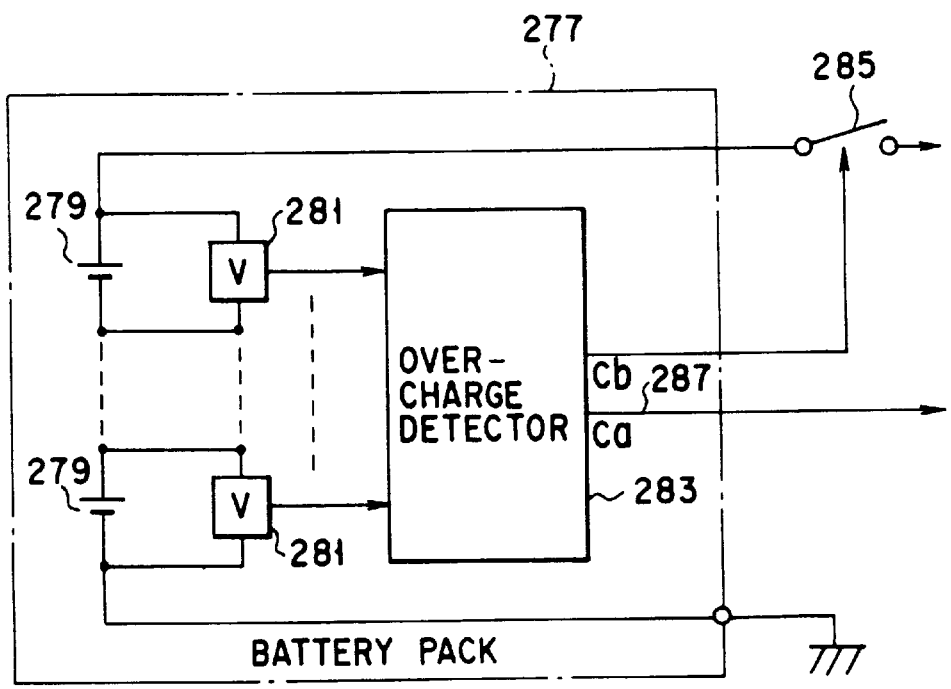
F I G. 26

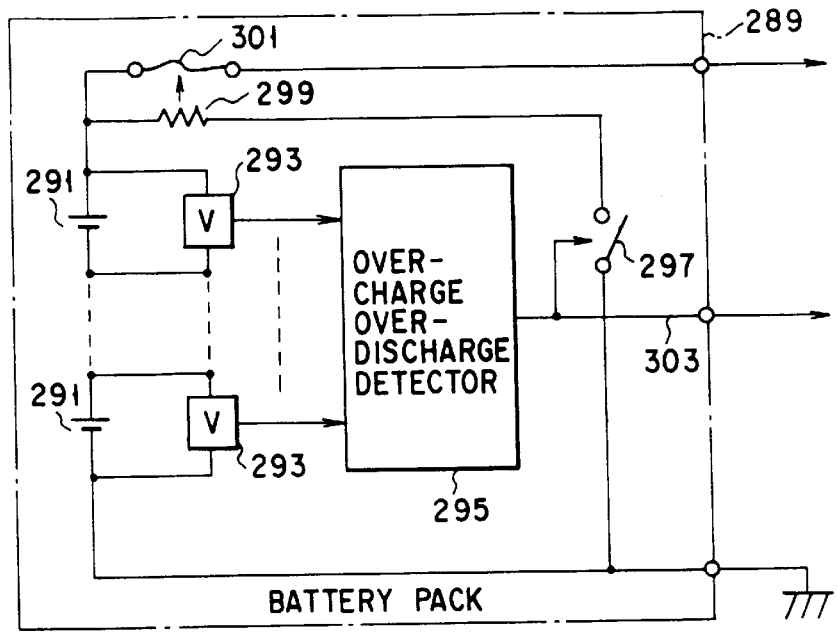
F I G. 27
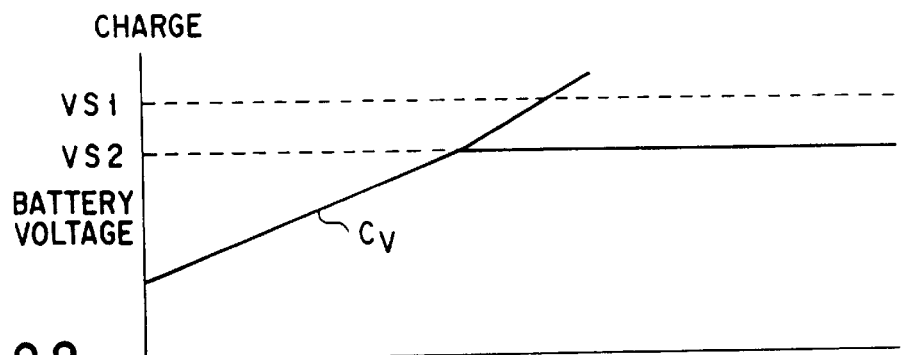
F I G. 28
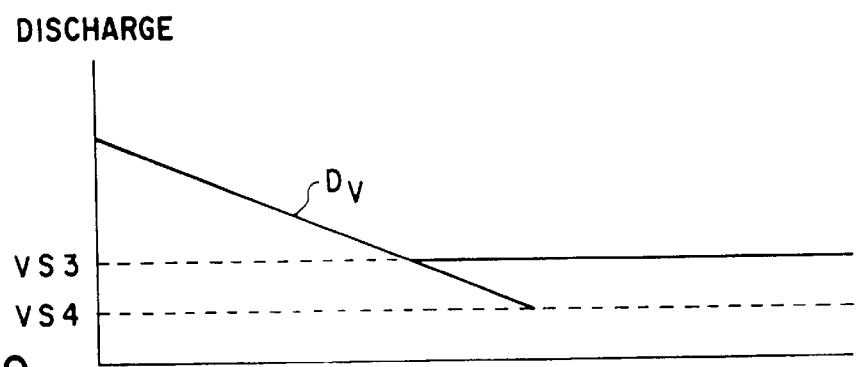
F I G. 29

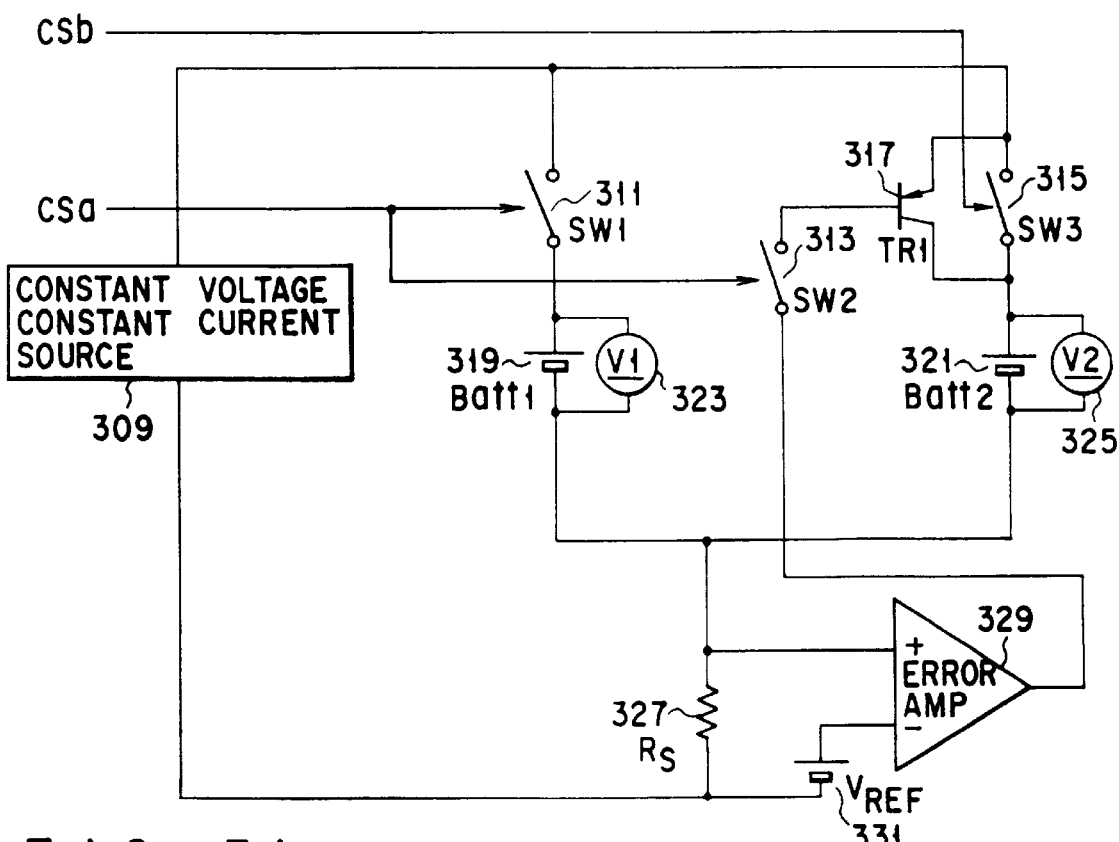
F I G. 31

| | Batt1 | Batt2 |
|---|---|---|
| (1) | START OF CHARGING | |
| (1) ~ (2) | CC | |
| (2) | CC → CV | |
| (2) ~ (3) | CV CHARGING | |
| (3) | CV CHARGING | START OF CHARGING |
| (3) ~ (4) | CV CHARGING | CHARGING BY RESIDUAL POWER |
| (4) | COMPLETION OF CHARGING | CHARGING BY RESIDUAL POWER → CC |
| (4) ~ (5) | | CC CHARGING |
| (5) | | CC → CV |
| (5) ~ (6) | | CV CHARGING |
| (6) | | COMPLETION OF CHARGING |

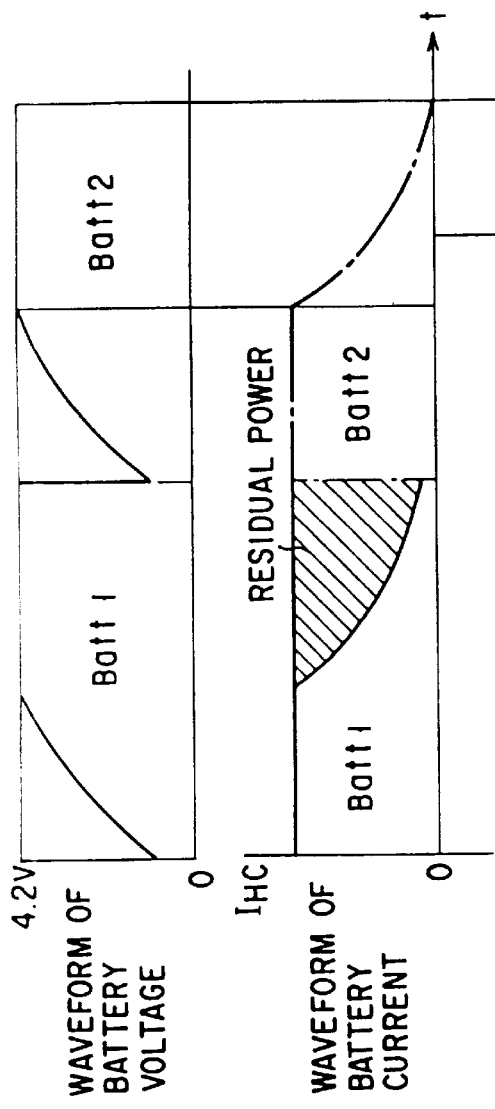
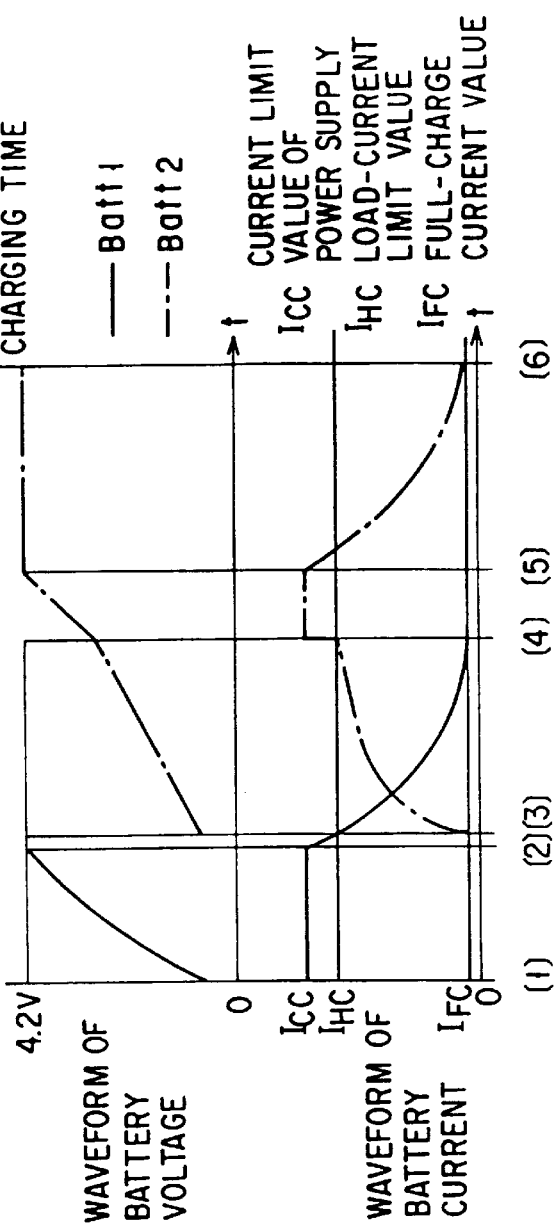
FIG. 36A (PRIOR ART)
FIG. 36B (PRIOR ART)
FIG. 37A
FIG. 37B

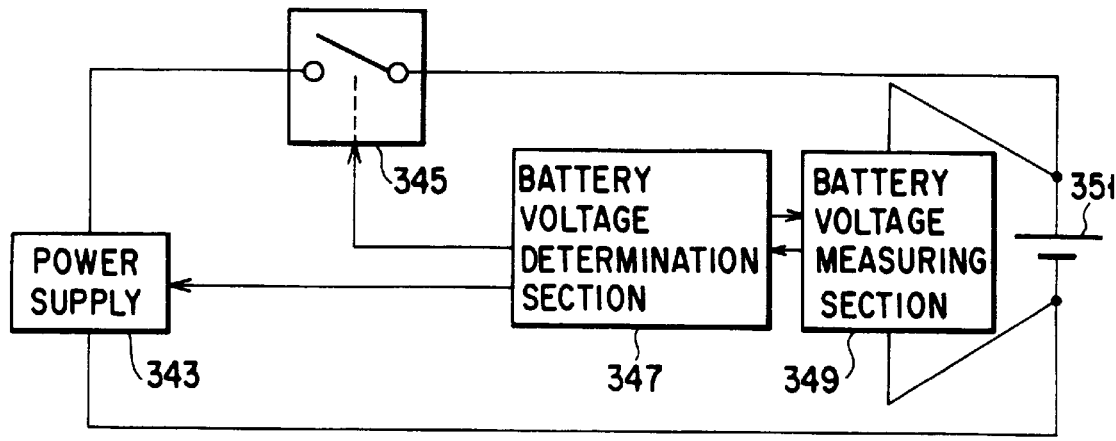
F I G. 38
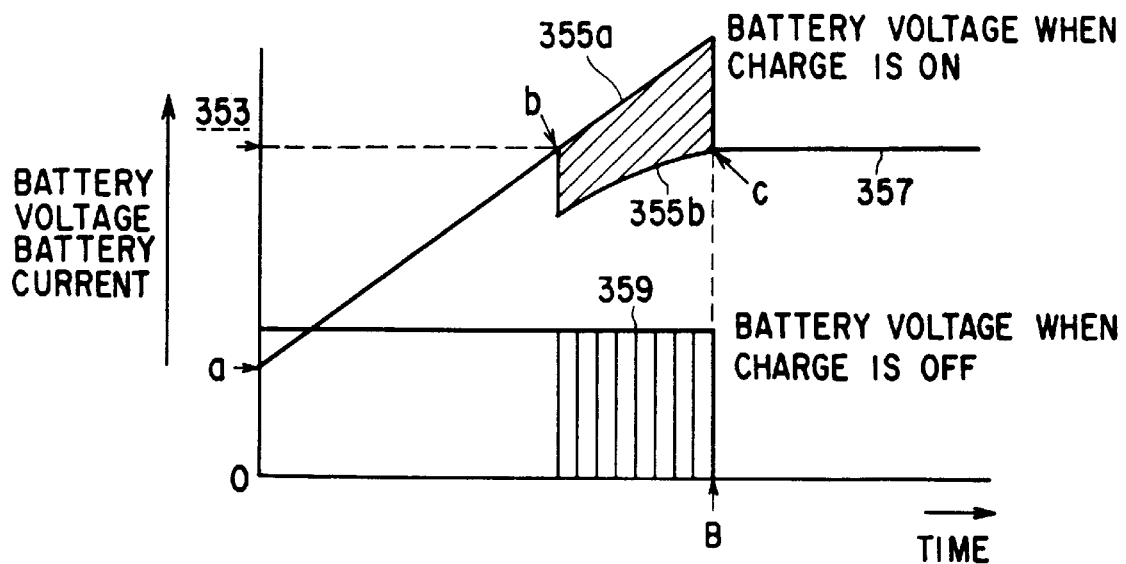
F I G. 39

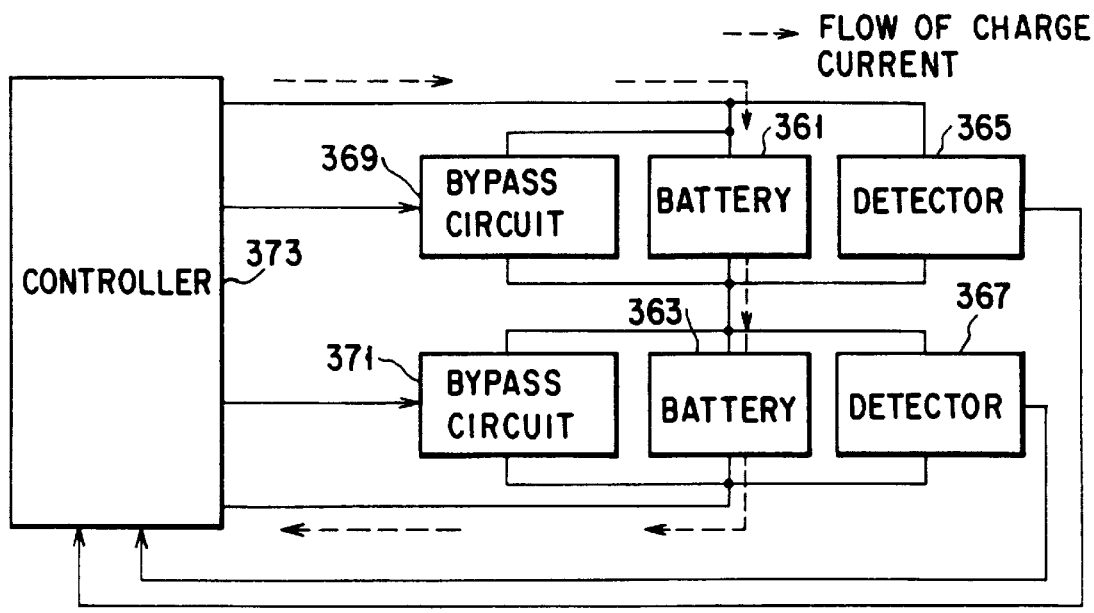
F I G. 40
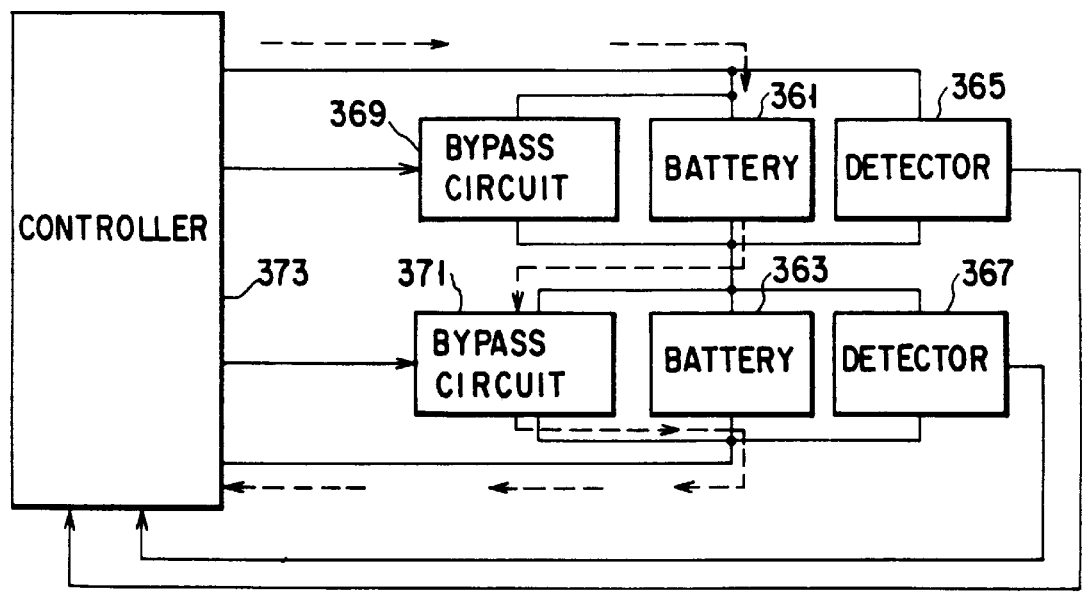
F I G. 41

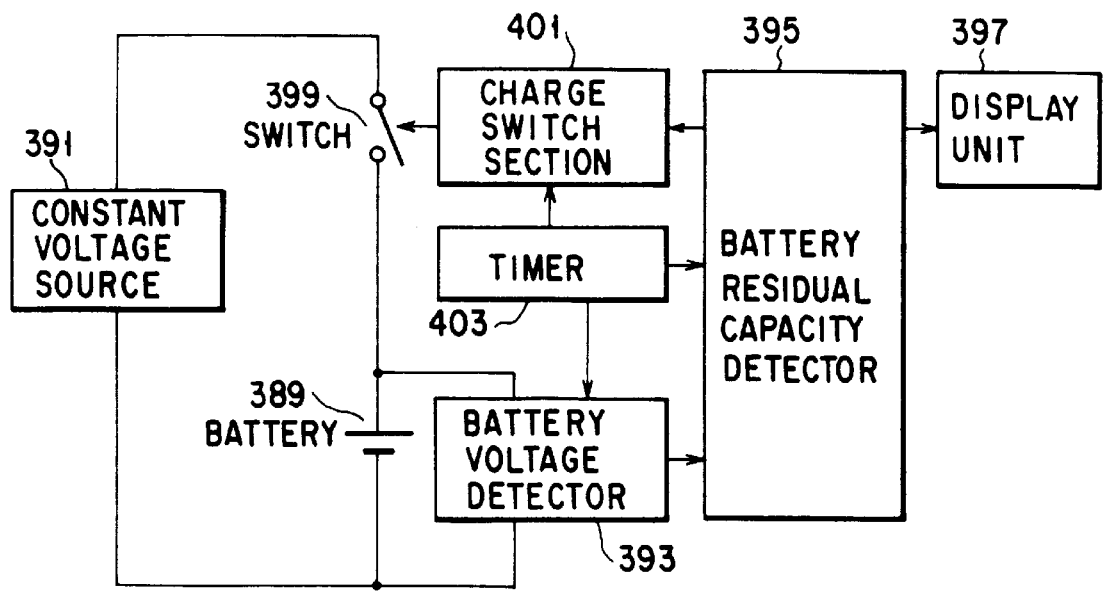
F I G. 45
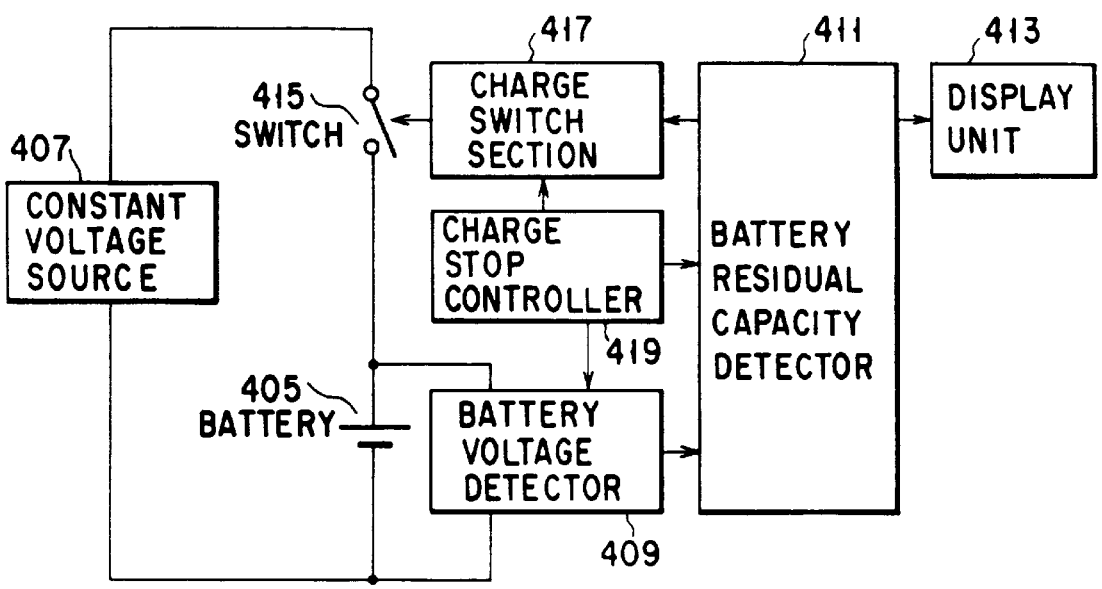
F I G. 46

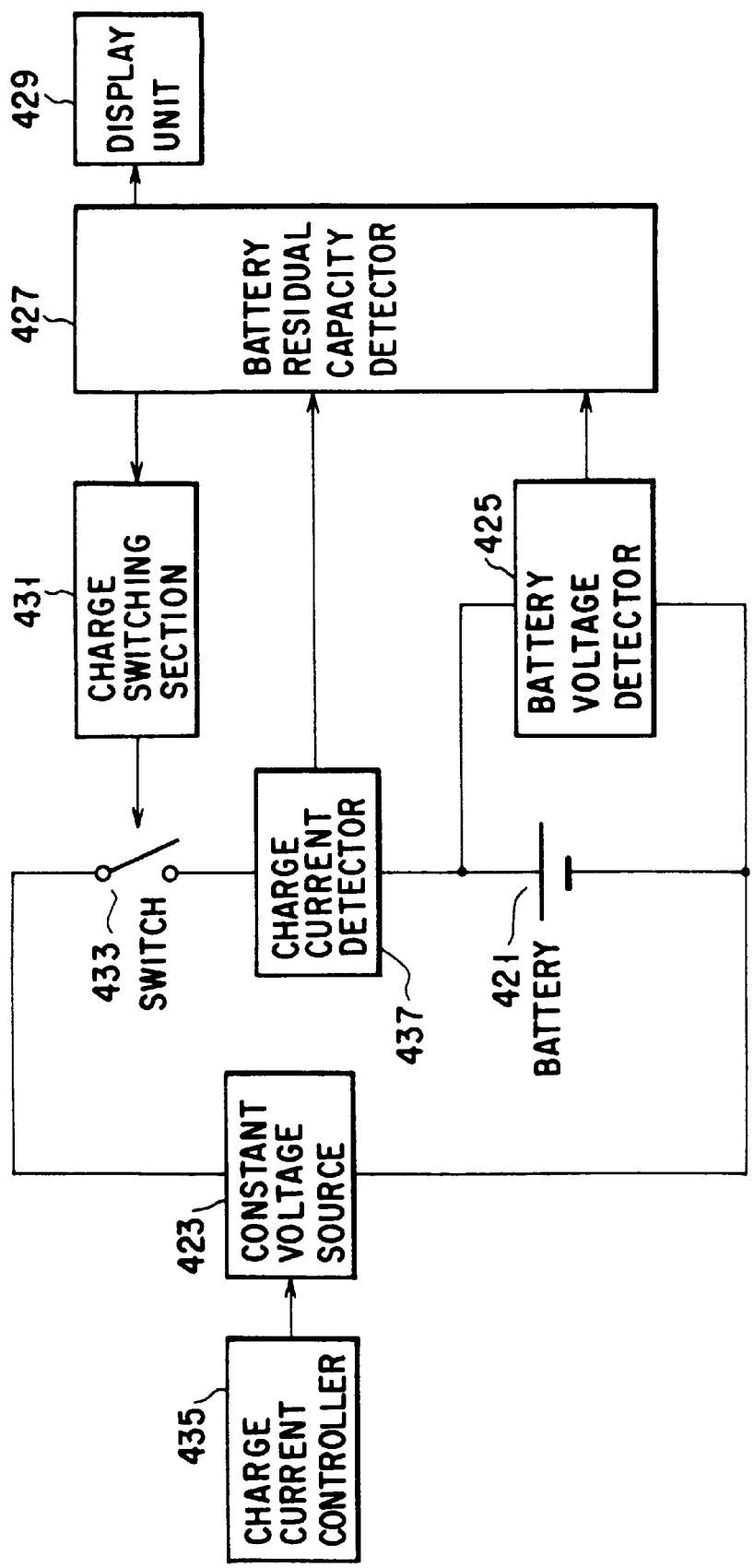
F I G. 47

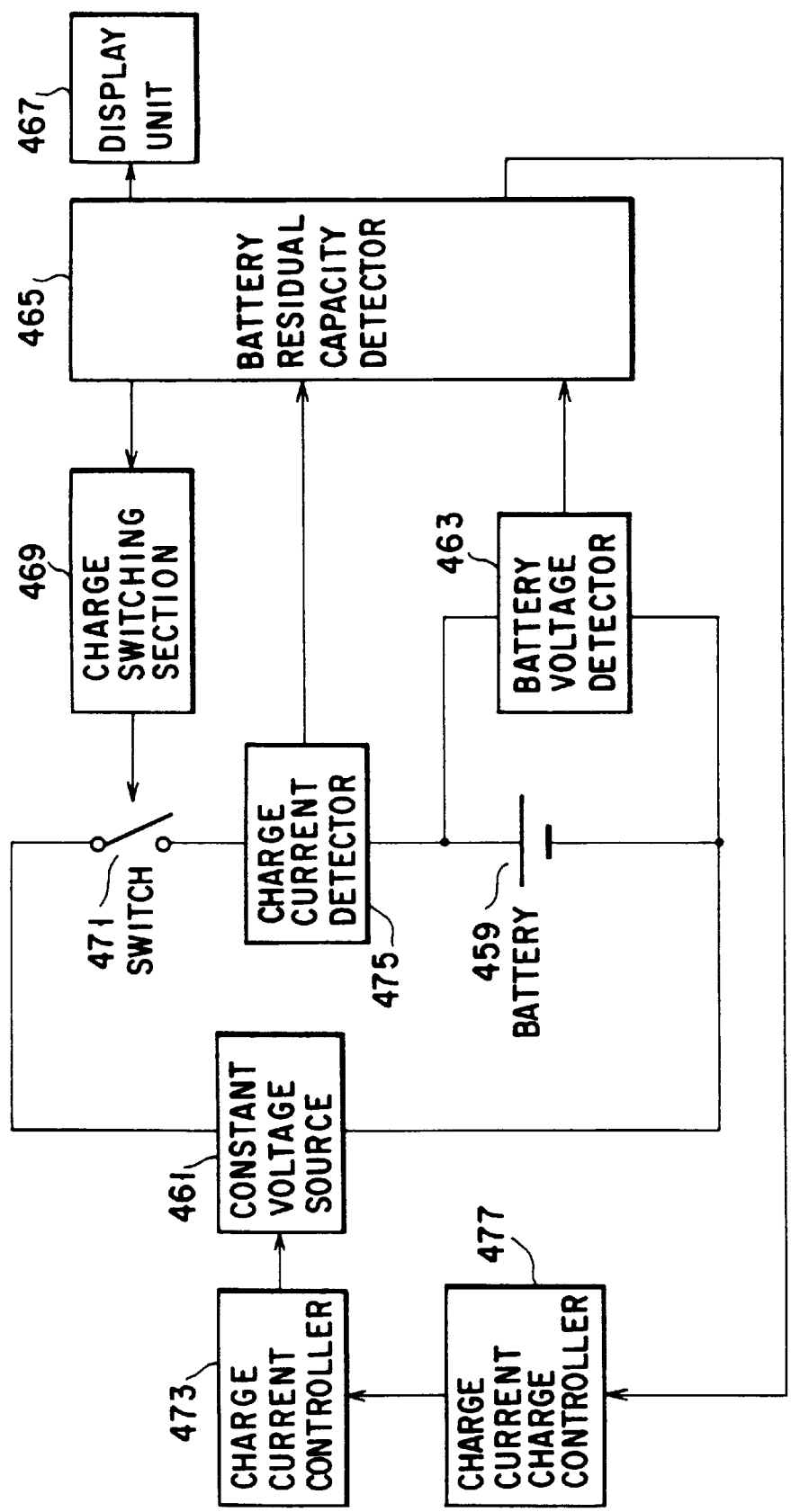
F I G. 49

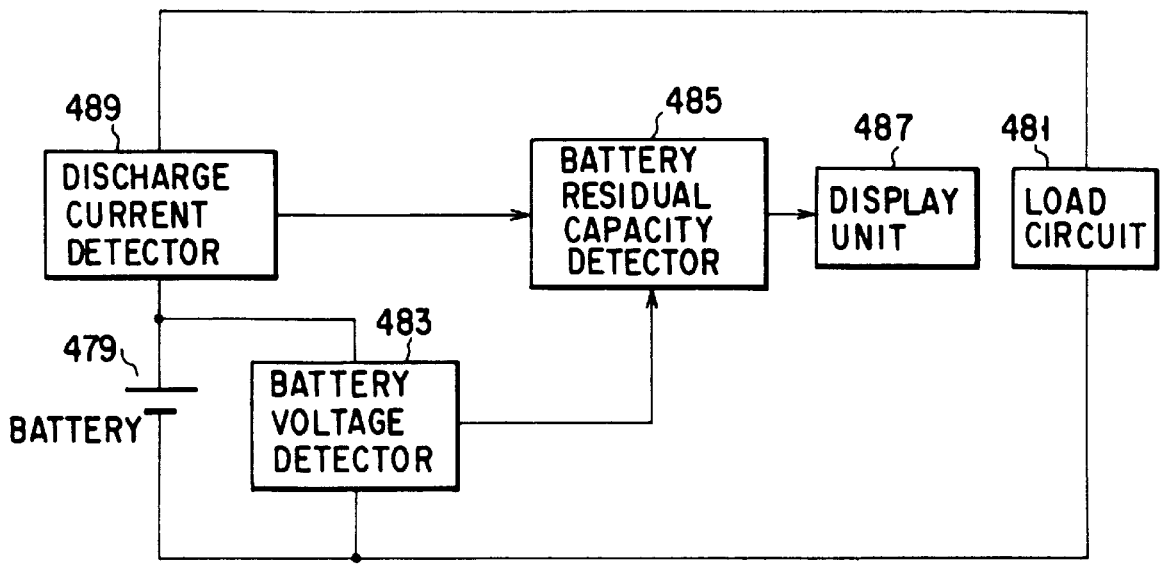
F I G. 50
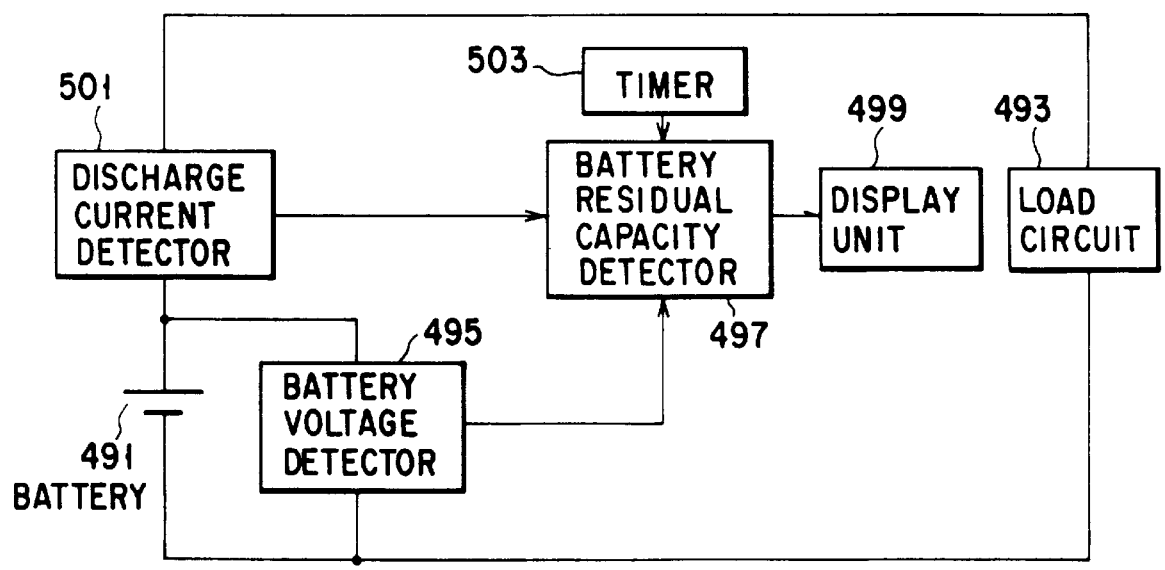
F I G. 51

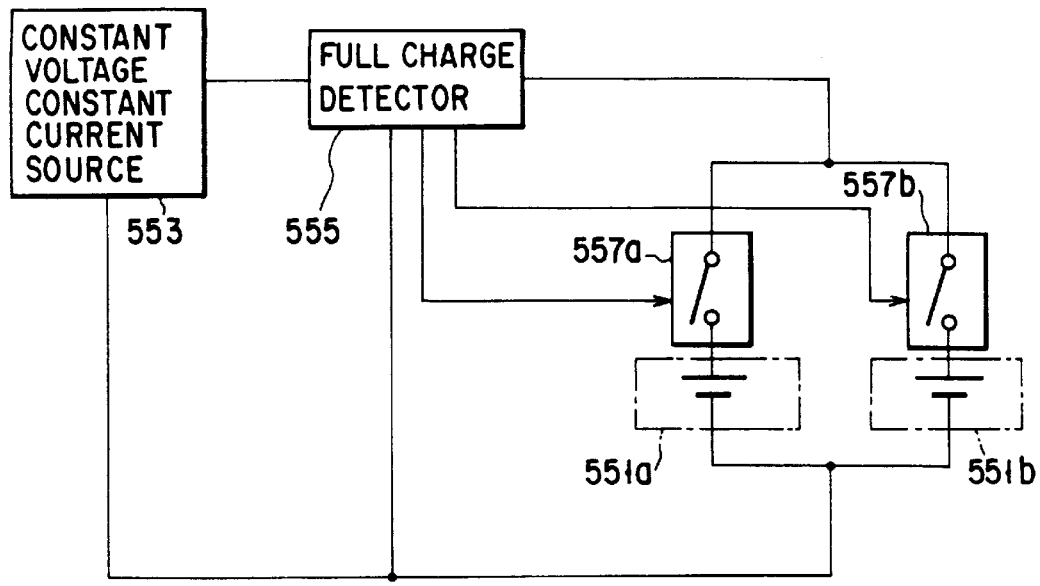
F I G. 56
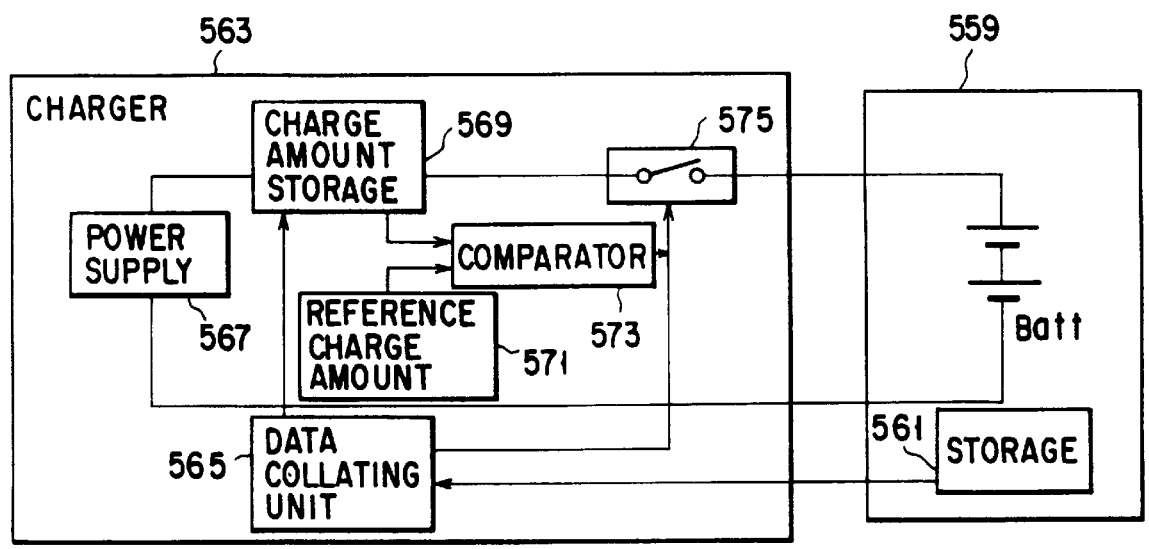
F I G. 58

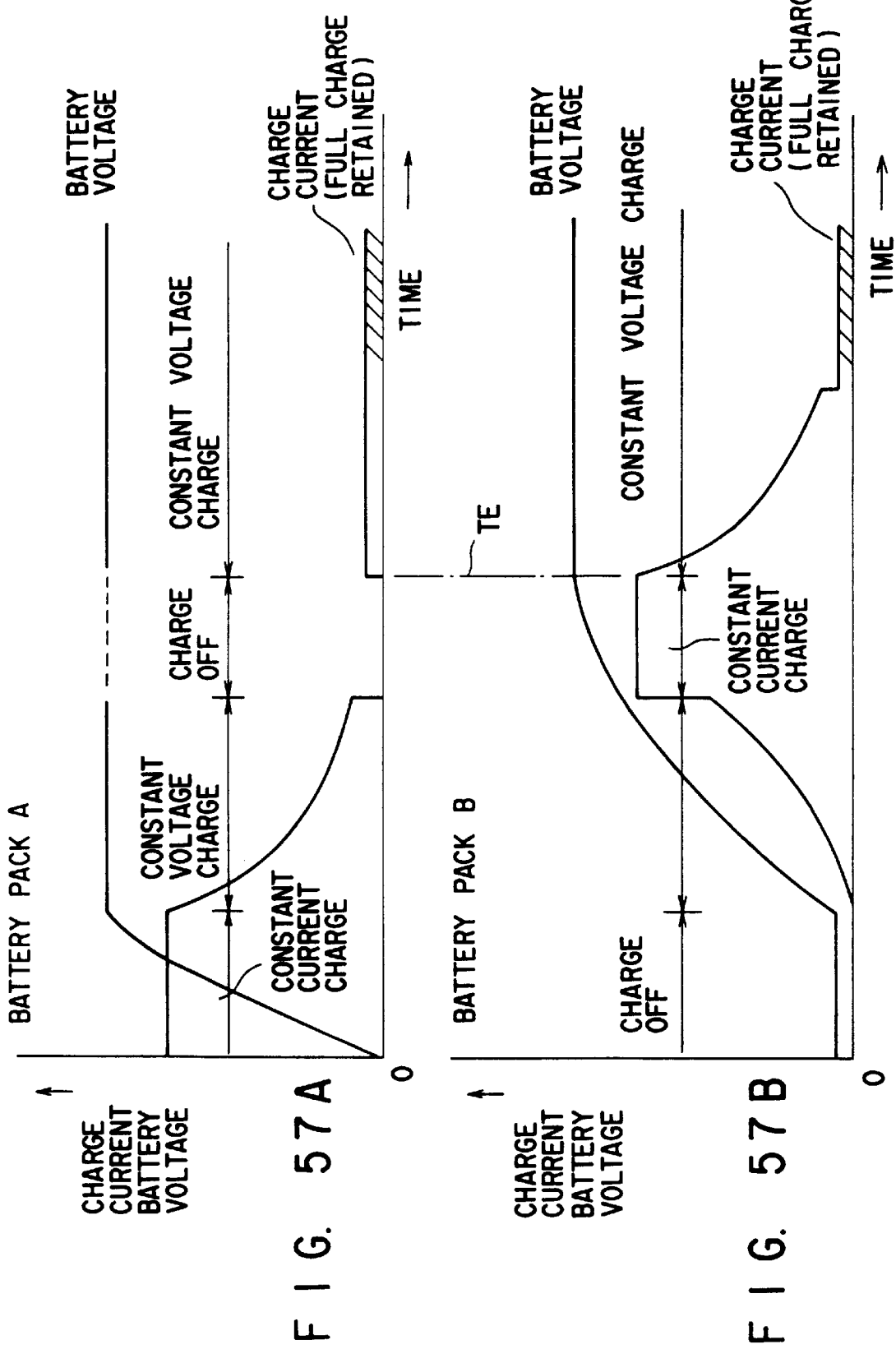
F I G. 57A
F I G. 57B

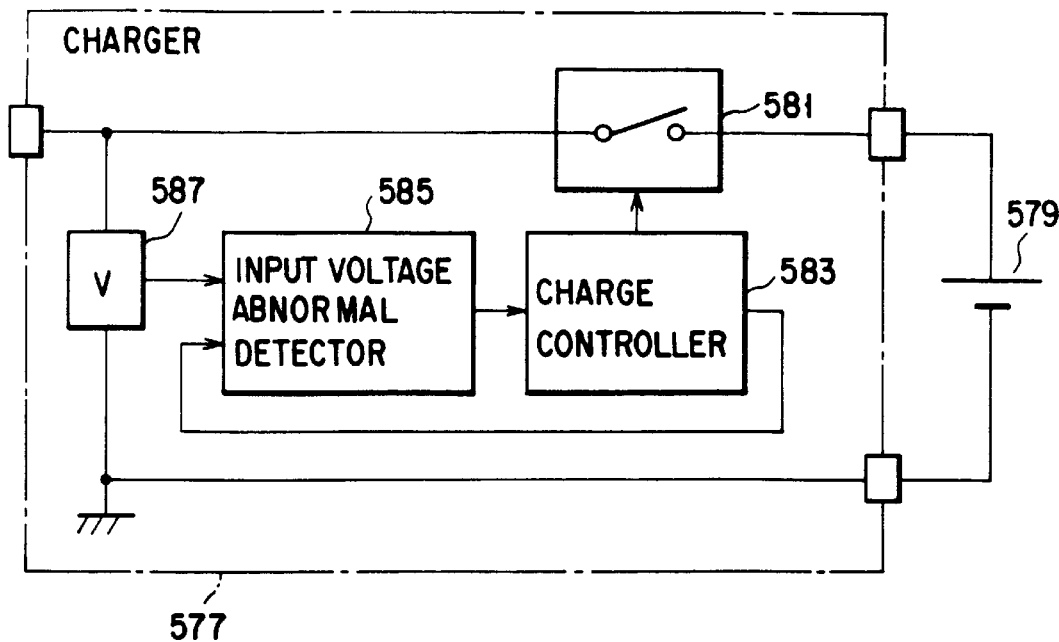
F I G. 59
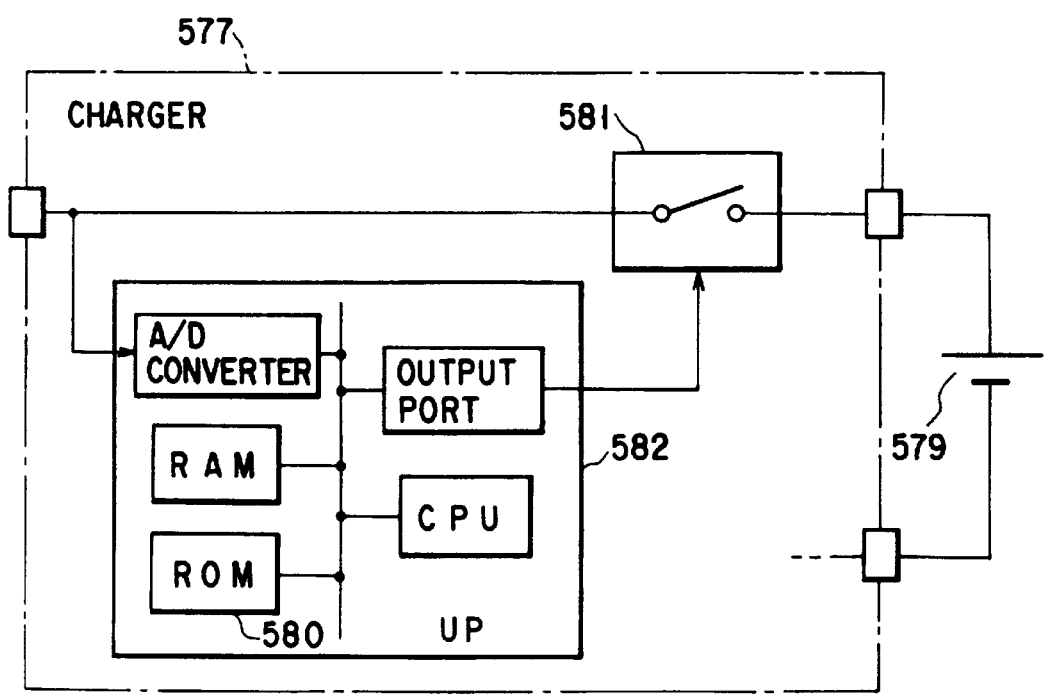
F I G. 60

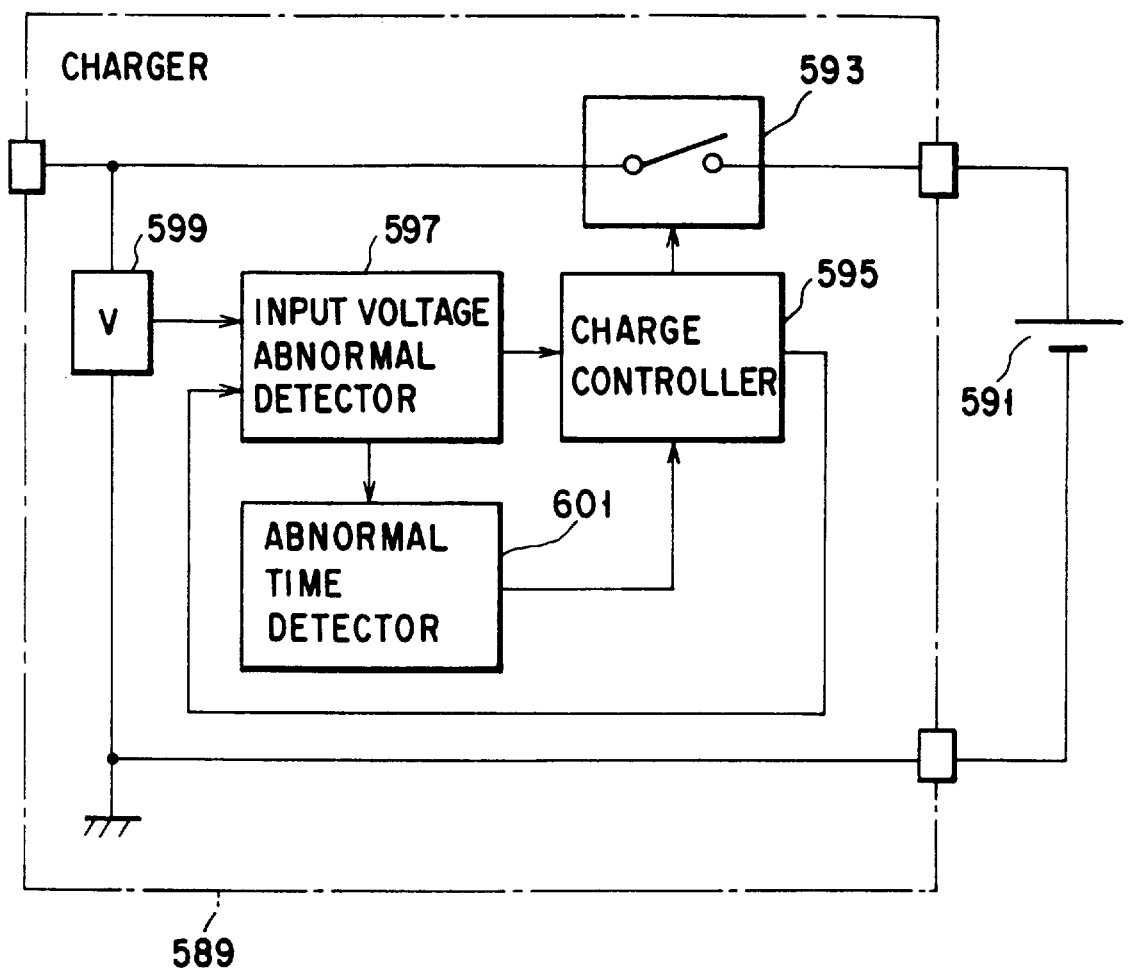
F I G. 61

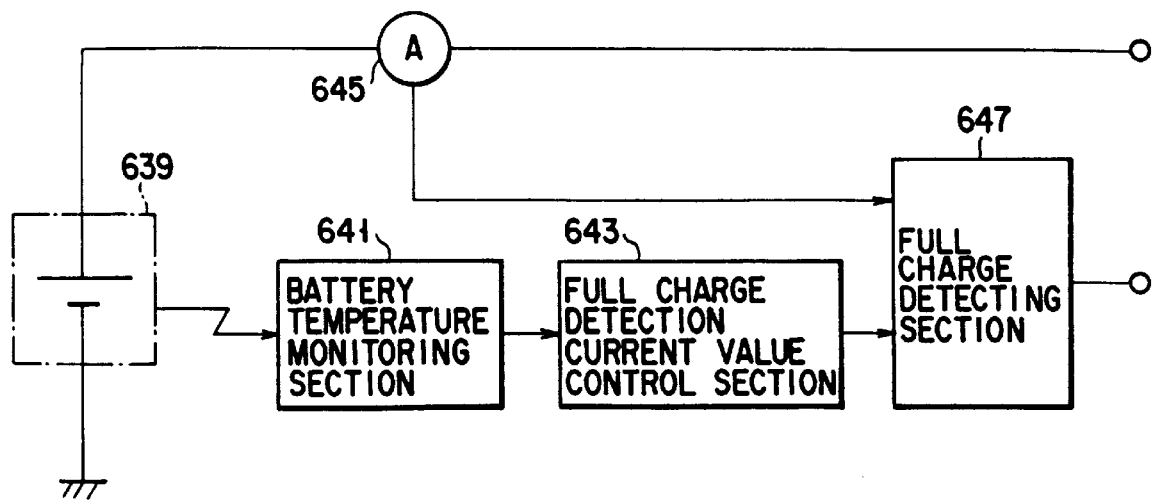
F I G. 68
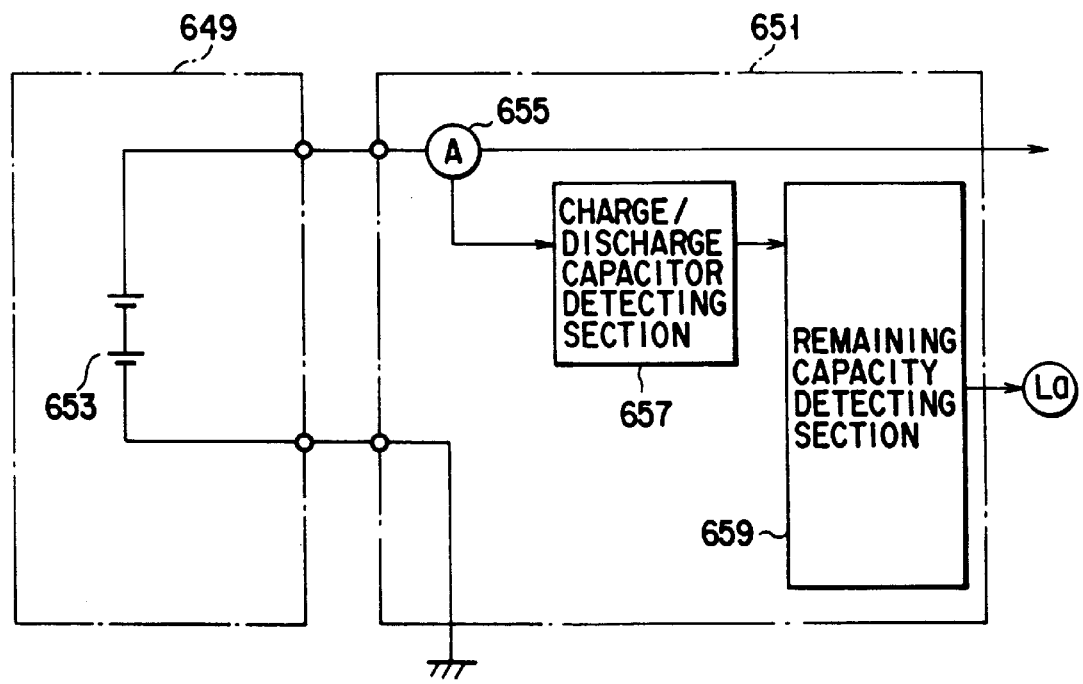
F I G. 71

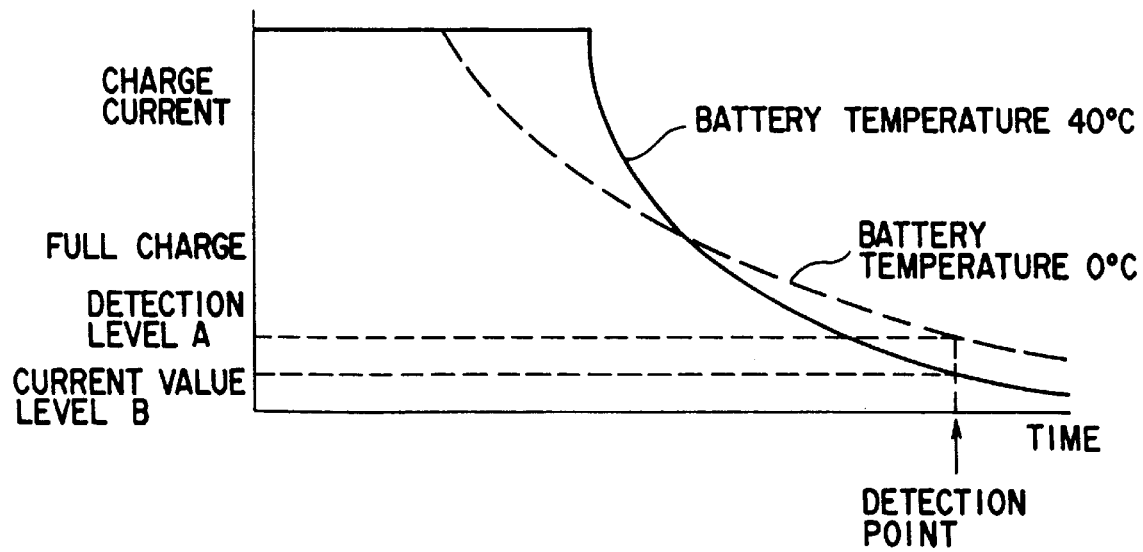
F I G. 69

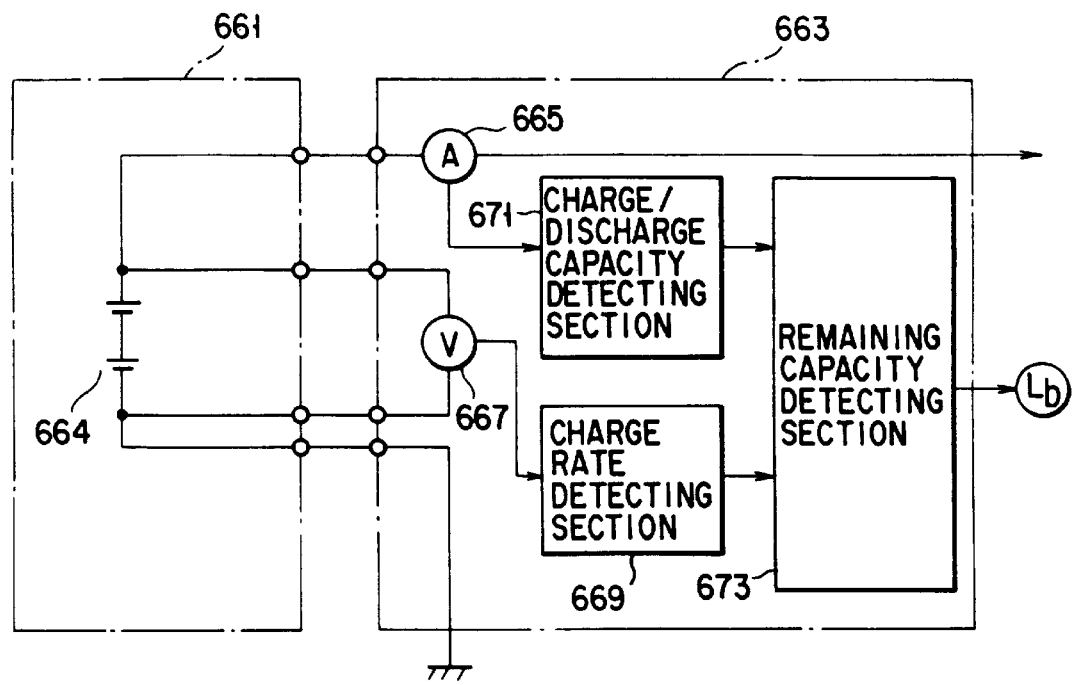
F I G. 73
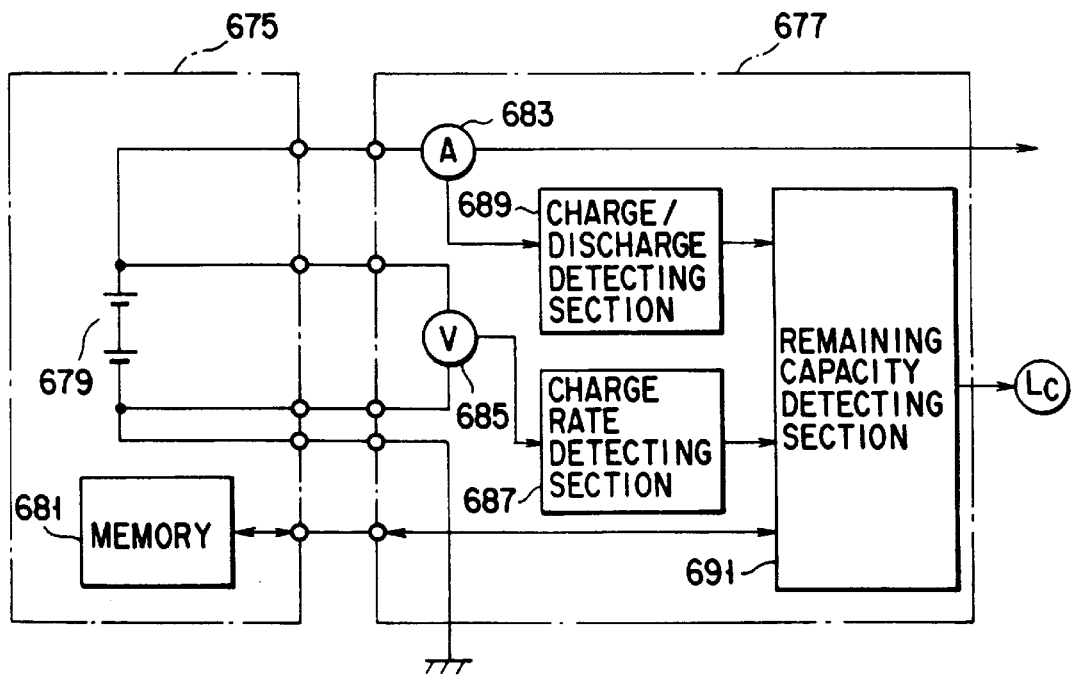
F I G. 75

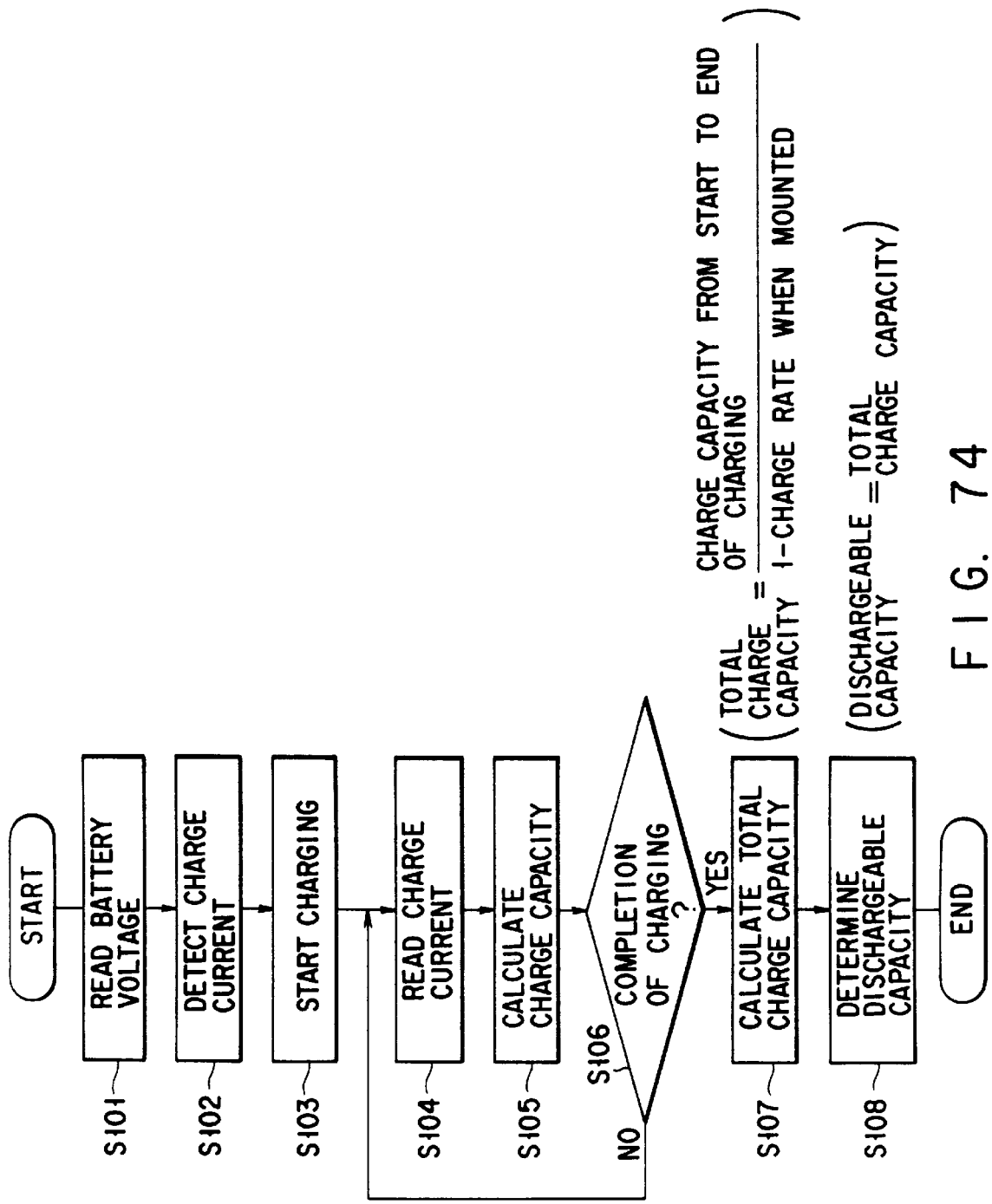
F I G. 74

BATTERY SET STRUCTURE AND CHARGE/DISCHARGE CONTROL APPARATUS FOR LITHIUM-ION BATTERY

This is a division of application Ser. No. 09/009,422 filed Jan. 20, 1998, now U.S. Pat. No. 5,903,131, which is a division of Ser. No. 08/853,415, filed May 9, 1997, now U.S. Pat. No. 5,825,155, which is a continuation of application Ser. No. 08/286,193 filed Aug. 8, 1994, now abandoned.

BACKGROUND OF THE INVENTION

1. Field of the Invention

The present invention relates to a battery pack used as a main power supply for a portable computer and a charge/discharge control apparatus therefor.

2. Related Art

A plurality of series-connected nickel-cadmium (Ni—Cd) or nickel-hydrogen (Ni—MH) secondary battery cells are generally used as a conventional main power supply battery for the functions of the above portable computer, a load increases, and user demand has arisen for prolonging a battery drive time. For these reasons, demand has increasingly arisen for a secondary battery having a larger capacity.

Under the above circumstances, a lithium-ion secondary battery can be used as a main power supply battery.

If eight lithium-ion battery cells are connected in series with each other as in the conventional arrangement so as to meet the needs for a large capacity, thereby constituting a battery pack, the following problem is posed. The upper limit of a terminal voltage of a cell itself of the lithium-ion battery is about 4.2 V, while its lower limit is about 2.7 V. The upper limit of the voltage range of the eight series-connected lithium-ion battery cells is 33.6 V, while its lower limit is 21.6 V. The voltage range is widened, and the absolute value of the voltage is increased, resulting in inconvenience. In addition, a conventional AC adapter is of 15 or 18 V, the voltage of the eight series-connected lithium-ion battery cells becomes about twice the AC adapter voltage. A circuit size becomes undesirably increased due to the circuit design of a protection circuit if the voltage exceeds 20 V. For this reason, three parallel circuits each consisting of three series-connected lithium-ion battery cells are prepared, and any one of the three series circuits is selectively used, as shown in FIG. 1. In this case, the voltage of one series circuit of the lithium-ion battery cells falls within the range of 15 V, and matching with the AC adapter can be improved. A lithium-ion battery (e.g., a lithium-ion battery of 3.6 V×1,000 mAh) has a higher internal impedance than that of the Ni—CD or Ni—MH battery. When a larger current flows through the lithium-ion battery, a battery voltage is reduced by an increase in current accordingly. A smaller current is required to extract a maximum energy stored in the battery. That is, as shown in FIG. 3, the product of time and ampere is kept unchanged in the Ni—Cd or Ni—MH battery. The energy extracted in 8-hour use at 2 A is equal to that in 2-hour use at 8 A. In the lithium-ion battery, however, as shown in FIG. 4, the energy extracted in 2-hour use at 8 A is smaller than that in 8-hour use at 2 A. For this reason, in the arrangement of series-connected lithium-ion battery cells, as shown in FIG. 1, the energy stored in the battery cells cannot be satisfactorily extracted. The lithium-ion battery tends to be exploded against overcharge. The battery voltage must be strictly monitored for each battery cell. In the arrangement shown in FIG. 1, a monitor circuit must be arranged for each lithium-ion battery cell so as to perform charge/discharge control. The circuit is complicated, and the circuit size is increased, resulting in impractical applications.

In the parallel circuit consisting of the three series circuits each having three series-connected lithium-ion battery cells, as shown in FIG. 2, when any one of the lithium-ion battery cells of each series circuit is broken due to short-circuiting or the like, the remaining two battery cells are charged with an energy of three lithium-ion battery cells, resulting in overcharge. To prevent this, a diode may be added to the above circuit. However, both a charge diode and a discharge diode must be added to each battery cell, and the circuit size is undesirably increased.

In a conventional charge circuit which can incorporate a plurality of single lithium-ion secondary battery cells, a plurality of battery sets thereof, or a plurality of battery packs using the single lithium secondary battery cells or lithium battery sets, a charge scheme shown in FIGS. 36A and 36B is employed.

More specifically, the secondary battery (Batt 1) of the first pack is charged with a constant current (constant current charge). When the battery voltage is increased and reaches a specified voltage, charge is continued with a constant voltage (constant voltage charge).

In a constant voltage charge state, the charge current is gradually decreased. A full charge state is set when the charge current becomes smaller than a specified value.

Upon detection of the full charge state of the secondary battery (Batt 1) of the first pack, the secondary battery (Batt 2) of the second pack is charged in the same manner as in the secondary battery of the first pack.

In the above conventional charge scheme, however, charge of the next battery pack is not started until the full charge state of the preceding battery pack is detected. For this reason, the total charge time of a plurality of battery packs becomes (Charge Time of Battery)×(Number of Battery Packs).

In the constant voltage charge mode, the charge current of the lithium-ion secondary battery is gradually reduced due to its battery characteristics. Along with this decrease, the current supply capacity has a sufficient margin. In the conventional scheme, however, the power corresponding to the sufficient margin cannot be used for the next charge operation, thus wasting the power.

In a conventional scheme, in charging a secondary battery required for constant voltage charge, as shown in FIG. 9, first of all, charge is started with a constant current. When a battery voltage 5 in the charge ON state is detected to reach a target value 3, and charge is switched to charge with a constant voltage at a point A. A charge current 7 is then gradually reduced. Charge with a constant voltage continues until a voltage 1 of the battery itself becomes the same potential as that of the target value 3 and a charge current does not flow (i.e., until the state reaches a full charge state).

As described above, when the battery voltage in the charge ON state reaches the target value 3, charge with a constant current is switched to charge with a constant voltage. At this time, the charge state is not yet the full charge state because the battery voltage includes a voltage drop caused by an internal resistance and the like. A long period of time is required until the full charge state is obtained after charge is switched to charge with a constant voltage.

In a conventional battery set obtained by series-connecting lithium-ion secondary battery cells, variations in secondary voltages during charge is corrected as follows.

More specifically, when a battery set obtained by series-connecting two secondary battery cells is taken as an example, the half of the battery set voltage is input to an amplifier, and an output from the amplifier is supplied to a connection point between the series-connected secondary battery cells, thereby setting the output voltage of the amplifier to ½ the total voltage of the battery set. The output from the amplifier is connected to the connection point of the secondary battery cells through a current limit resistor. Therefore, a correction current flows due to a potential difference and resistance between the output voltage of the amplifier and that of the connection point between the secondary battery cells.

The following problem is posed in a battery voltage measuring means having the above conventional arrangement. When the battery voltage of each secondary battery cell in the battery set is measured outside the battery set, a value including a voltage drop caused by the internal current limit resistance in the battery set is measured, and an accurate battery voltage cannot be measured.

SUMMARY OF THE INVENTION

It is an object of the present invention to provide a battery pack capable of sufficiently extracting an energy stored in a battery.

It is another object of the present invention to provide a charge circuit capable of shortening a total charge time of a plurality of battery packs and effectively utilizing an extra power upon temporarily performing parallel charge of the plurality of battery packs.

It is still another object of the present invention to provide an apparatus capable of rapidly charging a secondary battery.

It is still another object of the present invention to provide a battery set voltage measuring apparatus capable of accurately measuring the voltage of each secondary battery cell and preventing overcharge and overdischarge in a circuit for correcting a difference between the voltages of secondary battery cells constituting a battery set.

It is still another object of the present invention to provide a charge control apparatus capable of appropriately and safely performing charge control of each of series-connected secondary battery cells in battery set charge control using secondary battery cells requiring constant voltage charge.

It is still another object of the present invention to provide a remaining battery capacity detecting system capable of accurately detecting a battery residual capacity even in charge or discharge by utilizing secondary battery characteristics representing that an open battery voltage is almost proportional to the battery residual capacity of the battery.

It is still another object of the present invention to provide a portable electronic equipment detachably incorporating a battery pack having secondary battery cells therein and using this battery pack as an operating power supply during battery driving, wherein the residual capacity and operation time of a battery pack can be instantaneously detected when the battery pack is mounted in an equipment main body.

It is still another object of the present invention to provide a secondary battery charge control apparatus capable of accurately detecting a full charge state of a secondary battery which is to be charged with a constant voltage and a constant current.

It is still another object of the present invention to provide a battery pack incorporating a secondary battery requiring overdischarge protection, wherein the overdischarge state of the secondary battery can be instantaneously and externally output.

It is still another object of the present invention to provide a secondary battery charge control apparatus having a function of monitoring an apparatus state when an abnormality of a secondary battery charge apparatus is detected and starting charging again when a normal state is restored.

In order to achieve the above objects of the present invention, there is provided a battery pack comprising:

means constituting a battery set obtained by connecting n (n is a positive integer of two or more) rechargeable battery cells in parallel; and means constituting a power supply obtained by connecting m (m is a positive integer of two or more) battery sets in series each constituted by the battery set.

According to the present invention, n (n=2 through 4) lithium-ion secondary battery cells are connected in parallel to each other to constitute a battery set, and m (m=3 through 4) battery sets each constituted by the above battery set are connected in series with each other to constitute a battery pack. With this arrangement, even if any one of the battery cells is broken, the battery pack is overcharged with an energy for one battery set. The energy loss can be greatly reduced as compared with a conventional arrangement in which the battery pack is overcharged with an energy for the three battery sets. In addition, a voltage monitor circuit is arranged only for each battery set, thereby preventing an increase in circuit size.

BRIEF DESCRIPTION OF THE DRAWINGS

FIG. 1 is a circuit diagram in which three parallel circuits each consisting of three series-connected lithium-ion battery cells are prepared and any one of the three parallel circuits is selectively used;

FIG. 2 is a circuit diagram in which three series circuits each consisting of three series-connected lithium-ion battery cells are connected in parallel to each other;

FIG. 3 is a chart showing a relationship between time and a current in an NiCd or NiMH battery;

FIG. 4 is a chart showing a relationship between time and a current in a lithium-ion battery;

FIG. 5 is a perspective view showing a portable computer in which a battery pack according to the present invention is mounted;

FIG. 8 is a circuit diagram showing the detailed arrangement of a voltage monitor circuit and a charge circuit shown in FIG. 6;

FIG. 11 is a circuit diagram showing an arrangement according to the third embodiment (1) of the present invention;

FIGS. 12A through 12D are circuit diagrams showing an arrangement according to the third embodiment (2) of the present invention;

FIG. 19 is a block diagram showing an arrangement according to the eighth embodiment of the present invention;

FIG. 20 is a block diagram showing an arrangement according to the ninth embodiment of the present invention;

FIG. 21 is a block diagram showing an arrangement according to the tenth embodiment of the present invention;

FIG. 22 is a block diagram showing an arrangement according to the eleventh embodiment of the present invention;

FIG. 23 is a block diagram showing an arrangement according to the twelfth embodiment of the present invention;

FIG. 24 is a block diagram showing an arrangement according to the thirteenth embodiment of the present invention;

FIG. 25 is a block diagram showing an arrangement according to the fourteenth embodiment of the present invention;

FIG. 26 is a block diagram showing an arrangement according to the fifteenth embodiment of the present invention;

FIG. 27 is a block diagram showing an arrangement according to the sixteenth embodiment of the present invention;

FIG. 28 is a chart showing a relationship between a charge voltage and overcharge protection set voltages in the twelfth through sixteenth embodiments;

FIG. 29 is a chart showing a relationship between a discharge voltage and overcharge protection set voltages in the twelfth through sixteenth embodiments;

FIG. 31 is a circuit diagram showing an arrangement according to the seventeenth embodiment (1) of the present invention;

FIGS. 36A and 36B are charts for explaining a charge operation of two secondary batteries in a prior art;

FIGS. 37A and 37B are charts showing charge sequence steps of two secondary batteries in correspondence with each other in the seventeenth embodiment (1), (2), (3), or (4);

FIG. 38 is a circuit diagram showing an arrangement according to the eighteenth embodiment of the present invention;

FIG. 39 is a chart for explaining an operation according to the eighteenth embodiment;

FIGS. 40 and 41 are block diagrams showing arrangements according to the nineteenth embodiment of the present invention, in which FIG. 40 shows a charge current path at the start of charging and in a normal operation, and FIG. 41 shows a charge current path when one secondary battery reaches a specified voltage (4.2 V);

FIG. 45 is a block diagram showing an arrangement according to the twenty-first embodiment of the present invention;

FIG. 46 is a block diagram showing an arrangement according to the twenty-second embodiment of the resent invention;

FIG. 47 is a block diagram showing an arrangement according to the twenty-third embodiment of the present invention;

FIG. 49 is a block diagram showing an arrangement according to the twenty-fifth embodiment of the present invention;

FIG. 50 is a block diagram showing an arrangement according to the twenty-sixth embodiment of the present invention;

FIG. 51 is a block diagram showing an arrangement according to the twenty-seventh embodiment of the present invention;

FIG. 56 is a block diagram showing an arrangement according to the thirty-second embodiment of the present invention;

FIGS. 57A and 57B are charts for explaining an operation according to the thirty-second embodiment;

FIG. 58 is a block diagram for explaining an operation according to the thirty-third embodiment of the present invention;

FIG. 59 is a block diagram showing an arrangement according to the thirty-fourth embodiment of the present invention;

FIG. 60 is a block diagram showing a hardware arrangement for practicing the functional arrangement of the embodiment shown in FIG. 59;

FIG. 61 is a block diagram showing an arrangement according to the thirty-fifth embodiment;

FIG. 68 is a block diagram showing an arrangement according to the thirty-eighth embodiment of the present invention;

FIG. 69 is a chart showing charge characteristics in the thirty-eighth embodiment;

FIG. 71 is a block diagram showing an arrangement according to the thirty-ninth embodiment;

FIG. 73 is a block diagram showing an arrangement according to the fortieth embodiment;

FIG. 74 is a flow chart showing an operation according to the fortieth embodiment;

FIG. 75 is a block diagram showing an arrangement according to the forty-first embodiment of the present invention;

DETAILED DESCRIPTION OF THE PREFERRED EMBODIMENTS

First Embodiment

Figure 6:
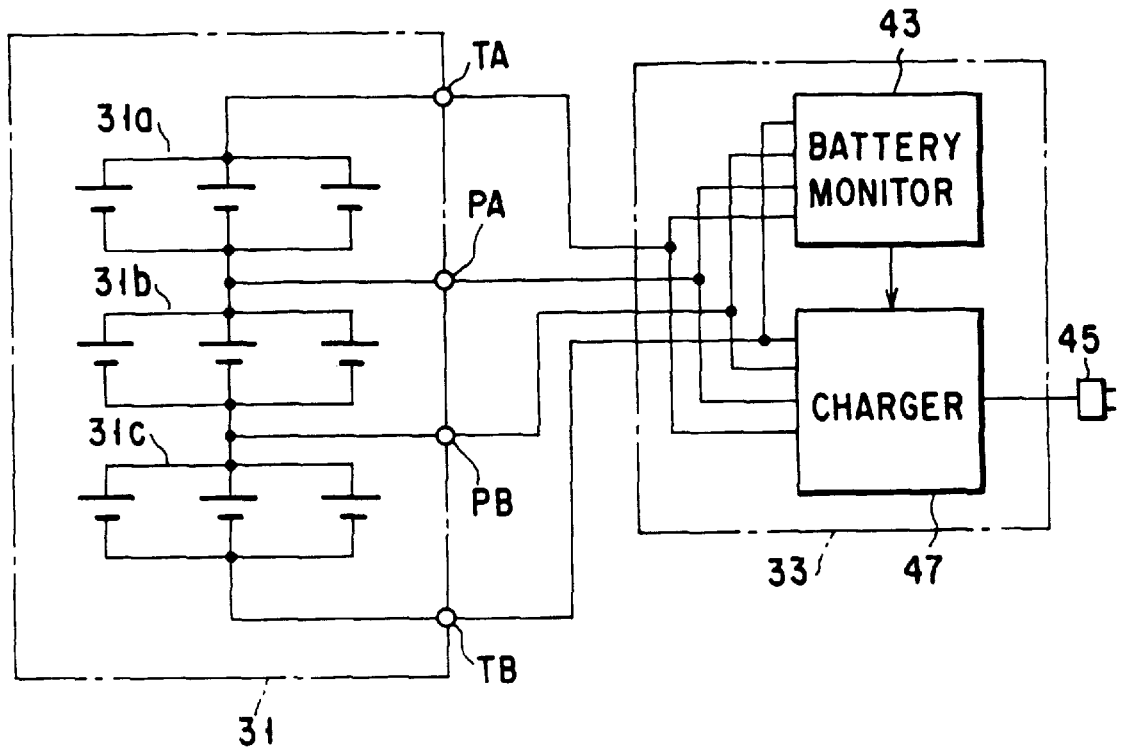
FIG. 6 is a block diagram showing the main part according to the first embodiment of the present invention.

FIG. 5 is a perspective view showing a portable computer in which a battery pack according to the present invention is mounted.

Referring to FIG. 5, reference numeral 31 denotes a battery pack incorporating lithium-ion secondary battery cells and serving as a main power supply source in a battery-driven state. The battery pack 31 is mounted in a battery pack housing section 34 through an opening 32 formed in the front wall surface portion of a computer main body. Reference numeral 33 denotes a power supply PCB (power supply Printed Circuit Board) for performing battery charge control and supplying power to a system. Reference numeral 35 denotes a system PCB on which chips such as CPU, RAM, and ROM chips are mounted. The system PCB controls the system. Reference numeral 37 denotes a display unit (flat panel display) for displaying processing results and the like. Reference numeral 39 denotes a keyboard used for inputting data and commands.

FIG. 6 is a block diagram showing the arrangement of the main part in the first embodiment of the present invention. The same reference numerals as in FIG. 5 denote the same parts in FIG. 6.

Referring to FIG. 6, reference numeral 31 denotes a battery pack constituted by lithium-ion secondary battery cells and serving as a main power source in a battery-driven state. Reference numerals 31a, 31b, and 31c denote battery sets constituted by the lithium-ion secondary battery cells serving as the main constituents of the battery pack 31. In this case, the power supply of the battery pack 31 is constituted such that the three battery sets 31a, 31b, and 31c each consisting of three series-connected lithium-ion secondary battery cells are connected in series with each other.

Figure 7:
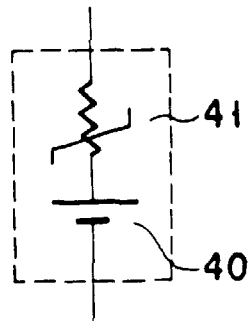
FIG. 7 is a circuit diagram showing a poly-switch incorporated in the lithium-ion battery.

Each battery cell incorporates a protector 41 called a poly-switch shown in FIG. 7 in addition to a battery portion 40. The poly-switch 41 generates heat when a current flows therethrough. The poly-switch 41 has characteristics representing that the resistance is increased when the temperature of the poly-switch 41 exceeds a predetermined value. In this manner, the cell has a structure in which the current flowing through the cell is limited or overcharge or overdischarge tends not to occur.

Reference symbols TA, TB, PA, and PB denote power supply terminals of the battery pack 31. Of these terminals, the terminals TA and TB serve as charge electrodes, and the terminals PA and PB serve as voltage monitoring electrodes. The terminal voltages at the power supply terminals TA and TB and the voltage monitoring electrodes PA and PB are input to a voltage monitor 43 in the power supply PCB (power supply Printed Circuit Board) 33 through the system PCB 35, so that the terminal voltage of the battery (the battery sets 31a, 31b, and 31c) is monitored.

Circuit elements for performing charge control of the battery pack 31 and supplying power to the system are mounted on the power supply PCB (power supply Printed Circuit Board) 33. In this case, only the battery monitor 43 and a charger 47 for charging the battery pack 31 using an external commercial AC power supply 45 as an input power supply are illustrated.

The charger 47 is mounted on the power supply PCB (power supply Printed Circuit Board) and controls to charge the battery pack 31 using the external commercial AC power supply as the input power supply. The charge monitor 43 is also mounted on the power supply PCB (power supply Printed Circuit Board) 33 and monitors the terminal voltage of the battery pack 31 and transmits the monitor result to the charger 47.

In the portable computer of the embodiment shown in FIG. 5, power (the stored power of the battery pack 31) discharged from the battery pack 31 is transformed into an appropriate voltage by the power supply PCB 33. The resultant voltage is applied to the system PCB 35. By this power, the system PCB 35 controls to display data input from, e.g., the keyboard 39 on the display unit 37.

The operation of the first embodiment of the present invention will be described with reference to FIG. 6.

Referring to FIG. 6, the battery pack 31 is arranged such that the three battery sets 31a, 31b, and 31c each consisting of three parallel-connected lithium-ion secondary battery cells are connected in series with each other.

In the discharge operation of the battery pack 31, the system is powered through the power supply terminals TA and TB. During the charge operation of the battery pack 31, the charger 47 charges the battery sets 31a, 31b, and 31c through the power supply terminals TA and TB using the external commercial AC power supply 45 as the input power supply (e.g., AC 100 V).

When the terminal voltages of the power supply terminals 31a, 31b, and 31c differ from each other due to some reason, the battery monitor 43 can detect the terminal voltages of the power supply terminals TA and TB and the voltage monitor electrodes PA and PB. The charger 47 performs independent charge control of the battery sets through the four electrodes (i.e., the power supply terminals TA and TB and the voltage monitor electrodes PA and PB) so that the terminals voltages become equal to each other in accordance with the detection contents of the battery monitor 43.

For example, when the terminal voltage of only the battery set 31a is low, a larger current is supplied to the battery set 31a through the power supply terminal TA and the voltage monitor electrode PA than that supplied to the remaining battery sets 31b and 31c, thereby equalizing the terminal voltages of the battery sets 31a, 31b, and 31c.

In the above embodiment, the three battery sets each consisting of the three parallel-connected lithium-ion secondary battery cells are connected in series with each other to constitute the battery pack 31. However, the arrangement is not limited to this. The number of cells of each battery set and the number of series-connected battery sets may be determined as, e.g., 2×3, 2×4, 3×4, or 4×3 to obtain the same discharge/charge control as in the above embodiment.

With the above arrangement, the large-capacity battery pack 31 can be arranged using the lithium-ion secondary battery cells. Even in a portable computer having a screen display function and an external memory access function and having relatively high power consumption, a long-period operation using the secondary battery can be achieved.

Figure 9:
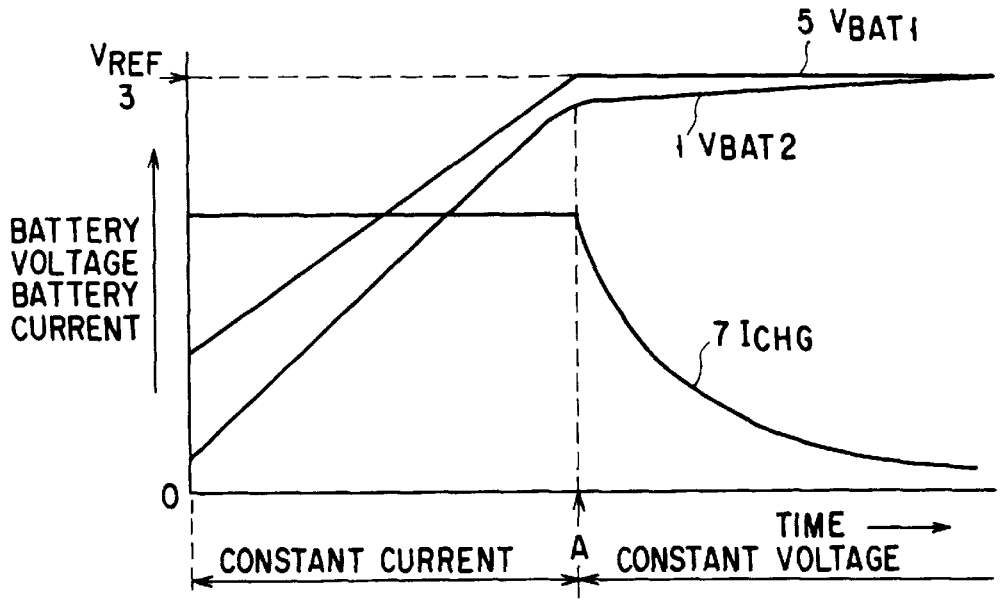
FIG. 9 is a chart showing a relationship between time and battery voltage and current in charging a secondary battery in a prior art.

FIG. 8 is a circuit diagram showing the detailed arrangement of the battery monitor and the charger shown in FIG. 6. A circuit protection diode 53 is connected to an AC adapter 51. The circuit protection diode is arranged to protect the circuit so as not to destroy the circuit upon reverse insertion of the AC adapter and application of a reverse voltage. A voltage applied from the AC adapter 51 is detected when a voltage generated through voltage division resistors 52a and 52b is applied to a power microcomputer (to be also referred to as a PS microcomputer ($\mu$-com) hereinafter) 60. A current from the AC adapter 51 is detected such that the current value is sent to the PS microcomputer 60 through a current detection resistor 56 and an amplifier 58. The circuit for detecting the current value from the AC adapter 51 is arranged due to the following reason. When rapid charge is to be performed during power-ON of the computer main body, the power used for the charge operation can be predicted, but it is impossible to predict the power because the load amount (e.g., whether a hard disk is accessed or set in a sleep state) of the computer main body is unknown. When the voltage and current values of the AC adapter 51 are detected, the specific percentage of the present power supply capacity with respect to 100% of the power supply capacity of the AC adapter 51 can be determined. A charge current for charging a battery is determined in accordance with this extra supply power of the AC adapter 51. A switch 55 is arranged to cut off the power from the AC adapter when any failure occurs in the circuit. The switch 55 is ON/OFF-controlled by the power supply microcomputer 60 arranged in the charge apparatus in the computer main body or the battery charger. In a charge operation, constant voltage control and constant current control are performed by a DC/DC converter 57. This constant current control is performed due to the following reason. When only constant voltage control is performed, a current infinitely flows until the voltage becomes constant, thereby breaking the battery and circuit. The DC/DC converter 57 performs current control of, e.g., 130 mA/step. The output stage of the DC/DC converter 57 is connected to a series dropper 59. The series dropper 59 has a function equivalent to a 3-terminal regulator and controls a voltage on the order of about 1%. The lithium-ion battery tends to be broken when it is over-charged. The series dropper 59 is arranged to accurately control a charge voltage so as to prevent overcharge. In charging a secondary battery which requires constant voltage charge, such as a lithium-ion, a constant current charge operation is started, as shown in FIG. 9. The battery voltage during the charge-ON state is detected to become equal to the target value, and the operation is switched to a constant voltage charge operation at a point A. The charge current is then gradually reduced, and the constant voltage charge operation continues until the voltage of the battery itself becomes equal to the potential of the target value and the charge current does not flow (until a full charge state is obtained). The series dropper 59 is not started until the battery voltage during the charge-ON state becomes the target value. The series dropper 59 directly transmits the output from the DC/DC converter 57. The operation of the series dropper 59 is controlled by the power supply microcomputer 60. Even if the series dropper 59 is caused to operate before the battery voltage reaches the voltage at the point A, the series dropper 59 will not be operated because the battery voltage does not reach the working voltage of the elements constituting the series dropper 59. A resistor 61 is an element for detecting the charge current and voltage supplied to the battery. The current flowing through the resistor 61 is amplified by an amplifier 63, and the amplified current is supplied to the power supply microcomputer 60 to read the charge current and the discharge current. At the same time, the amplified current is supplied to the DC/DC converter 57 to perform constant current control. In addition, the input and output voltages with respect to the battery are supplied to and determined by the power supply microcomputer 60 through voltage detection resistors 64a and 64b. An FET switch 65 is arranged to prevent overdischarge of the battery. When a lithium-ion battery is completely discharged, the battery characteristics are greatly degraded, and an energy cannot be accumulated even upon charge. For this reason, when the capacity of the battery reaches a predetermined value, the FET switch 65 is turned off to prevent discharge. This operation is performed using a control signal from a protection circuit 67 in the battery pack. The protection circuit 67 monitors the battery voltages of all series-connected stages (in this case, three stages) in the battery pack. When the protection circuit 67 detects an overdischarge voltage of any one of the above stages, the protection circuit 67 outputs the control signal for turning off the FET switch 65. In addition, the protection circuit 67 charges the battery pack with high precision. Even in an OFF state of the FET switch 65, a charge operation can be performed in the forward direction of a parasitic diode, thereby inhibiting only discharge.

An "overvoltage" signal output from the protection circuit 67 is supplied to the power supply microcomputer 60 to detect overcharge. When the overcharge is detected, the power supply microcomputer 60 turns off the D/D converter 57 and the switch 68. The protection circuit 67 turns off the switch 70.

Figure 89:
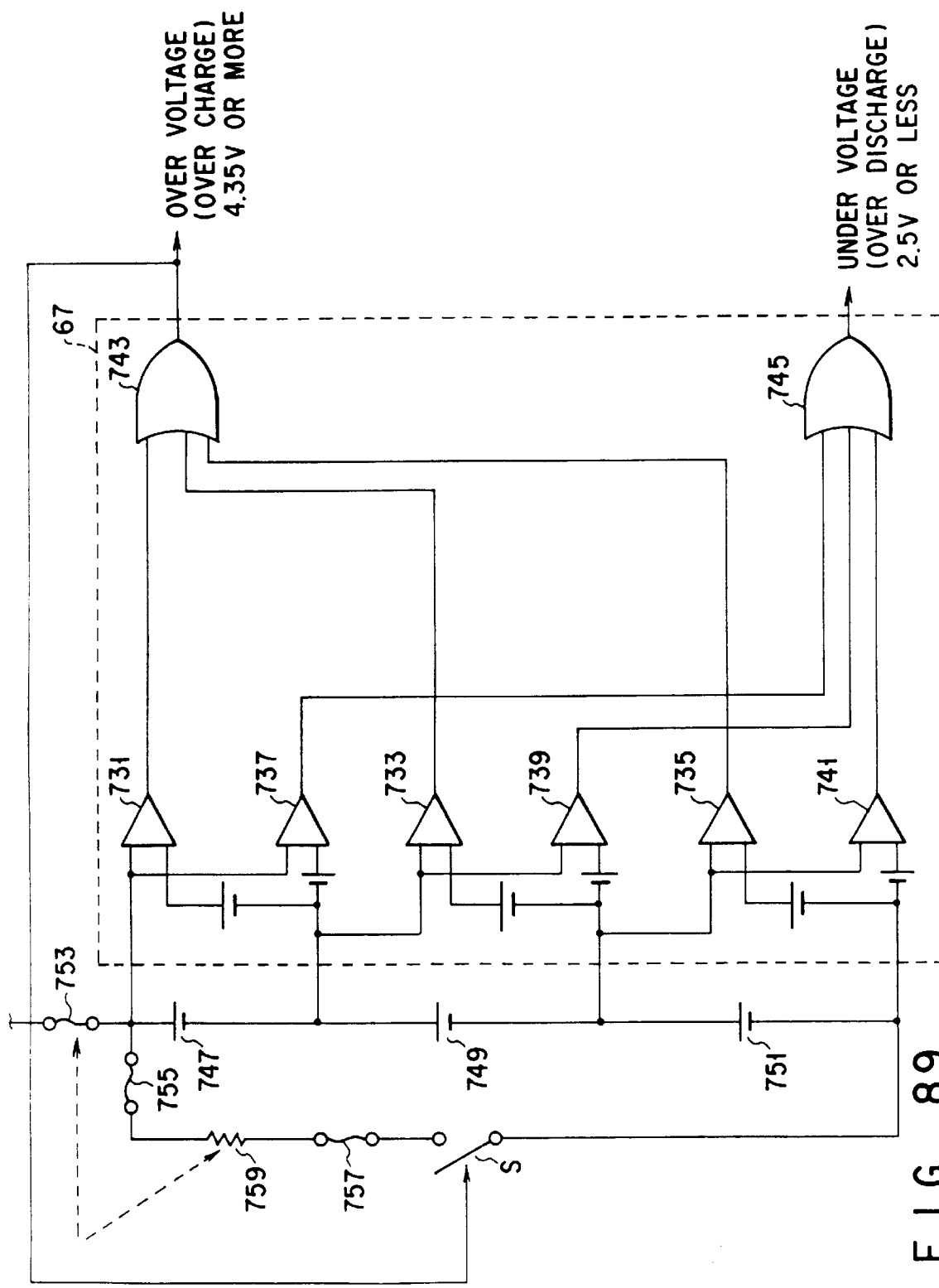
FIG. 89 is a detailed circuit diagram of a protection circuit shown in FIG. 8.

FIG. 89 is a detailed circuit diagram of overcharge/overdischarge detection.

Referring to FIG. 89, when voltage comparators 731, 733, and 735 detect overvoltages (e.g., 4.35 V or more) of the battery sets, they output signals of active "1" to an OR gate 743. When voltage comparators 737, 739, and 741 detect undervoltages (overdischarge) (e.g., 2.5 V or less), they output signals of active "1" to an OR gate 745.

Referring to FIG. 89, a resistor 759 and a temperature fuse 753 are in mechanical contact with each other. When an overvoltage is generated, a switch S is set in an ON state in accordance with an overvoltage signal to increase the temperature of the resistor, thereby fusing the temperature fuse.

Second Embodiment

This embodiment is designed to improve voltage measurement precision of each secondary battery cell in a circuit for correcting a voltage difference between the secondary battery cells constituting each battery set, thereby properly preventing overcharge and overdischarge.

Figure 10:
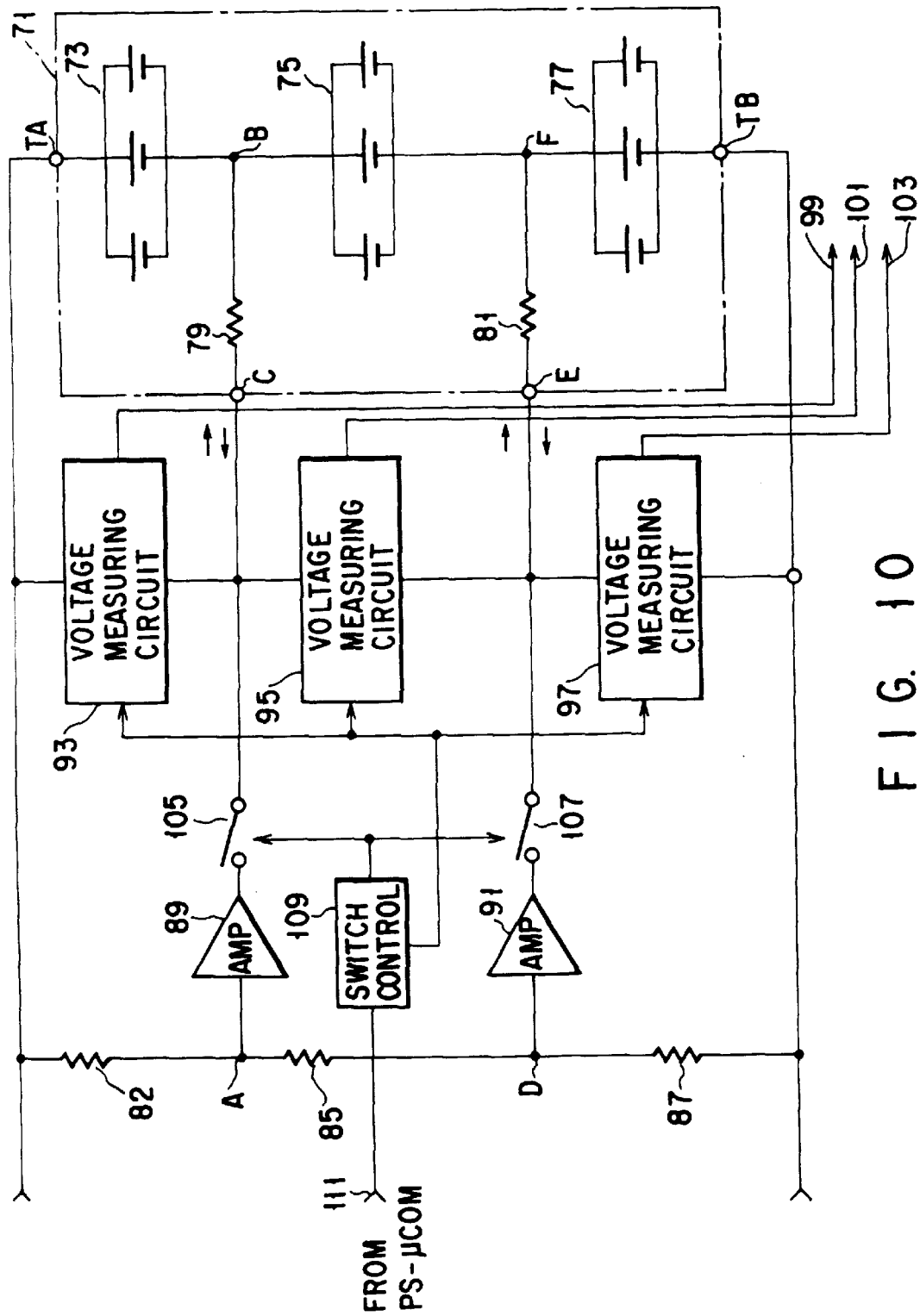
FIG. 10 is a circuit diagram showing an arrangement according to the second embodiment of the resent invention.

Referring to FIG. 10, a battery set 71 comprises secondary battery cells 73, 75, and 77, current limit resistors 79 and 81, charge/discharge terminals C and E, and power supply terminals TA and TB. The current limit element 79 is a fixed resistor arranged between the charge/discharge terminal C and a connection point B between the two series-connected secondary battery cells 73 and 75. This resistor limits the charge/discharge currents of the secondary battery cells 73 and 75. Similarly, the current limit element 81 is a fixed resistor arranged between the charge/discharge terminal E and a connection point F between the two series-connected secondary battery cells 75 and 77. This resistor limits the charge/discharge currents of the secondary battery cells 75 and 77. An external charge power for the entire battery set is supplied to the power supply terminals TA and TB of the battery set 71.

A voltage at a point A between voltage division resistors 82 and 85 has a voltage value $2/3$ times the sum of the voltage values of the battery cells 73, 75, and 77. Similarly, a voltage at a connection point D between the voltage division resistor 85 and a voltage division resistor 87 has a voltage value $1/3$ times the sum of the voltage values of the battery cells 73, 75, and 77. An amplifier 89 is an amplifier having a gain of 1 to amplify the voltage at the connection point A. Similarly, an amplifier 91 is an amplifier having a gain of 1 to amplify the voltage at the connection point D. These amplifiers 89 and 91 are arranged to reduce an input impedance.

A voltage measuring circuit 93 is connected between the power supply terminal TA and the charge/discharge terminal C, measures the voltage of the secondary battery cell 73, and externally outputs the measurement result as a voltage signal 99. Similarly, a voltage measuring circuit 95 is connected between the charge/discharge terminals C and E, measures the voltage of the secondary battery cell 75, and externally outputs the measurement result as a voltage signal 101. A voltage measuring circuit 97 is connected between the charge/discharge terminal E and the power supply terminal TB, measures the voltage of the secondary battery cell 77, and externally outputs the measurement result as a voltage signal 103. A switch 105 is connected between the amplifier 89 and the resistor 79 to electrically connect or disconnect the amplifier 89 to or from the resistor 79. Similarly, a switch 107 is connected between the amplifier 91 and the resistor 81 to electrically connect or disconnect the amplifier 91 to or from the resistor 81.

A switch control 109 turns off the switches 105 and 107 in response to a voltage check signal 111 from the power supply microcomputer 60 when the voltage measuring circuits 93, 95, and 97 respectively measure the voltages of the secondary battery cells 73, 75, and 77. In addition, after the switch control 109 turns off the switches 105 and 107, the switch control 109 outputs signals to the voltage measuring circuits 93, 95, and 97 so as to allow their voltage measurements when a predetermined period of time has elapsed.

The operation of the second embodiment arranged as described above will be described below.

A voltage $2/3$ times the sum of the voltages of the secondary battery cells 73, 75, and 77 is generated at the connection point A of the resistors 82 and 85. A voltage $1/3$ times the sum of the voltages of the secondary battery cells 73, 75, and 77 is generated at the connection point D of the resistors 85 and 87. The voltages at the connection points A and D are input to the amplifiers 89 and 91, respectively. An output from the amplifier 89 is supplied to the connection point B between the secondary battery cells 73 and 75 through the switch 105, the charge/discharge terminal C of the battery set 71, and the resistor 79. Similarly, an output from the amplifier 91 is supplied to the connection point F between the secondary battery cells 75 and 77 through the switch 107, the charge/discharge terminal E of the battery set 71, and the resistor 81.

In a normal charge operation, an active voltage check signal 111 is not supplied to the switch control 109, and the switches 105 and 107 are set in an ON state. For this reason, the charge power is supplied to the secondary battery cells 73, 75, and 77 through the power supply terminals TA and TB and the charge/discharge terminals C and E to charge the secondary battery cells 73, 75, and 77.

When the voltage of the secondary battery cell 73 becomes higher than the average voltage of the three battery voltages of the secondary battery cells 73, 75, and 77, the voltage at the connection point A becomes higher than that at the connection point B. A correction current then flows from the amplifier 89 to the connection point B between the secondary battery cells through the switch 105, the charge/discharge terminal C of the battery set 71, and the resistor 79. The charge current of each of the secondary battery cells 75 and 77 becomes larger than that of the secondary battery cell 73 by this correction current component, and the potential differences between the secondary battery cells 73, 75, and 77 are reduced. That is, finally, the potential at the point B becomes ⅔ times the sum of the voltages of the battery cells 73, 75, and 77, and the potential at the point F becomes ⅓ times the sum of the voltages of the battery cells 73, 75, and 77. As a result, the voltages of the battery cells 73, 75, and 77 become equal to each other.

In the above charge operation, the voltages of the secondary battery cells 73, 75, and 77 which are output from the voltage measuring circuits 93, 95, and 97 contain potential differences formed by the current limit resistors 79 and 81. For this reason, in measuring a battery voltage at the connection point B between the secondary battery cells 73 and 75, a value including a voltage drop across the current limit resistor 81 is measured, and an accurate voltage cannot be measured.

To measure the voltages of the secondary battery cells 73, 75, and 77 during the charge operation, a significant voltage check signal 111 is supplied to the switch control 109 to turn off the switches 105 and 107. A current path between the amplifier 89 and the charge/discharge terminal C connected to the resistor 79 is disconnected to nullify the potential difference formed by the resistor 79. At the same time, a current path between the amplifier 91 and the charge/discharge terminal E connected to the resistor 81 is disconnected to nullify the potential difference formed by the resistor 81, so that an accurate battery voltage can be measured. In this case, however, even if a battery voltage changes, the corresponding battery voltage does not follow this change. The voltage measurement is performed with a lapse of a predetermined period of time after the battery current becomes zero. That is, after the switches 105 and 107 are turned off in response to the switch control 109 and the voltage check signal 111, measuring signals are output to the voltage measuring circuits 93, 95, and 97 when the predetermined period of time has elapsed.

When the predetermined period of time has elapsed at the zero correction voltage, the voltage measuring circuits 93, 95, and 97 measure the voltages of the secondary battery cells 73, 75, and 77 and output the accurate voltage values as the external output signals 99, 101, and 103. In this manner, the voltages of the secondary battery cells 73, 75, and 77 constituting the battery set 71 are accurately measured to prevent overcharge and overdischarge.

Third Embodiment

The third embodiment (1) of the present invention will be described with reference to FIGS. 11 and 12A through 12D.

In the presence of loads respectively applied with the powers from the battery cells of the battery set constituted by at least two series-connected cells, or in the presence of a load whose consumed current changes in accordance with cell voltages, the third embodiment (1) of the present invention comprises a circuit means for detecting a current (neutral line current) of a circuit connecting connection points between the series-connected battery cells and the connection points between the loads, a circuit for controlling a discharge current of each battery cell in accordance with a detection signal from the circuit means, and a circuit connected in parallel to the load or loads, wherein the neutral line current is controlled to be zero ampere, thereby equalizing the discharge currents of the respective battery cells and hence maximizing the battery performance. This arrangement solves the following inconvenience. Assume that the voltage of the first battery cell is higher than that of the second battery cell. In this case, the first battery cell is charged earlier than the second battery cell in a charge operation, while the second battery cell is discharged earlier than the first battery cell in a discharge operation. As a result, in a full charge operation, the first battery cell is charged with a 100% energy, while the second battery cell is charged with only a 80% energy. In a discharge operation, when the second battery cell is completely discharged, a 20% energy is still left in the first battery cell. That is, the charge and discharge operations are performed with reference to a battery cell having a lower energy level. For this reason, a 100% energy cannot be extracted.

This conventional drawback will be described with reference to FIG. 13.

Figure 13:
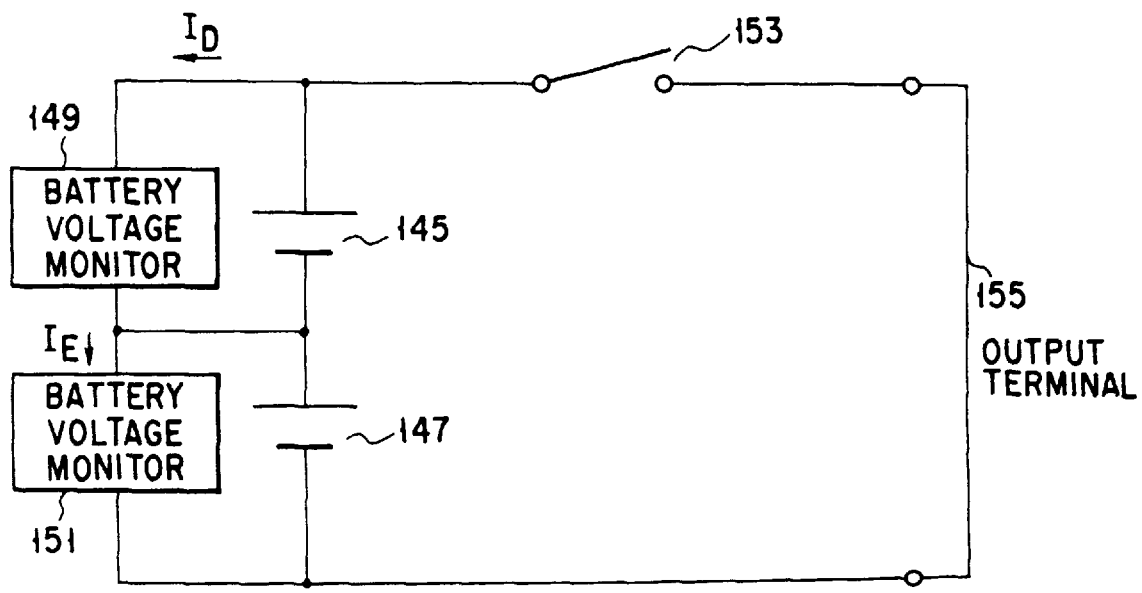
FIG. 13 is a circuit diagram showing a conventional arrangement corresponding to the third embodiment.

In a circuit shown in FIG. 13, even if identical circuits are manufactured for battery voltage monitors 149 and 151, consumed currents ID and IE of the battery voltage monitors 149 and 151 cannot be equal to each other due to variations of elements constituting these monitors. That is, the currents supplied from battery cells 145 and 147 to the battery voltage monitors 149 and 151 differ from each other. Even if this current difference is small, currents always flow through the battery voltage monitors 149 and 151, and a capacity difference between the battery cells 145 and 147 becomes large with a lapse of time. In particular, in a battery whose voltage is proportional to the residual capacity of the battery, such as a lithium battery, a difference between the battery voltages of the respective cells becomes large.

The circuit in FIG. 13 is operated as follows.

In a charge operation, when the battery voltage of one of the battery cells 145 and 147 reaches a maximum allowable voltage determined depending on the types of batteries, the battery voltage monitor 149 or 151 detects this. At this time, a charge/discharge ON/OFF switch 153 is operated to stop charging and prevent overcharge.

In a discharge operation, when the battery voltage of any one of the battery cells 145 and 147 reaches a minimum allowable voltage determined depending on the types of batteries, the battery voltage monitor 149 or 151 detects this. At this time, a charge/discharge ON/OFF switch 153 stops discharging and prevent overdischarge.

In the conventional battery set charge/discharge control means described above, when there is a battery capacity difference, i.e., a battery voltage difference, which is caused by a consumed current difference between the battery voltage monitors 149 and 151, a battery having a large battery capacity reaches the maximum allowable voltage earlier than a battery having a small battery capacity in a charge operation. The switch stops charging so as to prevent overcharge. For this reason, the other battery cannot reach a full charge state. In a discharge operation, the battery having the small battery capacity reaches the minimum allowable voltage earlier than the battery having the large battery capacity. The switch stops discharging so as to prevent overdischarge. The other battery is inhibited to discharge with a sufficient residual capacity, and this battery cannot sufficiently enhance the performance. In addition, when this is repeated, the battery capacity difference is increased, and the capacity which can be extracted from the battery set is further reduced, resulting in inconvenience.

According to this embodiment, the battery voltage of the first battery cell is set equal to that of the second battery cell, so that the first and second battery cells can be charged with a 100% energy. As a result, the overall energy can be maximally extracted.

The third embodiment (1) of the present invention will be described with reference to FIGS. 11 and 12A through 12D.

In the presence of loads respectively applied with the powers from the battery cells of the battery set constituted by at least two series-connected cells, or in the presence of a load whose consumed current changes in accordance with cell voltages, the third embodiment (1) of the present invention comprises a circuit means for detecting a current (neutral line current) of a circuit connecting connection points between the series-connected battery cells and the connection points between the loads, a circuit means for controlling a discharge current of each battery cell in accordance with a detection signal from the circuit means, and a circuit means connected in parallel to the load or loads, wherein the neutral line current is controlled to be 0 A (zero ampere), thereby equalizing the discharge currents (consumed currents) of the respective battery cells and hence maximizing the battery performance.

FIG. 11 is a circuit diagram showing an arrangement of the third embodiment (1) of the present invention.

Referring to FIG. 11, a current detector 121 is arranged midway along a neutral line connecting a connection point (Bj) of two series-connected secondary battery cells 117 and 119 and a connection line (Lj) between loads 123 and 125 and detects a current flowing through the neutral line.

A discharge current controller 127 for the secondary battery cell 117 has a consumed current changing in accordance with control information from the current detector 121 (a current flows if IF<IG). A discharge current controller 129 for a secondary battery cell 119 has a consumed current changing in accordance with control information from the current detector 121 (a current flows if IF>IG).

Assume that a current flowing through the load 123 for the secondary battery cell 117 is defined as IF, and a current flowing through the load 125 for the secondary battery cell 119 is defined as IG.

The operation of the third embodiment (1) shown in FIG. 11 will be described below.

If a difference is present between the currents IF and IG flowing through the loads 123 and 125 for the secondary battery cells 117 and 119, this difference flows through the neutral line. This current is detected by the current detector 121.

On the basis of this detection information, the consumed currents of the discharge current controllers 127 and 129 are changed to set a current flowing through the neutral line to 0 A, thereby equalizing the discharge currents flowing through the secondary battery cells 117 and 119.

This operation will be described in more detail below.

If IF<IG, then the following operation is performed.

A current of "IG–IF" flows through the neutral line from the connection point Bj between the secondary battery cells 117 and 119 to the connection point Lj between the loads 123 and 125.

The current detector 121 detects the magnitude and direction of this current and causes the discharge current controller 127 to output a current which sets the neutral line current to 0 A (in this case, the current detector 121 causes the discharge current controller 129 not to output a current).

If IF>IG, then the following operation is performed.

In this case, a current "IF–IG" flows from the connection point Lj to the connection point Bj in a direction reverse to that described above.

The current detector 121 detects the magnitude and direction of this current and causes the discharge current controller 129 to output a current which sets the neutral line current to be 0 A (at this time, the current detector 121 causes the discharge current controller 127 not to output a current).

As described above, when the neutral line current is controlled to be 0 A (zero ampere), the discharge currents (consumed currents) of the secondary battery cells 117 and 119 are equalized with each other, thereby maximizing the battery performance.

Figure 93:
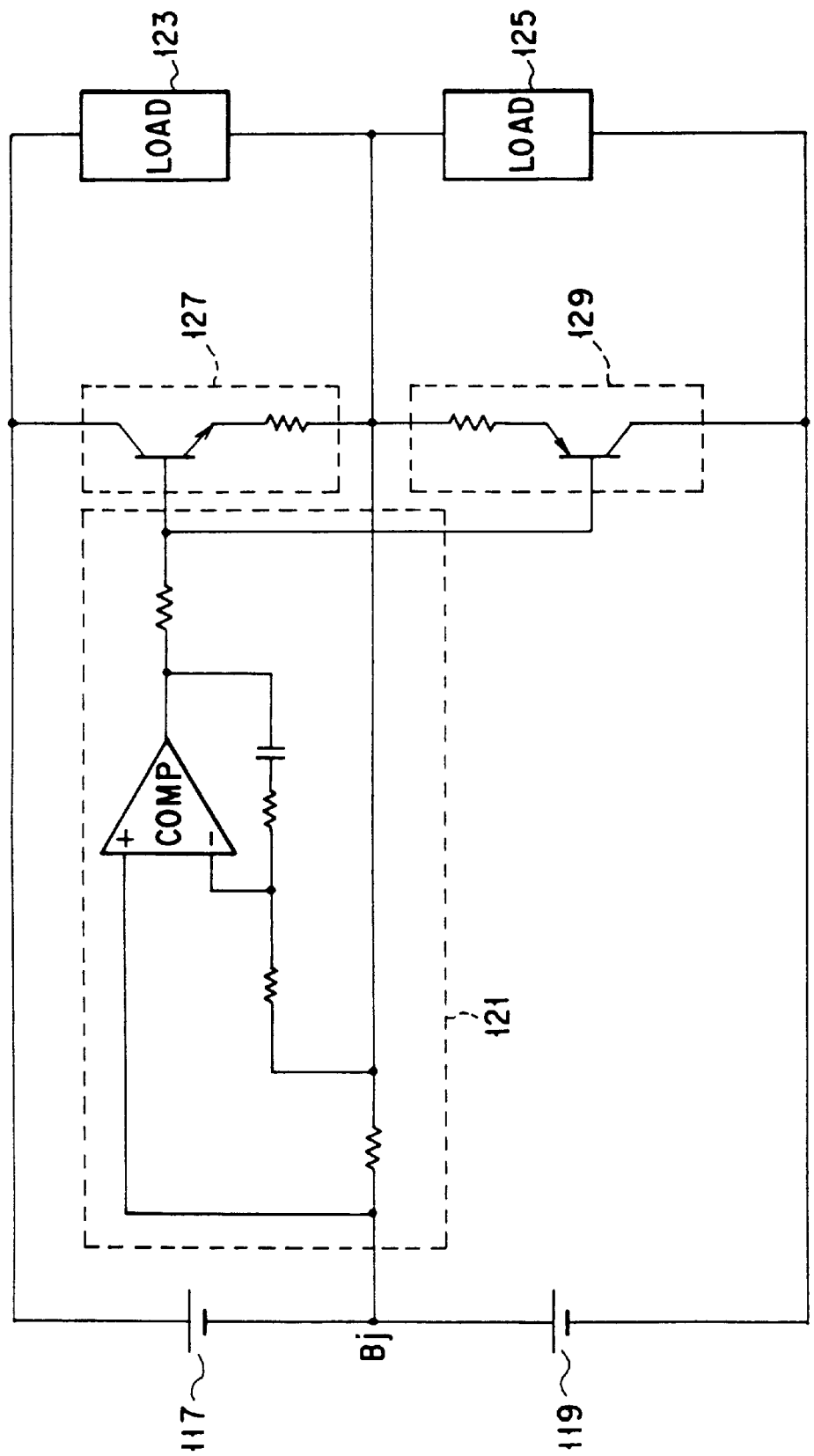
FIG. 93 is a circuit diagram showing the detailed arrangement of a discharge current controller and a current detector shown in FIG. 11.

FIG. 93 is a circuit diagram showing the detailed arrangement of the discharge current controllers 127 and 129 and the current detector 121 shown in FIG. 11.

FIGS. 12A through 12D are circuit diagrams showing the arrangement of the third embodiment (2) of the present invention. FIGS. 12B through 12D are circuit diagrams for explaining the operation of the third embodiment (2) shown in FIG. 12A.

Secondary battery cells 135 and 137 are connected in series with each other. An amplifier 139 having a very high impedance and a gain of 1 is arranged midway along a neutral line connecting a connection point (Bj) between the secondary battery cells 135 and 137 and a connection point (Lj) between loads 141 and 143. The load 141 is a circuit whose consumed current changes in accordance with the voltage of the secondary battery cell 135, e.g., a circuit for monitoring the voltage of the secondary battery cell 135. The load 143 is a circuit whose consumed current changes in accordance with the voltage of the secondary battery cell 137, e.g., a circuit for monitoring the voltage of the secondary battery cell 137.

The loads 141 and 143 are originally connected in parallel with the secondary battery cells 135 and 137, respectively, as shown in FIG. 12B. However, even when the amplifier 139 having a gain of 1 is arranged between the secondary battery cells 135 and 137 and the loads 141 and 143, as shown in FIG. 12A, the voltage at the connection point Bj is equal to that at the connection point Lj. Therefore, the same operation as in FIG. 10B can be obtained (same in function).

In FIG. 12B, consumed currents ID and IE of the loads 141 and 143 are supplied from the secondary battery cells 135 and 137, respectively. For this reason, if ID≠IE, a discharge current difference is generated between the battery cells. In FIG. 12A, a current corresponding to the difference between the consumed currents ID and IE is supplied from the amplifier 139. Since the power supply voltage is applied to the amplifier 139 from a series circuit of the secondary battery cells 135 and 137, the discharge currents of the battery cells are equal to each other without any difference.

This will be described in detail.

If ID>IE, then the following operation is performed.

Assume that the consumed current of the load 141 is defined as ID, and the consumed current of the load 143 is defined as IE. In this case, as shown in FIG. 12C, a current of (ID–IE) corresponding to a difference between these currents flows through a line 2 in a direction indicated by an arrow. Therefore, a current having a magnitude of IE+(ID–IE)=ID flows through a line 4, so the current of a line 5 is equal to that of the line 4.

Since the input impedance of the amplifier 139 having a gain of 1 is very high, few current flows through the input terminal. For this reason, the consumed currents of the secondary battery cells 135 and 137 are equal to each other.

If ID<IE, then the following operation is performed.

In this case, as shown in FIG. 12D, a current having a magnitude of (IE–ID) which corresponds to a difference between the consumed currents of the loads 141 and 143 flows. With this operation, the consumed currents of the secondary battery cells 135 and 137 are equal to each other due to the same reason as described above.

With the above-described function of controlling the consumed currents of the series-connected secondary battery cells to be equal to each other, the battery performance can be maximized.

Fourth Embodiment

The fourth embodiment of the present invention will be described below with reference to FIG. 14.

In the fourth embodiment of the present invention, a portable computer capable of mounting an arbitrary battery set of a plurality of types of battery sets each consisting of series-connected secondary battery cells comprises a battery set having a voltage detection terminal with a series connection point of the secondary battery cells, which is specified in accordance with a battery set type, and a means for recognizing the type of the mounted battery set in accordance with a voltage obtained from the voltage detection terminal of the battery set. A plurality of types of battery sets can be easily used with a minimum number of signals at low cost.

Figure 14:
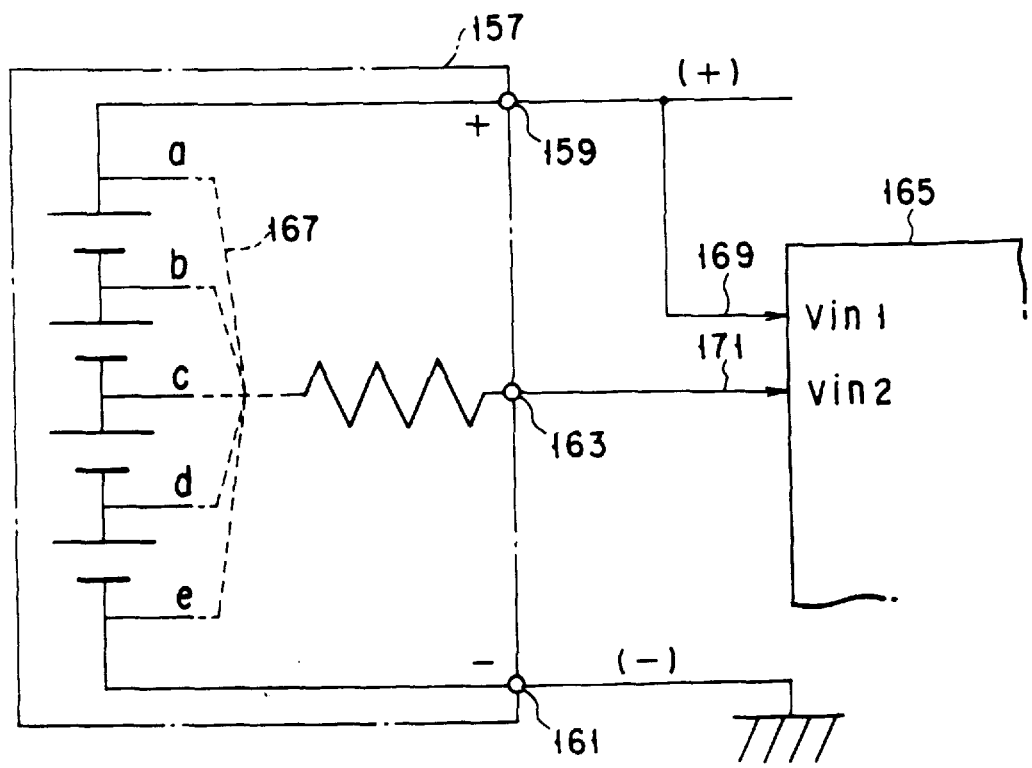
FIG. 14 is a circuit diagram showing an is arrangement according to the fourth embodiment of the present invention.

FIG. 14 is a circuit diagram showing the arrangement of the fourth embodiment of the present invention. Referring to FIG. 14, reference numeral 157 denotes a pack-type battery set which can be detachably incorporated in a portable computer main body and consists of a plurality of secondary battery cells connected in series. Reference numerals 159 and 161 denote a positive (+) terminal and a negative (–) terminal of the battery set 157, respectively. These terminals 159 and 161 are connected to the internal power supply circuit of the computer main body upon mounting the battery set in the main body. Reference numeral 163 denotes a voltage detection contact of the battery set 157, which is connected to a battery connection point (a, b, . . . , or e) inherent to a battery set (battery pack) type through a resistor.

Reference numeral 165 denotes hardware (voltage detector) for detecting the terminal voltage of the battery set 157 to recognize the type of the mounted secondary battery on the basis of the detected value. The hardware 165 is constituted by, e.g., a power supply control microprocessor.

Reference numeral 167 denotes a fixed wiring for connecting the voltage detection contact 163 of the battery set 157 to the battery connection point (a, b, . . . , or e) inherent to the secondary battery type through the resistor. The specific battery connection point (a, b, . . . , or e) determined in advance in accordance with the type (battery voltage, capacity, and the like) of the secondary battery (battery pack) is connected to the voltage detection contact 164 is through the resistor.

Reference numerals 169 and 171 denote input signal lines of the voltage detector 165 for A/D-converting a signal therein.

The operation of the fourth embodiment shown in FIG. 14 will be described.

In this embodiment, a battery set having four cells is exemplified. In this case, five types of batteries can be determined by the battery connection point (a, b, . . . , or e), the fixed wiring 167, and the voltage detection contact 163. The battery connection point (a, b, . . . , or e) to be connected by the fixed wiring 167 is selected from the connection points a through e in advance in accordance with the battery type. At this time, the voltage detected at the voltage detection contact 163 is an integer multiple of a battery cell voltage.

For example, when a battery cell voltage is 1.2 V, a voltage detected at the connection point a is 4.8 V, a voltage detected at the connection point b is 3.6 V, a voltage detected at the connection point c is 2.4 V, a voltage detected at the connection point d is 1.2 V, and a voltage detected at the connection point e is 0 V. Upon determination of the voltage at the voltage detection contact 163, the battery type can be easily identified.

Even when the battery voltage of the battery set 157 changes in a low battery state or the like, the voltage division ratio is represented by [Vin2/Vin1] and kept unchanged, so the battery set type can be identified.

The recognizing means of the battery type according to the above embodiment is not limited to the portable computer. This means can also be applied to other electronic equipment, e.g., a wordprocessor, for allowing battery driving. In addition, the hardware (voltage detector) for detecting the terminal voltage of the battery set 157 to recognize the type of the mounted secondary battery is not limited to the power supply control microprocessor, and other hardware can also be used.

With the above-described mechanism for recognizing the battery type, mechanical hardware need not be used to identify the battery. In addition, when the microcontroller is used for power supply control, only one resistor can be added to the circuit. For this reason, an inexpensive circuit can be easily realized without an increase in manufacturing cost. As compared to a case wherein identification is performed using the voltage of the entire battery set, the voltage detected at the voltage detection contact is an integer multiple of the voltage of one battery cell, so the determination can be accurately performed. Since only one terminal can be used as the voltage detection contact, one more terminal can be added to a conventional connector when the battery set is connected through the connector. Therefore, the manufacturing cost is increased in correspondence with only an increase in cost of the connector. Since the battery type can be properly recognized, the battery performance can be maximized.

Fifth Embodiment

Figure 15:
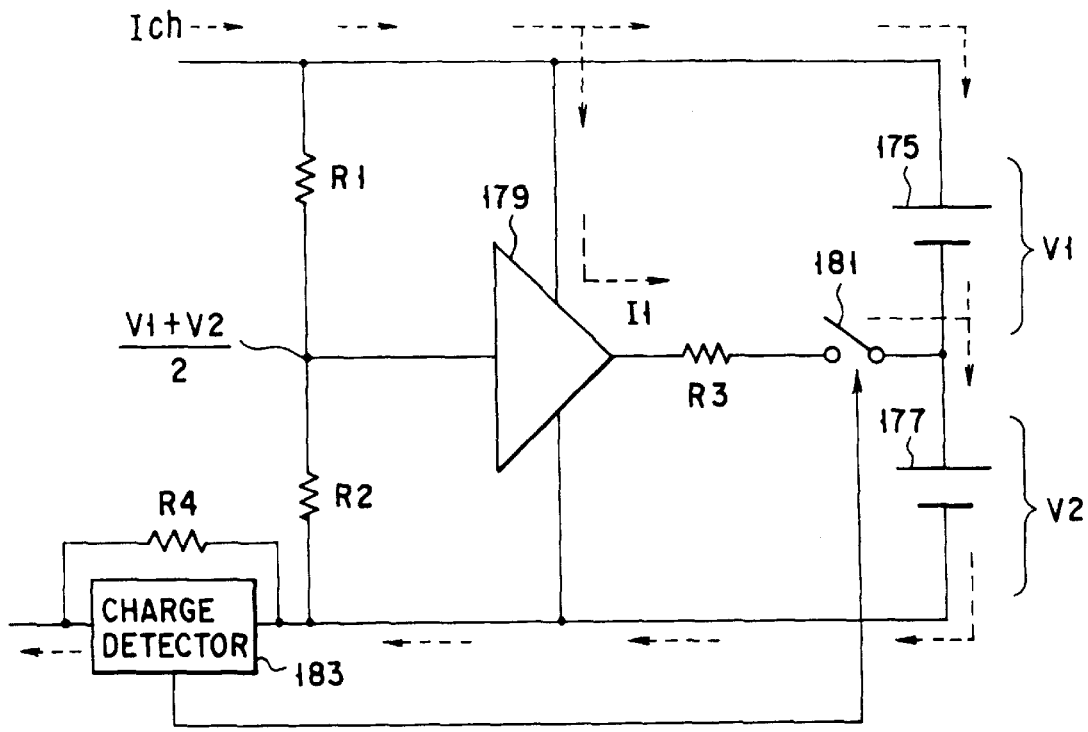
FIG. 15 is a circuit diagram showing an arrangement according to the fifth embodiment of the present invention.

FIG. 15 is a block diagram showing the arrangement of the fifth embodiment of the present invention.

Referring to FIG. 15, reference numerals 175 and 177 denote secondary battery cells connected in series and constituting a battery set. A battery voltage of the secondary battery cell 175 is defined as V1, and a battery voltage of the secondary battery cell 177 is defined as V2.

Reference numeral 179 denotes an amplifier having a gain of 1. The input terminal of the amplifier 179 is connected to a series connection point between fixed resistors R1 and R2 for generating a voltage ½ the voltage of the entire battery set. The output terminal of the amplifier 179 is connected to a series connection point between the secondary battery cells 175 and 177 through a fixed resistor R3 and a switch 181.

The switch 181 is arranged between the series connection point between the secondary battery cells 175 and 177 and the output terminal of the amplifier 179 through the fixed resistor R3. The switch 181 is ON/OFF-controlled in accordance with an output from a charge detector 183 and turned on upon detection of a charge state.

The charge detector 183 arranged midway along a charge current path turns on the switch 181 upon detection of the charge state.

The fixed resistors R1 and R2 having the same resistance generate a voltage obtained upon dividing the voltage of the battery set by a number of battery cells. In this case, since the battery set is constituted by two series-connected battery cells, the voltage of the battery set is divided into halves ((V1+V2)/2).

The fixed resistor R3 limits the charge currents of the battery cells. Reference symbol R4 denotes a fixed resistor for detecting the presence/absence of a charge current which is externally supplied. Reference symbol Ich denotes a charge current which is externally supplied.

The operation of the fifth embodiment will be described. To simplify a description, a current consumed by the amplifier 179 is ignored.

Assume that, in the series-connected secondary battery cells 175 and 177, a relationship between the battery voltage V1 of the secondary battery cell 175 and the battery voltage V2 of the secondary battery cell 177 satisfies V1>V2. An operation at this time will be described.

Since the amplifier 179 has a gain of 1, the voltage at the output terminal is equal to that at the input terminal represented by [(V1+V2)/2]. The voltage across the fixed resistor R3 is represented by [(V1+V2)/2−V2]. A current of [{(V1+V2)/2−V2}/R3] ampere (to be referred to as a current I1) flows from the amplifier 179 to the secondary battery cells 175 and 177.

Since, of the discharge current Ich, the current I1 flows from the amplifier 179 to the secondary battery cell 177, a charge current flowing to the secondary battery cell 175 is represented by Ich−I1. The charge current flowing to the secondary battery cell 177 is Ich. Therefore, a larger charge current flows to the secondary battery cell 177 having a low battery voltage.

This operation is performed only when a charge state is detected by the charge detector 183, thereby equalizing the voltages of the secondary battery cells 175 and 177 with each other.

If V1<V2, then the following operation is performed.

Since the amplifier 179 has a gain of 1, the voltage at the output terminal is equal to that at the input terminal represented by [(V1+V2)/2]. The voltage across the fixed resistor R3 is represented by [(V1+V2)/2−V2]. The current Ich flows from the secondary battery cells 175 and 177 to the amplifier 179. The charge current flowing to the secondary battery cell 175 is Ich, and the charge current flowing to the secondary battery cell 177 is [Ich−I1]. A larger charge current flows to the secondary battery cell 175 having a low battery voltage. This operation is performed only when a charge state is detected by the charge detector 183, thereby equalizing the voltages of the secondary battery cells 175 and 177 with each other.

Sixth Embodiment

Figure 16:
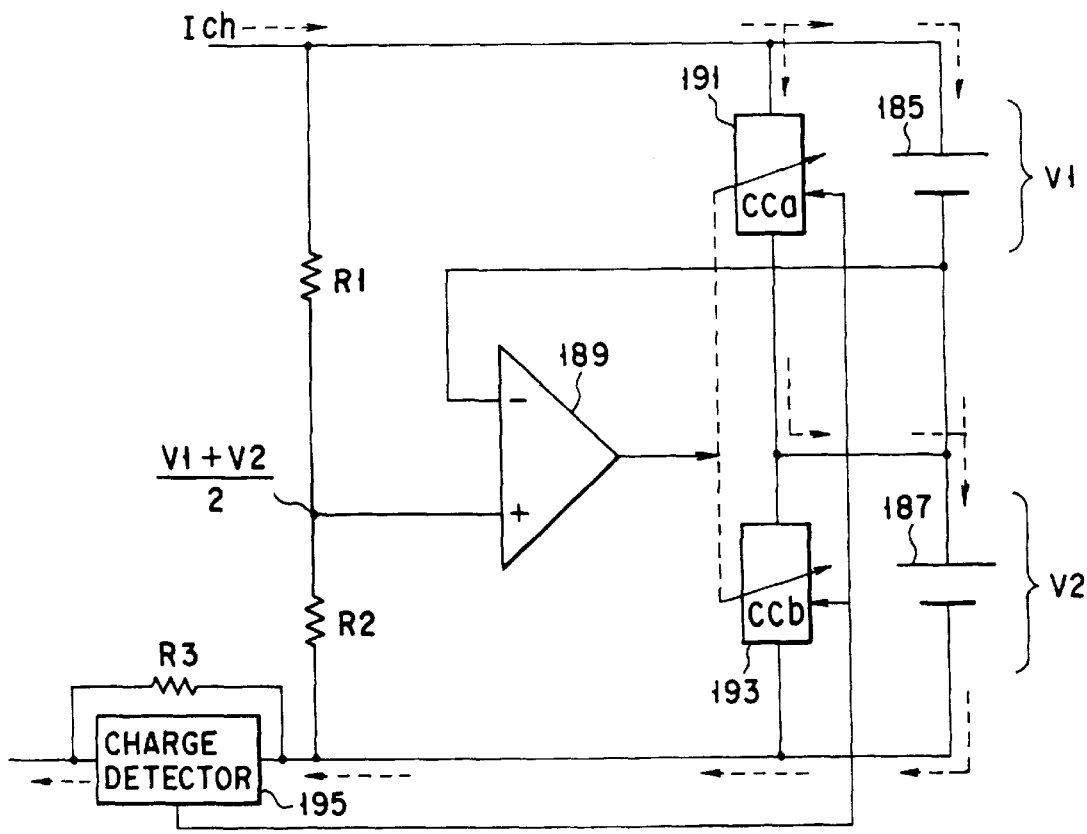
FIG. 16 is a block diagram showing an arrangement according to the sixth embodiment of the present invention.

FIG. 16 is a block diagram showing the arrangement of the sixth embodiment of the present invention.

Referring to FIG. 16, reference numerals 185 and 187 denote secondary battery cells connected in series and constituting a battery set. A battery voltage of the secondary battery cell 185 is defined as V1, and a battery voltage of the secondary battery cell 187 is defined as V2.

Reference numeral 189 denotes an amplifier for detecting a voltage difference (Vdif) between a voltage at a series connection point between the secondary battery cells 185 and 187 and a voltage obtained upon dividing the voltage of the battery set by the number of battery cells. The impedances of charge current controllers 191 and 193 are switched in accordance with the voltage difference (Vdif).

Figure 80:
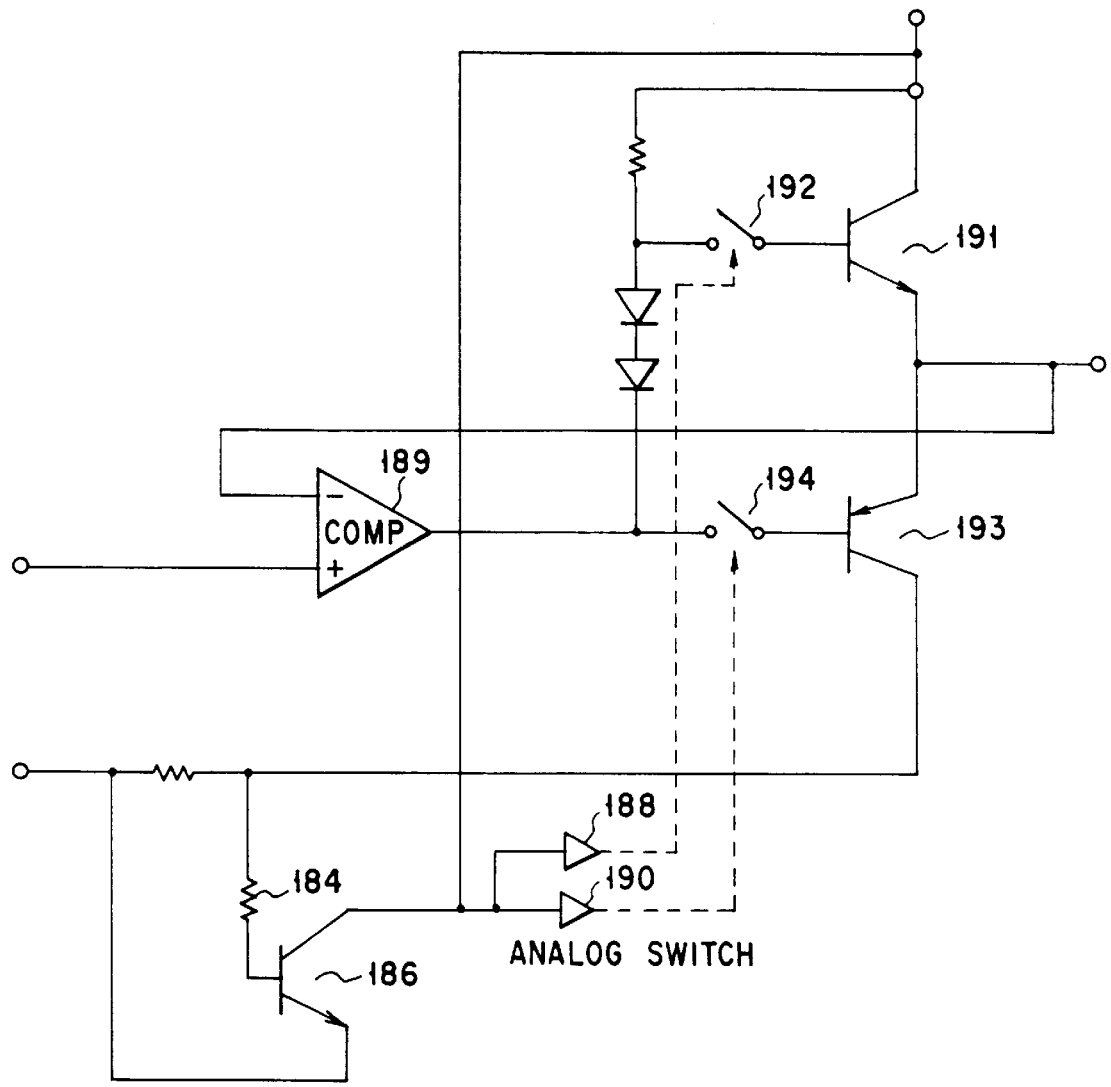
FIG. 80 is a circuit diagram showing the detailed arrangement of a charge current control apparatus according to the sixth embodiment.

The charge current controllers 191 and 193 have an arrangement as shown in FIG. 80. Referring to FIG. 80, when a charge current flows through a resistor 184, a transistor 186 is rendered conductive to operate analog switches 188 and 190, so switches 192 and 194 are turned on. The charge current controllers 191 and 193 operate only when a charge state is detected by a charge detector 195. When the voltage difference (Vdif) is generated, the impedance is controlled to be low. When the voltage difference (Vdif) is zero, the impedance is controlled to be high. With this operation, the charge currents of the secondary battery cells 185 and 187 are controlled. The charge current controller 191 operates only when V1>V2, and the charge current controller 193 operates only when V1<V2; otherwise, the impedance is set to be high.

The charge detector 195 is arranged midway along a charge current path and controls the charge current controllers 191 and 193 in accordance with a detection output. Upon detection of a charge state, the charge detector 195 sets the charge current controllers 191 and 193 in an operative state. If no charge state is detected, the charge current controllers 191 and 193 are set in an inoperative state.

Reference symbols R1 and R2 denote fixed resistors, having the same resistance, for generating a voltage obtained upon dividing the voltage of the battery set by the number of battery cells. In this case, since the battery set is constituted by two series-connected battery cells, the voltage of the battery set is divided into halves ((V1+V2)/2).

Reference symbol R3 denotes a fixed resistor for detecting the presence/absence of a charge current which is externally supplied. Reference symbol Ich denotes a charge current which is externally supplied.

The operation of the sixth embodiment will be described.

Assume that, in the series-connected secondary battery cells 185 and 187, a relationship between the battery voltage V1 of the secondary battery cell 185 and the battery voltage V2 of the secondary battery cell 187 satisfies V1>V2. An operation at this time will be described.

When the voltage difference (Vdif) is detected by the amplifier 189, the charge current controller 193 is left in a state wherein no current flows at a high impedance while the charge current controller 191 is operated to reduce the impedance, so part of the charge current Ich flows from the charge current controller 191 to the secondary battery cell 187. When the charge current flowing to the secondary battery cell 185 is compared with that flowing to the secondary battery cell 187, a larger charge current flows to the secondary battery cell 187 having a low battery voltage.

If V1<V2, then the following operation is performed. When the voltage difference (Vdif) is detected by the amplifier 189, the charge current controller 191 is left in the state wherein no current flows at a high impedance while the charge current controller 193 is operated to reduce the impedance, so part of the charge current Ich flows from the secondary battery cell 185 to the charge current controller 193. When the charge current flowing to the secondary battery cell 185 is compared with that flowing to the secondary battery cell 187, a larger charge current flows to the secondary battery cell 185 having a low battery voltage.

If V1=V2, then the following operation is performed. When the voltage difference (Vdif=0) is detected by the amplifier 189, the high impedances of the charge current controllers 191 and 193 are kept unchanged, and the charge current Ich flows to the secondary battery cells 185 and 187.

This operation is performed only when the charge state is detected by the charge detector 195, thereby equalizing the voltages of the secondary battery cells 185 and 187 with each other.

According to the sixth embodiment, the voltages of the series-connected battery cells constituting the battery set are always equal to each other. Overcharge or overdischarge caused due to the voltage difference between the battery cells is prevented so that the full charge state of all the battery cells can be properly obtained, and destruction or the shortened service life of the battery cells can be prevented.

Figure 17:
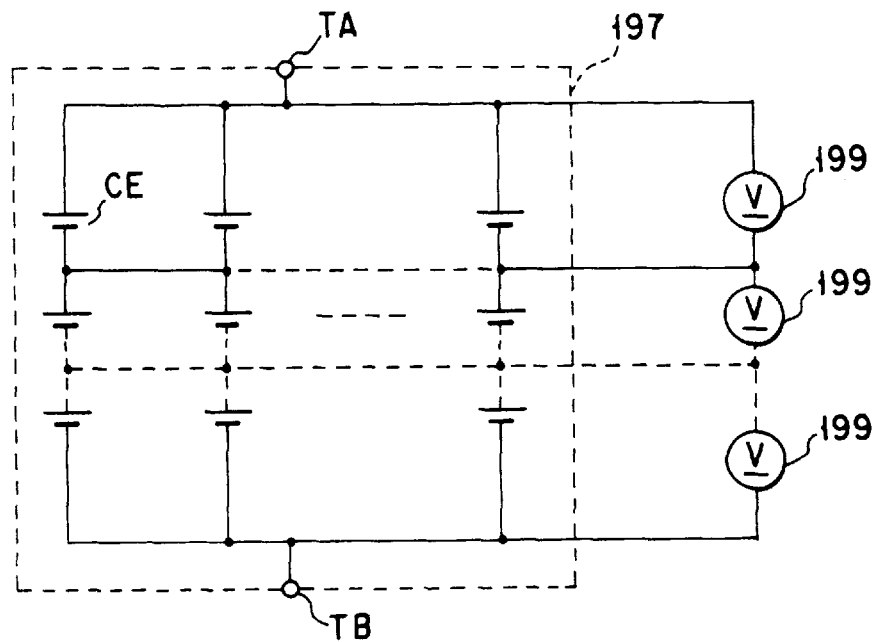
FIG. 17 is a circuit diagram showing a battery set applied to the fifth and sixth embodiments.

The battery set of the above embodiments has an arrangement in which secondary battery cells such as lithium-ion are connected in series with each other. As shown in FIG. 17, n secondary battery cells (CE) are connected in parallel with each other, m sets of the parallel-connected battery cells are connected in series with each other. External connecting terminals (reference symbols TA and TB denote power supply terminals) are provided for each battery set of the parallel-connected battery cells, thereby constituting a battery pack 197. In this case, a secondary battery having a large capacity can be realized. At this time, battery voltage detectors 199 are arranged between the external connecting terminals of the parallel-connected battery cells to monitor the voltage of the parallel-connected battery cells. When charge current control of the parallel-connected battery cells is performed in accordance with any one of the above-described embodiments, a secondary battery having a large current capacity with high reliability can be realized.

The above-described embodiments can be applied to a battery set using, in addition to the lithium-ion secondary battery, various secondary batteries such as a lead battery, a lithium-lead battery, and an Ni—Zn battery, which require constant voltage charge and constitute the battery set.

Seventh Embodiment

Figure 18:
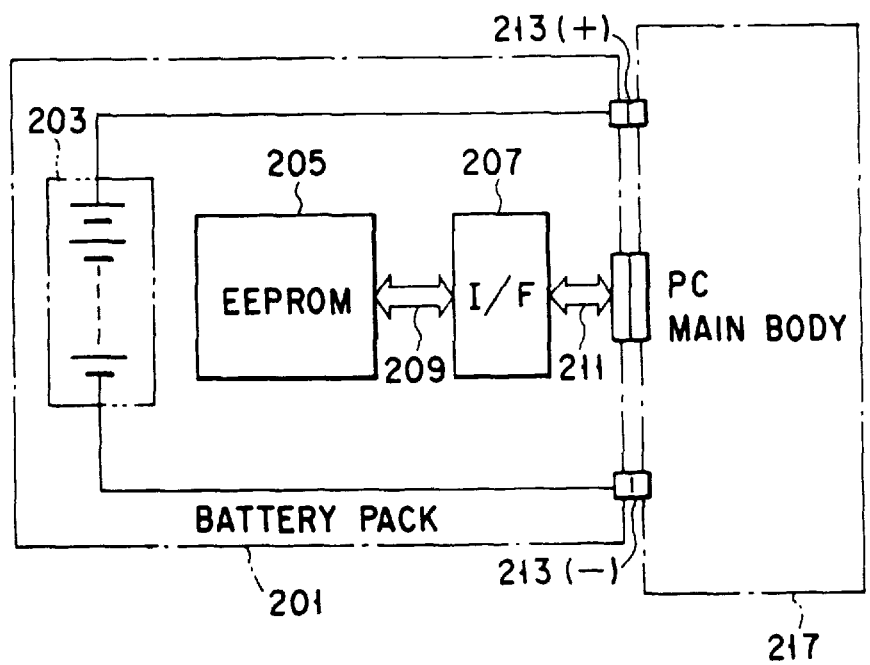
FIG. 18 is a block diagram showing an arrangement according to the seventh embodiment of the present invention.

FIG. 18 is a block diagram showing the arrangement of the seventh embodiment of the present invention.

Referring to FIG. 18, reference numeral 201 denotes a battery pack incorporating a secondary battery therein. Reference numeral 217 denotes an equipment main body, e.g., a personal computer main body (PC main body) having the mounting mechanism of the battery pack and using the mounted battery pack as an operating power supply during battery driving.

Reference numerals 203 through 213 are the constituent elements of the battery pack 201. Reference numeral 203 denotes a secondary battery whose charge/discharge operation is controlled through power supply terminals 213 (+ and −). Reference numeral 205 denotes a storage unit constituted by an EEPROM for storing charge information of the secondary battery 203.

Reference numerals 207, 209, and 211 are elements constituting an interface for allowing information transmission between the storage unit 205 and the CPU of the personal computer main body 217. Reference numeral 207 denotes an interface circuit section (I/F), and reference numerals 209 and 211 denote interface signal paths.

The charge/discharge operation of the secondary battery 203 is controlled through the power supply terminals 213 (+ and −).

In this embodiment, the operating power supply voltage of the storage unit 205 constituted by the EEPROM is applied from the personal computer main body 217 side through the interface signal paths 209 and 211. However, a circuit arrangement may also be used in which, when the battery pack 201 is mounted in the personal computer main body 217, the power supply voltage of the incorporated secondary battery 203 is applied to the storage unit 205 as the operating power supply voltage.

With the above arrangement, state information according to charge/discharge of the incorporated secondary battery 203 is written in the storage unit 205 incorporated in the battery pack 201 mounted in the personal computer main body 217 by the CPU of the personal computer main body 217 through the interface circuit section 207 and the interface signal paths 209 and 211.

At this time, since the storage unit 205 is constituted by the EEPROM, the state information stored in the storage unit 205 is saved in a non-operating-power-supply state even when the battery pack 201 is detached from the personal computer main body 217.

When the battery pack 201 is mounted in the personal computer main body 217, the processing unit (CPU) of the personal computer main body 217 reads the state information of the incorporated secondary battery 203 from the storage unit 205 incorporated in the battery pack 201, thereby instantaneously recognizing the battery residual capacity of the battery pack 201, the battery type, and the like. On the basis of this information, the operable time of the mounted battery pack 201 can be obtained in accordance with predetermined calculation and recognized.

Eighth Embodiment

FIG. 19 is a block diagram showing the arrangement of the eighth embodiment of the present invention.

In this embodiment, an LED display 215 is provided to the battery pack 201 of the eighteenth embodiment. Charge state information such as the residual capacity of an incorporated secondary battery 203 and the like according to the contents of an incorporated storage unit 205 can be displayed on the LED display 215 through an interface circuit section 207. Reference numeral 201 denotes a battery pack having the LED display 215.

As described above, by using the battery pack 201 having the incorporated storage unit 205 and the LED display 215, a user can easily recognize the charge state of the battery pack 201 mounted in a personal computer main body 217.

Also in this embodiment, when the battery pack 201 is mounted, an operating power supply voltage is applied to the storage unit 205 constituted by an EEPROM and the LED display 215 from the personal computer main body 217 through interface signal paths 209 and 211. A circuit arrangement can also be used in which, when the battery pack 201 is mounted in the personal computer main body 217, the power supply voltage of the incorporated secondary battery 203 is applied to the storage unit 205 and the LED display 215 as the operating power supply voltage.

Ninth Embodiment

FIG. 20 is a block diagram showing the arrangement of the ninth embodiment of the present invention.

In this embodiment, the state information of a mounted battery pack 201, which is recognized by the personal computer main body 217 in the seventh embodiment, is displayed on the display unit of the personal computer main body 217.

Referring to FIG. 20, reference numerals 219 through 225 denote constituent elements of a personal computer main body 217. Reference numeral 219 denotes an interface circuit (I/F) for reading/writing information from/in a storage unit 205 of the battery pack 201 under the control of a CPU 221.

The CPU 221 controls the personal computer main body 217. The CPU 221 reads/writes the state information of an incorporated secondary battery 203 from/in the storage unit 205 of the mounted battery pack 201 through the interface circuit 219.

Reference numeral 223 denotes a display controller (DISP-CONT) for controlling display on a display unit 225 under the control of the CPU 221.

The display unit (DISP) 225 as standard equipment of the personal computer main body 217 outputs and displays various information under the control of the display controller 223. In this embodiment, information such as the charge'state of the battery pack 201, usable time of the mounted battery pack 201, and the like is displayed.

In this embodiment, when the battery pack 201 is mounted in the personal computer main body 217, the CPU 221 accesses the storage unit 205 of the battery pack 201 through the interface circuit 219 to read the state information of the mounted battery pack 201, thereby recognizing the battery residual capacity of the battery pack 201, the battery type, and the like. On the basis of this information, the operable time of the mounted battery pack 201 is recognized. The CPU 221 displays this information on the display unit 225 as standard equipment of the personal computer main body 217 through the display controller 223.

With this operation, a user can easily recognize information such as the charge state of the battery pack 201 mounted in the personal computer main body 217 and the operable time of the mounted battery pack 201.

Tenth Embodiment

FIG. 21 is a block diagram showing the arrangement of the tenth embodiment of the present invention.

In this embodiment, information processed by a CPU 221 of a personal computer main body 217 is displayed on the LED display 215 of the battery pack 201 shown in the eighth embodiment. In this embodiment, when a battery pack 201 having an LED display 215 is mounted in the personal computer main body 217, the CPU 221 of the personal computer main body 217 accesses a storage unit 205 of the battery pack 201 through an interface circuit 219 to read the state information of the mounted battery pack 201, thereby recognizing the battery residual capacity of the battery pack 201, the battery type, and the like. On the basis of this information, the operable time of the mounted battery pack 201 is recognized. The CPU 221 sends this information to the LED display 215 of the battery pack 201 through the interface circuit 219. The LED display 215 displays information such as the charge state of the battery pack 201 mounted in the personal computer main body 217 and the operable time of the mounted battery pack 201.

With this operation, a user can easily recognize, on the LED display 215 provided to the battery pack 201, information such as the charge state of the battery pack 201 mounted in the personal computer main body 217 and the usable time of the mounted battery pack 201.

Eleventh Embodiment

The eleventh embodiment of the present invention will be described below with reference to FIG. 22.

FIG. 22 is a block diagram showing the arrangement of the eleventh embodiment of the present invention.

Referring to FIG. 22, reference numeral 227 denotes a battery pack, and reference numerals 229 through 243 denote constituent elements of the battery pack 227.

Reference numeral 229 denotes a programmable nonvolatile storage unit for storing the information of the battery pack 227. The storage unit 229 is realized by an EEPROM and its read/write access is controlled by a microprocessor 231.

The microprocessor (f COM) 231 (to be also referred to as a battery microcomputer hereinafter) is arranged between the EEPROM 229 and an external signal terminal 239 and controls the EEPROM 229 in accordance with an external instruction. The microprocessor 231 transmits/receives data to/from an equipment, e.g., a personal computer main body, through the external signal terminal 239 while performing predetermined error check.

Reference numeral 233 denotes a reset circuit (RESET) 233 for supplying a power-ON reset signal to the microprocessor 231. Reference numeral 235 denotes an oscillation circuit (OSC) for supplying a clock signal to the microprocessor 231.

Reference numeral 237 denotes an external power supply terminal for applying an operating power to the above-described components (229 through 235). The external signal connecting terminal 239 connects a data transfer path between the microprocessor 231 and the personal computer main body to relay data transferred therebetween. Reference numeral 241 denotes a secondary battery, and reference numeral 243 denotes a charge/discharge terminal of the secondary battery 241.

The operation of the battery pack 227 having the above arrangement will be described.

In the read operation of the EEPROM 229, an operating power is externally supplied to the external power supply terminal 237.

With this operation, the EEPROM 229, the microprocessor 231, the reset circuit 233, the oscillation circuit 235, and the like start to operate.

More specifically, the reset circuit 233 supplies a power-ON reset signal to the microprocessor 231, and the oscillation circuit 235 supplies a clock signal to the microprocessor 231. This signal supply control is generally performed by the peripheral circuits of the microprocessor. These circuits are not substantial constituent elements of the present invention, and a detailed description thereof will be omitted.

The microprocessor 231 performs communication with respect to the external personal computer main body (or a charger having an intelligent function) through the external signal connecting terminal 239 to receive a read instruction and an address (or an instruction code as a combination thereof) from the external personal computer main body.

Figure 86:
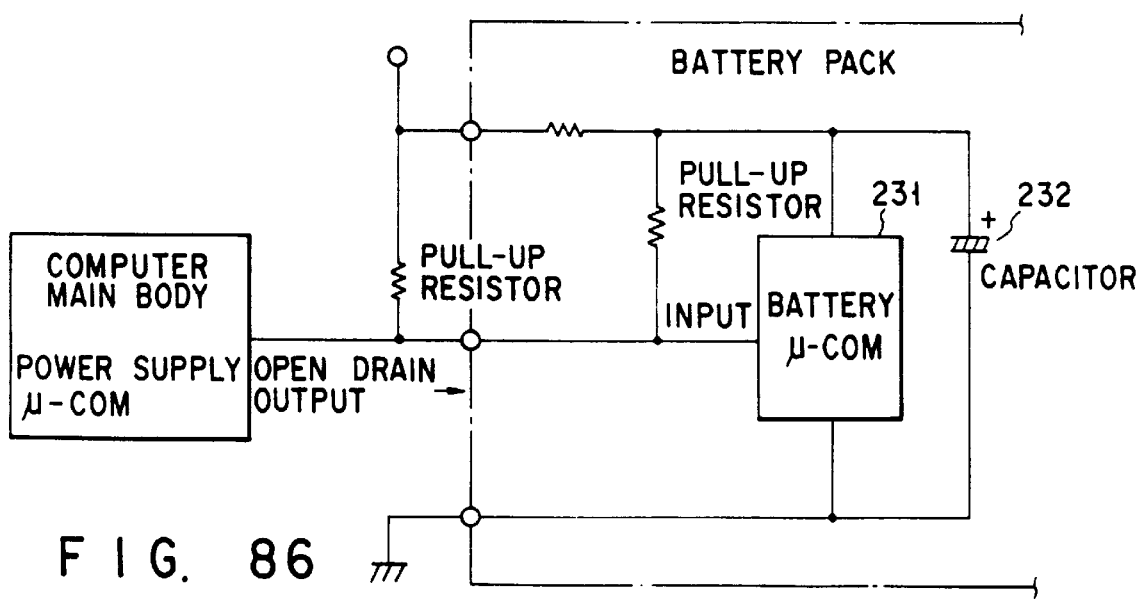
FIG. 86 is a block diagram for explaining a power supply microcomputer output on the conventional computer main body side.
Figure 87:
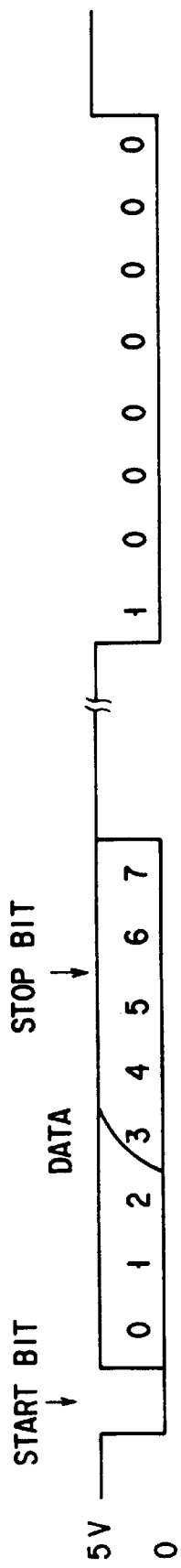
FIG. 87 is a format for explaining a conventional failure in data communication.
Figure 88:
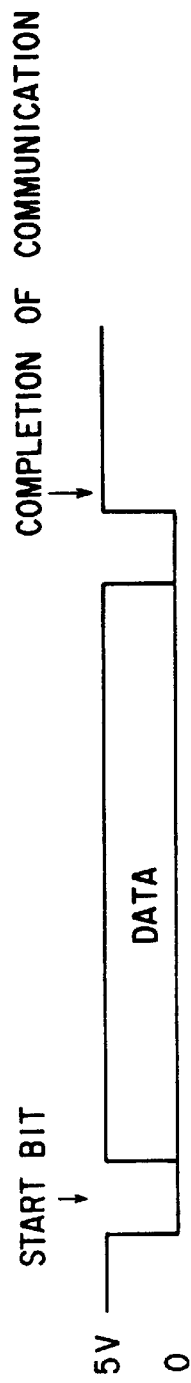
FIG. 88 is a general transmission format in data communication.

In this information exchange, a communication scheme is employed in which a data transmission error caused due to disturbance (static electricity, noise, or the like) can be detected by a control instruction, duplex of input/output data, addition of a parity bit, or the like. This scheme will be described below in detail. Conventionally, in asynchronous communication between the power supply microcomputer on the main body side and the microcomputer in the battery pack, as shown in FIG. 88, a high-level start bit is followed by arbitrary data, and a high-level state follows until communication is completed. Assume that the battery pack is detached during data communication of, e.g., data "3" in FIG. 87. In this case, as shown in FIG. 86, the power supply microcomputer output on the computer main body side is an open-drain output and pulled up by a pull-up resistor. For this reason, as shown in FIG. 87, the voltage increases in accordance with a time constant, and the battery microcomputer 231 recognizes this increase as a stop bit. The battery microcomputer determines that the communication is properly completed and erroneously writes data in the EEPROM 229. To solve this inconvenience, in the communication scheme of this embodiment, if the communication is properly completed, a signal of level "1" representing a stop bit is sent, and thereafter, seven bits of level "0" are sent. Only when seven bits of level "0" are received, the battery microcomputer 231 writes received data in the EEPROM

229. Even if the battery pack is detached during communication, a power supply voltage can be applied by a capacitor 232 during the write access time (e.g., 20 through 30 ms) of the seven bits of level "0".

Upon completion of access of the EEPROM 229, the operating power externally supplied to the external power supply terminal 237 is cut off (stopped). With this operation, the EEPROM 229 becomes inaccessible, and the power consumption of the internal circuit in the battery pack 227 becomes zero.

In the write operation of the EEPROM 229, the operating power is externally applied to the external power supply terminal 237.

With this operation, the EEPROM 229, the microprocessor 231, the reset circuit 233, the oscillation circuit 235, and the like start to operate.

The microprocessor 231 performs communication with respect to the external personal computer main body (or a charger having an intelligent function) through the external signal connecting terminal 239 to receive a write instruction and an address (or an instruction code as a combination thereof) from the external personal computer main body.

The microprocessor 231 outputs a write instruction, an address, and write data to the EEPROM 229 in accordance with the write instruction from the external personal computer main body. With this operation, data is written in the EEPROM 229.

Upon completion of the write operation of the EEPROM 229, the microprocessor 231 informs the result to the external personal computer main body through the external signal connecting terminal 239.

After the predetermined write operation of the EEPROM 229 is completed, the operating power externally applied to the external power supply terminal 237 is cut off (stopped). With this operation, the EEPROM 229 becomes inaccessible, and the power consumption of the internal circuit in the battery pack 227 becomes zero.

As described above, the microprocessor 231 incorporated in the battery pack 227 is arranged for information transmission between the EEPROM 229 incorporated in the battery pack 227 and the external personal computer main body (or a charger having an intelligent function), thereby improving reliability in transmission/reception of a control instruction or input/output data. In addition, the operating power is externally applied to the EEPROM 229, the microprocessor 231, and the like. Therefore, if external access is not needed, this externally supplied power is cut off to reduce the power consumption of the circuit.

Figure 95:
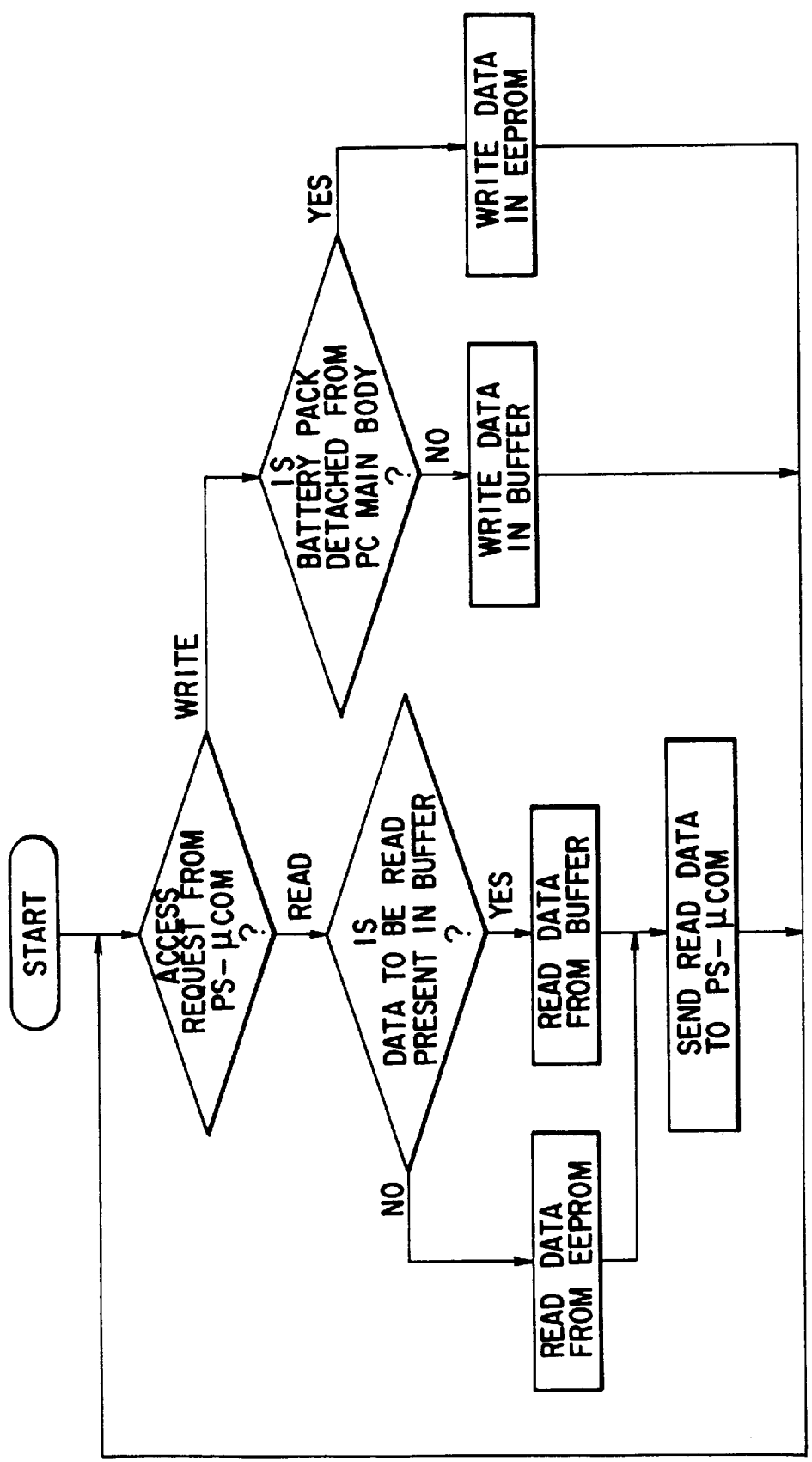
FIG. 95 is a flow chart showing access control to an EEPROM in all the control operations of the battery microcomputer shown in FIG. 22.

As shown in FIG. 22, a buffer 230 is arranged in a RAM in the battery microcomputer 231. The content of the EEPROM 229 is partially copied in the buffer 230. When a read request is output from the power supply microcomputer of the computer main body, and the requested data is present in the buffer 230, the data is read from the buffer 230 without read access of the EEPROM 229, and the readout data is sent to the PC main body. When a write request is output from the PC main body, data is written in the buffer 230 without write access of the EEPROM 229. Data in the buffer 230 may be written in the EEPROM 229 only when the battery pack is detached. With this arrangement, the service life of the EEPROM 229 with a limited number of read/write access cycles can be largely prolonged. FIG. 95 is a flow chart showing access control to the EEPROM by the battery microcomputer 231.

Twelfth Embodiment

FIG. 23 is a block diagram showing the circuit arrangement of the twelfth embodiment of the present invention.

Referring to FIG. 23, reference numeral 245 denotes a battery pack incorporating, e.g., a lithium-ion secondary battery requiring overdischarge protection. Reference numeral 247 denotes a secondary battery incorporated in the battery pack 245. Reference numeral 249 denotes a voltage measuring section for monitoring the battery voltage of the secondary battery 247. The voltage measuring section 249 always monitors the battery voltage of each battery cell constituting the secondary battery 247.

Figure 81:
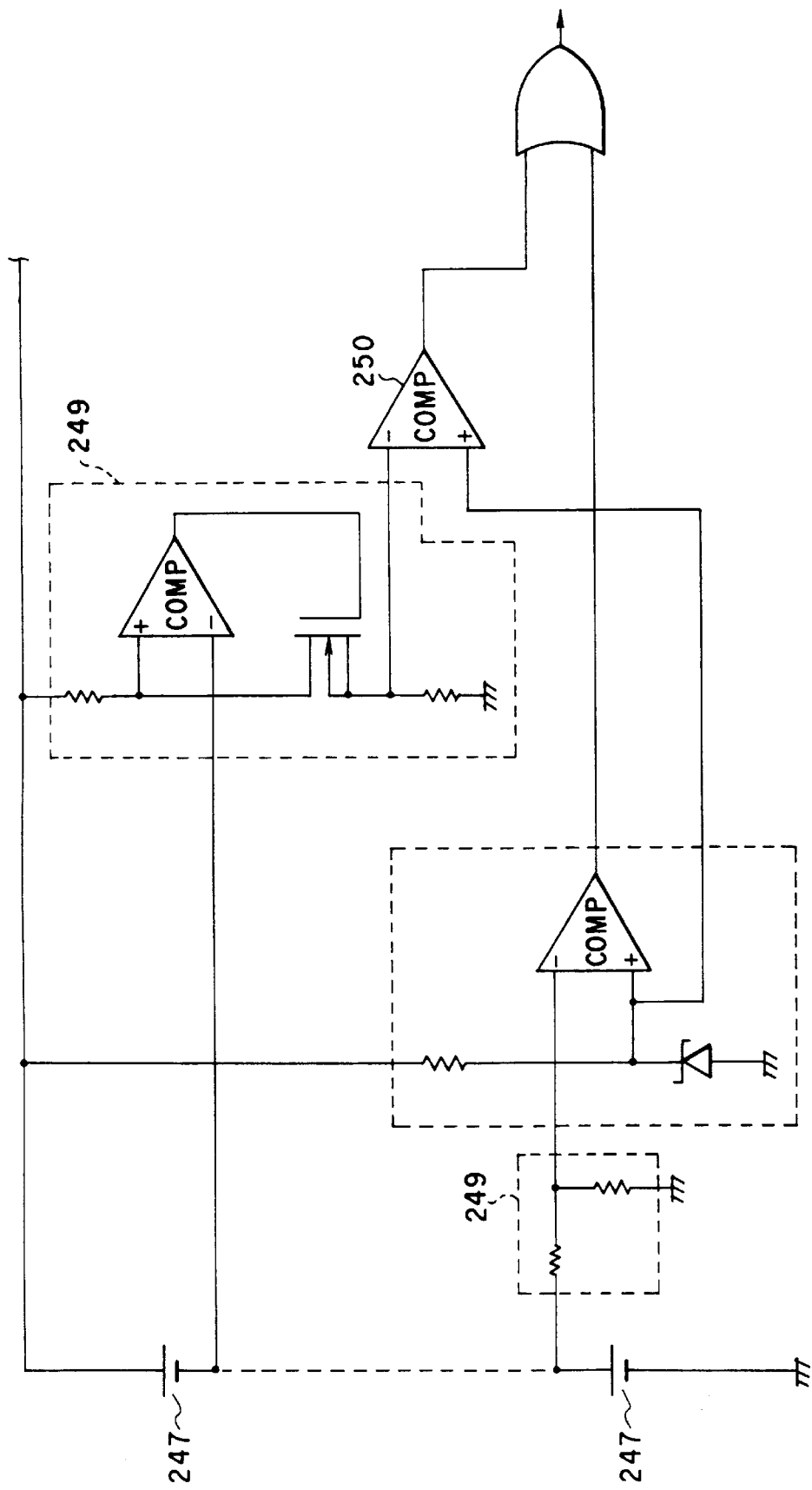
FIG. 81 is a detailed circuit diagram of an overdischarge detector and an overcharge detector shown in FIGS. 23 and 24.

Reference numeral 251 denotes an overdischarge detector for comparing the battery voltage measured by the voltage measuring section 249 with a predetermined overdischarge protection set voltage to detect the overdischarge state of the secondary battery 247. Using the lithium-ion secondary battery characteristics representing that the battery residual capacity is substantially proportional to an open battery voltage, the overdischarge detector 251 outputs an overdischarge detection signal when it is determined that a discharge operation causes a decrease in battery voltage, and the secondary battery 247 is overdischarge. FIG. 81 is a detailed circuit diagram of the overdischarge detector 251.

FIG. 29 is a chart showing a relationship between a discharge voltage at this time and the overdischarge protection set voltage. Referring to FIG. 29, Dv represents a discharge voltage of the secondary battery 247. VS3 represents a low battery detection voltage (applicable voltage) in a normal state. VS4 represents the overdischarge protection set voltage as an object of this embodiment of the present invention.

Reference numeral 253 denotes an overdischarge detection signal output path for externally outputting the detection information of the overdischarge detector 251 from the battery pack 245.

In the above arrangement, the voltage measuring section 249 always monitors the battery voltage of the incorporated secondary battery 247 and supplies the measured voltage to the overdischarge detector 251.

The overdischarge detector 251 compares the battery voltage measured by the voltage measuring section 249 with a predetermined overdischarge protection set voltage. When it is detected that the battery voltage measured by the voltage measuring section 249 becomes lower than the overdischarge protection set voltage, and the secondary battery 247 is set in an overdischarge state, the overdischarge detector 251 immediately externally outputs an overdischarge detection signal representing the overdischarge state of the secondary battery 247 from the battery pack through the overdischarge detection signal output path 253.

More specifically, the overdischarge detector 251 uses the lithium-ion secondary battery characteristics representing that a battery residual capacity is substantially proportional to the open battery voltage. Assume that it is determined that the battery voltage of the secondary battery 247 decreases with progress of the discharge operation to overdischarge the secondary battery 247. At this time, the overdischarge detector 251 outputs the overdischarge detection signal onto the overdischarge detection signal output path 253, thereby externally informing the overdischarge state of the secondary battery 247.

When the overdischarge detection signal is received from the battery pack 245, an equipment, e.g., a personal computer using the battery pack 245 as an operating power supply informs a user of the overdischarge state of the battery pack in use (or power supply abnormality) by a display, sound, or the like. At the same time, the personal computer executes predetermined termination processing to normally end the processing and perform termination processing according to a predetermined sequence such that the discharge path of the battery pack 245 is disconnected.

As described above, a function circuit for immediately externally outputting the overdischarge state of the incorporated secondary battery 247 is arranged in the battery pack 245. With this arrangement, normal termination of the equipment operated by the battery pack 245 can always be performed, thereby keeping the normal state of the equipment. At the same time, overdischarge protection of the incorporated secondary battery 247 can be performed to prevent a shortened battery service life.

In addition, as an incorporated protection circuit, only a circuit for detecting the overdischarge state of the secondary battery 247 is arranged in the battery pack 245. For this reason, the number of components of the incorporated protection circuit can be reduced to minimize the volume of the battery pack. At the same time, a low cost and facilitation of maintenance can be achieved.

Thirteenth Embodiment

FIG. 24 is a block diagram showing the circuit arrangement of the thirteenth embodiment of the present invention.

Referring to FIG. 24, reference numeral 255 denotes a battery pack incorporating, e.g., a lithium-ion secondary battery requiring overcharge protection. Reference numeral 257 denotes a secondary battery incorporated in the battery pack 255. Reference numeral 259 denotes a voltage measuring section for monitoring the battery voltage of the secondary battery 257. The voltage measuring section 259 always monitors the battery voltage of each battery cell constituting the secondary battery 257.

Reference numeral 261 denotes an overcharge detector for comparing the battery voltage measured by the voltage measuring section 259 with a predetermined overcharge protection set voltage to detect the overcharge state of the secondary battery 257. Using the lithium-ion secondary battery characteristics representing that the battery charge capacity is substantially proportional to an open battery voltage, the overcharge detector 261 outputs an overcharge detection signal when it is determined that a charge operation causes an increase in battery voltage, and the secondary battery 257 is overcharged. The detailed circuit diagram of the overcharge detector is the same as that of the overdischarge detector shown in FIG. 81. However, comparators 248 and 250 shown in FIG. 81 are reversed in input polarity as compared to the overdischarge detector.

FIG. 28 is a chart showing a relationship between a charge voltage at this time and the overcharge protection set voltage. Referring to FIG. 28, Cv represents a charge voltage of the secondary battery 257. VS1 represents an overcharge protection set voltage as a subject of this embodiment of the present invention. VS2 represents a constant voltage charge set voltage (switch set voltage for switching a constant current charge operation to a constant voltage charge operation) in a normal state.

Reference numeral 263 denotes an overcharge detection signal output path for externally outputting the detection information of the overcharge detector 261 from the battery pack 255.

In the above arrangement, the voltage measuring section 259 always monitors the battery voltage of the incorporated secondary battery 257 and supplies the measured voltage to the overcharge detector 261.

The overcharge detector 261 compares the battery voltage measured by the voltage measuring section 259 with a predetermined overcharge protection set voltage. When it is detected that the battery voltage measured by the voltage measuring section 259 becomes higher than the overcharge protection set voltage, and the secondary battery 257 is set in an overcharge state, the overcharge detector 261 immediately externally outputs an overcharge detection signal representing the overcharge state of the secondary battery 257 from the battery pack through the overcharge detection signal output path 263.

More specifically, the overcharge detector 261 uses the lithium-ion secondary battery characteristics representing that the battery charge capacity is substantially proportional to the open battery voltage. Assume that it is determined that the battery voltage of the secondary battery 257 increases with progress of the charge operation to cause overcharge of the secondary battery 257. At this time, the overcharge detector 261 outputs the overcharge detection signal onto the overcharge detection signal output path 263, thereby externally informing the overcharge state of the secondary battery 257.

When the overcharge detection signal is received from the battery pack 255, an equipment, e.g., a personal computer using the battery pack 255 as an operating power supply informs a user of the overcharge state of the battery pack in use (or power supply abnormality) by a display, sound, or the like. At the same time, the personal computer executes predetermined termination processing to normally end the processing and perform termination processing according to a predetermined sequence such that the charge path of the battery pack 255 is disconnected.

As described above, a function circuit for immediately externally outputting the overcharge state of the incorporated secondary battery 257 is arranged in the battery pack 255. With this arrangement, normal termination of the equipment operated by the battery pack 255 can always be performed, thereby keeping the normal state of the equipment. At the same time, overcharge protection of the incorporated secondary battery 257 can be performed to prevent a shortened battery service life, abnormal heat generation, destruction, and the like.

In addition, as an incorporated protection circuit, only a circuit for detecting the overcharge state of the secondary battery 257 is arranged in the battery pack 255. For this reason, the number of components of the incorporated protection circuit can be reduced to minimize the volume of the battery pack. At the same time, a low cost and facilitation of maintenance can be achieved.

Fourteenth Embodiment

FIG. 25 is a block diagram showing the circuit arrangement of the fourteenth embodiment of the present invention.

Referring to FIG. 25, reference numeral 265 denotes a battery pack incorporating, e.g., a lithium-ion secondary battery requiring overdischarge protection. Reference numeral 267 denotes a secondary battery incorporated in the battery pack 265. Reference numeral 269 denotes a voltage measuring section for monitoring the battery voltage of the secondary battery 267. The voltage measuring section 269 always monitors the battery voltage of each battery cell constituting the secondary battery 267.

Reference numeral 271 denotes an overdischarge detector for comparing the battery voltage measured by the voltage measuring section 269 with a predetermined overdischarge protection set voltage (see VS4 in FIG. 29) to detect the overdischarge state of the secondary battery 267. Using the lithium-ion secondary battery characteristics representing that the battery residual capacity is substantially proportional to an open battery voltage, the overdischarge detector 271 outputs an overdischarge detection signal when it is determined that a discharge operation causes a decrease in battery voltage, and the secondary battery 267 is overdischarge. In this embodiment, the overdischarge detector 271 outputs two overdischarge detection signals (c1 and c2) with a predetermined time lag (e.g., 500 ms). After the overdischarge detection signal (c1) is output, the overdischarge detection signal (c2) is output.

Reference numeral 273 denotes a discharge stop switch, provided outside the battery pack 265, for disconnecting the discharge path. The discharge stop switch 273 is ON/OFF-controlled in accordance with the overdischarge detection signal (c2) output from the overdischarge detector 271.

Reference numeral 275 denotes an overdischarge detection signal output path for externally outputting the overdischarge detection signals (c1 and c2) output from the overdischarge detector 271 from the battery pack 265.

In the above arrangement, the voltage measuring section 269 always monitors the battery voltage of the incorporated secondary battery 267 and supplies the measured voltage to the overdischarge detector 271.

The overdischarge detector 271 compares the battery voltage measured by the voltage measuring section 269 with a predetermined overdischarge protection set voltage (see VS4 in FIG. 29). When it is detected that the battery voltage measured by the voltage measuring section 269 becomes lower than the overdischarge protection set voltage, and the secondary battery 267 is set in an overdischarge state, the overdischarge detector 271 immediately externally outputs the overdischarge detection signals (c1 and c2) representing the overdischarge state of the secondary battery 267 from the battery pack through the overdischarge detection signal output path 275.

More specifically, the overdischarge detector 271 uses the lithium-ion secondary battery characteristics representing that the battery residual capacity is substantially proportional to the open battery voltage. Assume that it is determined that the battery voltage of the secondary battery 257 increases with progress of the discharge operation to cause overdischarge of the secondary battery 267. At this time, the overdischarge detector 271 outputs the overdischarge detection signals (c1 and c2) onto the overdischarge detection signal output path 275, thereby externally informing the overdischarge state of the secondary battery 31.

Of the overdischarge detection signals (c1 and c2) output from the overdischarge detector 271, the overdischarge detection signal (c1) which is previously output is supplied to an equipment, e.g., a personal computer using the battery pack 265. The overdischarge detection signal (c2) which is subsequently output with a predetermined time lag (e.g., 500 ms) is supplied to the discharge stop switch 273 arranged midway along the discharge path outside the battery pack 265.

When the overdischarge detection signal (c1) is received from the battery pack 265, the equipment, e.g., the personal computer using the battery pack 265 as an operating power supply recognizes the overdischarge state of the battery pack in use. The personal computer informs a user of this information by a display, sound, or the like, and at the same time, executes predetermined termination processing to normally end the processing.

The overdischarge detection signal (c2) is output from the battery pack 265 with a time lag corresponding to a time necessary for this normal termination processing and supplied to the discharge stop switch 273.

In addition, upon reception of the overdischarge detection signal (c2) from the battery pack 273, the discharge stop switch 34 disconnects the discharge path of the battery pack 265 to stop the discharge operation.

As described above, a function circuit for immediately externally outputting the overdischarge state of the incorporated secondary battery 267 is arranged in the battery pack 265, and the discharge stop switch 273 for realizing overdischarge protection is arranged outside the battery pack 265. With this arrangement, normal termination of the equipment operated by the battery pack 265 can always be performed, thereby keeping the normal state of the equipment. At the same time, overdischarge protection of the incorporated secondary battery 267 can be performed to prevent a shortened battery service life.

In addition, as an incorporated protection circuit, only a circuit for detecting the overdischarge state of the secondary battery 267 is arranged in the battery pack 265. For this reason, the number of components of the incorporated protection circuit can be reduced to minimize the volume of the battery pack. At the same time, a low cost and facilitation of maintenance can be achieved.

Fifteenth Embodiment

FIG. 26 is a block diagram showing the circuit arrangement of the fifteenth embodiment of the present invention.

Referring to FIG. 26, reference numeral 277 denotes a battery pack incorporating, e.g., a lithium-ion secondary battery requiring overcharge protection. Reference numeral 279 denotes a secondary battery incorporated in the battery pack 277. Reference numeral 281 denotes a voltage measuring section for monitoring the battery voltage of the secondary battery 279. The voltage measuring section 269 always monitors the battery voltage of each battery cell constituting the secondary battery 279.

Reference numeral 283 denotes an overcharge detector for comparing the battery voltage measured by the voltage measuring section 281 with a predetermined overcharge protection set voltage (see VS1 in FIG. 28) to detect the overcharge state of the secondary battery 279. Using the lithium-ion secondary battery characteristics representing that the battery charge capacity is substantially proportional to an open battery voltage, the overcharge detector 283 outputs an overcharge detection signal when it is determined that a charge operation causes an increase in battery voltage, and the secondary battery 279 is overcharged. In this embodiment, the overcharge detector 283 outputs two overcharge detection signals (ca and cb) with a predetermined time lag (e.g., 500 ms). After the overcharge detection signal (ca) is output, the overcharge detection signal (cb) is output.

Reference numeral 285 denotes a charge stop switch, provided outside the battery pack 277, for disconnecting the charge path. The charge stop switch 285 is ON/OFF-controlled in accordance with the overcharge detection signal (cb) output from the overcharge detector 283.

Reference numeral 287 denotes an overcharge detection signal output path for externally outputting the overcharge detection signals (ca and cb) output from the overcharge detector 283 from the battery pack 277.

In the above arrangement, the voltage measuring section 281 always monitors the battery voltage of the incorporated secondary battery 279 and supplies the measured voltage to the overcharge detector 283.

The overcharge detector 283 compares the battery voltage measured by the voltage measuring section 281 with a predetermined overcharge protection set voltage (see VS1 in FIG. 28). When it is detected that the battery voltage measured by the voltage measuring section 281 becomes higher than the overcharge protection set voltage, and the secondary battery 279 is set in an overcharge state, the overcharge detector 283 immediately externally outputs the overcharge detection signals (ca and cb) representing the overcharge state of the secondary battery 279 through the overcharge detection signal output path 287.

More specifically, the overcharge detector 283 uses the lithium-ion secondary battery characteristics representing that the battery residual capacity is substantially proportional to the open battery voltage. Assume that it is determined that the battery voltage of the secondary battery 279 decreases with progress of the charge operation to cause overcharge of the secondary battery 279. At this time, the overcharge detector 283 outputs the overdischarge detection signals (ca and cb) onto the overcharge detection signal output path 287, thereby externally informing the overcharge state of the secondary battery 279.

Of the overcharge detection signals (ca and cb) output from the overcharge detector 283, the overcharge detection signal (ca) which is previously output is supplied to an equipment, e.g., a personal computer using the battery pack 277. The overcharge detection signal (cb) which is subsequently output with a predetermined time lag (e.g., 500 ms) is supplied to the charge stop switch 285 arranged midway along the charge path outside the battery pack 277.

When the overcharge detection signal (ca) is received from the battery pack 277, the equipment, e.g., the personal computer using the battery pack 277 as an operating power supply recognizes the overcharge state of the battery pack in use. The personal computer informs a user of this information by a display, sound, or the like, and at the same time, executes predetermined termination processing to normally end the processing.

The overcharge detection signal (cb) is output from the battery pack 277 with a time lag corresponding to a time necessary for this normal termination processing and supplied to the charge stop switch 285.

In addition, upon reception of the overcharge detection signal (cb) from the battery pack 277, the charge stop switch 44 disconnects the charge path of the battery pack 277 to stop the charge operation.

As described above, a function circuit for immediately externally outputting the overcharge state of the incorporated secondary battery 279 is arranged in the battery pack 277, and the charge stop switch 285 for realizing overcharge protection is arranged outside the battery pack 277. With this arrangement, normal termination of the equipment operated by the battery pack 265 can always be performed, thereby keeping the normal state of the equipment. At the same time, overcharge protection of the incorporated secondary battery 279 can be performed to prevent a shortened battery service life, abnormal heat generation, destruction, and the like.

In addition, as an incorporated protection circuit, only a circuit for detecting the overcharge state of the secondary battery 279 is arranged in the battery pack 277. For this reason, the number of components of the incorporated protection circuit can be reduced to minimize the volume of the battery pack. At the same time, a low cost and facilitation of maintenance can be achieved.

Sixteenth Embodiment

FIG. 27 is a block diagram showing the circuit arrangement of the sixteenth embodiment of the present invention.

Referring to FIG. 27, reference numeral 289 denotes a battery pack incorporating, e.g., a lithium-ion secondary battery requiring overcharge protection. Reference numeral 291 denotes a secondary battery incorporated in the battery pack 289. Reference numeral 293 denotes a voltage measuring section for monitoring the battery voltage of the secondary battery 291. The voltage measuring section 293 always monitors the battery voltage of each battery cell constituting the secondary battery 291.

Reference numeral 295 denotes an overcharge/overdischarge detector for comparing the battery voltage measured by the voltage measuring section 293 with a predetermined overcharge/overdischarge protection set voltage (see VS1 in FIG. 28 and VS4 in FIG. 29) to detect the overcharge/overdischarge state of the secondary battery 291. Using the lithium-ion secondary battery characteristics representing that the battery charge capacity and the battery residual capacity are substantially proportional to an open battery voltage, the overcharge/overdischarge detector 295 outputs an overcharge detection signal when it is determined that a charge operation causes an increase in battery voltage, and the secondary battery 291 is overcharged. The overcharge/overdischarge detector 295 outputs an overdischarge detection signal when it is determined that a discharge operation causes a decrease in battery voltage, and the secondary battery 291 is overdischarge.

Reference numeral 297 denotes a current limit switch ON/OFF-controlled in accordance with an overcharge detection signal output from the overcharge/overdischarge detector 295 upon detection of an overcharge state. The current limit switch 297 is arranged midway along the current path of a heat generating element 299.

The heat generating element 299 receives the power of the secondary battery 291 through the current limit switch 297. When the current limit switch 297 is turned on, the heat generating element 299 generates heat due to the power of the secondary battery 291, thereby fusing a fuse section arranged near the heat generating element 299.

Reference numeral 301 denotes a fuse section arranged midway along the charge path of the secondary battery 291 and mechanically fused upon heat generation of the heat generating element 299. When the fuse section 301 is fused, the charge path of the secondary battery 291 is disconnected.

Reference numeral 303 denotes an overcharge/overdischarge detection signal output path to be simply referred to as a detection signal output path) for externally outputting the overcharge detection signal, the overdischarge detection signal, and the like, which are output from the overcharge/overdischarge detector 295.

In the above arrangement, the voltage measuring section 293 always monitors the battery voltage of the incorporated secondary battery 291 and supplies the measured voltage to the overcharge/overdischarge detector 295.

The overcharge/overdischarge detector 295 compares the battery voltage measured by the voltage measuring section 293 with a predetermined overcharge protection set voltage (see VS1 in FIG. 28) and a predetermined overdischarge protection set voltage (see VS4 in FIG. 29). When it is detected that the battery voltage measured by the voltage measuring section 293 becomes higher than the overcharge protection set voltage, and the secondary battery 291 is set in an overcharge state, the overcharge/overdischarge detector 295 immediately externally outputs the overcharge detection signals representing the overcharge state of the secondary battery 291 through the detection signal output path 303. When it is detected that the battery voltage measured by the voltage measuring section 293 becomes lower than the overdischarge protection set voltage, and the secondary battery 291 is set in an overdischarge state, the overcharge/overdischarge detector 295 immediately externally outputs the overdischarge detection signal representing the overdischarge state of the secondary battery 291 through the detection signal output path 303.

When the overcharge/overdischarge detector 295 detects the overcharge state of the secondary battery 291 and outputs the overcharge detection signal, the current limit switch 297 is turned on in accordance with the overcharge detection signal. The power of the secondary battery 291 is applied to the heat generating element 299, and the heat generating element 299 generates heat, thereby fusing the fuse section 301 arranged near the heat generating element 299.

In a normal state (nonfused state), the fuse section 301 is arranged midway along the charge path of the secondary battery 291 to form the charge current path in the battery pack. However, when the fuse section 301 is fused, the charge path in the battery pack is cut off (disconnected).

Figure 30:
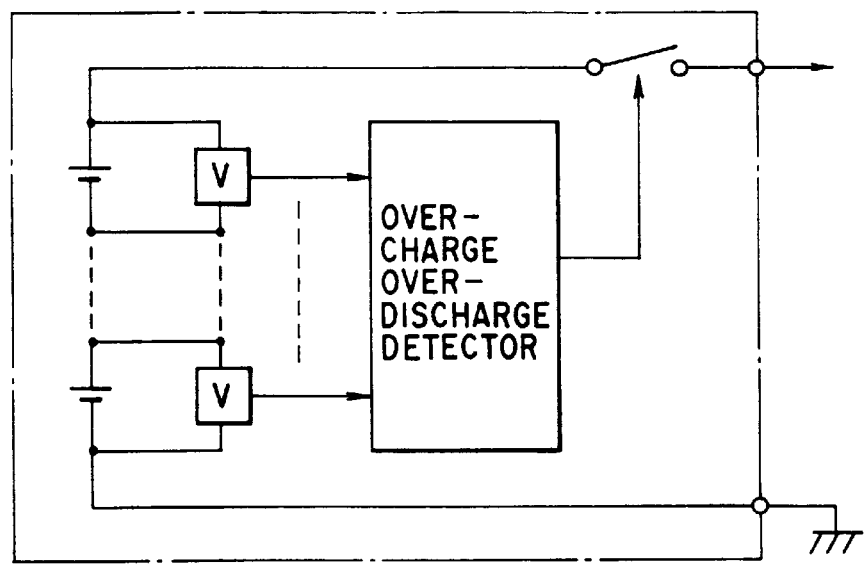
FIG. 30 is a block diagram showing the arrangement of a conventional battery pack in the twelfth through sixteenth embodiments.

Unlike a conventional battery pack shown in FIG. 30, which has only a charge/discharge terminal and a ground terminal, the battery pack of this embodiment immediately externally informs a battery abnormality due to overdischarge/overcharge of the incorporated secondary battery. At the same time, upon detection of the overcharge state, the charge path in the pack is disconnected, and the battery back itself performs overcharge protection of the incorporated secondary battery. Therefore, normal termination of an equipment operated by the battery pack 289 can always be performed, thereby keeping the normal state of the equipment. At the same time, overcharge protection of the incorporated secondary battery 291 can be performed to prevent a shortened battery service life, abnormal heat generation, destruction, and the like.

Seventeenth Embodiment

The seventeenth embodiment of the present invention will be described below with reference to FIGS. 31 through 37B.

FIG. 31 is a circuit diagram showing the arrangement of the seventeenth embodiment (1) of the present invention.

Referring to FIG. 31, reference numeral 309 denotes a constant voltage constant current source. The constant voltage constant current source 309 has an output current limit function according to a predetermined current limit value (Icc) of the power supply.

Reference numeral 311 denotes a switch (SW1) arranged midway along a charge current path between the power supply output terminal of the constant voltage constant current source 309 and a secondary battery (Batt1) 319. Reference numeral 313 denotes a switch (SW2) arranged midway along a series regulation control signal path of a secondary battery (Batt2) 321. The switches (SW1 and SW2) 311 and 313 are ON/OFF-controlled in accordance with a control signal (CSa) output from a power supply controller (not shown). The switches (SW1 and SW2) 311 and 313 are turned on at the start of the charge operation of the secondary battery (Batt1) 319 and off in a full charge state.

Reference numeral 315 denotes a switch (SW3) arranged midway along a charge current path between the power supply output terminal of the constant voltage constant current source 309 and the secondary battery (Batt2) 321. The switch (SW3) 315 is ON/OFF-controlled in accordance with a control signal (CSb) output from the power supply controller (not shown). The switch (SW3) 315 is turned on in the full charge state of the secondary battery (Batt1) 319 and off in the full charge state of the secondary battery (Batt2) 321.

Reference numeral 317 denotes a transistor (TR1) for performing series regulation of a charge current. When the switch (SW2) 313 is in an ON state, the transistor (TR1) 317 performs series regulation of the charge current of the secondary battery (Batt2) 321 in accordance with an output from an amplifier (Error Amp) 329.

The secondary batteries (Batt1 and Batt2) 319 and 321 serve as the battery power supply of a portable computer main body. In this embodiment, a lithium-ion battery (cell or battery set) is used. In accordance with the control signals (CSa and CSb) from the charge controller, in a charge operation, the secondary battery (Batt1) 319 is previously charged, and then, the secondary battery (Batt2) 321 is charged.

Reference numerals 323 and 325 denote battery voltage sense circuits for detecting the voltages of the secondary batteries (Batt1 and Batt2) 319 and 321, respectively. The battery voltages detected by the battery voltage sense circuits 323 and 325 are fed back to the constant voltage constant current source 309 and used for battery voltage control during the charge operation.

Reference numeral 327 denotes a fixed resistor (RS) for detecting a current supplied from the power supply. A voltage generated across the fixed resistor (RS) 327 is input to the amplifier (Error Amp) 329 together with a reference voltage (VREF) 331.

The amplifier (Error Amp) 329 performs series regulation of the secondary battery (Batt2) 321. The amplifier (Error Amp) 329 performs series regulation of the secondary battery (Batt2) 321 such that the voltage generated across the fixed resistor (RS) 327 is equalized with the reference voltage (VREF) 331.

The reference voltage (VREF) 331 generates a reference voltage compared with the voltage generated in the fixed resistor (RS) 327.

The operation of the seventeenth embodiment (1) shown in FIG. 31 will be described with reference to FIGS. 35 through 37B.

Figures 33, 35:
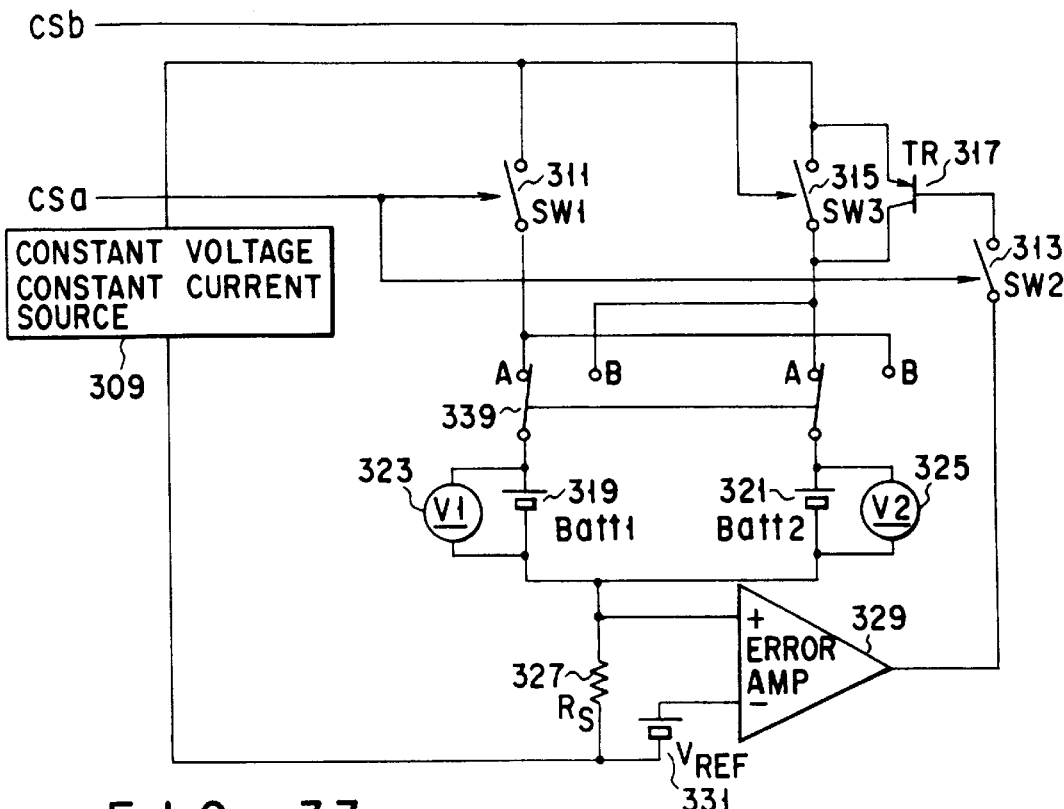
FIG. 33 is a circuit diagram showing an arrangement according to the seventeenth embodiment (3) of the present invention.
FIG. 35 is a table showing charge sequence steps of two secondary batteries in correspondence with each other in the seventeenth embodiment (1), (2), (3), or (4)

FIG. 35 is a table showing charge sequence steps of the two secondary batteries (Batt1 and Batt2) 319 and 321 in correspondence with each other. Numbers in brackets correspond to the charge operation timings shown in FIGS. 37A and 37B. Referring to FIG. 35, "CC" represents a constant current charge period, and "CV" represents a constant voltage charge period.

FIGS. 36A through 37B are charts for explaining the charge operation of the two secondary batteries (Batt1 and Batt2) 319 and 321 of the seventeenth embodiment (1), (2), (3), or (4) in correspondence with that in a prior art. FIGS. 36A and 36B show the charge operation in the prior art, and FIGS. 37A and 37B show the charge operation according to the seventeenth embodiment (1), (2), (3), or (4) of the present invention. Referring to FIGS. 36A through 37B, Icc represents the current limit value of the constant voltage constant current source 309, IHC represents a load current limit value, and IFC represents a full charge current value.

In the arrangement of the seventeenth embodiment (1) shown in FIG. 31, the charge priority of the two secondary batteries (Batt1 and Batt2) 319 and 321 is fixed. In this embodiment, the secondary battery Batt1) 319 is charged previously (preferentially).

When the switches (SW1 and SW2) 311 and 313 are turned on in accordance with the control signal (CSa), the charge operation of the secondary battery (Batt1) 319 to be previously charged is started. The charge operation at this time is constant current charge (CC) according to the current limit value Icc of the constant voltage constant current source 309. When the load current limit value (IHC) is set as follows, the amplifier (Error Amp) 329 outputs a signal to the transistor (TR1) 317 not to charge the secondary battery (Batt2) 321.

More specifically, the load current limit value (IHC) is set to satisfy [Icc>VREF (reference voltage 331)/RS (fixed resistor 327)=IHC]. In this case, in the constant current charge operation of the secondary battery (Batt1) 319, no gate signal of a level for flowing the charge current through the secondary battery (Batt2) 321 through the transistor (TR1) 317 is output.

When the charge operation of the secondary battery (Batt1) 319 continues until the operation is shifted to the constant voltage mode, the charge current decreases in accordance with the battery characteristics. When the charge current reaches the load current limit value (IHC), the amplifier (Error Amp) 329 performs series regulation of the transistor (TR1) 317 such that the voltage drop at the fixed resistor (RS) 327 is equalized with the reference voltage (VREF) 331, i.e., the sum of the charge currents of the secondary batteries (Batt1 and Batt2) 319 and 321 becomes the load current limit value (IHC).

That is, when the two secondary batteries (Batt1 and Batt2) 319 and 321 are charged in parallel, the current supplied from the constant voltage constant current source 309 is always IHC, and the secondary battery (Batt2) 321 is charged in an amount corresponding to a decrease in charge current of the secondary battery (Batt2) 319. In addition, since [Icc>IHC], and the constant voltage constant current source 309 is operated in the constant voltage mode because of its characteristics, the potential of the secondary battery (Batt1) 319 does not decrease.

The battery voltage sense circuit 323 detects the voltage of the secondary battery (Batt1) 319 and feeds back the voltage to the constant voltage constant current source 309, thereby accurately controlling the battery voltage during the charge operation.

When the secondary battery (Batt1) 319 is set in a full charge state, the switches (SW1 and SW2) 311 and 313 are turned off in accordance with the control signal (CSa), and the switch (SW3) 315 is turned on in accordance with the control signal (CSb). With this operation, the secondary battery (Batt2) 321 is charged with a constant current.

With such charge control, the extra power of the constant voltage constant current source 309 can be effectively utilized to temporarily and simultaneously charge a plurality of battery packs. As is apparent from correspondences between FIGS. 36A and 36B and between FIGS. 37A and 37B, the total charge time of the two secondary batteries (Batt1 and Batt2) 319 and 321 can be shortened.

Figure 32:
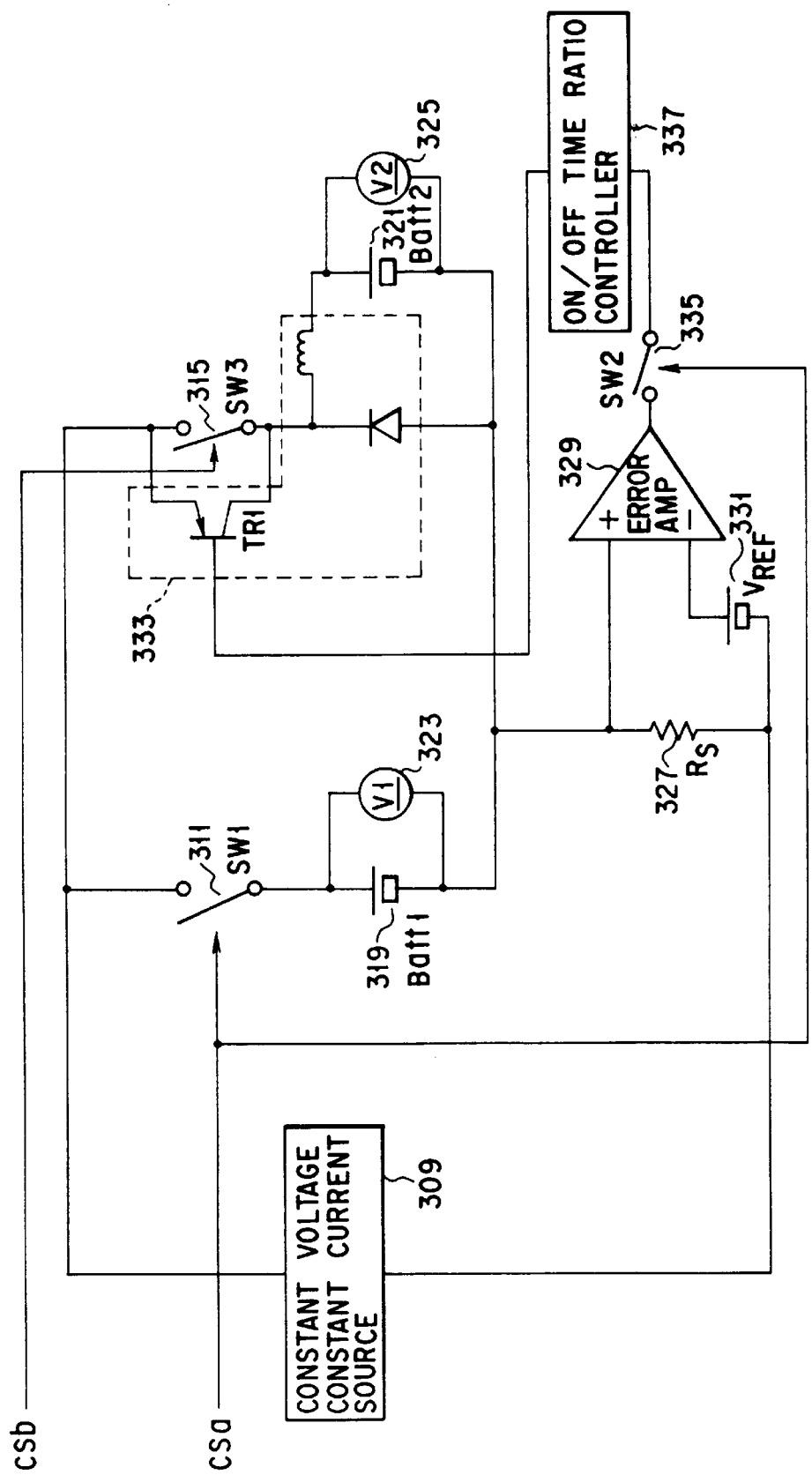
FIG. 32 is a circuit diagram showing an arrangement according to the seventeenth embodiment (2) of the present invention.

FIG. 32 is a circuit diagram showing the arrangement of the seventh embodiment (2) of the present invention.

Referring to FIG. 32, reference numeral 309 denotes a constant voltage constant current source. The constant voltage constant current source 309 has an output current limit function according to a predetermined current limit value (Icc) of the power supply.

Reference numeral 311 denotes a switch (SW1) arranged midway along a charge current path between the power supply output terminal of the constant voltage constant current source 309 and a secondary battery (Batt1) 319. The switch (SW1) 311 is ON/OFF-controlled in accordance with a control signal (CSa) output from a power supply controller (not shown) and turned on at the start of the charge operation of the secondary battery (Batt1) 319 and off in a full charge state.

Reference numeral 315 denotes a switch (SW3) arranged midway along a charge current path between the power supply output terminal of the constant voltage constant current source 309 and a secondary battery (Batt2) 321. The switch (SW3) 315 is ON/OFF-controlled in accordance with a control signal (CSb) output from the power supply controller (not shown). The switch (SW3) 315 is turned on in the full charge state of the secondary battery (Batt1) 319 and off in the full charge state of the secondary battery (Batt2) 321.

The secondary batteries (Batt1 and Batt2) 319 and 321 serve as the battery power supply of a portable computer main body. In this embodiment, a lithium-ion battery (cell or battery set) is used. In accordance with the control signals (CSa and CSb) from the charge controller, in a charge operation, the secondary battery (Batt1) 319 is previously charged, and then, the secondary battery (Batt2) 321 is charged.

Reference numerals 323 and 325 denote battery voltage sense circuits for detecting the voltages of the secondary batteries (Batt1 and Batt2) 319 and 321, respectively. The battery voltages detected by the battery voltage sense circuits 323 and 325 are fed back to the constant voltage constant current source 309 and used for battery voltage control during the charge operation.

Reference numeral 327 denotes a fixed resistor (RS) for detecting a current supplied from the power supply. A voltage generated across the fixed resistor (RS) 327 is input to an amplifier (Error Amp) 329 together with a reference voltage (VREF) 331.

The amplifier (Error Amp) 329 receives the voltage generated across the fixed resistor (RS) 327 and the reference voltage (VREF) 331 and differentially amplifies them. The amplifier (Error Amp) 329 controls an ON/OFF time ratio controller 337 such that the voltage generated across the fixed resistor (RS) 327 is equalized with the reference voltage (VREF) 331.

The reference voltage (VREF) 331 generates a reference voltage compared with the voltage generated in the fixed resistor (RS) 327.

Reference numeral 333 denotes a DC-DC converter. The DC-DC converter 333 turns on/off a transistor (TR1) in accordance with an output from the ON/OFF time ratio controller 337 and performs switching regulation of the charge current of the secondary battery (Batt2) 321.

Reference numeral 335 denotes a switch (SW2) arranged midway along a signal path between the amplifier (Error Amp) 329 and the ON/OFF time ratio controller 337. The switch (SW2) 335 is ON/OFF-controlled in accordance with the control signal (CSa). The switch (SW2) 335 is turned on at the start of the charge operation of the secondary battery (Batt1) 319 and off in the full charge state.

The ON/OFF time ratio controller 337 controls the ON/OFF time ratio of the DC-DC converter 333 in accordance with an output from the amplifier (Error Amp) 329.

The operation of the seventeenth embodiment (2) shown in FIG. 32 will be described.

Also in the arrangement of the seventeenth embodiment (2) shown in FIG. 32, as in the seventeenth embodiment (1) shown in FIG. 31, the charge priority of the two secondary batteries (Batt1 and Batt2) 319 and 321 is fixed. In this embodiment, the secondary battery (Batt1) 319 is charged previously (preferentially).

When the switches (SW1 and SW2) 311 and 335 are turned on in accordance with the control signal (CSa), the charge operation of the secondary battery (Batt1) 319 to be previously charged is started. The charge operation at this time is constant current charge (CC) according to the current limit value Icc of the constant voltage constant current source 309.

When a load current limit value (IHC) is set to satisfy [Icc>VREF (reference voltage 331)/RS (fixed resistor 327)= IHC], the amplifier (Error Amp) 329 outputs a signal to the ON/OFF time ratio controller 337 not to charge the secondary battery (Batt2) 321. That is, in the constant current charge operation of the secondary battery (Batt1) 319, no signal for switching the transistor (TR1) of the DC-DC converter 333 is output.

When charge operation of the secondary battery (Batt1) 319 continues until the operation is shifted to the constant voltage mode, the charge current decreases in accordance with the battery characteristics. When the charge current reaches the load current limit value (IHC), the amplifier (Error Amp) 329 outputs a control signal to the ON/OFF time ratio controller 337 such that the voltage drop at the fixed resistor (RS) 327 is equalized with the reference voltage (VREF) 331, i.e., the current supplied from the constant voltage constant current source 309 becomes the load current limit value (IHC).

In accordance with the control signal output from the amplifier (Error Amp) 329, the ON/OFF time ratio controller 337 performs switching regulation of the DC-DC converter 333.

That is, when the two secondary batteries (Batt1 and Batt2) 319 and 321 are charged in parallel, the current supplied from the constant voltage constant current source 309 is always IHC, and the secondary battery (Batt2) 321 is charged in an amount corresponding to a decrease in charge current of the secondary battery (Batt2) 319. In addition, since [Icc>IHC], and the constant voltage constant current source 309 is operated in the constant voltage mode because of its characteristics, the potential of the secondary battery (Batt1) 319 does not decrease.

The battery voltage sense circuit 323 detects the voltage of the secondary battery (Batt1) 319 and feeds back the voltage to the constant voltage constant current source 309, thereby accurately controlling the battery voltage during the charge operation.

When the secondary battery (Batt1) 319 is set in a full charge state, the switches (SW1 and SW2) 311 and 335 are turned off in accordance with the control signal (CSa), and the switch (SW3) 315 is turned on in accordance with the control signal (CSb). With this operation, the secondary battery (Batt2) 321 is charged with a constant current.

With such charge control, the extra power of the constant voltage constant current source 309 can be effectively utilized to temporarily and simultaneously charge a plurality of battery packs. As is apparent from correspondences between FIGS. 36A and 36B and between FIGS. 37A and 37B, the total charge time of the two secondary batteries (Batt1 and Batt2) 319 and 321 can be shortened.

FIG. 33 is a circuit diagram showing the arrangement of the seventeenth embodiment (3) of the present invention.

Referring to FIG. 33, reference numeral 309 denotes a constant voltage constant current source. The constant voltage constant current source 309 has an output current limit function according to a predetermined current limit value (Icc) of the power supply.

Reference numeral 311 denotes a switch (SW1) arranged midway along a charge current path between the power supply output terminal of the constant voltage constant current source 309 and a charge priority switching circuit 339. The switch (SW1) 311 is ON/OFF-controlled in accordance with a control signal (CSa) output from a power supply controller (not shown). The switch (SW1) 311 is turned on at the start of the charge operation of a secondary battery to be previously charged (a secondary battery (Batt1) 319 or (Batt2) 321) and off in a full charge state.

Reference numeral 313 denotes a switch (SW2) arranged midway along the series regulation control signal path of the secondary battery (Batt2) 321. The switch (SW2) 313 is ON/OFF-controlled in accordance with the control signal (CSa) output from the power supply controller. The switch (SW2) 313 is turned on at the start of the charge operation of the secondary battery (Batt1) 319 and off in the full charge state.

Reference numeral 315 denotes a switch (SW3) arranged midway along the charge current path between the power supply output terminal of the constant voltage constant current source 309 and the charge priority switching circuit 339. The switch (SW3) 315 is ON/OFF-controlled in accordance with a control signal (CSb) output from the power supply controller (not shown). The switch (SW3) 315 is turned on in the full charge state of the secondary battery which is previously charged (the secondary battery (Batt1) 319 or (Batt2) 321) and off in the full charge state of the secondary battery which is subsequently charged.

Reference numeral 317 denotes a transistor (TR1) for performing series regulation of a charge current. When the switch (SW2) 313 is in an ON state, the transistor (TR1) 317 performs series regulation of the charge current of the secondary battery (Batt1) 319 or (Batt2) 321 in accordance with an output from an amplifier (Error Amp) 329.

The secondary batteries (Batt1 and Batt2) 319 and 321 serve as a battery power supply of a portable computer main body. In this case, a lithium-ion battery (cell or battery set) is used. In accordance with the priority of the charge priority switching circuit 339, the secondary battery (Batt1) 319 or (Batt2) 321 is charged.

Reference numerals 323 and 325 denote battery voltage sense circuits for detecting the voltages of the secondary batteries (Batt1 and Batt2) 319 and 321, respectively. The battery voltages detected by the battery voltage sense circuits 323 and 325 are fed back to the constant voltage constant current source 309 and used for battery voltage control during the charge operation.

Reference numeral 327 denotes a fixed resistor (RS) for detecting a current supplied from the power supply. A voltage generated across the fixed resistor (RS) 327 is input to the amplifier (Error Amp) 329 together with a reference voltage (VREF) 331.

The control amplifier (Error Amp) 329 performs series regulation of the secondary battery (Batt1) 319 or (Batt2) 321 such that the voltage generated across the fixed resistor (RS) 327 is equalized with the reference voltage (VREF) 331.

The reference voltage (VREF) 331 generates a reference voltage compared with the voltage generated in the fixed resistor (RS) 327.

The charge priority switching circuit 339 is constituted by a switching circuit having two circuits and two contacts. When the secondary battery (Batt1) 319 is to be preferentially charged, the charge priority switching circuit 339 is set to the A side. When the secondary battery (Batt2) 321 is to be preferentially charged, the charge priority switching circuit 339 is set to the B side. The operation of the seventeenth embodiment (3) shown in FIG. 33 will be described.

In the arrangement of the seventeenth embodiment (3) shown in FIG. 33, the charge priority of the two secondary batteries (Batt1 and Batt2) 319 and 321 is not fixed and can be arbitrarily set by the charge priority switching circuit 339.

More specifically, in this embodiment, the charge priority switching circuit 339 is operated to determine the battery (secondary battery (Batt1) 319 or (Batt2) 321) to be charged preferentially (to be previously charged).

For example, when the secondary battery (Batt1) 319 is to be charged preferentially (previously), the charge priority switching circuit 339 is set to the A side.

Thereafter, in accordance with the control signal (CSa), the switches (SW1) and SW2) 311 and 335 are turned on. With this operation, the output power supply voltage of the constant voltage constant current source 309 is supplied to the secondary battery (Batt1) 319 through the switch (SW1) 311 and the charge priority switching circuit 339, thereby starting the charge operation of the secondary battery (Batt1) 319 in accordance with the priority set by the charge priority switching circuit 339. The charge operation at this time is constant current charge (CC) according to the current limit value Icc of the constant voltage constant current source 309. When a load current limit value (IHC) is set as follows, the amplifier (Error Amp) 329 outputs a signal to the transistor (TR1) 317 not to charge the secondary battery (Batt2) 321. More specifically, the load current limit value (IHC) is set to satisfy [Icc>VREF (reference voltage 331)/ RS (fixed resistor 327)=IHC]. In this case, in the constant current charge operation of the secondary battery (Batt1) 319, no gate signal of a level for flowing the charge current through the secondary battery (Batt2) 321 through the transistor (TR1) 317 is output.

When charge operation of the secondary battery (Batt1) 319 continues until the operation is shifted to the constant voltage mode, the charge current decreases in accordance with the battery characteristics. When the charge current reaches the load current limit value (IHC), the amplifier (Error Amp) 329 performs series regulation of the transistor (TR1) 317 such that the voltage drop at the fixed resistor (RS) 327 is equalized with the reference voltage (VREF) 331, i.e., the sum of the charge currents of the secondary batteries (Batt1 and Batt2) 319 and 321 becomes the load current limit value (IHC).

That is, when the two secondary batteries (Batt1 and Batt2) 319 and 321 are simultaneously charged, the current supplied from the constant voltage constant current source 309 is always IHC, and the secondary battery (Batt2) 321 is charged in an amount corresponding to a decrease in charge current of the secondary battery (Batt2) 319. In addition, since [Icc>IHC], and the constant voltage constant current source 309 is operated in the constant voltage mode because of its characteristics, the potential of the secondary battery (Batt1) 319 does not decrease.

At this time, the battery voltage sense circuit 323 always detects the voltage of the secondary battery (Batt1) 319 and feeds back the voltage to the constant voltage constant current source 309, thereby accurately controlling the battery voltage during the charge operation.

When the secondary battery (Batt1) 319 is set in a full charge state, the switches (SW1 and SW2). 311 and 313 are turned off in accordance with the control signal (CSa), and the switch (SW3) 315 is turned on in accordance with the control signal (CSb). With this operation, the secondary battery (Batt2) 213 is charged with a constant current.

The above-described operation is performed when the charge priority switching circuit 339 is set to the A side such that, of the two secondary batteries (Batt1 and Batt2) 319 and 321, the secondary battery (Batt1) 319 is preferentially charged. When the charge priority switching circuit 339 is set to the B side, the secondary battery to be charged is changed. With the same operation as described above, the secondary battery (Batt2) 321 is preferentially charged.

With such charge control, the extra power of the constant voltage constant current source 309 can be effectively utilized to temporarily and simultaneously charge a plurality of battery packs in an arbitrary order. As is apparent from correspondences between FIGS. 36A and 36B and between FIGS. 37A and 37B, the total charge time of the two secondary batteries (Batt1 and Batt2) 319 and 321 can be shortened.

Figure 34:
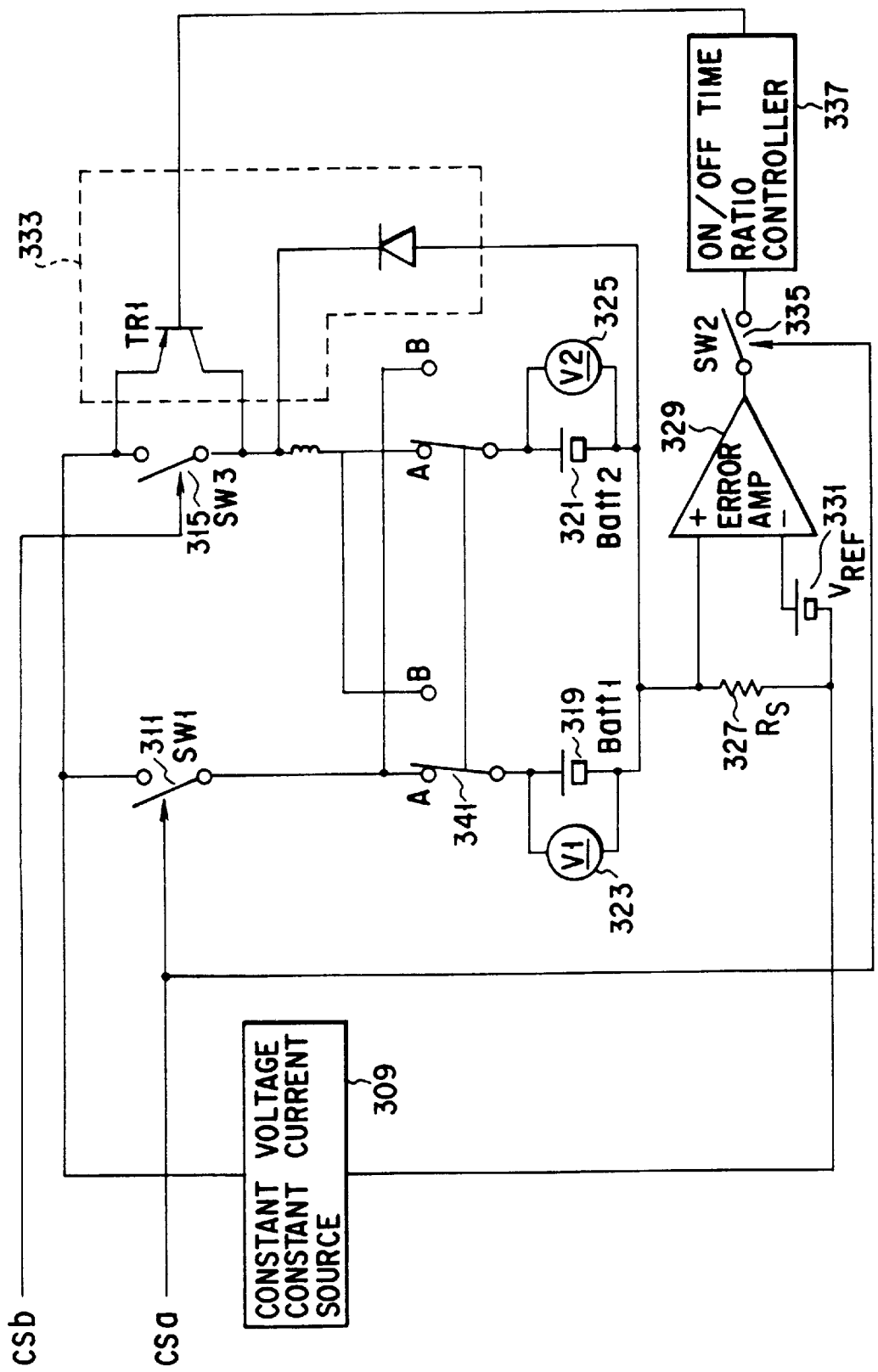
FIG. 34 is a circuit diagram showing an arrangement according to the seventeenth embodiment (4) of the present invention.

FIG. 34 is a circuit diagram showing the arrangement of the seventeenth embodiment (4) of the present invention.

Referring to FIG. 34, reference numeral 309 denotes a constant voltage constant current source. The constant voltage constant current source 309 has an output current limit function according to a predetermined current limit value (Icc) of the power supply.

Reference numeral 311 denotes a switch (SW1) arranged midway along a charge current path between the power supply output terminal of the constant voltage constant current source 309 and a charge priority switching circuit 341. The switch (SW1) 311 is ON/OFF-controlled in accordance with a control signal (CSa) output from a power supply controller. The switch (SW1) 311 is turned on at the start of the charge operation of a secondary battery to be previously charged (a secondary battery (Batt1) 319 or (Batt2) 321) and off in a full charge state.

Reference numeral 315 denotes a switch (SW3) arranged midway along the charge current path between the power supply output terminal of the constant voltage constant current source 309 and the charge priority switching circuit 341. The switch (SW3) 315 is ON/OFF-controlled in accordance with a control signal (CSb) output from the power supply controller. The switch (SW3) 315 is turned on in the full charge state of the secondary battery which is previously charged (the secondary battery (Batt1) 319 or (Batt2) 321) and off in the full charge state of the secondary battery which is subsequently charged.

The secondary batteries (Batt1 and Batt2) 319 and 321 serve as a main power supply of a portable computer main body which can be driven by a battery during battery driving. In this case, a lithium-ion battery (cell or battery set) is used. In accordance with the priority of the charge priority switching circuit 341, the secondary batteries (Batt1 and Batt2) 319 and 321 are charged.

Reference numerals 323 and 325 denote battery voltage sense circuits for detecting the voltages of the secondary batteries (Batt1 and Batt2) 319 and 321, respectively. The battery voltages detected by the battery voltage sense circuits 323 and 325 are fed back to the constant voltage constant current source 309 and used for battery voltage control during the charge operation.

Reference numeral 327 denotes a fixed resistor (RS) for detecting a current supplied from the power supply. A voltage generated across the fixed resistor (RS) 327 is input to an amplifier (Error Amp) 329 together with a reference voltage (VREF) 331.

The amplifier (Error Amp) 329 receives the voltage generated across the fixed resistor (RS) 327 and the reference voltage (VREF) 331 and differentially amplifies them. The amplifier (Error Amp) 329 controls an ON/OFF time ratio controller 337 such that the voltage generated across the fixed resistor (RS) 327 is equalized with the reference voltage (VREF) 331.

The reference voltage (VREF) 331 generates a reference voltage compared with the voltage generated in the fixed resistor (RS) 327.

Reference numeral 333 denotes a DC-DC converter. The DC-DC converter 333 turns on/off a transistor (TR1) in accordance with an output from the ON/OFF time ratio controller 337 and performs switching regulation of the charge current of the secondary battery (Batt1) 319 or (Batt2) 321.

Reference numeral 335 denotes a switch (SW2) arranged midway along a signal path between the amplifier (Error Amp) 329 and the ON/OFF time ratio controller 337. The switch (SW2) 335 is ON/OFF-controlled in accordance with the control signal (CSa). The switch (SW2) 335 is turned on at the start of the charge operation of the secondary battery to be previously charged (the secondary battery (Batt1) 319 or (Batt2) 321) and off in the full charge state.

The ON/OFF time ratio controller 337 controls the ON/OFF time ratio of the DC-DC converter 333 in accordance with an output from the amplifier (Error Amp) 329.

The charge priority switching circuit 341 is constituted by a switching circuit having two circuits and two contacts. When the secondary battery (Batt1) 319 is to be preferentially charged, the charge priority switching circuit 341 is set to the A side. When the secondary battery (Batt2) 321 is to be preferentially charged, the charge priority switching circuit 341 is set to the B side. The operation of the seventeenth embodiment (4) shown in FIG. 34 will be described.

Also in the arrangement of the seventeenth embodiment (4) shown in FIG. 34, as in the seventeenth embodiment (3) shown in FIG. 331 the charge priority of the two secondary batteries (Batt1 and Batt2) 319 and 321 is not fixed and can be arbitrarily set by the charge priority switching circuit 341.

More specifically, in this embodiment, the charge priority switching circuit 341 is operated to determine the battery (secondary battery (Batt1) 319 or (Batt2) 321) to be charged preferentially (to be previously charged).

For example, when the secondary battery (Batt1) 319 is to be charged preferentially (previously), the charge priority switching circuit 341 is set to the A side.

Thereafter, in accordance with the control signal (CSa), the switches (SW1 and SW2) 311 and 335 are turned on. With this operation, the output power supply voltage of the constant voltage constant current source 309 is supplied to the secondary battery (Batt1) 319 through the switch (SW1) 311 and the charge priority switching circuit 341, thereby starting the charge operation of the secondary battery (Batt1) 319 in accordance with the priority set by the charge priority switching circuit 341. The charge operation at this time is constant current charge (CC) according to the current limit value Icc of the constant voltage constant current source 309. When a load current limit value (IHC) is set to satisfy [Icc>VREF (reference voltage 331)/RS (fixed resistor 319)= IHC], the amplifier (Error Amp) 329 outputs a signal to the ON/OFF time ratio controller 337 not to charge the secondary battery (Batt2) 321. That is, in the constant current charge operation of the secondary battery (Batt1) 319, no signal for switching the transistor (TR1) of the DC-DC converter 333 is output.

When charge operation of the secondary battery (Batt1) 319 continues until the operation is shifted to the constant voltage mode, the charge current decreases in accordance with the battery characteristics. When the charge current reaches the load current limit value (IHC), the amplifier (Error Amp) 329 outputs a control signal to the ON/OFF time ratio controller 337 such that the voltage drop at the fixed resistor (RS) 327 is equalized with the reference voltage (VREF) 331, i.e., the current supplied from the constant voltage constant current source 309 becomes the load current limit value (IHC).

In accordance with the control signal output from the amplifier (Error Amp) 329, the ON/OFF time ratio controller 337 performs switching regulation of the DC-DC converter 333.

That is, when the two secondary batteries (Batt1 and Batt2) 319 and 321 are simultaneously charged, the current supplied from the constant voltage constant current source 309 is always IHC, and the secondary battery (Batt2) 321 is charged in an amount corresponding to a decrease in charge current of the secondary battery (Batt2) 319. In addition, since [Icc>IHC], and the constant voltage constant current source 309 is operated in the constant voltage mode because of its characteristics, the potential of the secondary battery (Batt1) 319 does not decrease.

The battery voltage sense circuit 323 detects the voltage of the secondary battery (Batt1) 319 and feeds back the voltage to the constant voltage constant current source 309, thereby accurately controlling the battery voltage during the charge operation.

When the secondary battery (Batt1) 319 is set in a full charge state, the switches (SW1 and SW2) 321 and 335 are turned off in accordance with the control signal (CSa), and the switch (SW3) 315 is turned on in accordance with the control signal (CSb). With this operation, the secondary battery (Batt2) 321 is charged with a constant current.

When the battery (Batt2) 321 is to be preferentially charged, the charge priority switching circuit 341 is set to the B side. With the same operation as described above, the secondary battery (Batt2) 321 is preferentially charged.

With such charge control, the extra power of the constant voltage constant current source 309 can be effectively utilized to temporarily and simultaneously charge a plurality of battery packs in an arbitrary order. As is apparent from correspondences between FIGS. 36A and 36B and between FIGS. 37A and 37B, the total charge time of the two secondary batteries (Batt1 and Batt2) 319 and 321 can be shortened.

In the above-described seventeenth embodiment, the lithium-ion secondary battery serving as the battery power supply of the portable computer main body is exemplified. However, this charge control is not limited to this and can also be realized in other electronic equipment such as a wordprocessor having a battery power supply or equipment using a secondary battery other than the lithium-ion, which is charged with a constant voltage.

Eighteenth Embodiment

The eighteenth embodiment of the present invention will be described below with reference to FIGS. 38 and 39.

The eighteenth embodiment comprises a power supply 343 for charging a secondary battery 351, a battery voltage measuring section 349 for measuring a battery voltage, a battery voltage determination section 347 for determining whether the battery voltage reaches a target value (a battery voltage target value 353 used for switching a continuous constant current charge operation to an intermittent constant current charge operation, and a battery voltage target value 357 in a charge OFF state), and a charge ON/OFF controller 345 for turning on/off the charge operation in accordance with the determination content of the battery voltage determination section 347. If the battery voltage value is smaller than the target value 353, the continuous constant current charge operation is performed. If the battery voltage value is larger than the target value 353, the constant current charge operation is ON/OFF-controlled at a predetermined period. If the battery voltage value in the charge OFF state becomes larger than the target value 357, it is determined that a full charge state is set. With this operation, in a charge apparatus for charging a secondary battery requiring constant current charge, the secondary battery is rapidly charged.

Eighteenth Embodiment (5-197328, FIG. 9)

FIG. 38 is a circuit diagram showing the arrangement of the eighteenth embodiment of the present invention.

Referring to FIG. 38, the constant voltage constant current source 343 charges the secondary battery 351. The constant voltage constant current source 343 charges the secondary battery 351 with a constant current or voltage through the charge ON/OFF controller 345 in accordance with a signal from the battery voltage determination section 347. More specifically, in accordance with a signal from the battery voltage determination section 347, a constant current charge operation is performed to a point B in FIG. 39. From the point B, a constant voltage charge operation is performed. During the constant current charge operation, even when the battery voltage during the charge operation exceeds the target value 353, a voltage higher than the target value 353 is generated, thereby performing the constant current charge operation.

The charge ON/OFF controller 345 turns on/off the charge operation. When the battery voltage during the charge operation exceeds the target value 353, the charge ON/OFF controller 345 performs the intermittent constant current charge operation at a predetermined ON/OFF period in accordance with a signal from the battery voltage determination section 347.

The battery voltage determination section 347 determines the battery voltage input from the battery voltage measuring section 349 in the charge OFF state. It is determined whether the voltage at this time reaches the second target value 357. If the voltage does not reach the target value yet, charge ON/OFF control is continuously performed.

When the charge operation continues until the battery voltage in the charge OFF state reaches the second target value 357 (point c in FIG. 39), the battery voltage determination section 347 outputs an operation control signal to the constant voltage constant current source 343 to cause it to output the same voltage as the second target value 357 (i.e., for performing the constant voltage charge operation).

With such charge control, the secondary battery 351 can be rapidly charged as compared to the prior art shown in FIG. 9.

In the above-described embodiment, the first target value 353 and the second target value 357 are set to the same voltage value. However, they may be set to different voltage values. The above-described charge control is not limited to the lithium-ion secondary battery and can also be applied to other secondary batteries requiring constant voltage charge.

Nineteenth Embodiment

A prior art will be described before the description of the nineteenth embodiment.

Figure 43:
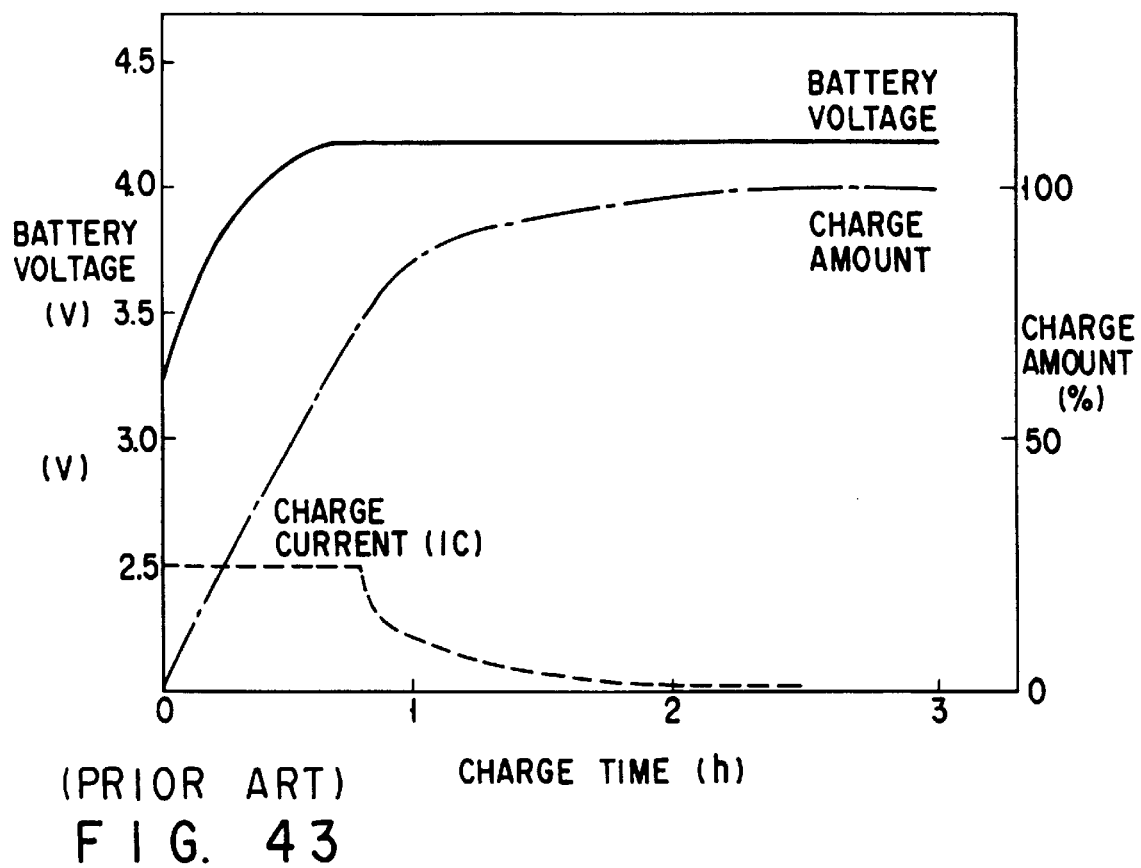
FIG. 43 is a chart showing charge characteristics of a lithium-ion secondary battery.

In a lithium-ion secondary battery, a battery terminal voltage per cell during a charge operation must not exceed 4.2 V. For this reason, charge control as shown in FIG. 43 is required, in which the charge operation is started with constant current charge, and when the terminal voltage reaches 4.2 V, the operation is switched to constant voltage charge, thereby gradually decreasing a charge current.

Figure 83:
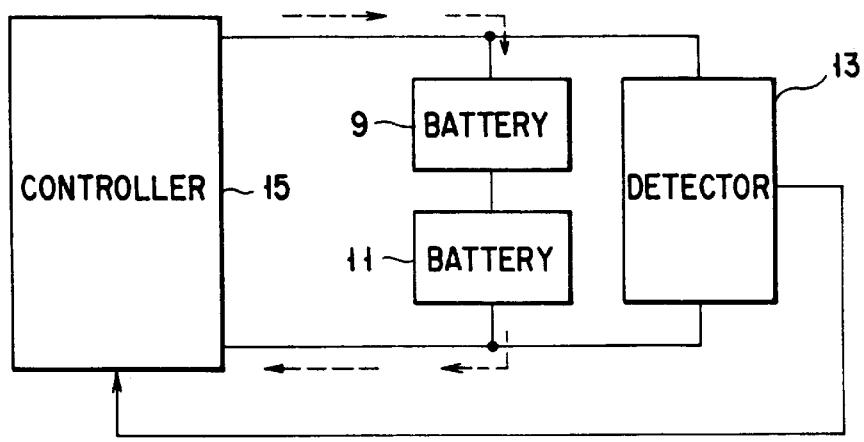
FIG. 83 is a block diagram showing the arrangement of conventional charge control for series-connected lithium-ion secondary battery cells.
Figure 84:
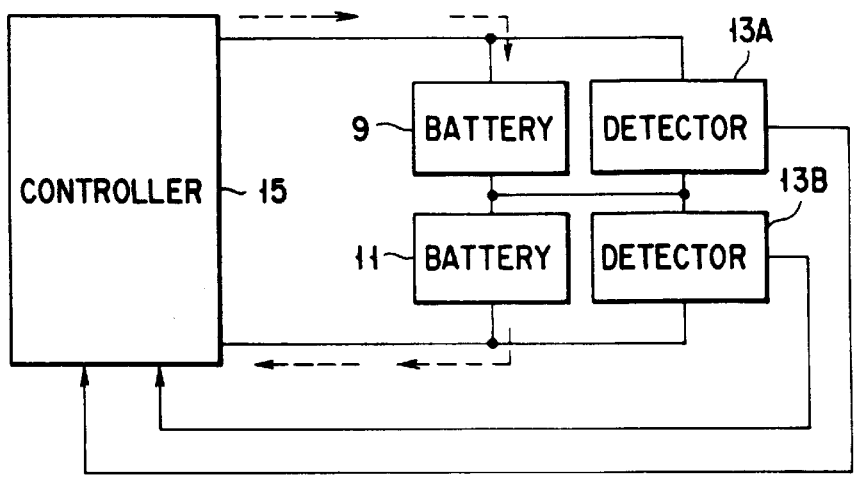
FIG. 84 is a block diagram showing the arrangement of another conventional charge control for series-connected lithium-ion secondary battery cells.

Conventional charge control of series-connected lithium-ion secondary batteries has been realized by an arrangement shown in FIG. 83 or 84.

In the arrangement shown in FIG. 83, a controller performs charge control to charge series-connected secondary batteries 9 and 11 with a constant current. During this charge operation, the voltage of the series-connected secondary batteries 9 and 11 as a hole is monitored by a voltage detector 13 and supplied to the controller 15.

If it is detected that the voltage of the series-connected secondary batteries 9 and 11 as a whole (voltage of the battery set as a whole) reaches 8.4 V (4.2 V per cell), the charge mode is shifted from constant current charge to constant voltage charge. When the charge current is decreased, and a predetermined period of time has elapsed, the charge operation is stopped.

In the arrangement shown in FIG. 83, however, if the voltage of one of the batteries (e.g., 9) reaches 4.2 V in advance due to variations in capacity or the like, and the voltage of the remaining battery (e.g., 11) is, e.g., 4.0 V, the controller 15 continuously determines that the voltage per cell does not reach 4.2 V yet. This is because the controller 15 monitors and controls the voltage of the series-connected secondary battery cells 9 and 11 as a whole. When the voltage of the battery set reaches 8.4 V, the voltages of the secondary batteries 9 and 11 reach 4.3 V and 4.1 V, respectively, resulting in overcharge of one battery (9).

To solve this problem, the arrangement shown in FIG. 84 has been proposed.

In the arrangement shown in FIG. 84, the voltages of the series-connected secondary batteries 9 and 11 are monitored by voltage detectors 13A and 13B, respectively. If it is detected that the voltage of one of the secondary batteries 9 and 11 reaches 4.2 V, the charge mode is shifted from constant current charge to constant voltage charge. When the charge current is decreased, and a predetermined period of time has elapsed, the charge operation is stopped.

In the arrangement shown in FIG. 84, however, if the voltage of one of the series-connected secondary batteries 9 and 11 reaches 4.2 V in advance, the constant voltage charge operation is started. For this reason, the charge operation is ended before the voltage of the remaining battery reaches 4.2 V, and in some cases, a full charge state is not obtained. In addition, in the arrangement shown in FIG. 84, when the charged batteries are to be discharged, the battery which is not in the full charge state is completely discharged in advance. For this reason, the apparent capacity of the battery set as a whole decreases.

FIGS. 40 and 41 are block diagrams showing the arrangement of the nineteenth embodiment of the present invention. FIG. 40 shows a charge current path at the start of a charge operation and in a normal state. FIG. 41 shows a charge current path obtained when the voltage of one secondary battery (363) reaches a specified voltage (4.2 V) in advance.

Referring to FIGS. 40 and 41, reference numerals 361 and 363 denote series-connected lithium-ion secondary batteries. Reference numerals 365 and 367 denote battery voltage detectors for monitoring the battery voltages of the lithium-ion secondary batteries 361 and 363, respectively. The detected voltages are supplied to a controller 373 (to be described later).

Figure 82:
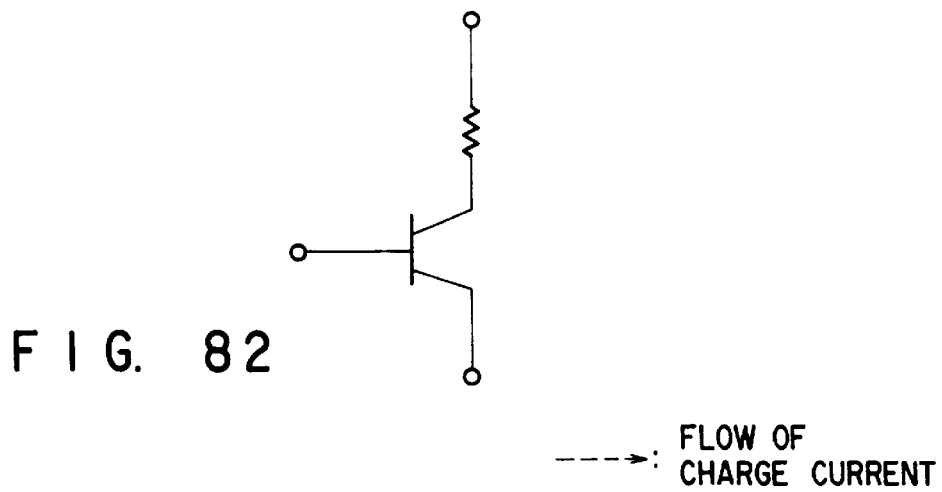
FIG. 82 is a circuit diagram showing the detailed arrangement of a bypass circuit shown in FIGS. 40 and 41.

Reference numerals 369 and 371 denote bypass circuits for bypassing the charge currents of the lithium-ion secondary batteries 361 and 363. Each of the bypass circuits 369 and 371 is constituted by, e.g., a resistor and a transistor, as shown in FIG. 82. When one of the series-connected lithium-ion secondary batteries 361 and 363 is set in a full charge state in advance, the charge current of the battery is bypassed under the control of the controller 373.

The controller 373 performs charge control including bypass control of the charge current and is constituted by, e.g., a power supply and a power supply microcomputer. The controller 373 controls the bypass circuits 369 and 371 of the lithium-ion secondary batteries 361 and 363 in accordance with the battery voltage states detected by the battery voltage detectors 365 and 367.

Figure 42:
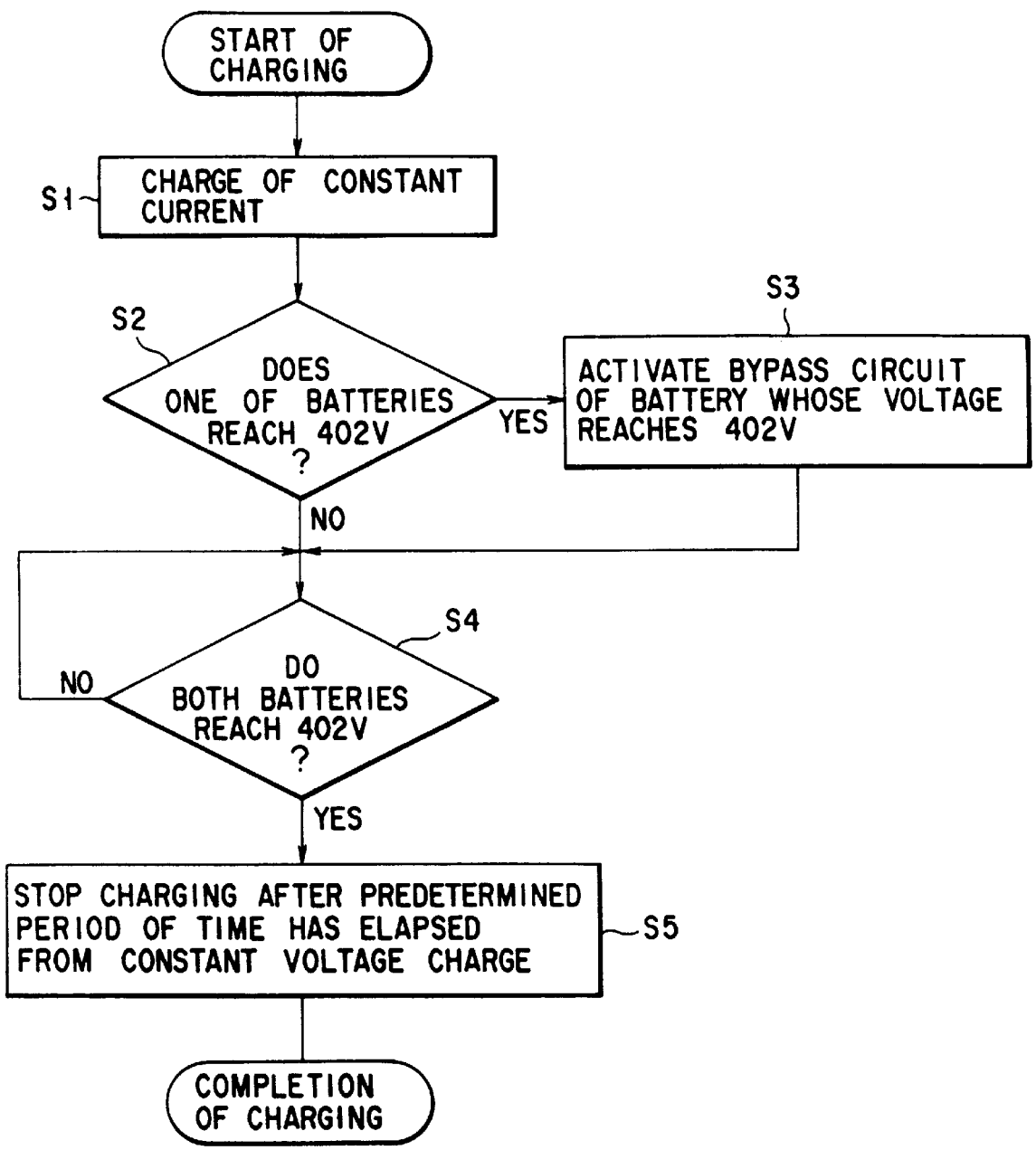
FIG. 42 is a flow chart for explaining an operation according to the nineteenth embodiment.

FIG. 42 is a flow chart for explaining the operation of the nineteenth embodiment.

The operation of the nineteenth embodiment will be described.

In the charge operation of the series-connected lithium-ion secondary batteries 361A and 361B, the controller 373 starts charge with a constant current (step S1 in FIG. 42). With this constant current charge operation, the battery voltages of the lithium-ion secondary batteries 361 and 363 gradually increase. The battery voltages at this time are monitored by the battery voltage detectors 365 and 367.

In this constant current charge operation, charge control performed when variations are caused in battery voltages of the secondary batteries 361 and 363 will be described with reference to FIG. 41. When, of the series-connected secondary batteries 361 and 363, the voltage of the battery 363 reaches 4.2 V in advance, the controller 373 recognizes, from the detection voltages received from the battery voltage detectors 365 and 367, that the voltage of the battery 363 reaches 4.2 V and operates the bypass circuit 371 for the battery 363 (steps S2 and S3 in FIG. 42).

With this operation, a charge current path obtained upon interposition of the bypass circuit 371 for the battery 363, i.e., bypassing the battery 363, is formed. A charge current output from the controller 373 flows through the battery 361 whose voltage does not reach 4.2 V yet and the bypass circuit for the battery 363, as shown in FIG. 41.

When the charge operation of the battery 361 continues until the battery voltage of the battery 361 reaches 4.2 V, the controller 373 stops the operation of the bypass circuit 371 for the battery 363 and switches the charge mode to charge with a constant voltage of 8.4 V (steps S4 and S5 in FIG. 42). Thereafter, the charge current gradually decreases, as shown in FIG. 43. When a predetermined period of time has elapsed, the batteries 361 and 363 are set in the full charge state, thereby completing the charge operation.

With such charge control, the shortened service life of the lithium-ion secondary battery caused due to overcharge can be prevented. In addition, regardless of variations in voltages of the series-connected batteries, all the battery cells can be properly set in the full charge state.

Twentieth Embodiment

In a conventional nickel-cadmium battery, a battery voltage is peaked at the end of a charge operation and decreases from this peak value. Conventionally, by detecting a voltage drop at the end of the charge operation, a full charge state is detected. However, in a lithium-ion secondary battery, the full charge state cannot be detected by detecting the voltage drop at the end of the charge operation. In addition, when the battery voltage during a charge/discharge operation is measured to obtain a battery residual capacity from the battery voltage during the charge/discharge operation, the battery capacity cannot be accurately detected because of the internal resistance of the battery, or the like.

The twentieth embodiment of the present invention will be described below with reference to the accompanying drawing.

Figure 44:
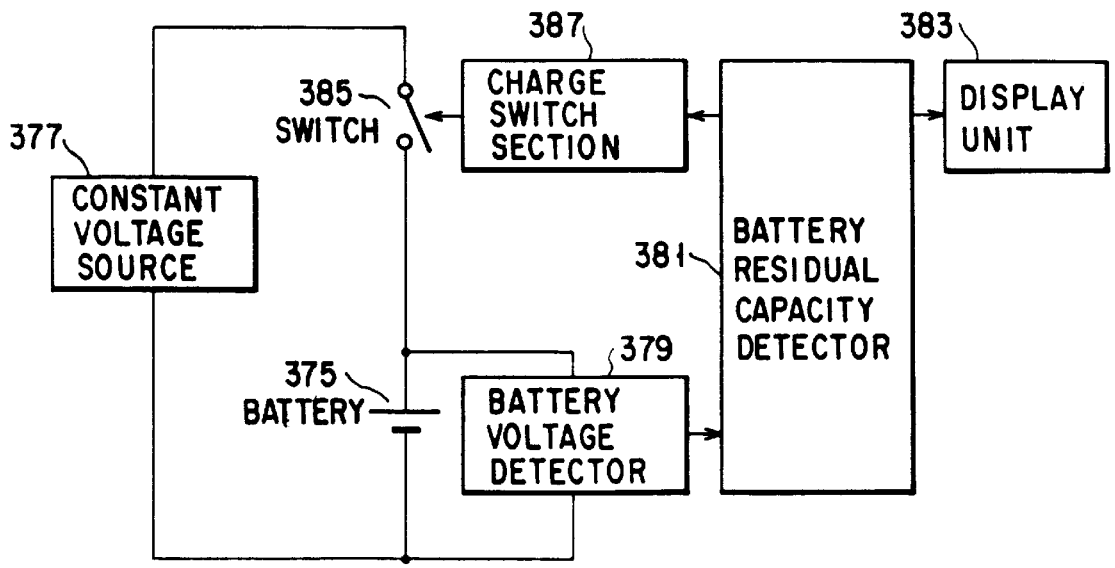
FIG. 44 is a block diagram showing an arrangement according to the twentieth embodiment of the present invention.

FIG. 44 is a block diagram showing the arrangement of the twentieth embodiment of the present invention.

Referring to FIG. 44, reference numeral 375 denotes a lithium-ion secondary battery. Reference numeral 377 denotes a constant voltage source with a current limit function, which charges the lithium-ion secondary battery 375. Reference numeral 379 denotes a known battery voltage detector for detecting the battery voltage of the lithium-ion secondary battery 375.

Reference numeral 381 denotes a battery residual capacity detector, realized by, e.g., a power supply microcomputer, for detecting the battery residual capacity and the full charge state of the lithium-ion secondary battery 375. The battery residual capacity detector 381 stores a battery voltage according to a known battery capacity in advance and compares a battery voltage detected by the battery voltage detector 379 in a charge OFF state with the stored voltage (set battery voltage data) according to the known battery capacity to obtain a battery capacity in the charge OFF state, thereby detecting the battery residual capacity.

Reference numeral 383 denotes a display unit for displaying data related to the residual capacity of the lithium-ion secondary battery 375. In this embodiment, the battery residual capacity detected by the battery residual capacity detector 381 is output and displayed.

Reference numeral 385 denotes a switch arranged midway along the charge current path of the lithium-ion secondary battery 375. The switch 387 turns on/off the charge operation of the lithium-ion secondary battery 375 under the control of a charge switching section 387.

The charge switching section 387 turns on/off the switch 385 arranged midway along the charge current of the lithium-ion secondary battery 375 in accordance with control of the battery residual capacity detector 381.

The operation of the twentieth embodiment of the present invention will be described.

The constant voltage source 377 with the current limit function charges the lithium-ion secondary battery 375 with a constant voltage at a predetermined current or less.

When the lithium-ion secondary battery 375 is to be charged, the switch 385 is turned on by the charge switching section 387.

With this operation, the output power supply voltage of the constant voltage source 377 is applied to the lithium-ion secondary battery 375 through the switch 385. The lithium-ion secondary battery 375 is charged with a constant voltage at a predetermined current or less.

During the charge operation, using the characteristics representing that the open battery voltage of the lithium-ion secondary battery 375 is substantially proportional to the battery residual capacity, the battery residual capacity during the charge operation is checked in accordance with the following procedures.

The switch 385 is turned off by the charge switching section 387 to temporarily cut off the charge current. The charge operation is temporarily stopped to set the lithium-ion secondary battery 375 in an open state.

The battery voltage at this time is detected by the battery voltage detector 379.

Upon completion of the open battery voltage detection, the switch 385 is turned on again, thereby restarting the charge operation of the lithium-ion secondary battery 375.

The battery residual capacity detector 381 compares the open battery voltage detected by the battery voltage detector 379 with the stored battery voltage (set battery voltage data) according to the known battery capacity, thereby obtaining the battery residual capacity.

The battery residual capacity data is sent to the display unit 383 to cause it display the battery residual capacity.

In this manner, the battery capacity of the lithium-ion secondary battery 375 during the charge operation is detected, and the battery residual capacity is displayed.

If a full charge state is detected from the battery residual capacity during the charge operation, the switch 386 is turned off by the charge switching section 387, thereby completing the charge operation.

As described above, according to the first embodiment, in a system having the lithium-ion secondary battery which is one of secondary batteries having characteristics representing that the open battery voltage is substantially proportional to the battery residual capacity, the battery residual capacity during the charge operation can be accurately detected using the battery characteristics. Therefore, the battery residual capacity can be externally informed.

Twenty-first Embodiment

The twenty-first embodiment of the present invention will be described below with reference to FIG. 45.

FIG. 45 is a block diagram showing the arrangement of the twenty-first embodiment of the present invention.

Referring to FIG. 45, reference numeral 389 denotes a lithium-ion secondary battery. Reference numeral 391 denotes a constant voltage source with a current limit function, which charges the lithium-ion secondary battery 389. Reference numeral 393 denotes a battery voltage detector for detecting the battery voltage of the lithium-ion secondary battery 389. In this embodiment, the battery voltage detector 389 detects the battery voltage in a charge OFF state in accordance with an output from a timer 403.

Reference numeral 395 denotes a battery residual capacity detector for comparing the measured battery voltage of the lithium-ion secondary battery 389 in the charge OFF state with a stored voltage (set battery voltage data) according to a known battery capacity to obtain a battery capacity in the charge OFF state, thereby detecting the battery residual capacity and the full charge state of the lithium-ion secondary battery 389. In this embodiment, the battery residual capacity is detected at a predetermined interval.

Reference numeral 397 denotes a display unit for displaying data related to the residual capacity of the lithium-ion secondary battery 389. In this embodiment, the battery residual capacity detected by the battery residual capacity detector 395 is output and displayed.

Reference numeral 399 denotes a switch arranged midway along the charge current path of the lithium-ion secondary battery 389. The switch 399 turns on/off the charge operation of the lithium-ion secondary battery 389 under the control of a charge switching section 401.

The charge switching section 401 turns on/off the switch 399 in accordance with control of the battery residual capacity detector 395 and the timer 403.

The timer 403 controls an interval for turning off the charge operation of the lithium-ion secondary battery 389.

The operation of the twenty-first embodiment of the present invention will be described.

The constant voltage source 391 with the current limit function charges the lithium-ion secondary battery 389 with a constant voltage at a predetermined current or less.

When the lithium-ion secondary battery 389 is to be charged, the switch 399 is turned on by the charge switching section 401.

During the charge operation, using the characteristics representing that the open battery voltage of the lithium-ion secondary battery 389 is substantially proportional to the battery residual capacity, the battery residual capacity during the charge operation is checked in accordance with the following procedures.

By a timer count operation according to a predetermined clock, the timer 403 sends a timer output signal to the charge switching section 401, the battery voltage detector 393, and the battery residual capacity detector 395 such that the residual capacity of the lithium-ion secondary battery 389 is detected at a predetermined interval.

The switch 399 is turned off by the charge switching section 401 to temporarily stop the charge current supplied to the lithium-ion secondary battery 389, thereby setting the lithium-ion secondary battery 389 in an open state.

The battery voltage at this time is detected by the battery voltage detector 393.

Upon completion of the open battery voltage detection, the switch 399 is turned on again, thereby restarting the charge operation of the lithium-ion secondary battery 389.

The battery residual capacity detector 395 compares the open battery voltage detected by the battery voltage detector 393 with the stored battery voltage (set battery voltage data) according to the known battery capacity, thereby obtaining the battery residual capacity.

The battery residual capacity data is sent to the display unit 397 to cause it display the battery residual capacity.

If a full charge state is detected from the battery residual capacity during the charge operation, the switch 399 is turned off by the charge switching section 401, thereby completing the charge operation.

In this manner, according to an output from the timer 403, the residual capacity of the lithium-ion secondary battery 389 in the charge mode is detected at a predetermined interval.

Twenty-second Embodiment

FIG. 46 is a block diagram showing the arrangement of the twenty-second embodiment of the present invention.

Referring to FIG. 46, reference numeral 405 denotes a lithium-ion secondary battery. Reference numeral 407 denotes a constant voltage source with a current limit function, which charges the lithium-ion secondary battery 405. Reference numeral 409 denotes a battery voltage detector for detecting the battery voltage of the lithium-ion secondary battery 405. In this embodiment, the battery voltage detector 405 detects the battery voltage in a charge OFF state in accordance with an output signal from a charge stop controller 419.

Reference numeral 411 denotes a battery residual capacity detector for comparing the measured battery voltage of the lithium-ion secondary battery 405 in the charge OFF state with a stored battery voltage (set battery voltage data) according to a known battery capacity to obtain a battery capacity in the charge OFF state, thereby detecting the battery residual capacity and the full charge state of the lithium-ion secondary battery 405.

Reference numeral 413 denotes a display unit for displaying data related to the residual capacity of the lithium-ion secondary battery 405. In this embodiment, the battery residual capacity detected by the battery residual capacity detector 411 is output and displayed.

Reference numeral 415 denotes a switch arranged midway along the charge current path of the lithium-ion secondary battery 405. The switch 415 turns on/off of the charge operation of the lithium-ion secondary battery 405 in accordance with control of a charge switching section 417.

The charge switching section 417 turns on/off the switch 415 in accordance with control of the battery residual capacity detector 411 and the charge stop controller 419.

The charge stop controller 419 controls an interval for turning off the charge operation of the lithium-ion secondary battery 405. The interval for battery residual capacity detection is changed in accordance with the battery residual capacity detected by the battery residual capacity detector 411. In this embodiment, if the battery residual capacity is small, the interval for battery residual capacity detection is prolonged. If the battery residual capacity is large and close to the full charge state, the interval for battery residual capacity detection is shortened.

The operation of the twenty-second embodiment of the present invention will be described.

The constant voltage source 407 with the current limit function charges the lithium-ion secondary battery 405 with a constant voltage at a predetermined current or less.

When the lithium-ion secondary battery 405 is to be charged, the switch 415 is turned on by the charge switching section 417.

During the charge operation, using the characteristics representing that the open battery voltage of the lithium-ion secondary battery 405 is substantially proportional to the battery residual capacity, the battery residual capacity during the charge operation is checked in accordance with the following procedures.

The charge stop controller 419 changes the interval for battery residual capacity detection in accordance with the battery residual capacity of the lithium-ion secondary battery 405, which is detected by the battery residual capacity detector 411. The charge stop controller 419 sends detection control signals to the charge switching section 417, the battery voltage detector 409, and the battery residual capacity detector 411 such that, if the battery residual capacity of the lithium-ion secondary battery 405 is small, the interval for battery residual capacity detection is prolonged, and if the battery residual capacity is large and close to the full charge state, the interval for battery residual capacity detection is shortened.

The charge switching section 417 turns off the switch 415 in accordance with the detection control signal from the charge stop controller 419 to temporarily stop the charge current to the lithium-ion secondary battery 389, thereby setting the lithium-ion secondary battery 405 in an open state.

The battery voltage at this time is detected by the battery voltage detector 409.

Upon completion of the open battery voltage detection, the switch 415 is turned on again, thereby restarting the charge operation of the lithium-ion secondary battery 405.

The battery residual capacity detector 411 compares the open battery voltage detected by the battery voltage detector 409 with the stored battery voltage (set battery voltage data) according to the known battery capacity, thereby obtaining the battery residual capacity.

The battery residual capacity data is sent to the display unit 413 to cause it display the battery residual capacity.

If a full charge state is detected from the battery residual capacity during the charge operation, the switch 415 is turned off by the charge switching section 417, thereby completing the charge operation.

In this manner, according to control of the charge stop controller 419, the residual capacity of the lithium-ion secondary battery 405 in the charge mode is detected at an interval according to the battery residual capacity.

Twenty-third Embodiment

FIG. 47 is a block diagram showing the arrangement of the twenty-third embodiment of the present invention.

Referring to FIG. 47, reference numeral 421 denotes a lithium-ion secondary battery. Reference numeral 423 denotes a constant voltage source with a current limit function, which charges the lithium-ion secondary battery 421. Reference numeral 425 denotes a battery voltage detector for detecting the battery voltage of the lithium-ion secondary battery 421.

Reference numeral 427 denotes a battery residual capacity detector for detecting the battery residual capacity and the full charge state of the lithium-ion secondary battery 421. In this embodiment, a charge current is temporarily changed, and a battery voltage at a charge current of zero ampere is obtained from measured battery voltages at different charge currents. The obtained battery voltage is compared with a stored known battery voltage (set battery voltage data) to obtain a battery capacity at a charge current of zero ampere, thereby detecting the battery residual capacity during the charge operation.

Reference numeral 429 denotes a display unit for displaying data related to the residual capacity of the lithium-ion secondary battery 421. In this embodiment, the battery residual capacity detected by the battery residual capacity detector 427 is output and displayed.

Reference numeral 431 denotes a charge switching section for turning on/off a switch 437 in accordance with control of the battery residual capacity detector 427. The switch 437 is arranged midway along the charge current path of the lithium-ion secondary battery 421. The switch 433 turns on/off the charge operation of the lithium-ion secondary battery 421 under the control of the charge switching section 431.

Reference numeral 435 denotes a charge current controller for temporarily changing the charge current of the lithium-ion secondary battery 421, which is supplied from the constant voltage source 423.

Reference numeral 437 denotes a charge current detector for detecting the charge current of the lithium-ion secondary battery 421.

The operation of the twenty-third embodiment of the present invention will be described.

The constant voltage source 423 with the current limit function charges the lithium-ion secondary battery 421 with a constant voltage at a predetermined current or less.

When the lithium-ion secondary battery 421 is to be charged, the switch 431 is turned on by the charge switching section 433.

During the charge operation, using the characteristics representing that the open battery voltage of the lithium-ion secondary battery 421 is substantially proportional to the battery residual capacity, the battery residual capacity during the charge operation is checked in accordance with the following procedures.

The charge current controller 435 changes the limit current value of the current limit function of the constant voltage source 423, thereby temporarily changing the charge current.

The charge current according to the change in charge current is detected by the charge current detector 437. Simultaneously, the battery voltage is detected by the battery voltage detector 425.

When detection of the charge current and the battery voltage according to the change in charge current is completed, the charge current is returned to the state before the change.

The charge current and the battery voltage, which restore the states before the charge current is changed, are detected by the charge current detector 437 and the battery voltage detector 403, respectively.

The battery residual capacity detector 427 obtains a battery voltage at a charge current of zero ampere from the battery voltages at different charge currents before and after the charge current is changed, which are detected by the charge current detector 437 and the battery voltage detector 425. The battery voltage at a charge current of zero ampere is compared with a predetermined known battery voltage to obtain a battery capacity at a charge current of zero ampere, thereby detecting the battery residual capacity during the charge operation.

The battery residual capacity data is sent to the display unit 429 to cause it display the battery residual capacity.

If a full charge state is detected from the battery residual capacity during the charge operation, the switch 433 is turned off by the charge switching section 431, thereby completing the charge operation.

In this manner, the charge current is temporarily changed, and the battery voltage at a charge current of zero ampere is obtained from the measured battery voltages at different charge currents. The obtained battery voltage is compared with the predetermined known battery voltage to obtain the battery capacity at a charge current of zero ampere, thereby detecting the battery residual capacity during the charge operation.

Twenty-fourth Embodiment

Figure 48:
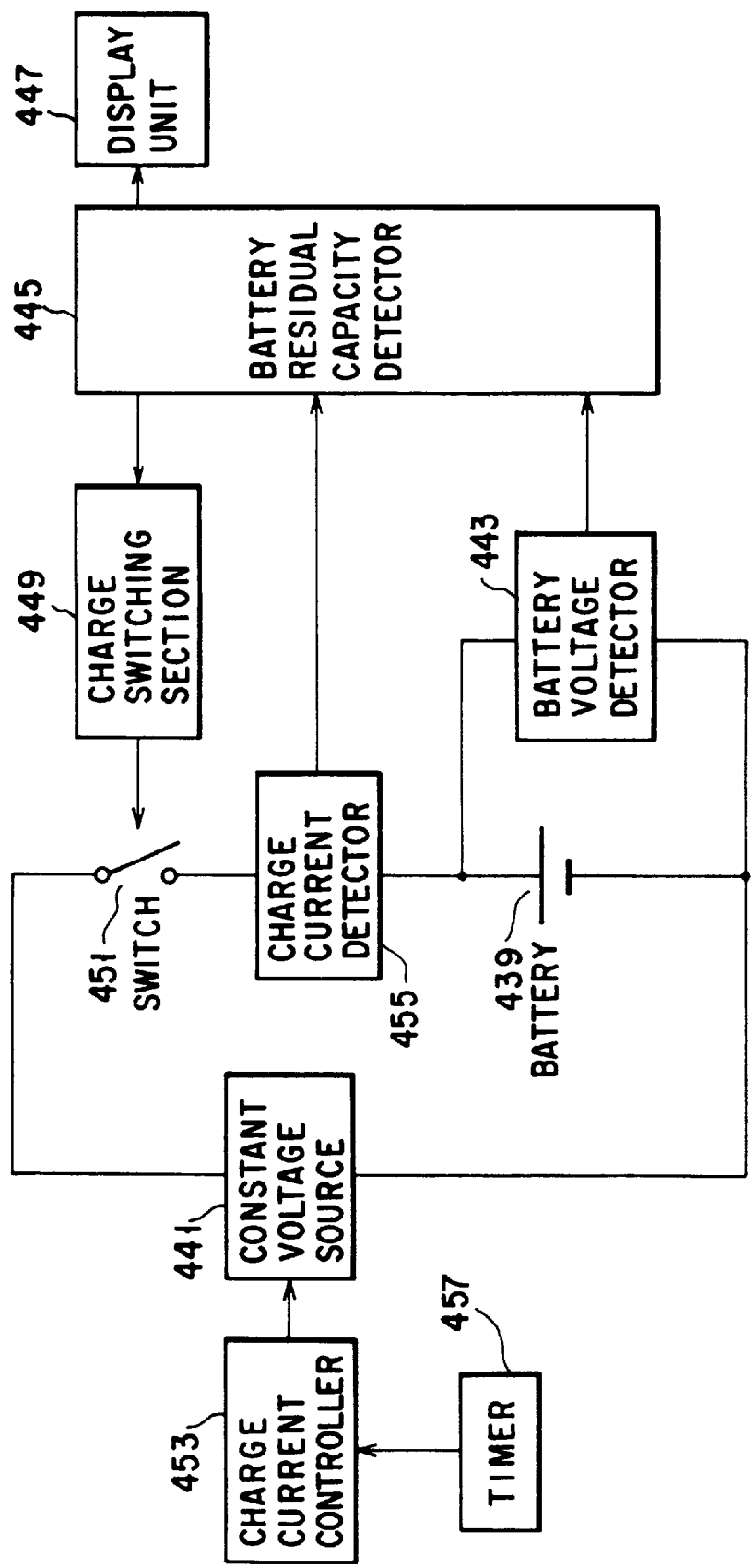
FIG. 48 is a block diagram showing an arrangement according to the twenty-fourth embodiment of the present invention.

FIG. 48 is a block diagram showing the arrangement of the twenty-fourth embodiment of the present invention.

Referring to FIG. 48, reference numeral 439 denotes a lithium-ion secondary battery. Reference numeral 441 denotes a constant voltage source with a current limit function, which charges the lithium-ion secondary battery 439. Reference numeral 443 denotes a battery voltage detector for detecting the battery voltage of the lithium-ion secondary battery 439.

Reference numeral 403 denotes a battery residual capacity detector for detecting the battery residual capacity and the full charge state of the lithium-ion secondary battery 439. In this embodiment, a charge current is temporarily changed at a predetermined interval, and a battery voltage at a charge current of zero ampere is obtained from measured battery voltages at different charge currents. The obtained battery voltage is compared with a predetermined known battery voltage to obtain a battery capacity at a charge current of zero ampere, thereby detecting the battery residual capacity at a predetermined interval.

Reference numeral 447 denotes a display unit for displaying data related to the residual capacity of the lithium-ion secondary battery 439. In this embodiment, the battery residual capacity detected by the battery residual capacity detector 445 is output and displayed.

Reference numeral 449 denotes a charge switching section for turning on/off a switch 451 in accordance with control of the battery residual capacity detector 445.

The switch 451 is arranged midway along the charge current path of the lithium-ion secondary battery 439. The switch 451 turns on/off the charge operation of lithium-ion secondary battery 439.

Reference numeral 453 denotes a charge current controller for temporarily changing the charge current of the lithium-ion secondary battery 439, which is supplied from the constant voltage source 441, in accordance with a time count output signal output from a timer 457 at a predetermined interval.

Reference numeral 455 denotes a charge current detector, arranged midway along the charge current path of the lithium-ion secondary battery 439, for detecting the charge current of the lithium-ion secondary battery 439.

The timer 457 outputs a time count output signal to the charge current controller 453 at a predetermined interval, thereby controlling an interval for temporarily changing the charge current of the lithium-ion secondary battery 439.

The operation of the twenty-fourth embodiment of the present invention will be described.

The constant voltage source 441 with the current limit function charges the lithium-ion secondary battery 439 with a constant voltage at a predetermined current or less.

When the lithium-ion secondary battery 439 is to be charged, the switch 451 is turned on by the charge switching section 449.

During the charge operation, using the characteristics representing that the open battery voltage of the lithium-ion secondary battery 439 is substantially proportional to the battery residual capacity, the battery residual capacity during the charge operation is checked in accordance with the following procedures.

The timer 457 sends a signal to the charge current controller 453 such that the residual capacity of the lithium-ion secondary battery 439 is detected at a predetermined interval.

The charge current controller 453 changes the limit current value of the current limit function of the constant voltage source 441 in accordance with the signal from the timer 457, thereby temporarily changing the charge current.

The charge current and the battery voltage after the charge current is changed are detected by the charge current detector 455 and the battery voltage detector 443, respectively.

When detection of the charge current and the battery voltage after the charge current is changed is completed, the charge current is returned to the state before the change.

The charge current and the battery voltage, which restore the states before the charge current is changed, are detected by the charge current detector 455 and the battery voltage detector 443, respectively.

The battery residual capacity detector 445 obtains a battery voltage at a charge current of zero ampere from the battery voltages at different charge currents before and after the charge current is changed, which are detected by the charge current detector 455 and the battery voltage detector 443. The battery voltage at a charge current of zero ampere is compared with a predetermined known battery voltage to obtain a battery capacity at a charge current of zero ampere, thereby detecting the battery residual capacity during the charge operation.

The battery residual capacity data is sent to the display unit 447 to cause it display the battery residual capacity.

If a full charge state is detected from the battery residual capacity during the charge operation, the switch 451 is turned off by the charge switching section 449, thereby completing the charge operation.

In this manner, the charge current is temporarily changed at a predetermined interval, and the battery voltage at a charge current of zero ampere is obtained from the measured battery voltages at different charge currents. The obtained battery voltage is compared with the predetermined known battery voltage to obtain the battery capacity at a charge current of zero ampere, thereby detecting the battery residual capacity at a predetermined interval.

Twenty-fifth Embodiment

FIG. 49 is a block diagram showing the arrangement of the twenty-fifth embodiment of the present invention.

Referring to FIG. 49, reference numeral 459 denotes a lithium-ion secondary battery. Reference numeral 461 denotes a constant voltage source with a current limit function, which charges the lithium-ion secondary battery 1. Reference numeral 461 denotes a battery voltage detector for detecting the battery voltage of the lithium-ion secondary battery 459.

Reference numeral 465 denotes a battery residual capacity detector for detecting the battery residual capacity and the full charge state of the lithium-ion secondary battery 459. In this embodiment, a charge current is temporarily changed at an interval according to a battery residual capacity, and a battery voltage at a charge current of zero ampere is obtained from measured battery voltages at different charge currents. The obtained battery voltage is compared with a stored known battery voltage to obtain a battery capacity at a charge current of zero ampere, thereby detecting the battery residual capacity. The interval for battery residual capacity detection is changed in accordance with the battery residual capacity, thereby detecting the battery residual capacity.

Reference numeral 467 denotes a display unit for displaying data related to the residual capacity of the lithium-ion secondary battery 459. In this embodiment, the battery residual capacity detected by the battery residual capacity detector 465 is output and displayed.

Reference numeral 469 denotes a charge switching section for turning on/off a switch 471 in accordance with control of the battery residual capacity detector 465. The switch 471 is arranged midway along the charge current path of the lithium-ion secondary battery 459. The switch 471 turns on/off the charge operation of lithium-ion secondary battery 459.

Reference numeral 473 denotes a charge current controller for controlling the charge current of the lithium-ion secondary battery 459, which is supplied from the constant voltage source 461, in accordance with control of a charge current change controller 477.

Reference numeral 475 denotes a charge current detector, arranged midway along the charge current path of the lithium-ion secondary battery 459, for detecting the charge current of the lithium-ion secondary battery 459.

The charge current change controller 477 controls the interval for changing the charge current of the lithium-ion secondary battery 459 in accordance with the battery residual capacity. In this embodiment, if the battery residual capacity of the secondary battery is small, the interval for battery residual capacity detection is prolonged. If the battery residual capacity is large and close to the full charge state, the interval for battery residual capacity detection is shortened.

The operation of the twenty-fifth embodiment of the present invention will be described.

The constant voltage source 461 with the current limit function charges the lithium-ion secondary battery 459 with a constant voltage at a predetermined current or less.

When the lithium-ion secondary battery 459 is to be charged, the switch 469 is turned on by the charge switching section 471.

During the charge operation, using the characteristics representing that the open battery voltage of the lithium-ion secondary battery 459 is substantially proportional to the battery residual capacity, the battery residual capacity during the charge operation is checked in accordance with the following procedures.

The charge current change controller 479 controls the interval for changing the charge current of the lithium-ion secondary battery 459 in accordance with the battery residual capacity detected by the battery residual capacity detector 465. In this embodiment, the charge current change controller 477 sends a control signal to the charge current controller 473 such that, if the battery residual capacity of the lithium-ion secondary battery 459 is small, the interval for battery residual capacity detection is prolonged, and if the battery residual capacity is large and close to the full charge state, the interval for battery residual capacity detection is shortened.

The charge current controller 473 changes the limit current value of the current limit function of the constant voltage source 407 in accordance with the control signal from the charge current change controller 477, thereby temporarily changing the charge current.

The charge current and the battery voltage after the charge current is changed are detected by the charge current detector 475 and the battery voltage detector 463, respectively.

When detection of the charge current and the battery voltage after the charge current is changed is completed, the charge current is returned to the state before the change.

The charge current and the battery voltage, which restore the states before the charge current is changed, are detected by the charge current detector 367 and the battery voltage detector 463, respectively.

The battery residual capacity detector 465 obtains a battery voltage at a charge current of zero ampere from the battery voltages at different charge currents before and after the charge current is changed, which are detected by the charge current detector 475 and the battery voltage detector 463. The battery voltage at a charge current of zero ampere is compared with a stored known battery voltage to obtain a battery capacity at a charge current of zero ampere, thereby detecting the battery residual capacity during the charge operation.

The battery residual capacity data is sent to the display unit 467 to cause it display the battery residual capacity.

If a full charge state is detected from the battery residual capacity during the charge operation, the switch 471 is turned off by the charge switching section 469, thereby completing the charge operation.

In this manner, the interval is changed in accordance with the battery residual capacity to detect the battery residual capacity. More specifically, the charge current is temporarily changed at an interval according to the battery residual capacity, and the battery voltage at a charge current of zero ampere is obtained from the measured battery voltages at different charge currents. The obtained battery voltage is compared with the predetermined known battery voltage to obtain the battery capacity at a charge current of zero ampere, thereby detecting the battery residual capacity.

Twenty-sixth Embodiment

FIG. 50 is a block diagram showing the arrangement of the twenty-sixth embodiment of the present invention.

Referring to FIG. 50, reference numeral 479 denotes a lithium-ion secondary battery. Reference numeral 481 denotes a load circuit for the battery 479. In this embodiment, a load with a load variation is used. Reference numeral 483 denotes a battery voltage detector for detecting the battery voltage of the lithium-ion secondary battery 479.

Reference numeral 485 denotes a battery residual capacity detector for detecting the battery residual capacity of the lithium-ion secondary battery 479. In this embodiment, a battery voltage at a discharge current of zero ampere is obtained from a plurality of battery voltage data at different discharge currents according to load variations of the load circuit 481, which are detected by a discharge current detector 489. The obtained battery voltage is compared with a stored known battery voltage to obtain the battery capacity at a discharge current of zero ampere, thereby detecting the battery residual capacity.

Reference numeral 487 denotes a display unit for displaying data related to the residual capacity of the lithium-ion secondary battery 479. In this embodiment, the battery residual capacity detected by the battery residual capacity detector 485 is output and displayed.

The discharge current detector 489 detects the discharge current of the lithium-ion secondary battery 479.

The operation of the twenty-sixth embodiment of the present invention will be described.

A power is applied to the load circuit 481 from the lithium-ion secondary battery 479.

Using the characteristics representing that the open battery voltage of the lithium-ion secondary battery 479 is substantially proportional to the battery residual capacity, the battery residual capacity during the discharge operation is checked in accordance with the following procedures.

The battery residual capacity detector 485 obtains a battery voltage at a discharge current of zero ampere from two or more battery voltage data at different discharge currents, which are detected by the discharge current detector 489 and the battery voltage detector 483. The obtained battery voltage is compared with a stored known battery voltage to detect the battery residual capacity.

The battery residual capacity data is sent to the display unit 487 to cause it display the battery residual capacity.

In this manner, the battery capacity of the lithium-ion secondary battery 479 during the discharge operation is detected, and the detected battery residual capacity is output and displayed.

Twenty-seventh Embodiment

FIG. 51 is a block diagram showing the arrangement of the twenty-seventh embodiment of the present invention.

Referring to FIG. 51, reference numeral 491 denotes a lithium-ion secondary battery. Reference numeral 493 denotes a load circuit with a load variation. Reference numeral 495 denotes a battery voltage detector for detecting the battery voltage of the lithium-ion secondary battery 491.

Reference numeral 497 denotes a battery residual capacity detector for detecting the battery residual capacity of the lithium-ion secondary battery 491. In this embodiment, in accordance with a start signal output from a timer 503 at a predetermined interval, a battery voltage at a discharge current of zero ampere is obtained from a plurality of battery voltage data at different discharge currents according to load variations of the load circuit 493, which are detected by a discharge current detector 501. The obtained battery voltage is compared with a stored known battery voltage to obtain a battery capacity at a discharge current of zero ampere, thereby detecting the battery residual capacity.

Reference numeral 499 denotes a display unit for displaying data related to the residual capacity of the lithium-ion secondary battery 491. In this embodiment, the battery residual capacity detected by the battery residual capacity detector 497 is output and displayed.

The discharge current detector 501 detects the discharge current of the lithium-ion secondary battery 491.

The timer 503 controls an interval for residual capacity detection of the lithium-ion secondary battery 491, which is performed by the battery residual capacity detector 497, at a predetermined interval.

The operation of the twenty-seventh embodiment of the present invention will be described.

A power is applied to the load circuit 493 from the lithium-ion secondary battery 491.

Using the characteristics representing that the open battery voltage of the lithium-ion secondary battery 491 is substantially proportional to the battery residual capacity, the battery residual capacity during the discharge operation is checked in accordance with the following procedures.

The timer 503 sends a signal to the battery residual capacity detector 497 such that the residual capacity of the lithium-ion secondary battery 491 is detected at a predetermined interval.

Upon reception of the signal from the timer 503, the battery residual capacity detector 497 obtains a battery voltage at a discharge current of zero ampere from two or more battery voltage data at different discharge currents, which are detected by the discharge current detector 501 and the battery voltage detector 495. The obtained battery voltage is compared with a stored known battery voltage to detect the battery residual capacity.

The battery residual capacity data is sent to the display unit 499 to cause it display the battery residual capacity.

In this manner, the battery capacity of the lithium-ion secondary battery 491 during the discharge operation is detected at a predetermined interval according to control of the timer 503, and the detected battery residual capacity is output and displayed.

Twenty-eighth Embodiment

Figure 52:
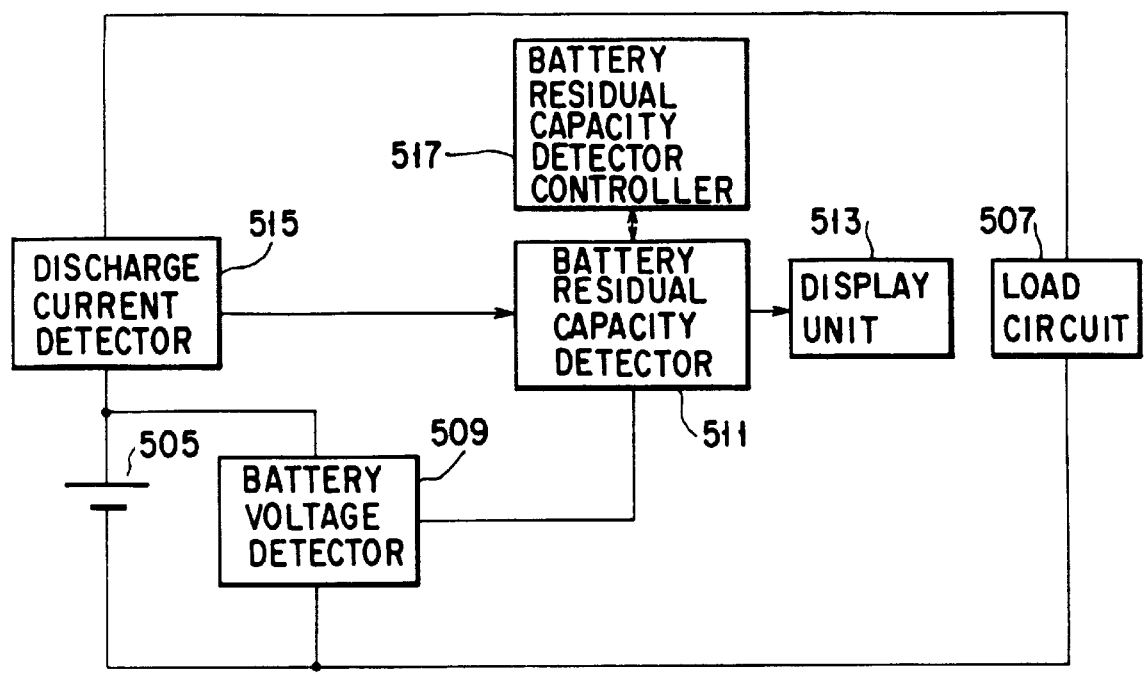
FIG. 52 is a block diagram showing an arrangement according to the twenty-eighth embodiment of the present invention.

FIG. 52 is a block diagram showing the arrangement of the twenty-eighth embodiment of the present invention.

Referring to FIG. 52, reference numeral 505 denotes a lithium-ion secondary battery. Reference numeral 507 denotes a load circuit with a load variation. Reference numeral 509 denotes a battery voltage detector for detecting the battery voltage of the lithium-ion secondary battery 505.

Reference numeral 511 denotes a battery residual capacity detector for detecting the battery residual capacity of the lithium-ion secondary battery 505. In this embodiment, a battery voltage at a charge current of zero ampere is obtained, at an interval changed in accordance with a battery residual capacity, from a plurality of battery voltage data at different discharge currents according to load variations of the load circuit 507, which are detected by a discharge current detector 515. The obtained battery voltage is compared with a stored known battery voltage to obtain a battery capacity at a charge current of zero ampere, thereby detecting the battery residual capacity.

Reference numeral 513 denotes a display unit for displaying data related to the residual capacity of the lithium-ion secondary battery 505. In this embodiment, the battery residual capacity detected by the battery residual capacity detector 511 is output and displayed.

The discharge current detector 515 detects the discharge current of the lithium-ion secondary battery 505.

Reference numeral 517 denotes a battery residual capacity detecting controller for changing an interval for detection of the battery residual capacity of the lithium-ion secondary battery 505 in accordance with the battery residual capacity. In this embodiment, the battery residual capacity detecting controller 517 sends a signal to the battery residual capacity detector 511 such that, if the battery residual capacity is large, the interval for battery residual capacity detection is prolonged, and if the battery residual capacity is small, the interval for battery residual capacity detection is shortened.

The operation of the twenty-eighth embodiment of the present invention will be described.

A power is applied to the load circuit 507 from the lithium-ion secondary battery 505.

Using the characteristics representing that the open battery voltage of the lithium-ion secondary battery 505 is substantially proportional to the battery residual capacity, the battery residual capacity during the discharge operation is checked in accordance with the following procedures.

The battery residual capacity detecting controller 517 changes an interval for battery residual capacity detection in accordance with the residual capacity of the lithium-ion secondary battery 505. In this embodiment, the battery residual capacity detecting controller 517 sends a signal to the battery residual capacity detector 511 such that, if the battery residual capacity is large, the interval for residual capacity detection is prolonged, and if the battery residual capacity is small, the interval for battery residual capacity detection is shortened.

Upon reception of the signal from the battery residual capacity detecting controller 517, the battery residual capacity detector 511 obtains a battery voltage at a discharge current of zero ampere from battery voltage data at different discharge currents, which are detected by the discharge current detector 515 and the battery voltage detector 509. The obtained battery voltage is compared with a stored known battery voltage to detect the battery residual capacity.

The battery residual capacity data is sent to the display unit 513 to cause it display the battery residual capacity.

In this manner, battery residual capacity detection is performed at an interval changed in accordance with the residual capacity of the lithium-ion secondary battery 505.

In the above-described embodiments, the battery residual capacity of the lithium-ion secondary battery is detected. However, the above embodiments can also be applied to a system having a secondary battery such as a vanadium-lithium secondary battery, a carbon-lithium secondary battery, a lead battery, which have characteristics representing that the open battery voltage is substantially proportional to the battery residual capacity.

In the twenty-sixth, twenty-seventh, and twenty-eighth embodiments, the load circuit with a load variation has been exemplified. However, a circuit arrangement can also be used in which, in battery residual capacity detection, the load current of a load with no load variation during a short period of time (load current does not change during a short period of time) is temporarily externally changed.

Twenty-ninth Embodiment

In charge control of a secondary battery in a battery pack incorporating a lithium-ion secondary battery, first of all, a constant current charge operation is performed. When a battery voltage increases to reach a predetermined maximum charge voltage, the charge mode is switched to a constant voltage charge operation. Upon detection of a full charge state, the charge operation is completed.

To detect the full charge state of the secondary battery in such charge control, conventionally, a charge current during the constant voltage charge operation is measured. If the charge current is smaller than a specified current value, the full charge state is detected.

However, in such a full charge detecting means, the full charge state is also detected when the charge current does not flow because of a failure such as an open battery state.

In addition, if the full charge state is erroneously detected, the operable time of the battery pack is erroneously recognized. Processing (e.g., application software processing) must be incompletely interrupted during driving of an equipment by the battery pack (during battery driving), resulting in inconvenience.

Furthermore, some battery packs have a storage unit for storing charge/discharge information of the incorporated secondary battery.

The battery capacity of the battery pack of this type is managed by adding/subtracting a battery capacity detected during the charge/discharge operation to/from a battery capacity stored in the storage unit.

However, such a battery capacity managing means poses the following problem.

Assume that, after the battery in the full charge state ("100%" in the storage unit) is left unused and discharged to some extent, the battery is charged again. In this case, the battery capacity information stored by the storage unit remains "100%" although the actual capacity decreases. Since the full charge state is recognized, the battery cannot be completely charged. If the discharge operation is performed in a state wherein the information in the storage unit is "100%", the capacity information in the storage unit does not become "0" although the actual capacity becomes zero.

To charge the secondary battery of the above-described battery pack, a charge scheme is employed in which the charge amount of the battery during the charge operation is added at a predetermined interval, and the charge operation is ended upon detection of the full charge state. Alternatively, a charge scheme is employed in which, when it is detected that the charge current becomes smaller than a reference current value, the charge operation is ended.

Assume that, during the charge operation of a secondary battery (battery A), the secondary battery (battery A) being charged is replaced with another secondary battery (battery B). In the conventional charge scheme, battery capacity data representing the full charge state detected during the charge operation of the battery A is held. If the charge capacity of the battery A during the charge operation is smaller than that of the battery B, the charge capacity becomes too small. To the contrary, if the capacity of the battery B is larger than that of the battery A, an overcharge state is set. If the battery exchanged during the charge operation is an abnormal battery, exchange of the battery pack cannot be detected, so the charge operation is continuously performed.

When a plurality of lithium-ion secondary batteries are to be independently charged, the full charge state of one lithium-ion secondary battery is detected, and thereafter, a next lithium-ion secondary battery is charged. Upon detection of the full charge state of all the batteries, the charge operation of each secondary battery is ended.

However, in such conventional charge control, after the full charge state of one secondary battery is detected, this secondary battery is not charged anymore. For this reason, the secondary battery is discharged, and the full charge state cannot be maintained. If the secondary battery is continuously discharged, it cannot be appropriately managed.

Figure 53:
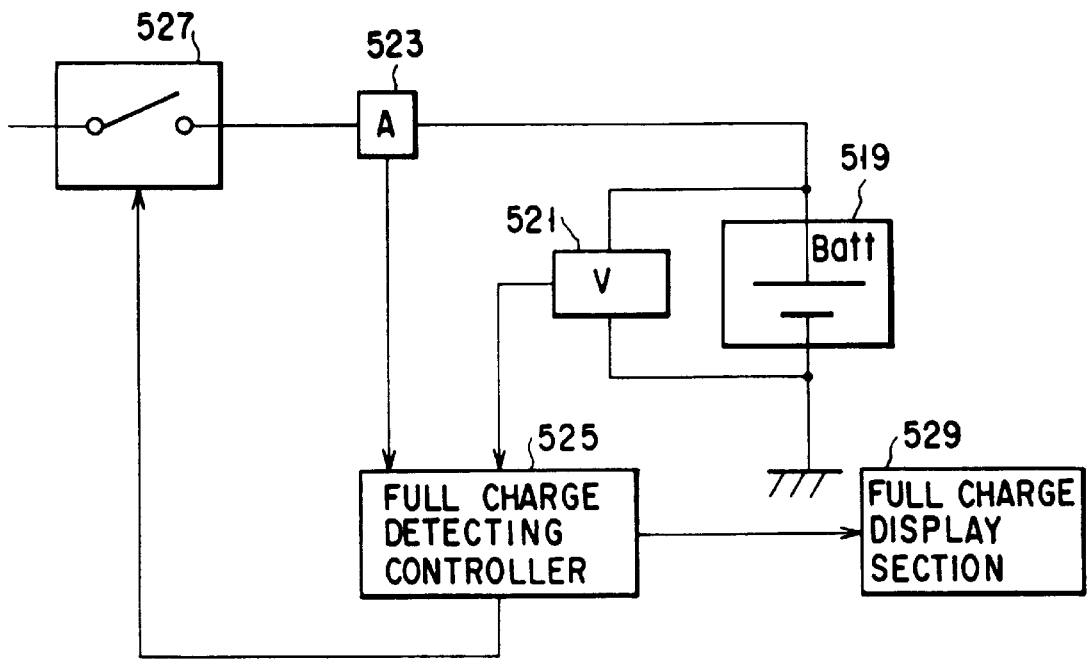
FIG. 53 is a block diagram showing an arrangement according to the twenty-ninth embodiment of the present invention.

FIG. 53 is a block diagram showing the twenty-ninth embodiment of the present invention.

Referring to FIG. 53, reference numeral 519 denotes a lithium-ion secondary battery (BATT) subjected to a constant current constant voltage charge operation. Reference numeral 521 denotes a voltage measuring section (V) for measuring the charge voltage of the lithium-ion secondary battery 519. Reference numeral 523 denotes a current measuring section (A) for measuring the charge current of the lithium-ion secondary battery 519.

Reference numeral 525 denotes a full charge detecting controller for detecting the full charge state of the lithium-ion secondary battery 519 from a voltage measured by the voltage measuring section 521 and a current measured by the current measuring section 523. When the charge current measured by the current measuring section 523 becomes smaller than a specified current value, a switch 527 is temporarily turned off. The battery voltage measured by the voltage measuring section 521 is checked. If the measured voltage reaches a specified voltage, the full charge state is detected. The full charge detecting controller 525 is realized by, e.g., a power supply microcomputer.

The switch 527 is arranged midway along the charge current path of the lithium-ion secondary battery 519 and turned on/off by the full charge detecting controller 525. When the charge current measured by the current measuring section 523 becomes smaller than the specified value, the switch 527 is turned off.

Reference numeral 529 denotes a full charge display section. Upon detection of the full charge state by the full charge detecting controller 525, the full charge state of the lithium-ion secondary battery 519 is output and displayed.

The operation of the twenty-ninth embodiment shown in FIG. 53 will be described.

During the charge operation of the lithium-ion secondary battery 519, a charge power is supplied to the lithium-ion secondary battery 519 from a constant current constant voltage source (not shown) through the switch 527. With this operation, the constant current constant voltage charge operation of the lithium-ion secondary battery 519 is performed.

The charge current of the lithium-ion secondary battery 519 decreases as the charge operation comes to the end. At the end of the charge operation, the charge current becomes smaller than a predetermined current value, i.e., a specified current value set by the full charge detecting controller 525.

When it is recognized that the charge current measured by the current measuring section 523 is smaller than the specified current value, the full charge detecting controller 525 temporarily turns off the switch 527 and checks the battery voltage measured by the voltage measuring section 521. More specifically, the open battery voltage of the lithium-ion secondary battery 519 is checked. It is determined whether the measured voltage reaches a predetermined specified voltage. If the voltage reaches the specified voltage, the full charge state is detected and informed to the full charge display section 529. With this operation, information representing the full charge state of the lithium-ion secondary battery 519 is displayed on the full charge display section 529.

As described above, according to the twenty-ninth embodiment, the full charge state is detected on the basis of the charge current and the battery voltage. For this reason, the full charge state erroneously detected when the charge current does not flow because of an abnormal battery can be avoided, thereby always appropriately detecting the full charge state.

Thirtieth Embodiment

Figure 54:
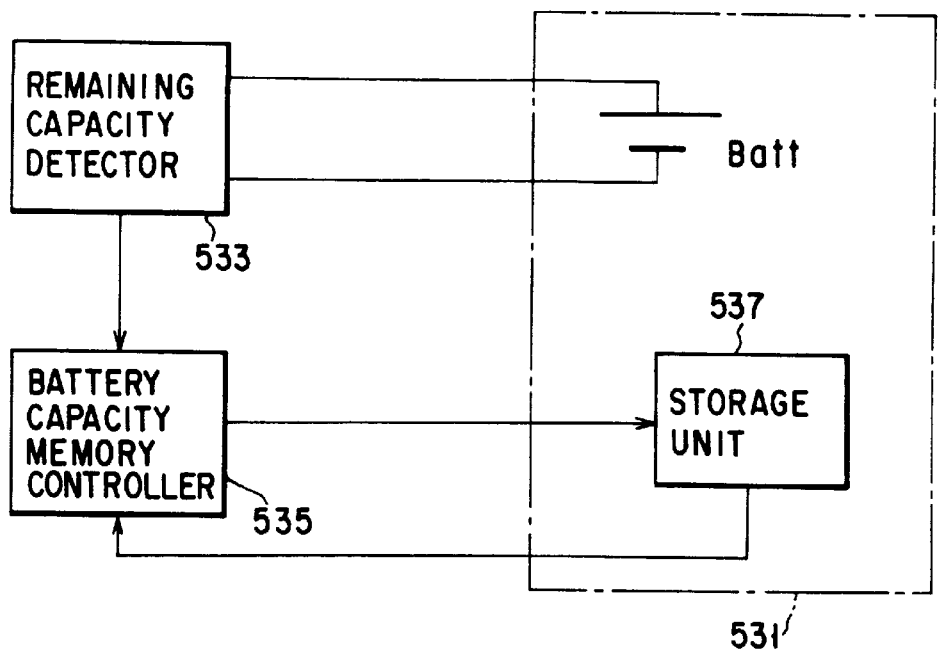
FIG. 54 is a block diagram showing an arrangement according to the thirtieth embodiment of the present invention.

FIG. 54 is a block diagram showing the thirtieth embodiment of the present invention.

Referring to FIG. 54, reference numeral 531 denotes a battery pack incorporating a secondary battery (BATT) and a storage unit 537 for storing the residual capacity of the incorporated secondary battery (BATT).

Reference numeral 533 denotes a residual capacity detector for detecting the residual capacity of the battery pack 531 (residual capacity of the secondary battery (BATT) incorporated in the battery pack 531). The residual capacity detector 533 detects the residual capacity of the battery pack 531 from the battery voltage of the battery pack 531 (battery voltage of the secondary battery (BATT) incorporated in the battery pack 531). The residual capacity detector 533 is realized by, e.g., a power supply microcomputer. A lithium-ion secondary battery has characteristics representing that the battery voltage is proportional to the battery capacity. For this reason, the battery voltage is measured to calculate the capacity from the characteristics of the battery voltage and the battery capacity, thereby detecting the residual capacity.

Reference numeral 535 denotes a battery capacity memory controller having a battery capacity comparing function, which is realized by, e.g., a power supply microcomputer. The battery capacity memory controller 535 compares the residual capacity of the battery pack 531, which is detected by the residual capacity detector 533, with the residual capacity stored in the storage unit 537 of the battery pack 531. If a difference between the residual capacities is larger than a predetermined specified value, the information of the residual capacity detector 533 is written in the storage unit 537 as accurate residual capacity information. If the difference between the residual capacities does not reach the specified value, no information is written in the storage unit 537. After a predetermined period, the above-described operation including battery capacity comparison is repeatedly performed.

The storage unit 537 is arranged in the battery pack 531. The read/write operation of the storage unit 537 is controlled in accordance with control of the battery capacity memory controller 535. The residual capacity information of the incorporated secondary battery (BATT) is stored in the storage unit 537.

The operation of the thirtieth embodiment shown in FIG. 54 will be described.

The residual capacity of the battery pack 531 (residual capacity of the secondary battery (BATT) incorporated in the battery pack 531) is stored in the storage unit 537 in the battery pack 531 under the control of the battery capacity memory controller 535 at a predetermined period.

The residual capacity detector 533 detects the actual residual capacity of the battery pack 531 from the battery voltage of the battery pack 531 (battery voltage of the secondary battery (BATT) incorporated in the battery pack 531). The detected residual capacity is supplied to the battery capacity memory controller 535.

The battery capacity memory controller 535 accesses the storage unit 537 of the battery pack 531 at a predetermined period to read the residual capacity stored in the storage unit 537. The residual capacity is compared with the actual battery residual capacity detected by the residual capacity detector 535 to determine whether a difference therebetween is larger than a specified value.

As the comparison result, if the difference between the residual capacities is larger than the specified value, the actual residual capacity detected by the residual capacity detector 533 is written in the storage unit 537 as an accurate residual capacity. After a predetermined period, the above-described operation including battery capacity comparison is repeatedly performed.

If the difference between the residual capacities does not reach the specified value, no information is written in the storage unit 537. After a predetermined period, the above-described operation including battery capacity comparison is repeatedly performed.

With such a battery capacity managing mechanism, an accurate residual capacity can be always stored in the storage unit 537 of the battery pack 531.

Thirty-first Embodiment

Figure 55:
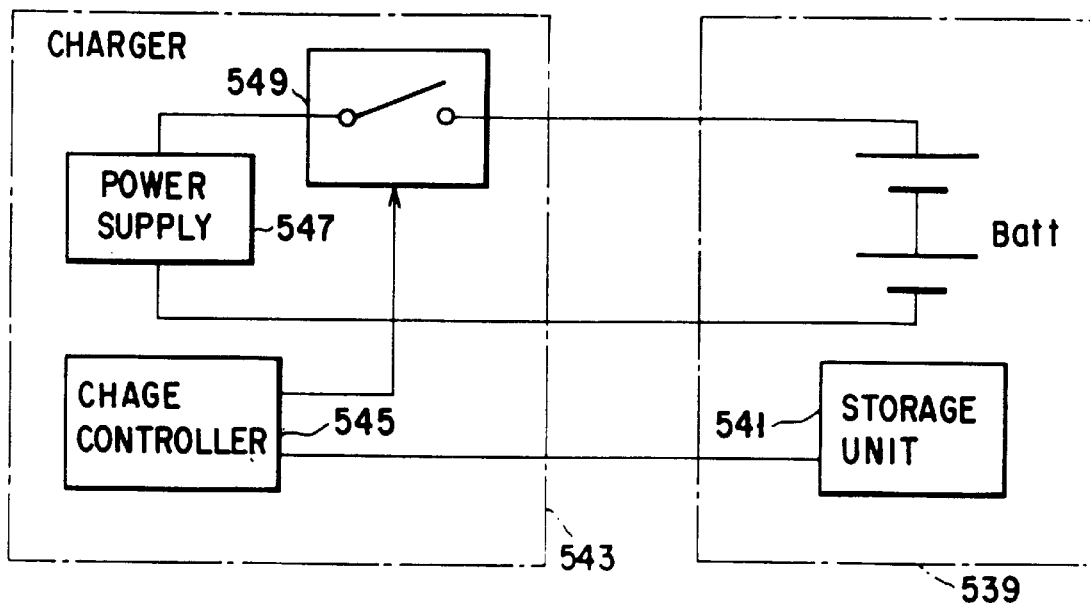
FIG. 55 is a block diagram showing an arrangement according to the thirty-first embodiment of the present invention.

FIG. 55 is a block diagram showing the thirty-first embodiment of the present invention.

Referring to FIG. 55, reference numeral 539 denotes a battery pack incorporating a secondary battery (BATT) constituted by a battery set, and a storage unit 541 for storing the residual capacity of the incorporated secondary battery (BATT), identification information inherent to a pack and used to identify battery packs, and the like.

Reference numeral 543 denotes a charger for controlling the charge operation of the battery pack 539. The charger 543 has a charge controller 545, a power supply 547, a charge ON/OFF switch 549, and the like.

The charge controller 545 reads identification information inherent to a battery pack from the storage unit 541 of the battery pack 539 at a predetermined period. The read information is updated and stored. The charge controller 545 compares the currently read identification information with the previously read and stored identification information to detect the presence/absence of exchange of the battery pack during the charge operation. If exchange of the battery pack 539 during the charge operation is detected, the switch 549 arranged midway along the charge path is temporarily turned off, thereby temporarily stopping the charge operation of the battery pack before exchange. The information of the incorporated secondary battery (BATT) is read from the storage unit 541 of the exchanged battery pack 539. In accordance with the state of the exchanged battery pack 539, the charge operation is started from the beginning.

The operation of the thirty-first embodiment shown in FIG. 55 will be described.

The storage unit 541 of the battery pack 539 stores the state information such as the residual capacity of the incorporated secondary battery (BATT) and the identification information inherent to the battery pack.

A charge power is supplied to the secondary battery (BATT) incorporated in the battery pack 539 from the power supply 547 of the charger 543 through the charge ON/OFF switch 549. The charge operation is continued until the full charge state of the secondary battery incorporated in the battery pack 539 is obtained. In this charge operation, any one of the following charge schemes can be used: a charge scheme in which the charge operation is continued until the charge amount of the battery pack during the charge operation reaches a specified value; a charge scheme in which the charge operation is continued until the charge current becomes smaller than a specified value; and a charge scheme in which the charge operation is continued until the charge time reaches a set time.

The charge controller 545 reads identification information inherent to a battery pack from the storage unit 541 of the battery pack 539 at a predetermined period. The read information is stored, and the charge controller 545 compares the currently read identification information with the previously read and stored identification information to check the presence/absence of exchange of the battery pack during the charge operation. If exchange of the battery pack 539 during the charge operation is detected, the switch 549 arranged midway along the charge path is temporarily turned off, thereby temporarily stopping the charge operation of the battery pack before the exchange. The information of the incorporated secondary battery (BATT) is read from the storage unit 541 of the exchanged battery pack 539. In accordance with the state of the exchanged battery pack 539, the charge operation is started from the beginning.

As described above, there is provided a charge control means for stopping the charge operation of the battery pack before exchange upon detection of exchange of the battery pack during the charge operation and newly starting the charge operation of the exchange battery pack. With this arrangement, even when the battery pack is exchanged during the charge operation, the charge operation can be accurately performed in accordance with each battery state. The chargeable capacity of the battery pack can be utilized without any waste. In addition, even if the battery pack exchanged during the charge operation is abnormal, the battery abnormality can be recognized at the time of exchange of the battery. For this reason, an accurate charge operation can be maintained at high reliability and safety.

In the above embodiment shown in FIG. 55, when exchange of the battery pack 539 during the charge operation is detected, the charge operation is stopped. The information of the incorporated secondary battery (BATT) is read from the storage unit 541 of the exchanged battery pack 539, and the charge operation is started from the beginning in accordance with the state of the exchanged battery pack 539. However, a storage section for storing the charge state information of the battery may be arranged outside the battery pack. In this case, the storage section is initialized upon detection of exchange of the battery pack during the charge operation. Thereafter, the charge operation of the exchanged battery pack is newly started, and the charge state information according to this charge operation is stored in the storage section. Also in this case, as in the above embodiment, regardless of exchange of the battery pack during the charge operation, the charge operation can be accurately performed in accordance with each battery state, and the chargeable capacity of the battery pack can be utilized without any waste. At the same time, even if the battery pack exchanged during the charge operation is abnormal, the battery abnormality can be recognized at the time of exchange of the battery, so an accurate charge operation can be maintained at high reliability and safety.

Thirty-second Embodiment

FIG. 56 is a block diagram showing the thirty-second embodiment of the present invention. FIGS. 57A and 57B are charts for explaining the operation of the thirty-second embodiment.

Referring to FIG. 56, reference numerals 551a and 551b denote battery packs incorporating secondary batteries to be charged. Reference numeral 553 denotes a constant voltage constant current source for applying a constant voltage charge voltage to the battery packs 551a and 551b.

Reference numeral 555 denotes a charge controller, realized by, e.g., a power supply microcomputer, for controlling the constant voltage charge operation of the battery packs 551a and 551b. The charge controller 555 has a full charge detecting function. The charge controller 555 also has a charge control function of temporarily stopping the charge operation of the battery pack (551a) and starting the constant current charge operation of the remaining battery pack (515b) requiring constant current charge when the full charge state of the battery pack (e.g., 551a) during the charge operation is detected. The charge controller 555 also has a charge control function of forming, when the constant current charge operation of the battery packs 551d and 551b is completed, charge paths for the battery packs 551a and 551b such that the battery packs 551a and 551b are kept in the full charge state, thereby controlling the constant voltage charge operation.

More specifically, as shown in FIGS. 57A and 57B, upon completion of the constant current charge operation of the battery packs 551a and 551b, the charge controller 555 turns on switches 557a and 557b arranged midway along the charge paths of the battery packs 551a and 551b, respectively, thereby forming the charge paths for the battery packs 551a and 551b. When the charge current becomes smaller than a specified value, the constant voltage constant current source 553 outputs a charge power in a constant voltage mode. With this operation, the battery packs 551a and 551b are charged with a constant voltage and maintain the full charge state.

The switches 557a and 557b are arranged midway along the charge paths of the battery packs 551a and 551b, respectively, and turned on/off by the charge controller 555.

The operation of the thirty-second embodiment shown in FIG. 56 will be described with reference to FIGS. 57A and 57B.

When it is determined that one battery pack 551a is set in the full charge state by the constant current constant voltage charge operation, and the other battery pack 551b has completed the constant current charge operation, the charge controller 555 turns on the switches 557a and 557b respectively arranged midway along the charge paths of the battery packs 551a and 551b.

When the charge current becomes smaller than a specified value, the constant voltage constant current source 553 outputs the charge power in the constant voltage mode.

With this operation, the constant voltage charge operation of the battery packs 551a and 551b is controlled, and the battery packs 551a and 551b are kept in the full charge state.

FIGS. 57A and 57B are charts showing the charge states of the battery packs 551a and 551b. The constant voltage charge operation of the battery packs 551a and 551b is controlled from a point TE in FIGS. 57A and 57B. The battery packs 551a and 551b are kept in the full charge state, and the battery management can be always performed in an appropriate battery state.

Thirty-third Embodiment

FIG. 58 is a block diagram showing the thirty-third embodiment of the present invention.

Referring to FIG. 58, reference numeral 559 denotes a battery pack constituted by a battery set and having a storage unit 561 for storing identification information inherent to the pack therein.

Reference numeral 563 denotes a charger having a function of storing the identification information inherent to the battery pack 559, which is read from the battery pack 559, and detecting the presence/absence of exchange of the battery pack during a charge operation.

Reference numeral 565 denotes a data collating unit arranged in the charger 563. The data collating unit 565 periodically reads the identification information inherent to the battery pack 559 and collates the read information with previously read and stored identification information, thereby detecting the presence/absence of exchange of the battery pack.

Reference numeral 567 denotes a power supply for the charger 563 for outputting the charge current of the battery pack 559.

Reference numeral 569 denotes a charge amount storage unit arranged in the charger 563. The charge amount storage unit 569 adds a charge amount in accordance with the charge operation and stops the charge operation when the charge amount reaches a predetermined charge amount.

Reference numeral 571 denotes a reference charge amount storage unit, arranged in the charger 563, for storing the charge amount of the battery pack 559 in a full charge state.

Reference numeral 573 denotes a comparator arranged in the charger 563. The comparator 573 compares the charge amount of the battery pack 559 during the charge operation with a reference charge amount stored in the reference charge amount storage unit 571.

Reference numeral 575 denotes a switch arranged in the charger 563. The switch 575 is turned off when exchange of the battery pack is detected by the data collating unit 565 and when the charge amount reaches the reference charge amount, thereby stopping the charge operation of the battery pack 559.

The operation of the thirty-third embodiment shown in FIG. 58 will be described.

The data collating unit 565 of the charger 563 periodically reads the identification information inherent to the battery pack 559 from the storage unit 561 of the battery pack 559 during the charge operation. The read identification information is collated with previously read and stored identification information to detect the presence/absence of exchange of the battery pack.

Upon detection of exchange of the battery pack during the charge operation, the data collating unit 565 turns off the switch 575. At the same time, the data collating unit 565 clears an added charge amount stored in the charge amount storage unit 569, and thereafter, turns on the switch 575 to start the charge operation of the exchanged battery pack 559.

In detection of the presence/absence of exchange of the battery pack, if exchange of the battery pack during the charge operation is not detected, the comparator 593 compares the added charge amount stored in the charge amount storage unit 569 with the reference charge amount stored in the reference charge amount storage unit 571. With this comparison, if it is detected that the charge amount reaches the reference charge amount, the switch 575 is turned off to stop the charge operation of the battery pack 559.

As described above, upon detection of exchange of the battery pack during the charge operation, the charge operation of the battery pack before the exchange is stopped, and the charge operation of the exchanged battery pack is newly started. With such a charge control means, regardless of exchange of the battery pack during the charge operation, the charge operation can accurately performed in accordance with each battery state, and the chargeable capacity of the battery pack can be utilized without any waste. In addition, even if the battery pack exchanged during the charge operation is abnormal, the battery abnormality can be recognized at the time of exchange of the battery pack, so an accurate charge operation can be maintained at high reliability and safety.

Thirty-fourth Embodiment

In a conventional charge apparatus (charger) for charging a secondary battery, when the abnormality of an input voltage (charge voltage) or an input current (charge current) is detected, the charge operation is stopped.

In the prior art, although the abnormality is detected when the input voltage only instantaneously or temporarily decreases, the charge operation cannot be continued.

More specifically, in the prior art, the abnormality is detected although the input voltage only instantaneously or temporarily decreases, and the subsequent charge operation is stopped. For this reason, a full charge state cannot be obtained even in a normal secondary battery, so a user erroneously recognizes the abnormality of the battery or the charge unit.

In addition, in the conventional detection of the full charge state of the secondary battery, a full charge detecting means is used in which a charge amount is periodically added, and when the added charge amount reaches a predetermined charge amount, the full charge state is detected. Alternatively, a full charge detecting means is used in which, when the charge time reaches a predetermined time, the full charge state is detected.

As described above, in the full charge detection in which the full charge state of the secondary battery is detected in accordance with the charge amount or the charge time, the battery voltage of the charged secondary battery is not measured. For this reason, it cannot be determined whether the battery is actually set in the full charge state, so the problem of reliability is posed. When the secondary battery is not sufficiently charged or cannot be charged, an abnormal battery and a normal battery cannot be discriminated.

Furthermore, in the conventional charge mechanism of the secondary battery, to ensure the safety, a controller using a microprocessor is arranged in a secondary battery pack to confirm, before a charge operation, whether the battery pack is suitable for the charger and whether the secondary battery is normal. With this mechanism, charge control is performed by communication between the controller and a unit on the charger side.

Communication procedures between the controller (microprocessor) in the battery pack and the unit on the charger side will be described below. The unit on the charger side detects that the secondary battery is mounted (set) in the charge section. When it is detected that the secondary battery is set, a voltage for performing communication with the controller in the battery pack is applied to the battery pack. Upon application of the voltage, the controller starts to operate. A communication enable state is confirmed by both the units. Thereafter, secondary battery data stored in a memory in the battery pack is read by communication. It is determined whether the secondary battery is standard and in a chargeable state. If the secondary battery is chargeable, an in-charge state is displayed, and the charge operation is started.

However, in such a charge control mechanism by communication, matching or the state of the battery to be charged is confirmed by communication, and thereafter, the charge operation is started. This requires much time from setting of the battery to the in-charge display, so the display is delayed. For this reason, when the secondary battery is set in the charger, display is largely delayed. Therefore, a user cannot immediately recognize the start of the charge operation of the secondary battery (battery pack) suitable for the charger, resulting in inconvenience in state display.

Conventionally, as information processing equipments such as a personal computer, compact and lightweight portable equipments are widely used. The information processing equipment of this type can be driven by a chargeable battery (secondary battery) and has various functions for power consumption saving. The secondary battery also has various functions of preventing overcharge or overdischarge while taking the safety of the battery into consideration.

In the constant voltage charge operation of a lithium-ion secondary battery, generally, when the charge current becomes smaller than a predetermined value (set current value for full charge detection), a full charge state is detected.

However, in the full charge detection of this type, the battery voltage or current characteristics during the charge operation vary depending on a battery temperature, so full charge detection cannot be accurately performed.

Figure 70:
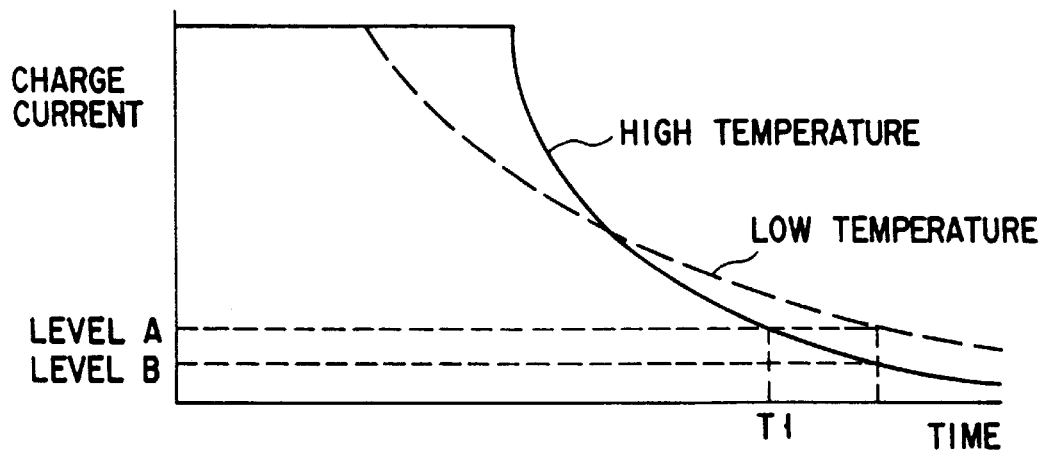
FIG. 70 is a chart of charge characteristics for explaining conventional charge control without considering a battery temperature.

More specifically, conventionally, a change in battery characteristics with a change in battery temperature is not taken into consideration, and when the charge current becomes smaller than a predetermined value, a full charge state is detected. For example, as shown in FIG. 70, a detection point is set at a level A where a full charge state can be appropriately detected at a low temperature. In this case, if the temperature increases, a full charge state is detected at a time T1 before the battery is actually set in the full charge state. To the contrary, when the full charge detection point is set at a level B where a full charge state is appropriately detected at a high temperature, a full charge state cannot be undesirably detected at a low temperature.

Thirty-fourth Embodiment (6-46022, FIGS. 1 and 2)

FIG. 59 is a block diagram showing the functional arrangement of the thirty-fourth embodiment of the present invention.

Referring to FIG. 59, reference numeral 577 denotes a charger. Reference numeral 579 denotes a secondary battery. When the secondary battery 579 is set in the charge section of the charger 577, the secondary battery 579 is connected to the circuit and charge-controlled.

Reference numerals 581 through 587 denote constituent elements of the charger 577. Reference numeral 581 denotes a switch arranged midway along a charge path and ON/OFF-controlled by a charge controller 583. The switch 581 corresponds to the DC/DC converter 57 in FIG. 8.

When an input voltage (charge power supply voltage) applied to the secondary battery 579 is normal, the charge controller 583 turns on the switch 581 arranged midway along the charge path, thereby performing the charge operation of the secondary battery 579 set in the charge section. When the input voltage becomes abnormal, and an abnormality detection signal is received from an input voltage abnormal detector 585, the charge controller 583 turns off the switch 581, thereby stopping the charge operation. The charge controller 583 corresponds to the power supply microcomputer 69 in FIG. 8.

The input voltage abnormal detector 585 checks an input voltage measured by an input voltage measuring section 587 to determine a normality/abnormality, thereby informing a determination signal to the charge controller 583. The input voltage abnormal detector 585 corresponds to, e.g., the voltage division resistors 52a and 52b in FIG. 8.

The input voltage measuring section (V) 587 measures an input voltage (charge power supply voltage) applied to the secondary battery 579 and informs the measured input voltage to the input voltage abnormal detector 585.

Figure 91:
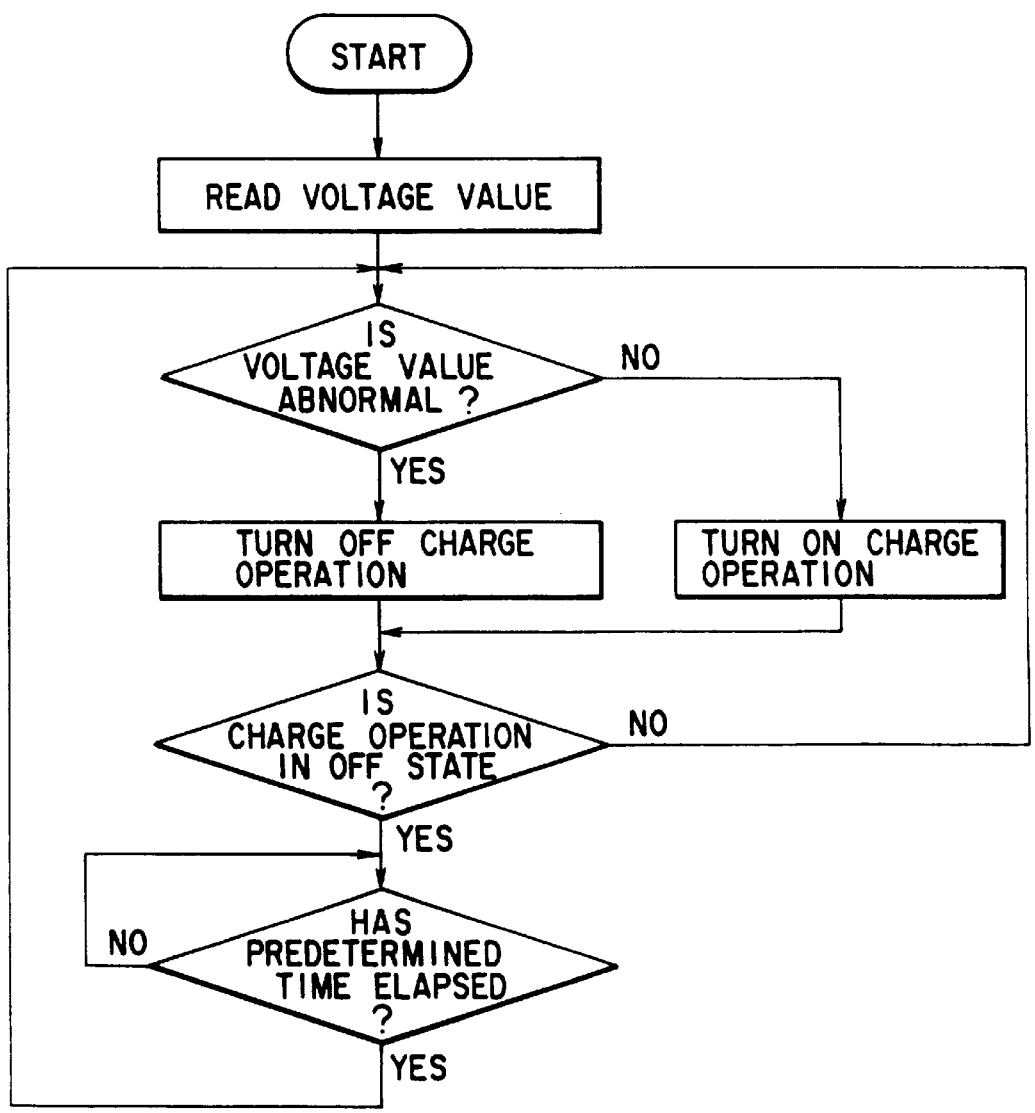
FIG. 91 is a flow chart of input voltage abnormal detection firmware stored in a ROM of the thirty-fourth embodiment shown in FIG. 60.
Figure 94:
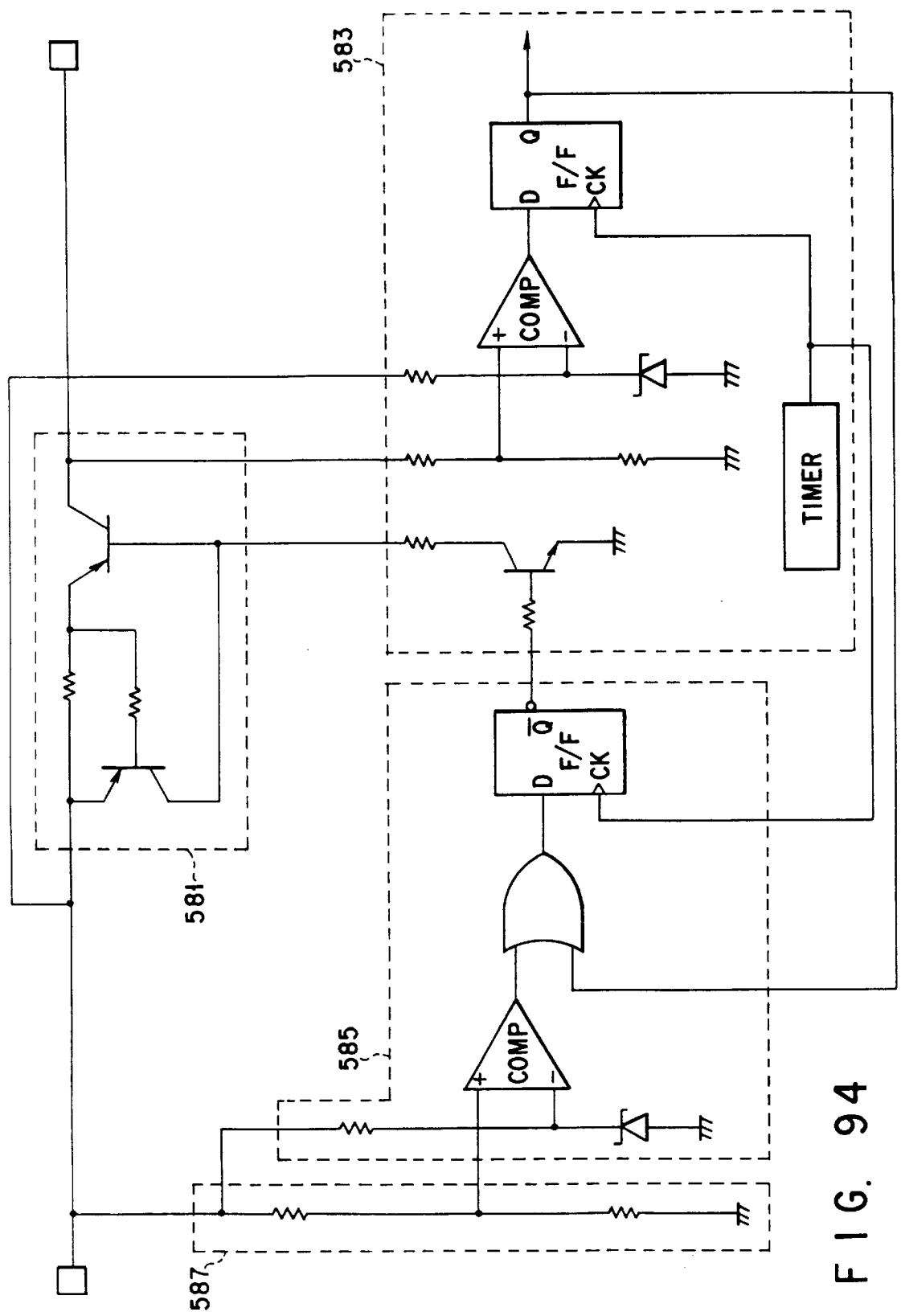
FIG. 94 is a circuit diagram showing a discrete circuit constituted by an input voltage measuring section, an input voltage controller, a switch, an input voltage controller, a switch, and a charge controller shown in FIG. 59.

FIG. 60 is a block diagram showing a hardware arrangement for practicing the functional arrangement of the embodiment shown in FIG. 59. The constituent elements shown in FIG. 59 such as the charger controller 583, the input voltage abnormal detector 585, the input voltage measuring section (V) 587 are realized by a one-chip microprocessor (fP) 582. A ROM 580 stores abnormal voltage detection firmware which corresponds to the input voltage abnormal detector 585 in FIG. 59. FIG. 91 is a flow chart of the abnormal voltage detection firmware. The functions shown in FIG. 59 can be realized by discrete circuits by one skilled in the art. For example, the input voltage measuring section 587, the input voltage controller 585, the switch 581, and the charge controller 583 shown in FIG. 59 may be constituted by discrete circuits, as shown in FIG. 94.

The operation of the thirty-fourth embodiment will be described.

When the secondary battery 579 is set in the charge section of the charger 577, the charger 577 starts the charge operation of the secondary battery 579.

At this time, in the charger 577, the input voltage measuring section 587 measures an input voltage applied to the secondary battery 579 and sends the measurement result to the input voltage abnormal detector 585.

Upon reception of an input control signal from the charge controller 583, the input voltage abnormal detector 585 determines, from the measured input voltage value received from the input voltage measuring section 587, whether the input voltage is normal or abnormal, and sends the determination result signal to the charge controller 583.

The charge controller 583 controls the charge operation on the basis of the determination result signal received from the input voltage abnormal detector 585. More specifically, upon reception of a normality determination signal from the input voltage abnormal detector 585, the switch 581 arranged midway along the charge path is turned on to continue the charge operation. Upon reception of an abnormality determination signal from the input voltage abnormal detector 585, the switch 581 arranged midway along the charge path is turned off to stop the charge operation.

The charge controller 583 measures a charge amount or charge time during the charge operation to store the charge state of the secondary battery 579.

In this manner, the charge controller 583 periodically sends an input control signal to the input voltage abnormal detector 585 at a predetermined period. Every time an input control signal is sent, the charge controller 583 receives a determination signal representing normality/abnormality from the input voltage abnormal detector 585, thereby performing charge control in accordance with the determination signal.

Even after an abnormality determination signal is received from the input voltage abnormal detector 585, and the switch 581 is turned off to stop the charge operation, the charge controller 583 sends an input control signal to the input voltage abnormal detector 585, thereby periodically checking the input voltage.

Upon reception of a normality determination signal in place of an abnormality determination signal from the input voltage abnormal detector 585, the switch 581 is turned on to restart the charge operation.

Upon reception of an abnormality determination signal from the input voltage abnormal detector 585, the charge controller 583 determines, from the charge state of the secondary battery 579, which is stored upon reception of a previous determination signal, whether the secondary battery 579 is in the full charge state. If the secondary battery is in the full charge state, the full charge state information is stored even after a normal state is restored, thereby displaying the full charge state. If the charge state of the secondary battery 579, which is stored upon reception of the previous determination signal, is not the full charge state, the charge operation is started from an initial charge state.

With this operation, if the temporary input voltage abnormality of the charger 577 is detected, the charge operation is restarted after a normal state is restored, thereby keeping the secondary battery 579 in the full charge state.

Thirty-fifth Embodiment

The thirty-fifth embodiment of the present invention will be described below with reference to FIGS. 61 and 62. In the thirty-fifth embodiment, upon detection of the temporary input voltage abnormality of a charger, after a normal state is restored, an optimal charge operation can be restarted while taking a battery charge state with the abnormality generation time into consideration.

FIG. 61 is a block diagram showing the functional arrangement of the thirty-fifth embodiment of the present invention.

Referring to FIG. 61, reference numeral 577 denotes a charger. Reference numeral 591 denotes a secondary battery. When the secondary battery 591 is set in the charge section of the charger 591, the secondary battery is connected to the circuit and charge-controlled.

Reference numerals 593 through 601 denote constituent elements of the charger 589. Reference numeral 593 denotes a switch arranged midway along a charge path and ON/OFF-controlled by a charge controller 595.

When an input voltage (charge power supply voltage) applied to the secondary battery 591 is normal, the charge controller 595 turns on the switch 593 arranged midway along the charge path to perform the charge operation of the secondary battery 591 set in the charge section. When the input voltage becomes abnormal, and an abnormality detection signal is received from an input voltage abnormal detector 597, the charge controller 595 turns off the switch 593 to stop the charge operation. The charge controller 595 also updates and stores a charge state during the charge operation until a full charge state is detected. If the abnormality of the input voltage is detected, and an abnormality detection time detected by an abnormal time detector 601 does not exceed a set time, the charge operation is restarted from the charge state immediately before the abnormality detection upon restoring a normal state. If the abnormality detection time exceeds the set time, the charge state information so far is cleared, and the charge operation is started from the beginning.

The input voltage abnormal detector 597 has the same arrangement as that of the input voltage abnormal detector 585 shown in FIG. 59. The input voltage abnormal detector 597 checks an input voltage measured by an input voltage measuring section 599 to determine the normality/abnormality, thereby informing a determination signal to the charge controller 595 and the abnormal time detector 601.

The input voltage measuring section (V) 599 measures an input voltage (charge power supply voltage) applied to the secondary battery 591 and informs the measured input voltage to the input voltage abnormal detector 597.

Figure 90:
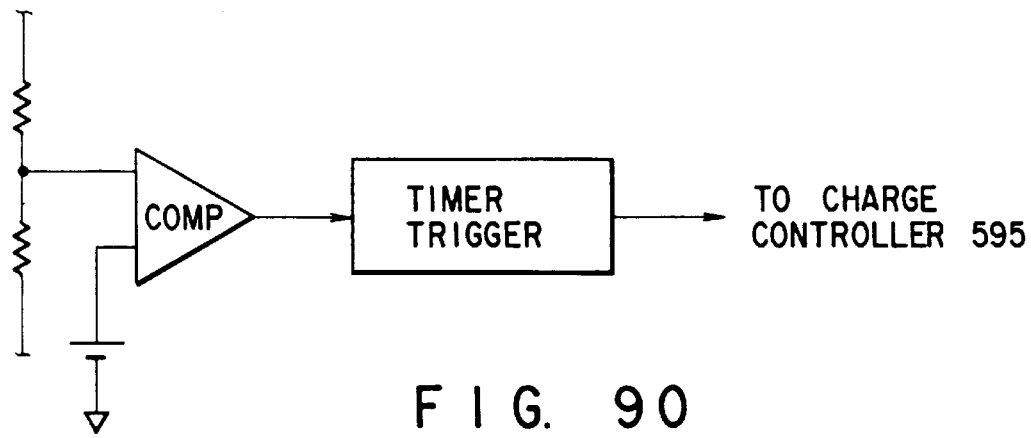
FIG. 90 is a circuit diagram obtained when an abnormal time detector of the thirty-fifth embodiment is arranged by hardware.

The abnormal time detector 601 having a charge stop timer starts the charge stop timer in accordance with an abnormality detection signal from the input voltage abnormal detector 597 to count the abnormality generation time (charge stop time). It is determined whether the abnormality time reaches a predetermined time, and the determination result signal is informed to the charge controller 595. The abnormal time detector is constituted by, e.g., a power supply microcomputer and firmware. However, it may also be constituted by hardware, as shown in FIG. 90.

Figure 62:
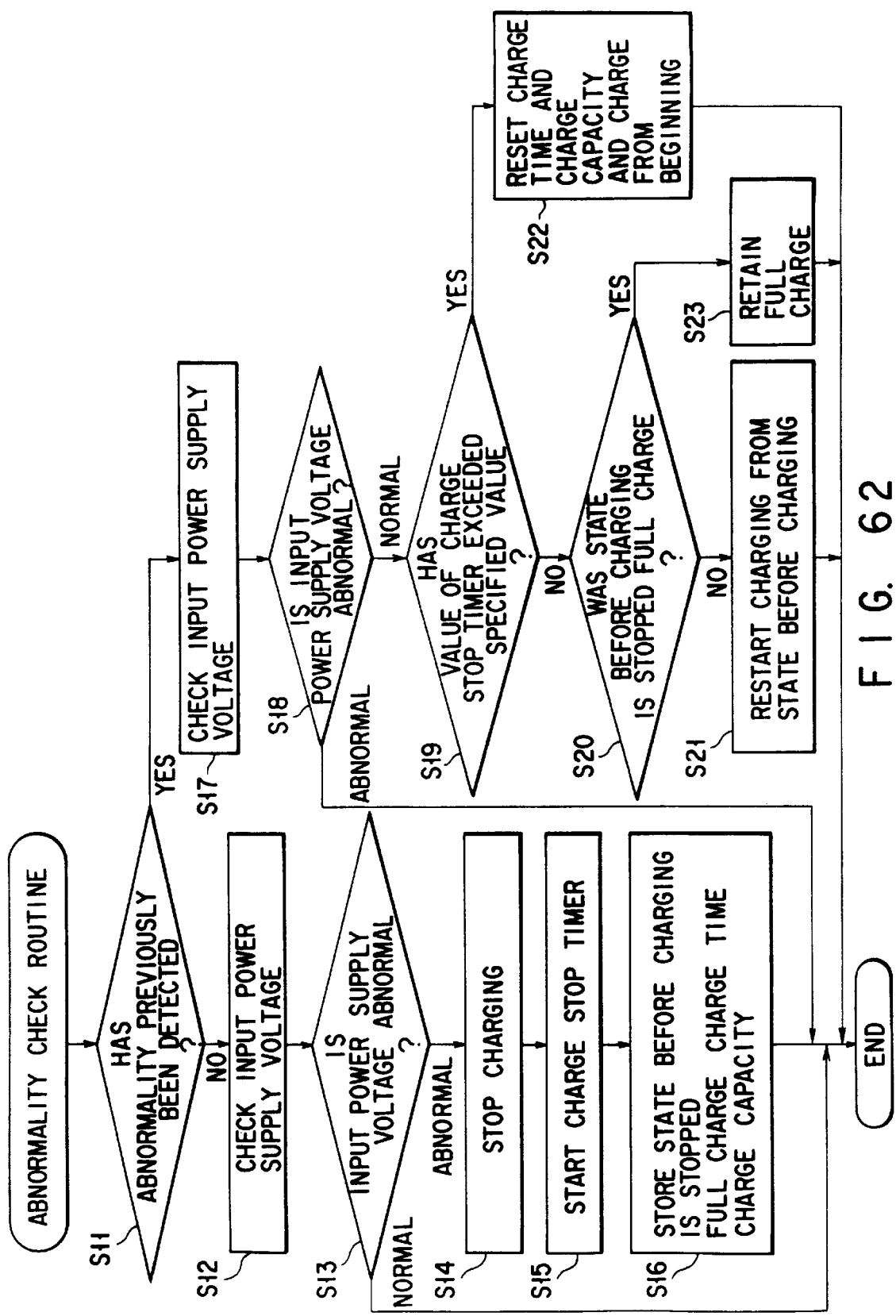
FIG. 62 is a flow chart showing a processing sequence of the thirty-fifth embodiment.

FIG. 62 is a flow chart showing the processing sequence of the thirty-fifth embodiment.

The operation of the thirty-fifth embodiment shown in FIG. 61 will be described with reference to the flow chart shown in FIG. 62.

When the secondary battery 591 is set in the charge section of the charger 589, the charger 589 starts the charge operation of the secondary battery 591.

At this time, in the charger 589, the input voltage measuring section 599 measures an input voltage applied to the secondary battery 591 and sends the measurement result to the input voltage abnormal detector 597.

Every time an input control signal is received from the charge controller 595, the input voltage abnormality detector 597 determines, from the measured input voltage value received from the input voltage measuring section 599, whether the input voltage is normal or abnormal. The determination result signal is sent to the charge controller 595.

On the basis of the determination result signal received from the input voltage abnormal detector 597, the charge controller 595 performs charge control in accordance with the processing sequence shown in FIG. 62.

More specifically, upon reception of a normal determination signal from the input voltage abnormal detector 597, the switch 593 arranged midway along the charge path is turned on to continue the charge operation (steps S11, S12, and S13 in FIG. 62).

Upon output of an abnormality determination signal from the input voltage abnormal detector 597, the abnormality determination signal is sent to the charge controller 595 and the abnormal time detector 601.

Upon reception of the abnormality determination signal from the input voltage abnormal detector 597, the charge controller 595 turns off the switch 593 to stop the charge operation. At the same time, the charge controller 595 stores the charge state (the full charge state, the charge time, the charge capacity, and the like) of the secondary battery 591 immediately before the charge operation is stopped in an internal memory (steps S13, S14, and S16 in FIG. 62).

Upon reception of the abnormality determination signal from the input voltage abnormal detector 597, the abnormal time detector 601 starts the charge stop timer to count the abnormality generation time (charge stop time) (step S15 in FIG. 62).

After the charge operation is stopped, the charge controller 595 sends an input control signal to the input voltage abnormal detector 597 to periodically check the input voltage. Every time an input control signal is output, the charge controller 595 receives a normality/abnormality determination signal from the input voltage abnormal detector 597, thereby continuously monitoring the abnormality of the apparatus (steps S17 and S18 in FIG. 62).

When the normality of the input voltage is detected, the input voltage abnormal detector 597 sends a normal determination signal in place of an abnormality determination signal to the charge controller 595 and the abnormal time detector 601.

Upon reception of the normal determination signal in place of an abnormal determination signal from the input voltage abnormal detector 597, the abnormal time detector 601 stops the time counting operation of the charge stop timer. It is determined whether the counted time exceeds a predetermined time, and the determination result signal is informed to the charge controller 595.

Upon reception of the normality determination signal in place of an abnormality determination signal from the input voltage abnormal detector 597, the charge controller 595 recognizes, on the basis of the determination result signal received from the abnormal time detector 601, whether the abnormality generation time (charge stop time) exceeds the set time. If the abnormality generation time does not exceed the set time, it is determined whether the secondary battery 591 immediately before the charge operation is stopped is set in the full charge state on the basis of the charge state (the full charge state, the charge time, the charge capacity, and the like) of the secondary battery 591 immediately before the charge operation is stopped, which is stored in the internal memory. If it is not in the full charge state, the switch 593 is turned on to restart the charge operation from the charge state of the secondary battery 591 immediately before the stop of the charge operation in accordance with the charge time or the charge capacity immediately before the stop of the charge operation (steps S19, S20, and S21 in FIG. 62).

If the abnormality generation time (charge stop time) exceeds the set time, the charge state (the full charge state, the charge time, the charge capacity, and the like) of the secondary battery 591 immediately before the stop of the charge operation, which is stored in the internal memory, is cleared. The switch 593 is turned on to start the charge operation from the initial state (step S22 in FIG. 62).

If the abnormality generation time (charge stop time) does not exceed the set time, and the secondary battery 591 immediately before the charge operation is stopped is set in the full charge state, the charge state (full charge state) is held, and the secondary battery 591 set in the charge section is regarded as a full-charged battery. Data representing that the secondary battery 591 set in the charge section is in the full charge state is externally output and displayed (step S23 in FIG. 62).

With this operation, when the temporary input voltage abnormality of the charger 589 is detected, an optimal charge operation can be restarted while taking the charge state of the secondary battery 591 with the abnormality time into consideration after a normal state is restored.

In this embodiment, charge control according to abnormality detection of the input voltage (charge power supply voltage) applied to the secondary battery 579 has been described. However, this charge control can also be applied to a charge current abnormality, a temperature abnormality, a communication abnormality, or the like.

Thirty-sixth Embodiment

The thirty-sixth embodiment of the present invention will be described below with reference to FIGS. 63 through 65. The thirty-sixth embodiment comprises a means for temporarily stopping a charge operation and measuring a battery voltage when a full charge state is detected on the basis of a charge amount, a charge time, or the like, and comparing the measured battery voltage with a set battery voltage for full charge determination, thereby determining the full charge state or abnormality of the battery.

Figure 63:
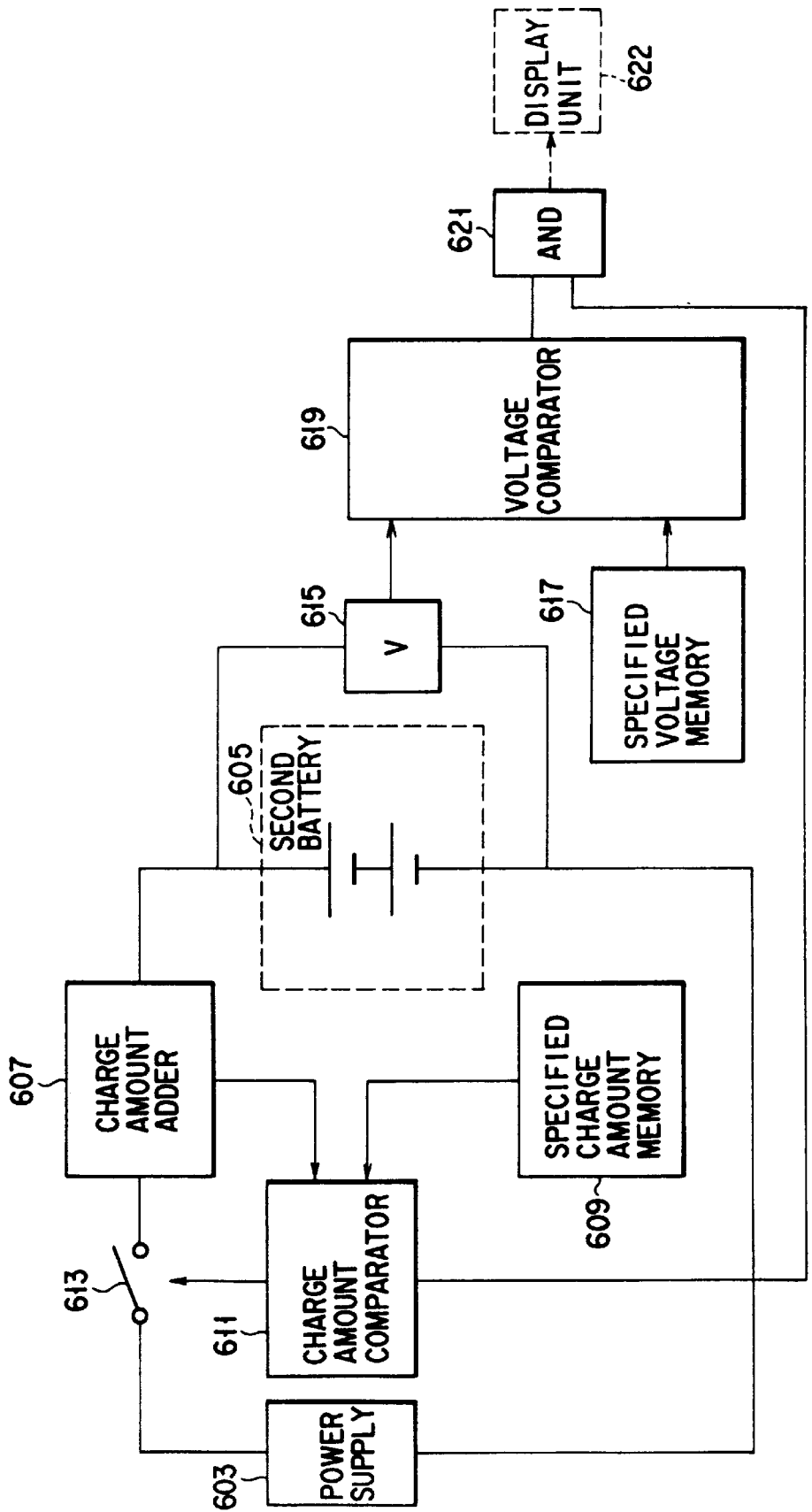
FIG. 63 is a block diagram showing an arrangement according to the thirty-sixth embodiment of the present invention.

FIG. 63 is a block diagram showing the arrangement of the thirty-sixth embodiment of the present invention.

Referring to FIG. 63, reference numeral 603 denotes a power supply for generating and outputting a charge power for a secondary battery. Reference numeral 605 denotes a secondary battery for receiving the power output from the power supply 603 to be charge-controlled.

Reference numeral 607 denotes a charge amount adder arranged midway along a charge path for periodically adding a charge amount in accordance with the charge operation of the secondary battery 605. Reference numeral 609 denotes a specified charge amount memory for storing a predetermined specified charge amount in a full charge state (full charge detection charge amount).

Reference numeral 611 denotes a charge amount comparator for comparing the specified charge amount (full charge detection charge amount) stored in the specified charge amount memory 609 with a charge amount (integrated charge amount) obtained by the charge amount adder 607. If the charge amount (integrated charge amount) reaches the specified charge amount (full charge detection charge amount), a full charge state is temporarily detected, and a switch 613 arranged midway along the charge path is turned off.

The charge control switch 613 is arranged midway along the charge path and turns on/off the charge operation in accordance with control of the charge amount comparator 611.

Reference numeral 615 denotes a voltage measuring unit for measuring the voltage of the secondary battery 605. Reference numeral 617 denotes a specified voltage memory for storing a specified battery voltage in the full charge state.

Reference numeral 619 denotes a voltage comparator for comparing a battery voltage measured by the voltage measuring unit 615 with the specified voltage. If the measured battery voltage reaches the specified voltage, a normal full charge state is determined. If the measured battery voltage does not reach the specified voltage, a battery abnormality is determined.

Reference numeral 621 denotes an AND circuit. When the charge operation of the secondary battery 605 is stopped by the charge amount comparator 611 (when a full charge state is temporarily detected), the AND circuit 621 outputs a determination result from the voltage comparator 619 to a display unit 622.

The display unit 622 displays the full charge state or the abnormality of the secondary battery 605.

Figure 64:
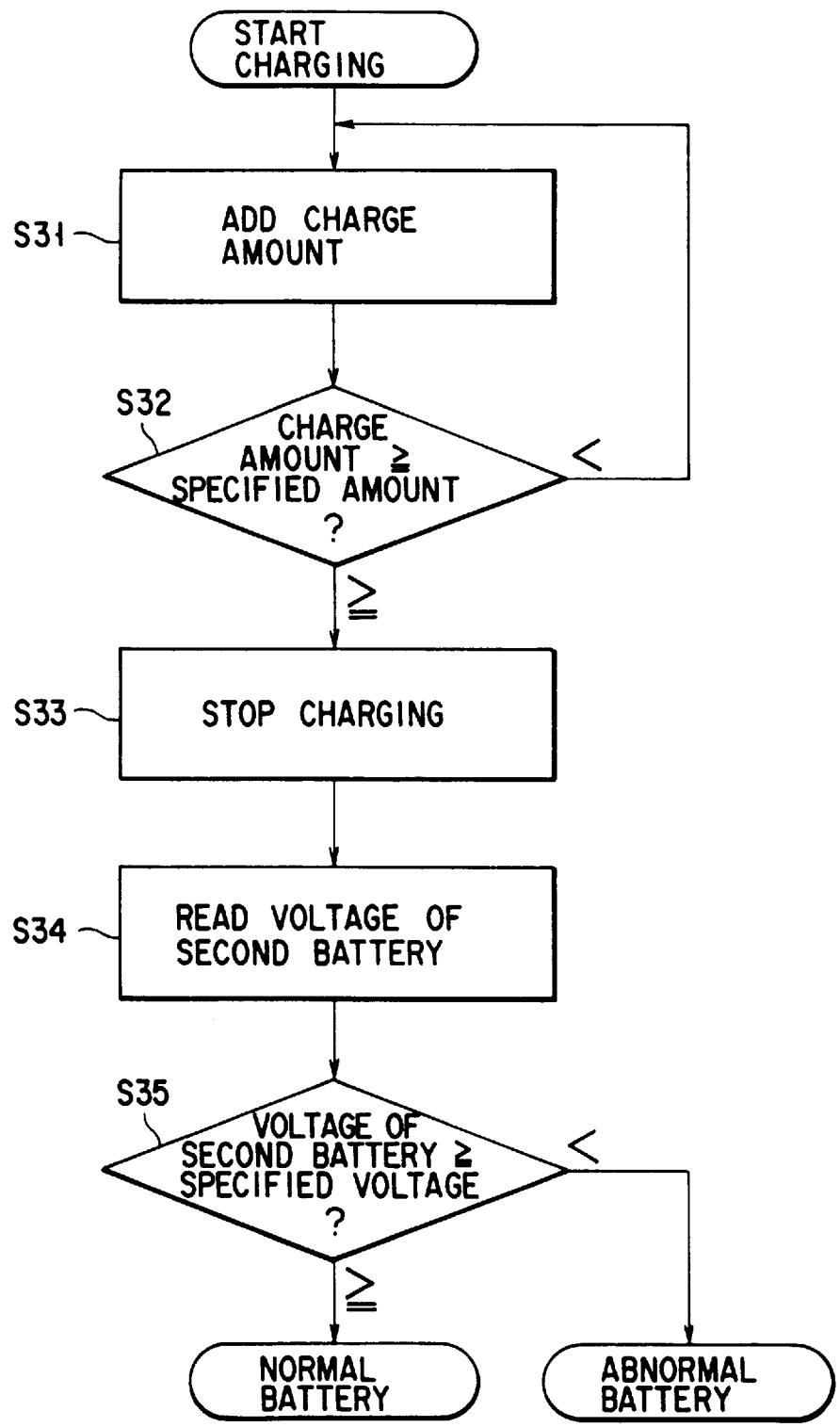
FIG. 64 is a flow chart showing an operation according to the thirty-sixth embodiment.
Figure 65:
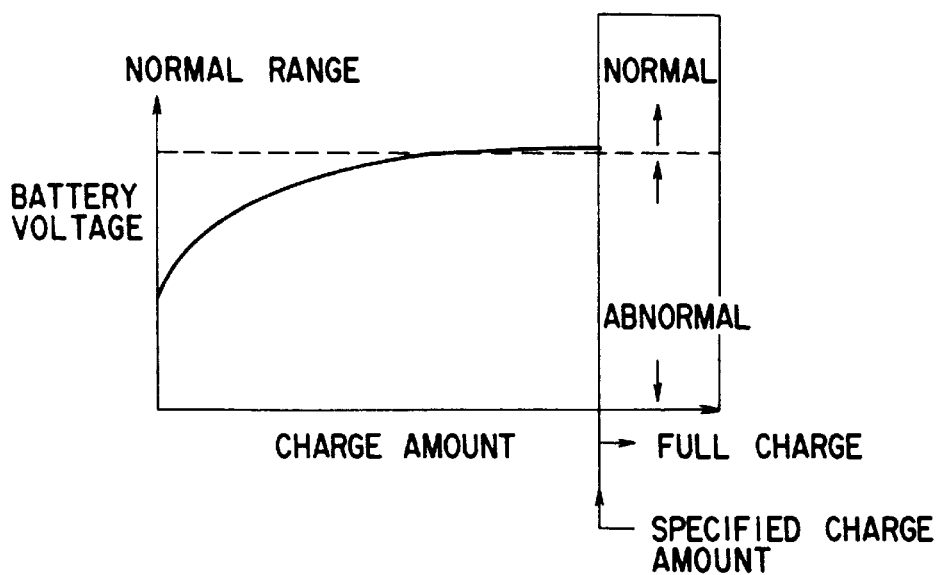
FIG. 65 is a view for explaining normality or abnormality determination operation for a battery in the thirty-sixth embodiment.

FIG. 64 is a flow chart showing the processing sequence of the thirty-sixth embodiment. FIG. 65 is a view for explaining the normality or abnormality determination operation of the battery.

The operation of the thirty-sixth embodiment shown in FIG. 63 will be described with reference to FIGS. 64 and 65.

During the charge operation of the secondary battery 605, a charge power output from the power supply 603 is supplied to the secondary battery 605 through the switch 613, thereby charging the secondary battery 605.

During the charge operation of the secondary battery 605, the charge amount adder 607 measures and adds a charge current every a predetermined period to output a charge amount (integrated charge amount) (step S31 in FIG. 64).

The charge amount (integrated charge amount) added by the charge amount adder 607 is supplied to the charge amount comparator 611 and compared with a specified charge amount (full charge detection charge amount) of the specified charge amount memory 609 for storing a charge amount for full charge detection (step S32 in FIG. 64).

If the charge amount (integrated charge amount) output from the charge amount adder 607 is equal to or larger than the specified charge amount (full charge detection charge amount), a full charge state is temporarily detected, and the switch 613 is turned off to stop the charge operation (step S33 in FIG. 64).

At this time, the battery voltage of the secondary battery 605 is measured by the voltage measuring unit 615. The measured battery voltage is supplied to the voltage comparator 619 and compared with the specified voltage of the specified voltage memory 617 for storing a battery voltage for full charge detection (steps S34 and S35 in FIG. 64).

If the voltage measured by the voltage measuring unit 615 reaches the specified voltage, the voltage comparator 619 determines a normal full charge state. If the measured voltage does not reach the specified voltage, the voltage comparator 619 determines a battery abnormality. The determination result information is output to the AND circuit 621. The normality or abnormality determination operation is shown in FIG. 65.

While the charge amount comparator 611 stops the charge operation of the secondary battery 605, the AND circuit 621 outputs the determination result from the voltage comparator 619 to the display unit 622. The display unit 622 displays the full charge state or the abnormality of the secondary battery 605.

As described above, the full charge state is temporarily detected on the basis of the charge amount, the charge time, or the like. Upon detection of the full charge state, the charge operation is temporarily stopped, and the battery voltage is measured and compared with the set battery voltage for full charge determination, thereby determining the full charge state or the abnormality of the secondary battery. With this operation, a battery in the full charge state and an abnormal battery can be discriminated from each other, and erroneous detection of the full charge state can be prevented, thereby improving the safety.

Thirty-seventh Embodiment

The thirty-seventh embodiment of the present invention will be described with reference to FIGS. 66 and 67. In the thirty-seventh embodiment, charge control is performed by communication between a unit on a charger side and a controller (microprocessor) in a battery pack constituting a secondary battery. When it is detected that the secondary battery is set in a charge section, an in-charge state is displayed before a charge operation is started such that a user can immediately confirm the battery state at the time of setting of the battery. Thereafter, it is determined whether the battery is normal or abnormal. If the battery is normal, the charge operation is started. If the battery is abnormal, an abnormality display (e.g., flickering display) is performed.

Figure 66:
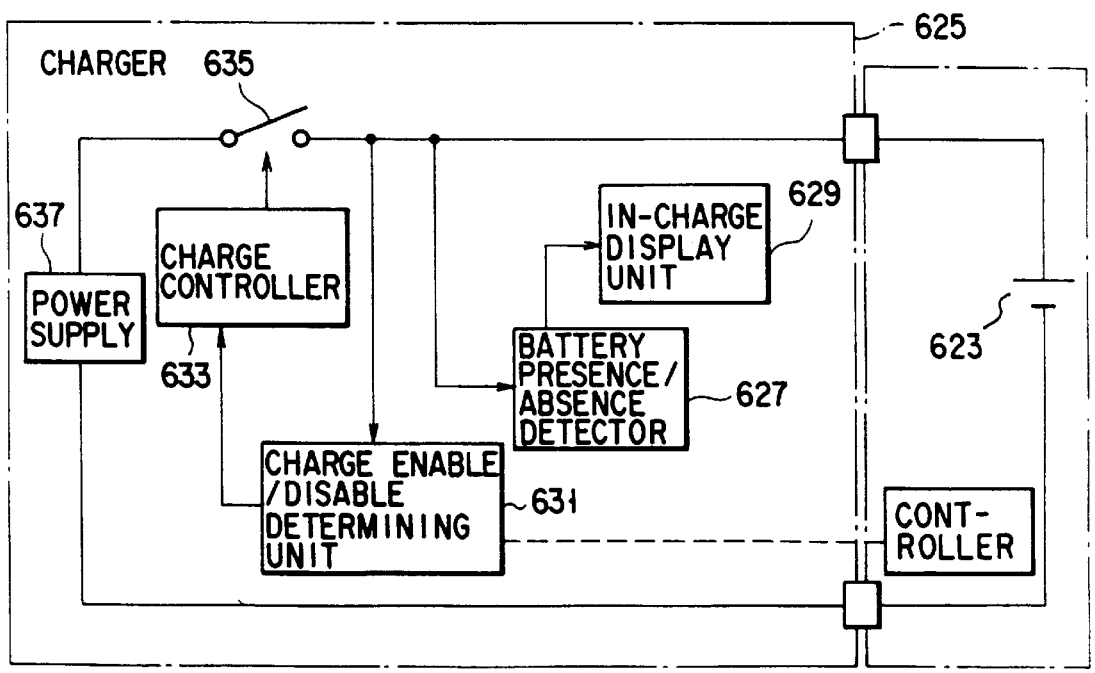
FIG. 66 is a flow chart showing a processing sequence according to the thirty-seventh embodiment of the present invention.

FIG. 66 is a block diagram showing the arrangement of the thirty-seventh embodiment of the present invention.

Referring to FIG. 66, reference numeral 623 denotes a secondary battery to be charged. Reference numeral 625 denotes a charger for charging the secondary battery 623. In the battery pack of the secondary battery 623, a controller using a microprocessor is provided. The controller manages the battery state and transmits/receives data (information inherent to the battery such as a battery type and a rated voltage, and battery data including charge state information such as a charge amount) to/from the charger 625 by communication.

Reference numerals 627 through 637 denote constituent elements of the charger 625. Reference numeral 627 denotes a battery presence/absence detector for detecting the presence/absence of the secondary battery 623 and outputting state information to a display unit 629.

The display unit 629 displays the charge operation state of the charger 625. If the battery presence/absence detector 627 detects connection of the secondary battery 623, the display unit 629 displays an in-charge state.

Reference numeral 631 denotes a charge enable/disable determining unit. In accordance with secondary battery information (a battery type, a rated voltage, a battery capacity, and the like) obtained upon communication with a controller using a microprocessor on the secondary battery 623 side, and the actual battery voltage of the secondary battery 623, the charge enable/disable determining unit 631 determines whether the secondary battery 623 can be charged.

Reference numeral 633 denotes a charge controller. When the charge enable/disable determining unit 631 determines that the charge operation can be performed, the charge controller 633 turns on a switch 635 arranged midway along a charge path to start the charge operation.

The charge control switch 635 is arranged midway along the charge path and turns on/off the charge operation of the secondary battery 623.

Reference numeral 637 denotes a charge power supply for generating and outputting a charge power for the secondary battery 623. The charge power output from the power supply 637 is supplied to the secondary battery 623 through the switch 635.

Figure 67:
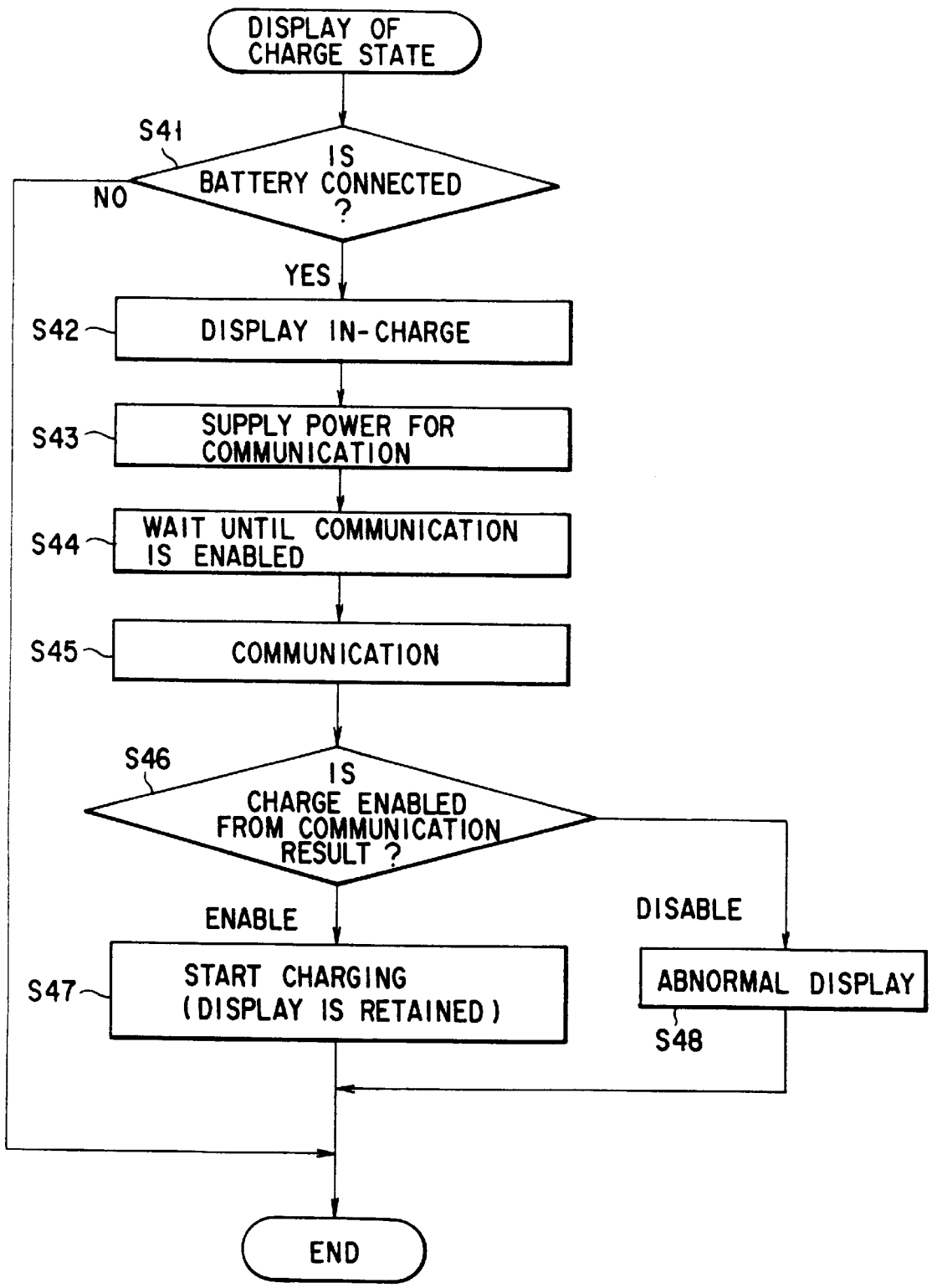
FIG. 67 is a flow chart showing a processing sequence of the thirty-seventh embodiment.

FIG. 67 is a flow chart showing the processing sequence of the thirty-seventh embodiment.

The operation of the thirty-seventh embodiment will be described with reference to the flow chart shown in FIG. 67.

When the secondary battery 632 is connected to the charge section of the charger 625, the battery presence/absence detector 627 in the charger 625 detects the presence/absence of connection of the secondary battery 623 in accordance with the presence/absence of a battery voltage. If the secondary battery 623 is connected, the display unit 629 immediately displays an in-charge state (steps S41 and S42 in FIG. 67).

Thereafter, the charge enable/disable detector 631 of the charger 625 applies a communication power supply voltage to the controller using the microprocessor arranged in the battery pack of the secondary battery 623 and waits until communication is enabled. When communication is enabled, the data (the battery type, the rated voltage, and the like) of the secondary battery 623 is read, and the battery voltage is detected. The charge enable/disable detector 631 determines, from the contents of the data, whether the battery is chargeable (steps S43 through S46 in FIG. 67).

If the battery is chargeable, the switch 635 is turned on through the charge controller 633 while the in-charge state is kept displayed on the display unit 629, thereby starting the charge operation of the secondary battery 623 (step S47 in FIG. 67).

If the battery is not chargeable, while the switch 635 is kept in an OFF state, a charge disable state is displayed on the display unit 629 in place of the in-charge state (step S48 in FIG. 67).

With such a charge display function, a user can immediately confirm that the chargeable secondary battery 623 is set in the charger 625 at the time of setting of the battery. If the battery is not chargeable, the charge operation is stopped, and the charge disable state can be displayed, thereby improving operability and safety.

In the above embodiment, the presence/absence of the battery is detected in accordance with the presence/absence of the battery voltage. However, in this detection, a detection mechanism using the resistance of a thermistor incorporated in the battery pack, a detection mechanism using a mechanical switch, a detection circuit mechanism using a closed circuit by terminal-to-terminal connection, a detection mechanism for reading the contents of a storage unit in the battery pack, or a detection mechanism according to communication with the microprocessor in the battery pack may also be used.

Thirty-eighth Embodiment

The thirty-eighth embodiment of the present invention will be described below with reference to FIGS. 68 and 69. In the thirty-eighth embodiment, during the charge operation of a secondary battery, the charge current and the temperature of the secondary battery are monitored. When the charge current value is to be compared with a predetermined full charge detection current value to check a full charge state, the full charge detection current value is changed in accordance with the detected temperature, thereby always detecting a full charge state at high accuracy without any influence of the battery temperature.

FIG. 68 is a block diagram showing the arrangement of the thirty-eighth embodiment of the present invention.

Referring to FIG. 68, reference numeral 639 denotes a lithium-ion secondary battery to be charged.

Reference numeral 641 denotes a battery temperature monitoring section of the secondary battery 639 for always monitoring the battery temperature of the secondary battery 639 during a charge operation. If the temperature changes, the information is sent to a full charge detection current value controller 643.

The full charge detection current value controller 643 changes a full charge detection current value in accordance with information from the battery temperature monitoring section 641.

Reference numeral 645 denotes a charge current measuring section (A) for measuring the charge current of the lithium-ion secondary battery 639.

Figure 92:
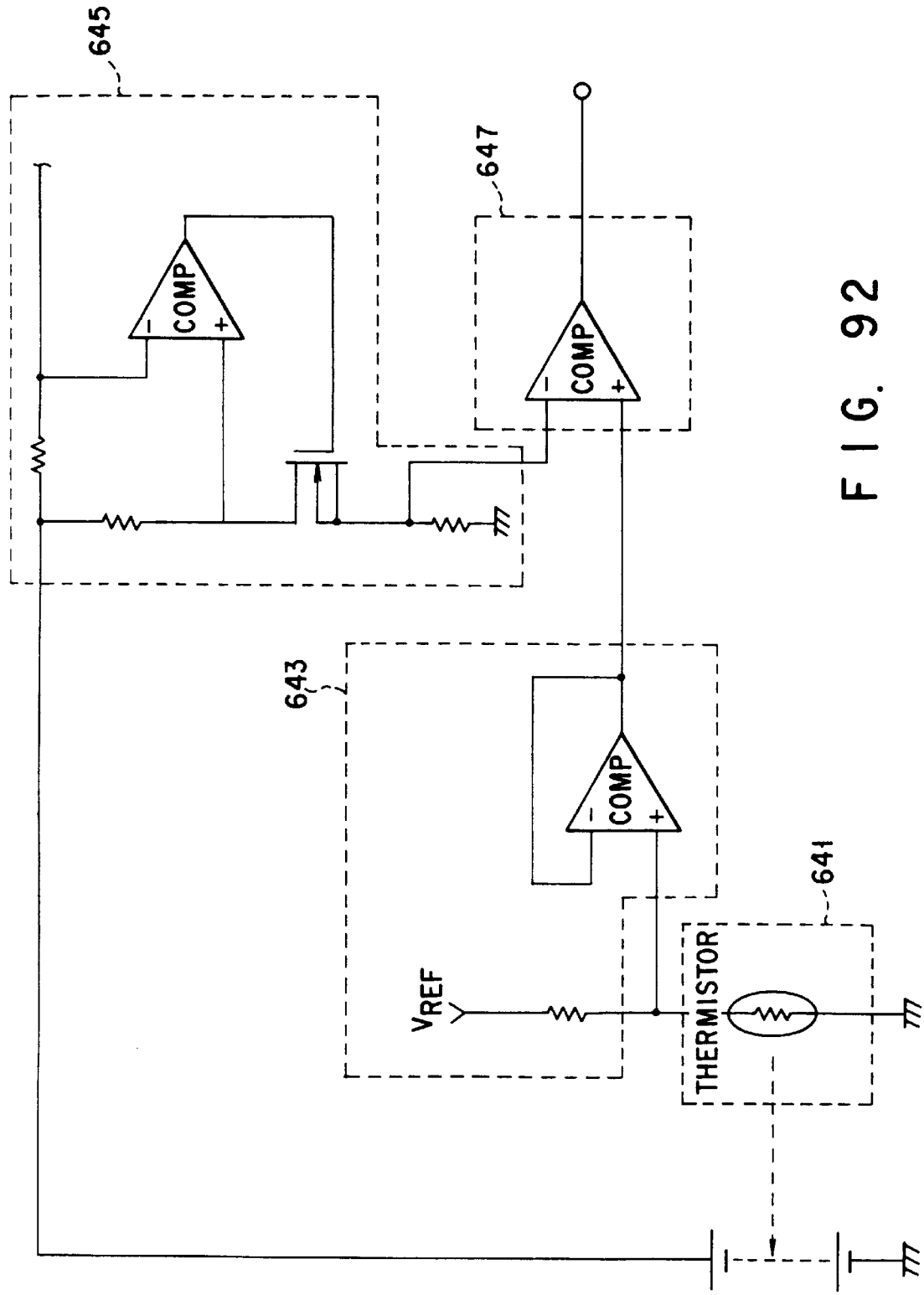
FIG. 92 is a circuit diagram showing the detailed arrangement of a charge current measuring section, a battery temperature monitoring section, a full charge detection current value control section, and a full charge detecting section shown in FIG. 68.

Reference numeral 647 denotes a full charge detector for comparing a charge current value measured by the charge current measuring section (A) 645 with a full charge detection current value output from the full charge detection current value controller 643, thereby detecting a full charge state. FIG. 92 is a circuit diagram showing the detailed arrangement of the charge current measuring section 645, the battery temperature monitoring section 92, the full charge detection current controller 93, and the full charge detector 95 shown in FIG. 68.

FIG. 69 is a chart showing charge control characteristics in the thirty-eighth embodiment.

The operation of the thirty-eighth embodiment shown in FIG. 68 will be described below with reference to the charge characteristics shown in FIG. 69.

The battery temperature monitoring section 641 always monitors the battery temperature of the lithium-ion secondary battery 639. The charge current measuring section 645 always monitors the charge current of the lithium-ion secondary battery 639.

Assume that information representing that the battery temperature is 0° C., as shown in FIG. 69, is output from the battery temperature monitoring section 641 and input to the full charge detection current value controller 643. At this time, the full charge detection current value controller 643 determines a value at a level A as a full charge detection current value and outputs the value to the full charge detector 647.

The full charge detector 647 compares the charge current value measured by the charge current measuring section 645 with the full charge detection current value determined by the full charge detection current value controller 643. If the measured charge current value is smaller than the full charge detection current value, a full charge state is detected.

Similarly, when the battery temperature is 40° C., full charge detection is performed using a value at a level B as a full charge detection current value. Similarly, at other temperatures, optimal full charge detection current values are determined in accordance with the temperatures, thereby detecting the full charge state.

As described above, during the charge operation of the secondary battery, the charge current and the temperature of the secondary battery are monitored. When the charge current value is to be compared with a predetermined full charge detection current value to check a full charge state, the full charge detection current value is changed in accordance with the detected temperature. With this arrangement, a full charge state can be always detected at high accuracy without any influence of the battery temperature.

Thirty-ninth Embodiment

The thirty-ninth embodiment of the present invention will be described below with reference to FIGS. 71 and 72.

In the thirty-ninth embodiment, in an equipment having a function of detecting the charge capacity of a secondary battery and a function of obtaining a charge capacity from the start of a discharge operation during battery driving, a total charge capacity is defined as a battery capacity, thereby realizing a secondary battery residual capacity detecting mechanism for obtaining a residual capacity during the discharge operation from the total charge capacity and the discharge capacity.

FIG. 71 is a block diagram showing the arrangement of the thirty-ninth embodiment of the present invention.

Referring to FIG. 71, reference numeral 649 denotes a chargeable battery pack incorporating a secondary battery. Reference numeral 651 denotes an electronic equipment main body (to be simply referred to as a main body hereinafter) which can be operated using the battery pack 649 as a battery driving power supply. The main body 651 controls the charge/discharge operation of the battery pack 649 mounted in a battery pack mounting section.

Reference numeral 653 denotes a secondary battery incorporated in the battery pack 649. The secondary battery 653 is constituted by, e.g., a lithium-ion battery, and has characteristics representing that a charge capacity is substantially equal to a discharge capacity.

Reference numeral 655 denotes a current detector for measuring the charge/discharge current of the secondary battery 653 of the battery pack 649 mounted in the main body 651.

Reference numeral 657 denotes a charge/discharge capacity detector for detecting a charge capacity during the charge operation of the secondary battery 653 and a discharge capacity during a discharge operation from the charge/discharge current of the secondary battery 653, which is measured by the current detector 655.

Reference numeral 659 denotes a residual capacity detector for detecting the residual capacity of the secondary battery 653 from a capacity detected by the charge/discharge capacity detector 657. The residual capacity detector 659 is realized by, e.g., a power supply microcomputer.

Reference symbol La denotes a display section for displaying the residual capacity of the battery pack 649 in use, which is detected by the residual capacity detector 659.

The above-described current detector 655, the charge/discharge capacity detector 657, and the residual capacity detector 659 are realized by, e.g., software control of a microcomputer (power supply microcomputer).

The operation of the thirty-ninth embodiment shown in FIG. 71 will be described with reference to a flow chart shown in FIG. 72.

When the battery pack 649 is mounted in the main body 651, and the charge operation of the secondary battery 653 is started, the charge current of the secondary battery 653 is measured by the current detector 655. The measured charge current is supplied to the charge/discharge capacity detector 657 (step S91 in FIG. 72).

Figure 72:
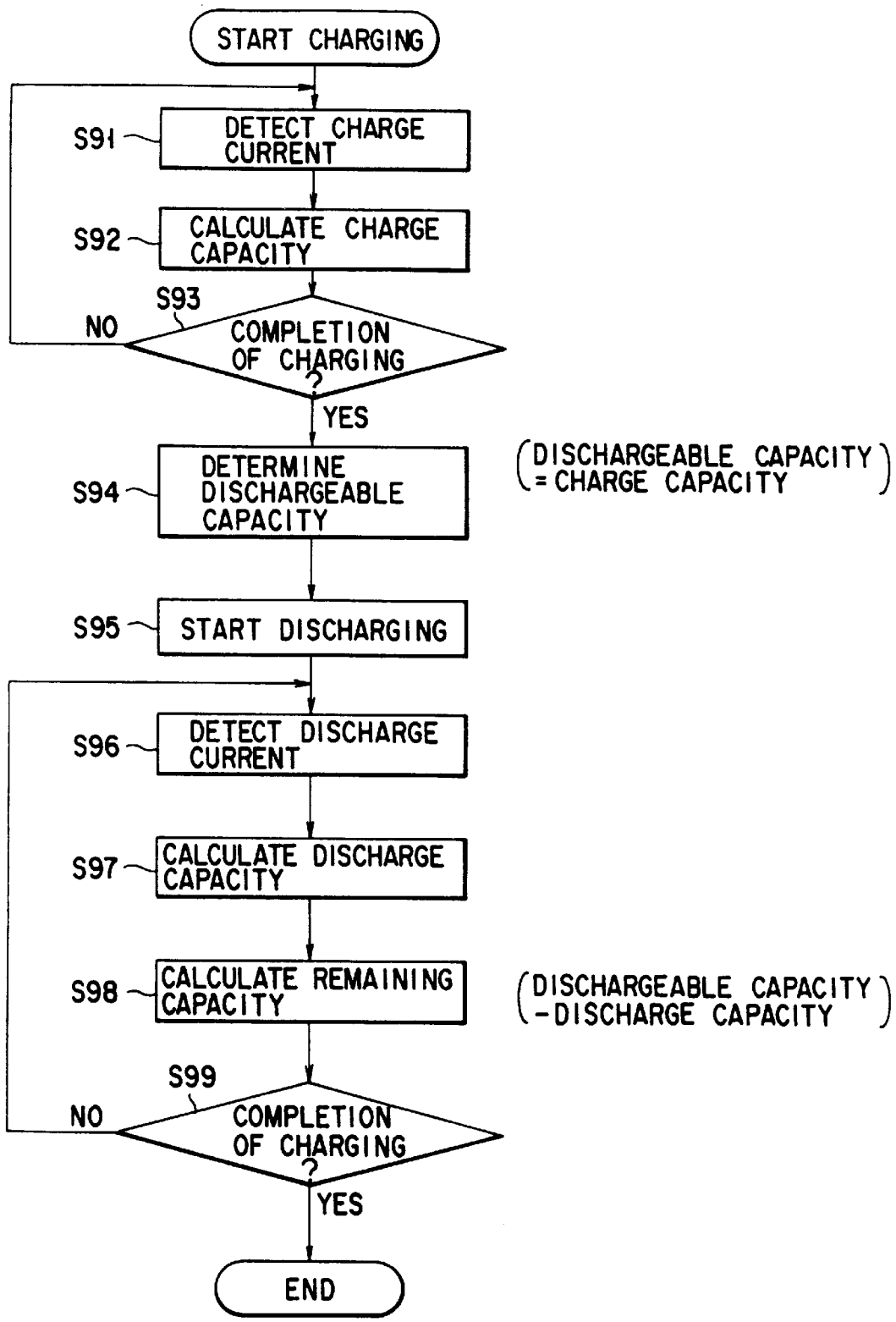
FIG. 72 is a flow chart showing an operation according to the thirty-ninth embodiment.

The charge/discharge capacity detector 657 calculates a charge capacity from the charge current measured by the current detector 655 and supplies the charge capacity to the residual capacity detector 659 (step S92 in FIG. 72).

When the charge operation of the secondary battery 653 is completed (a full charge state is set), the residual capacity detector 659 holds the charge capacity as a dischargeable capacity (steps S93 and S94 in FIG. 72).

After the charge operation of the secondary battery 653 is completed, a discharge operation is started. At this time, the discharge current of the secondary battery 653 is measured by the current detector 655. The measured discharge current is supplied to the charge/discharge capacity detector 657 (steps S95 and S96 in FIG. 72).

The charge/discharge capacity detector 657 calculates a discharge capacity from the discharge current measured by the current detector 655 and supplies the discharge capacity to the residual capacity detector 659 (step S97 in FIG. 72).

At the end of the charge operation, the residual capacity detector 659 calculates the residual capacity of the secondary battery 11 in accordance with [dischargeable capacity= charge capacity] and [residual capacity=dischargeable capacity−discharge capacity] (step S98 in FIG. 72).

During the discharge operation of the secondary battery 653, the above-described processing from measurement of the discharge current to calculation of the residual capacity is repeatedly executed. At this time, in accordance with the residual capacity of the secondary battery 11, which is detected by the residual capacity detector 23, the usable time of the mounted battery pack 649 is displayed on the display section La (steps S99, S96, S97, . . . in FIG. 72).

With such a mechanism for detecting the residual capacity of the secondary battery, the inconvenience of the prior art can be eliminated. More specifically, conventionally, in batteries having the same nominal capacity, the residual capacity is detected using the same dischargeable capacity. For this reason, if variations in actual capacity of each secondary battery, a decrease in battery capacity due to a shortened service life, and the like are caused, an accurate battery capacity cannot be detected, so an accurate usable time during battery driving cannot be displayed. According to this embodiment, the above inconvenience can be eliminated. A current dischargeable capacity can be always recognized during battery driving, thereby accurately recognizing the residual usable time of the secondary battery in use.

Fortieth Embodiment

The fortieth embodiment of the present invention will be described below with reference to FIGS. 73 and 74.

In the fortieth embodiment, in an equipment having a function of detecting the charge capacity of a secondary battery and a function of obtaining a charge capacity from the start of a discharge operation during battery driving, a charge rate before a charge operation is started is detected. A total charge capacity is estimated from the charge rate and a charge capacity from the start of the charge operation to the end thereof, and the total battery capacity is defined as a dischargeable capacity, thereby realizing a secondary battery residual capacity detecting mechanism for obtaining a residual capacity during the discharge operation from the total charge capacity and the discharge capacity.

FIG. 73 is a block diagram showing the arrangement of the fortieth embodiment of the present invention.

Referring to FIG. 73, reference numeral 661 denotes a chargeable battery pack incorporating a secondary battery. Reference numeral 663 denotes an electronic equipment main body (to be simply referred to as a main body hereinafter) which can be operated using the battery pack 661 as a battery driving power supply. The main body 633 controls the charge/discharge operation of the battery pack 661 mounted in a battery pack mounting section.

Reference numeral 664 denotes a secondary battery incorporated in the battery pack 661. The secondary battery 664 is constituted by, e.g., a lithium-ion battery, and has characteristics representing that a charge capacity is substantially equal to a discharge capacity.

Reference numeral 665 denotes a current detector for measuring the charge/discharge current of the secondary battery 664 of the battery pack 661 mounted in the main body 633. Reference numeral 667 denotes a voltage detector for measuring the voltage of the secondary battery 664.

Reference numeral 669 denotes a charge rate detector for estimating, before mounting, the charge rate of the secondary battery 664 from the battery voltage of the secondary battery 664, which is detected by the voltage detector 667 when the battery pack 661 is mounted.

Reference numeral 671 denotes a charge/discharge capacity detector for detecting a charge capacity during the charge operation of the secondary battery 664 and a discharge capacity during a discharge is operation from the charge/ discharge current of the secondary battery 664, which is measured by the current detector 665.

Reference numeral 673 denotes a residual capacity detector for detecting the residual capacity of the secondary battery 664 from a capacity detected by the charge/discharge capacity detector 671 and a charge rate obtained by the charge rate detector 669.

The charge/discharge capacity detector 671, the charge rate detector 669, and the residual capacity detector 673 are realized by, e.g., a power supply microcomputer.

Reference symbol Lb denotes a display section for displaying the residual capacity of the battery pack 661 in use, which is detected by the residual capacity detector 673.

The charge/discharge capacity detector 671, the charge rate detector 669, and the residual capacity detector 673 are realized by a power supply microcomputer as in the thirty-ninth embodiment.

The operation of the fortieth embodiment shown in FIG. 73 will be described with reference to a flow chart shown in FIG. 74.

When the battery pack 661 is mounted in the main body 633, the open battery voltage of the secondary battery 664 incorporated in the battery pack 601 is measured by the voltage detector 667, and the battery voltage is supplied to the charge rate detector 669 (step S101 in FIG. 74).

The charge rate detector 669 estimates a charge rate at the time of mounting from the battery voltage measured by the voltage detector 667 and sends the charge rate to the residual capacity detector 673 (step S102 in FIG. 74).

When the charge operation of the secondary battery 664 is started, the charge current of the secondary battery 664 is measured by the current detector 665. The measured current is supplied to the charge/discharge capacity detector 671 (steps S103 and S104 in FIG. 74).

The charge/discharge capacity detector 671 calculates a charge capacity from the charge current measured by the current detector 665 and supplies the charge capacity to the residual capacity detector 673 (step S105 in FIG. 74).

When the charge operation of the secondary battery 664 is completed, and a discharge operation is started, the discharge current of the secondary battery 664 is measured by the current detector 665. The measured discharge current is supplied to the charge/discharge capacity detector 671.

The charge/discharge detector 671 calculates a discharge capacity from the discharge current measured by the current detector 665 and supplies the discharge capacity to the residual capacity detector 673. The residual capacity detector 673 calculates a total charge capacity in accordance with [total charge capacity=(charge capacity from the start of the charge operation to the end thereof)/(1−charge rate at the time of mounting)] (steps S106 and S107 in FIG. 74).

In accordance with [dischargeable capacity=total charge capacity] and [residual capacity=dischargeable capacity−discharge capacity], the residual capacity detector 673 calculates the residual capacity, i.e., the dischargeable capacity of the secondary battery 664 (step S108 in FIG. 74).

In accordance with the residual capacity of the secondary battery 664, which is detected by the residual capacity detector 673, the usable time of the mounted battery pack 661 is displayed on the display section Lb.

With such a mechanism for detecting the residual capacity of the secondary battery, a current dischargeable capacity can be always recognized during battery driving, thereby accurately recognizing the residual usable time of the secondary battery in use.

Forty-first Embodiment

The forty-first embodiment of the present invention will be described below with reference to FIGS. 75 and 76.

In the forty-first embodiment, in an equipment having a function of detecting the charge capacity of a secondary battery and a function of obtaining a discharge capacity from the start of a discharge operation during battery driving, the number of days passing from the final history of the battery is taken into consideration, a corrected charge rate is detected, and a total charge capacity is estimated from the charge rate and a charge capacity from the start of the charge operation to the end thereof. The total battery capacity is defined as a dischargeable capacity, thereby realizing a secondary battery residual capacity detecting mechanism for accurately obtaining a residual capacity during the discharge operation from the total charge capacity and the discharge capacity.

FIG. 75 is a block diagram showing the arrangement of the forty-first embodiment of the present invention.

Referring to FIG. 75, reference numeral 675 denotes a chargeable battery pack incorporating a secondary battery. Reference numeral 677 denotes an electronic equipment main body (to be simply referred to as a main body hereinafter) which can be operated using the battery pack 675 as a battery driving power supply. The main body 677 controls the charge/discharge operation of the battery pack 675 mounted in a battery pack mounting section.

Reference numeral 679 denotes a secondary battery incorporated in the battery pack 675. The secondary battery 679 is constituted by, e.g., a lithium-ion battery, and has characteristics representing that a charge capacity is substantially equal to a discharge capacity, a current charge rate can be estimated from an open battery voltage, and the estimation error of the charge rate increases when the battery is left unused for a predetermined period of time or more.

Reference numeral 681 denotes a memory incorporated in the battery pack 675 for storing data such as date and time set by the main body. The read/write access of the memory 681 is controlled by the main body.

Reference numeral 683 denotes a current detector for measuring the charge/discharge current of the secondary battery 679 of the battery pack 675 mounted in the main body 677. Reference numeral 685 denotes a voltage detector for measuring the voltage of the secondary battery 679.

Reference numeral 687 denotes a charge rate detector for estimating, before mounting, the charge rate of the secondary battery 679 from the battery voltage of the secondary battery 679, which is detected by the voltage detector 685 when the battery pack 675 is mounted.

Reference numeral 689 denotes a charge/discharge capacity detector for detecting a charge capacity during the charge operation of the secondary battery 679 and a discharge capacity during a discharge operation from the charge/discharge current of the secondary battery 679, which is measured by the current detector 683.

Reference numeral 691 denotes a residual capacity detector for detecting the residual capacity of the secondary battery 679 on the basis of a capacity detected by the charge/discharge capacity detector 689, a charge rate obtained by the charge rate detector 687, and information of the memory 681 incorporated in the battery pack 675. The residual capacity detector 691 has a memory access function of writing/reading information from/in the memory 681.

The charge/discharge capacity detector 689, the charge rate detector 687, and the residual capacity detector 691 are realized by, e.g., a power supply microcomputer.

Reference symbol Lc denotes a display section for displaying the residual capacity of the battery pack 675 in use, which is detected by the residual capacity detector 691.

The operation of the forty-first embodiment shown in FIG. 75 will be described with reference to a flow chart shown in FIG. 76.

Figure 76:
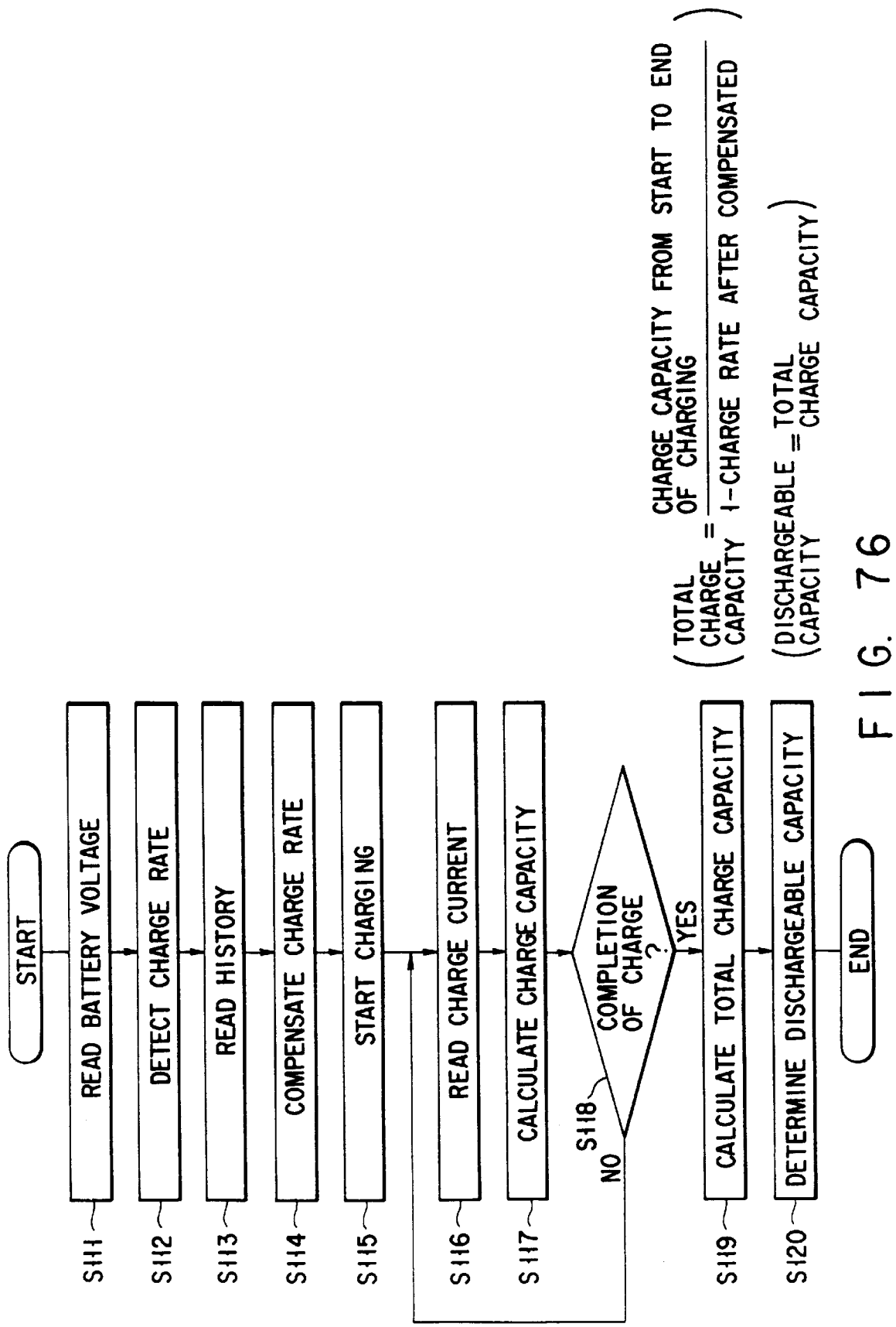
FIG. 76 is a flow chart showing an operation according to the forty-first embodiment.

When the battery pack 675 is mounted in the main body 677, the voltage detector 685 measures the open battery voltage of the secondary battery 679 incorporated in the battery pack 675 and supplies the voltage to the charge rate detector 687 (step S111 in FIG. 76).

The charge rate detector 687 estimates a charge rate at the time of mounting of the battery pack from the battery voltage measured by the voltage detector 685 and sends the charge rate to the residual capacity detector 691 (step S112 in FIG. 76). In more detail, a table for representing a correspondence between a battery voltage and a charge rate is prepared in the memory in a power supply microcomputer 60, and the measured battery voltage can be used to obtain a charge rate from the table.

The residual capacity detector 691 reads a date in previous use, which is written in the memory 681 incorporated in the battery pack 675, calculates the number of days, of the battery pack 675, passing from the read date, and corrects the charge rate in accordance with the number of passing days (steps S113 and S114 in FIG. 76).

When the charge operation of the secondary battery 679 is started, the charge current of the secondary battery 679 is measured by the current detector 683. The measured current is supplied to the charge/discharge capacity detector 689 (steps S115 and S116 in FIG. 74).

The charge/discharge capacity detector 689 calculates a charge capacity from the charge current measured by the current detector 683 and supplies the charge capacity to the residual capacity detector 691 (step S117 in FIG. 76).

When the charge operation of the secondary battery 679 is completed, and a discharge operation is started (step S118 in FIG. 76), the discharge current of the secondary battery 679 is measured by the current detector 683. The measured discharge current is supplied to the charge/discharge capacity detector 689.

The charge/discharge capacity detector 689 calculates a discharge capacity from the discharge current measured by the current detector 683 and supplies the discharge capacity to the residual capacity detector 691.

The residual capacity detector 691 calculates a total charge capacity in accordance with [total charge capacity=

(charge capacity from the start of the charge operation to the end thereof)/(1−charge rate at the time of mounting)] (step S119 in FIG. 76).

In accordance with [dischargeable capacity=total charge capacity] and [residual capacity=dischargeable capacity−discharge capacity], the residual capacity detector 691 calculates the residual capacity, i.e., the dischargeable capacity of the secondary battery 679 (step S120 in FIG. 76).

In accordance with the residual capacity of the secondary battery 679, which is detected by the residual capacity detector 691, the usable time of the mounted battery pack 675 is displayed on the display section Lc.

With this mechanism for detecting the residual capacity of the secondary battery, the latest dischargeable capacity can be always recognized during battery driving, thereby accurately recognizing the residual usable time of the secondary battery in use.

Forty-second Embodiment

Figure 77:
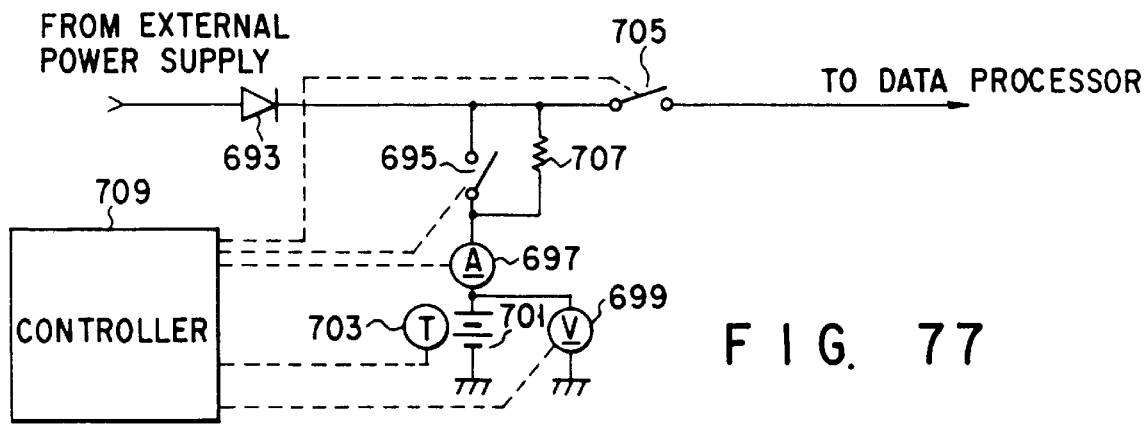
FIG. 77 is a block diagram showing an arrangement according to the forty-second embodiment of the present invention.

FIG. 77 is a block diagram showing the forty-second embodiment.

Referring to FIG. 77, reference numeral 693 denotes a reverse-flow preventing element for determining the direction of a current such that the current does not reversely flow to an external power supply. Reference numeral 695 denotes a charge/discharge switching circuit. The charge/discharge operation of a secondary battery 701 is controlled by turning on/off the switch 695.

Reference numeral 697 denotes a battery current measuring section for measuring the charge current and the discharge current of the secondary battery 701. Reference numeral 699 denotes a battery voltage measuring section for measuring the voltage of the secondary battery 701.

As the secondary battery 701, a nickel-cadmium battery or a nickel-hydrogen battery is used in this embodiment.

Reference numeral 703 denotes a battery temperature measuring section for measuring the temperature of the secondary battery 701.

Reference numeral 705 denotes a switching circuit for turning on/off power supply from an external power supply (not shown) or the secondary battery to an information processing equipment. Reference numeral 707 denotes a resistor constituting a current limit circuit. A small current flows in the secondary battery 701 through the resistor to charge the secondary battery 701.

Reference numeral 709 denotes a controller for performing charge control. The controller 709 is constituted by a microcomputer. The controller 709 obtains charge control parameter data such as a voltage, a current, and a temperature, and controls the switching circuits 695 and 705 in accordance with an incorporated program, thereby performing appropriate charge control (to be described later).

The operation of the forty-second embodiment will be described below.

If the switching circuit 705 is in an OFF state, the power of the external power supply is not supplied to the information processing equipment. The power of the external power supply can be entirely used to charge the secondary battery 701.

When the charge/discharge switching circuit 695 is turned on, the secondary battery 701 is rapidly charged with a constant current by the output current limit function of the external power supply. If the charge/discharge switching circuit 695 is in the OFF state, the secondary battery 701 is charged with a small current (trickle charge) by the current limit circuit 707.

If the switching circuit 705 is in an ON state, the power of the external power supply is partially applied to the information processing equipment, and the remaining power is used to charge the secondary battery 701. If the battery voltage of the secondary battery is low, during the rapid charge operation of the secondary battery 701, no power can be supplied to the information processing equipment in some cases. For this reason, before the secondary battery 701 is rapidly charged, the battery voltage is measured by the battery voltage measuring section 699. If the battery voltage is higher than the level of a predetermined value, the charge/discharge switching circuit 695 is turned on to rapidly charge the secondary battery 701. However, if the battery voltage of the secondary battery 701 is lower than the level of the predetermined value, the rapid charge operation is not performed. Since the secondary battery 701 is always charged with a small current through the current limit circuit 707, the rapid charge operation is started at a battery voltage of the predetermined value or more.

When the secondary battery 701 is rapidly charged during the operation of the information processing equipment, a power is supplied to the information processing equipment and the secondary battery 701 with a constant current by the output current limit function. However, the power supplied to the information processing equipment changes depending on the operative state of the information processing equipment, and the charge current flowing in the secondary battery 701 also changes.

The charge current is measured by the battery current measuring section 697. The measured charge current is used to determine two elements. As one of them, the total charge amount of the secondary battery 701 is calculated from the charge current per short unit time. When the total charge amount reaches a predetermined value, the charge operation of the secondary battery 701 is stopped. As the other element, the detection value of an increase in temperature per unit time (dT/dt) is changed in accordance with the charge current per short unit time, and when the value dT/dt reaches the detection value, the charge operation of the secondary battery 701 is stopped. The above-described control is performed in accordance with the contents of the program of the controller 709 and realized by the charge/discharge switching circuit 695.

As described above, the charge control parameters are changed in accordance with a change in charge current. With this operation, even when the secondary battery 701 is charged during the operation of the information processing equipment, charge control can be properly and accurately performed. Therefore, unlike the prior art, a power applied to the secondary battery does not vary depending on the operative state of the information processing equipment, so abnormal charge control can be prevented.

Forty-third and Forty-fourth Embodiments

The forty-third and forty-fourth embodiments of the present invention will be described with reference to FIG. 78.

Figure 78:
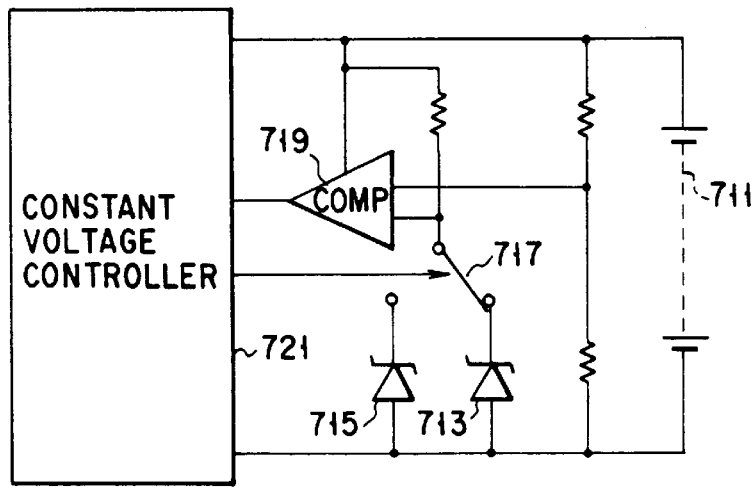
FIG. 78 is a block diagram showing an arrangement according to the forty-third and forty-fourth embodiments of the present invention.

FIG. 78 is a block diagram showing the circuit arrangement of the forty-third and forty-fourth embodiments of the present invention.

Referring to FIG. 78, reference numeral 711 denotes a secondary battery requiring constant voltage charge. Reference numeral 713 denotes a high-precision reference voltage source requiring large power consumption (consumed current). Reference numeral 715 denotes a non-high-precision reference voltage source whose power consumption (consumed current) is small.

Reference numeral 717 denotes a switch for selecting and connecting the reference voltage source. The high-precision reference voltage source 713 and the non-high-precision reference voltage source 715 are switched by a constant voltage controller 721.

Reference numeral 719 denotes a comparator (COMP) for detecting a difference between a battery voltage (output voltage) and a reference voltage. The comparator 719 compares a reference voltage obtained from the reference voltage source selected by the switch 717 with the output voltage of the secondary battery 711 and outputs a voltage (detection voltage) corresponding to a difference therebetween.

Figure 85:
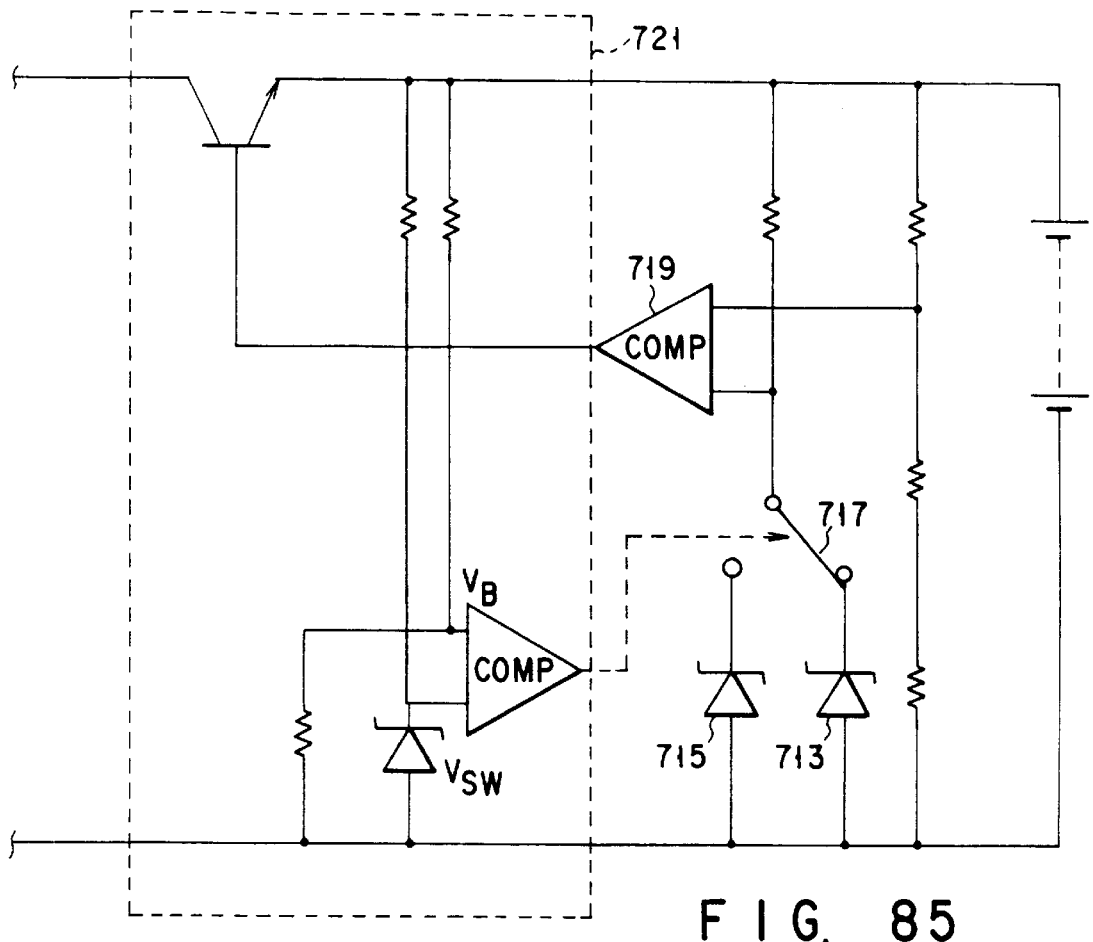
FIG. 85 is a circuit diagram showing the detailed arrangement of a constant voltage controller according to the forty-third embodiment.

The constant voltage controller 721 controls the constant voltage charge operation of the secondary battery 711 and has an arrangement as shown in FIG. 85. In the forty-third embodiment, the constant voltage charge operation of the secondary battery 711 is controlled on the basis of the output voltage of the secondary battery 711, an output (detection voltage) from the comparator 719, and a predetermined set switching voltage. In the forty-fourth embodiment, the constant voltage charge operation of the secondary battery 711 is controlled on the basis of the output voltage of the secondary battery 711, an output (detection voltage) from the comparator 719, a predetermined set switching voltage, the precision error range of the non-high-precision reference voltage source 715, and the maximum allowable voltage of the secondary battery 711.

The operations of the forty-third and forty-fourth embodiments of the present invention will be described with reference to FIG. 78.

The operation of the forty-third embodiment will be described with reference to FIG. 78.

In this embodiment, a battery voltage of the secondary battery 711 is defined as VB (V), and a set switching voltage is defined as VSW (V).

The secondary battery 711 requires constant voltage charge control during a charge operation.

The comparator 719 compares a check battery voltage obtained upon dividing an output (VB) from the secondary battery 1 by a fixed resistor with a reference voltage obtained from the reference voltage source (the high-precision reference voltage source 713 or the non-high-precision reference voltage source 715) selected and connected by the constant voltage controller 721. A voltage difference is sent to the constant voltage controller 721.

The constant voltage controller 721 receives the output voltage (VB) of the secondary battery 711 and the output voltage of the comparator 719 and controls the constant voltage charge operation of the secondary battery 711 in accordance with the output voltage values and the predetermined switching voltage (VSW).

More specifically, at the start of the charge operation, the non-high-precision reference voltage source 715 is connected. From the start of the charge operation to a point where [VB<VSW] is satisfied, voltage detection is performed on the basis of the reference voltage value obtained from the non-high-precision reference voltage source 715.

At the point where [VB<VSW] is satisfied, the switch 717 switches the circuit from the non-high-precision reference voltage source 715 to the high-precision reference voltage source 713. If [VB≧VSW], voltage detection is performed with reference to the high-precision reference voltage source 713.

If [VB≧VSW], constant voltage control of the secondary battery 711 is performed at a high precision using the high-precision reference voltage source 717.

In the discharge operation of the secondary battery 711, the circuit is switched to the non-high-precision reference voltage source 715 (the non-high-precision reference voltage source 715 is connected) to suppress the power consumption.

The forty-fourth embodiment will be described below with reference to FIG. 78.

In this embodiment, an output voltage (battery voltage) of the secondary battery 711 is defined as VB (V), a set switching voltage is defined as VSW (V), the precision of the non-high-precision reference voltage source 715 is defined as α (V), and the maximum allowable voltage of the secondary battery 711 is defined as VBMAX.

The secondary battery 711 requires constant voltage charge control during a charge operation.

The comparator 719 compares the output voltage (battery voltage) of the secondary battery 711 with a reference voltage obtained from the reference voltage source (the high-precision reference voltage source 713 or the non-high-precision reference voltage source 715) selected and connected by the constant voltage controller 721. A voltage difference is sent to the constant voltage controller 721.

The constant voltage controller 721 receives the output voltage of the secondary battery 711 and the output voltage of the comparator 719 and controls the constant voltage charge operation of the secondary battery 711 in accordance with the output voltage values and the predetermined switching voltage (VSW).

More specifically, at the start of the charge operation, the non-high-precision reference voltage source 715 is connected. From the start of the charge operation to a point where [VB<VSW] is satisfied, voltage detection is performed on the basis of the reference voltage value obtained from the non-high-precision reference voltage source 715.

At the point where [VB=VSW] is satisfied, the switch 717 switches the circuit from the non-high-precision reference voltage source 715 to the high-precision reference voltage source 717. The reference voltage source 715 has a precision, and the reference voltage varies within a range of VB+α at maximum. Therefore, since [VB+α≦VBMAX] need to be satisfied, the switching voltage (VSW) of the switch 717 is given as [VSW=VBMAX−α].

If [VB≧VSW], constant voltage control of the secondary battery 711 is performed at a high precision using the high-precision reference voltage source 713.

In the discharge operation of the secondary battery 711, the circuit is switched to the non-high-precision reference voltage source 715 (the non-high-precision reference voltage source 715 is connected) to suppress the power consumption.

Forty-fifth and Forty-sixth Embodiments

The forty-fifth and forty-sixth embodiments of the present invention will be described below with reference to FIG. 79.

Figure 79:
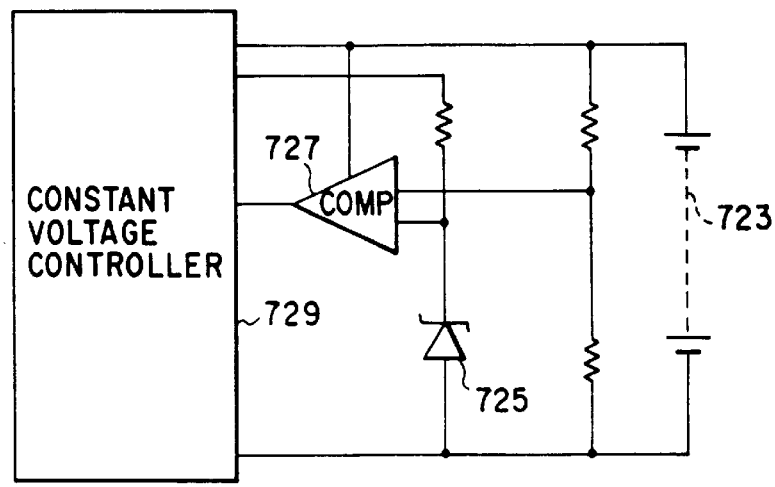
FIG. 79 is a block diagram showing an arrangement according to the forty-fifth and forty-sixth embodiments of the present invention.

FIG. 79 is a block diagram showing the circuit arrangement of the forty-fifth and forty-sixth embodiments of the present invention.

Referring to FIG. 79, reference numeral 723 denotes a secondary battery requiring constant voltage charge. Reference numeral 725 denotes a reference voltage source whose precision changes in accordance with a change in power to be supplied. As this power becomes high, the consumed current and the precision increases.

Reference numeral 727 denotes a comparator (COMP) for detecting a difference between a battery voltage (output voltage) and a reference voltage. The comparator 727 compares a reference voltage obtained from the reference voltage source 725 with the output voltage of the secondary battery 723 and outputs a voltage difference (detection voltage).

Reference numeral 729 denotes a constant voltage controller for controlling the constant voltage charge operation of the secondary battery 723. In the forty-fifth embodiment, a power supplied to the reference voltage source 725 is controlled on the basis of the output voltage of the secondary battery 723, an output (detection voltage) from the comparator 727, and a predetermined set switching voltage. The constant voltage charge operation of the secondary battery 723 is controlled on the basis of a reference voltage value having a precision according to the supplied power. In fourth embodiment, the constant voltage charge operation of the secondary battery 723 is controlled on the basis of the output voltage of the secondary battery 723, an output (detection voltage) from the comparator 727, a predetermined set switching voltage, the precision error range ($\alpha$) of the reference voltage source 725 at a non-high precision and a maximum allowable voltage (VBMAX) of the secondary battery 723.

The operations of the forty-fifth and forty-sixth embodiments of the present invention will be described with reference to FIG. 79.

The operation of the forty-fifth embodiment will be described with reference to FIG. 79.

In this embodiment, the battery voltage of the secondary battery 723 is defined as VB (V), and a set switching voltage is defined as VSW (V).

The comparator 727 compares the output voltage (battery voltage) of the secondary battery 723 with a reference voltage and sends the voltage difference to the constant voltage controller 729.

The constant voltage controller 729 receives the output voltage (battery voltage VB) of the secondary battery 723 and the output voltage of the comparator 727 and controls the constant voltage charge operation of the secondary battery 1 in accordance with the output voltage values and the predetermined switching voltage (VSW). At the same time, the constant voltage controller 729 controls the power supplied to the reference voltage source 725. More specifically, the constant voltage controller 729 controls the power supplied to the reference voltage source 725 on the basis of the output voltage of the secondary battery 723, the output (detection voltage) from the comparator 727, and the predetermined set switching voltage (VSW). The constant voltage charge operation of the secondary battery 723 is controlled on the basis of a reference voltage value having a precision according to the supplied power.

If this power is high, the reference voltage source 725 is switched to a high precision. If the supplied power is low, the reference source 725 is switched to a non-high precision.

At the start of the charge operation, the constant voltage controller 729 suppresses the power supplied to the reference voltage source 725 and sets the reference voltage source 725 to a non-high precision. From the start of the charge operation to a point where [VB<VSW) is satisfied, charge control is performed at a non-high precision.

If [VB=VSW], the constant voltage controller 729 increases the power supplied to the reference voltage source 725 and switches the reference voltage source 725 from a non-high precision to a high precision.

If [VB≧VSW], charge control is performed at a high precision.

In the discharge operation, the reference voltage source 725 is switched to a non-high precision to suppress the power consumption.

Forty-sixth Embodiment

The forty-sixth embodiment will be described below with reference to FIG. 79.

In this embodiment, the output voltage (battery voltage) of the secondary battery 723 is defined as VB (V), the switching voltage is defined as VSW (V), the maximum allowable voltage of the secondary battery 723 is defined as VBMAX, and the precision of the reference voltage source 725 at a non-high precision is defined as $\alpha$ (V).

The secondary battery 723 requires constant voltage charge control during a charge operation.

The comparator 727 compares a battery voltage with a reference voltage and sends a voltage difference to the constant voltage controller 729.

The constant voltage controller 729 controls the constant voltage charge operation of the secondary battery 723 on the basis of the output voltage (VB) of the secondary battery 723, the output voltage (detection voltage) of the comparator 727, the predetermined switching voltage (VSW), the precision ($\alpha$) of the reference voltage source 725 at a non-high precision, and the maximum allowable voltage (VBMAX) of the secondary battery 723. At the same time, the constant voltage controller 729 controls the power supplied to the reference voltage source 725.

If this power is high, the reference voltage source 725 is switched to a high precision. If the supplied power is small, the reference source 725 is switched to a non-high precision.

At the start of the charge operation, the constant voltage controller 729 suppresses the power supplied to the reference voltage source 725 and sets the reference voltage source 725 to a non-high precision. From the start of the charge operation to a point where [VB<VSW] is satisfied, the charge operation is performed at a non-high precision.

If [VB=VSW], the constant voltage controller 729 increases the power supplied to the reference voltage source 725 and switches the reference voltage source 725 from a non-high precision to a high precision.

Depending on the precision according to the consumed current of the reference voltage source 725, the reference voltage of the reference voltage source 725 varies within a range of VB+$\alpha$ at maximum. Therefore, since [VB+$\alpha$≦VBMAX] need to be satisfied in charge control of this type, (VSW=VBMAX−$\alpha$) is obtained.

If [VB≧VSW], charge control is performed at a high precision.

In the discharge operation, the power supplied to the reference voltage source 725 is suppressed to switch the reference voltage source 725 to a non-high precision, thereby suppressing the power consumption.

With the above-described precision switching control of the reference voltage source, in the charge operation, charge control can be performed at a high charge voltage appropriate to the secondary battery characteristics, so the charge capacity is increased. In the discharge operation, because of a high discharge efficiency, the battery driving time of an equipment in use can be prolonged. In the prior art, when the reference voltage source is set to a high precision, the power consumption increases. To the contrary, when the power consumption is to be suppressed, the reference voltage source need be set to a non-high precision, and the charge voltage need be set to be low. According to the above embodiments, these inconveniences can be eliminated.

What is claimed is:

1. A battery pack comprising:

a secondary battery;

means for monitoring battery voltages of battery cells constituting the secondary battery;

means for comparing the battery voltages with a predetermined voltage value to detect an overdischarge state of the secondary battery; and means for outputting detection information, detected by the means for comparing, to a portion outside the battery pack.

2. A battery pack comprising:

a secondary battery;

means for monitoring battery voltages of battery cells constituting the secondary battery;

means for comparing the battery voltages with a predetermined voltage value to detect an overcharge state of the secondary battery; and means for outputting detection information, detected by the means for comparing, to a portion outside the battery pack.

3. The battery pack according to claim 2, further comprising:

a fuse section arranged midway along a charge path of the secondary battery; and means for fusing the fuse section in accordance with the detection information.

4. A computer system comprising:

a computer main body;

a battery pack having
  a secondary battery,
  means for monitoring battery voltages of battery cells constituting the secondary battery,
  means for comparing the battery voltages with a predetermined voltage value, and
  means for outputting detection information, detected by the means for comparing, to a portion outside the battery pack; and a circuit arranged outside the battery pack for disconnecting an electrical path of the secondary battery, wherein the circuit disconnects the electrical path on the basis of the detection information.

5. The computer system according to claim 4, wherein the circuit for disconnecting is provided in the computer main body.

6. The computer system according to claim 4, wherein the predetermined voltage value is an overdischarge protection set voltage.

7. The computer system according to claim 6, wherein the electrical path is a discharge path of the secondary battery.

8. The computer system according to claim 4, wherein the predetermined voltage value is an overcharge protection set voltage.

9. The computer system according to claim 6, wherein the electrical path is a charge path of the secondary battery.

10. The computer system according to claim 4, wherein the circuit receives the detection information directly from the means for outputting.

11. The computer system according to claim 6, wherein the computer main body executes termination processing to normally end a process before the circuit disconnects the electrical path.

* * * * *